US012174114B2

(12) United States Patent
Tsuruda

(10) Patent No.: US 12,174,114 B2
(45) Date of Patent: Dec. 24, 2024

(54) TERAHERTZ DEVICE

(71) Applicant: ROHM CO., LTD., Kyoto (JP)

(72) Inventor: Kazuisao Tsuruda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 221 days.

(21) Appl. No.: 17/998,883

(22) PCT Filed: Jun. 7, 2021

(86) PCT No.: PCT/JP2021/021550
§ 371 (c)(1),
(2) Date: Nov. 15, 2022

(87) PCT Pub. No.: WO2021/251333
PCT Pub. Date: Dec. 16, 2021

(65) Prior Publication Data

US 2023/0213442 A1 Jul. 6, 2023

(30) Foreign Application Priority Data

Jun. 9, 2020 (JP) ................................ 2020-100133

(51) Int. Cl.

| | |
|---|---|
| ***G01N 21/3586*** | (2014.01) |
| ***G01R 31/28*** | (2006.01) |
| ***H01Q 1/12*** | (2006.01) |
| ***H01Q 15/14*** | (2006.01) |

(52) U.S. Cl.
CPC ..... *G01N 21/3586* (2013.01); *G01R 31/2831* (2013.01); *H01Q 1/12* (2013.01); *H01Q 15/145* (2013.01)

(58) Field of Classification Search
None
See application file for complete search history.

(56) References Cited

U.S. PATENT DOCUMENTS 10,126,631 B2* 11/2018 Uchida .............. G01N 21/3581
2011/0233406 A1 9/2011 Majewski et al.
2017/0271774 A1 9/2017 Mukai et al.
2022/0238464 A1* 7/2022 Tsuruda .................. H01L 29/20
2022/0404140 A1* 12/2022 Mästle ................. G02B 6/4216

FOREIGN PATENT DOCUMENTS

JP 2011203253 A 10/2011
JP 2016111542 A 6/2016

OTHER PUBLICATIONS

Office Action issued for German Patent Application No. 112021002389.6, dated Jun. 17, 2024, 7 pages including English machine translation.
International Search Report and Written Opinion issued for International Patent Application No. PCT/JP2021/021550, Date of mailing: Jul. 20, 2021, 11 pages including English translation of Search Report.

* cited by examiner

*Primary Examiner* — Hoon K Song
(74) *Attorney, Agent, or Firm* — HSML P.C.

(57) ABSTRACT

A terahertz device includes an antenna base including reflective films, wherein: the reflective films are curved to be recessed; the reflective film and the reflective film are arranged to be adjacent to each other in a y direction; and when viewed from a z direction, the sizes of the reflective film and the reflective film along an x direction are smaller than the sizes of the reflective film and the reflective film along the y direction.

22 Claims, 72 Drawing Sheets

TERAHERTZ DEVICE

TECHNICAL FIELD

The present disclosure relates to a terahertz device.

BACKGROUND ART

Recent advances in miniaturization of electronic devices such as transistors have reduced the size of electronic devices to nanoscale. As a result, a phenomenon called a quantum effect is observed. The quantum effect is used to develop an ultra-speed processing device and a device having a new function.

In such an environment, in particular, electromagnetic waves in the frequency range of 0.1 THz to 10 THz, which is called a terahertz band, are used in attempts to perform high capacity communication, information processing, imaging, and measurements. This frequency range has characteristics of both light and radio waves. If a device operating in this frequency band is realized, the device may be used in many applications such as measurements in various fields, for example, in the fields of physics, astronomy, and biology, in addition to imaging, high capacity communication, and information processing, which are described above.

A known element that generates or receives electromagnetic waves having a frequency in the terahertz band has a structure integrating, for example, a resonant tunneling diode and a fine slot antenna (refer to, for example, Patent Literature 1).

CITATION LIST

Patent Literature

Patent Literature 1: Japanese Laid-Open Patent Publication No. 2016-111542

SUMMARY OF INVENTION

Technical Problem

A terahertz device is used as a light source that outputs an electromagnetic wave having a frequency in the terahertz band or as a detector that detects an electromagnetic wave having a frequency in the terahertz band. There are needs for a terahertz device that produces high output or improves resolution.

It is an objective of the present disclosure to provide a terahertz device that produces high output or improves resolution.

Solution to Problem

To solve the above problem, a terahertz device includes terahertz elements including a first terahertz element and a second terahertz element configured to receive an electromagnetic wave, and reflective surfaces including a first reflective surface and a second reflective surface, the first reflective surface being opposed to the first terahertz element in a thickness-wise direction of the first terahertz element to reflect an incident electromagnetic wave toward the first terahertz element, and the second reflective surface being opposed to the second terahertz element in a thickness-wise direction of the second terahertz element to reflect an incident electromagnetic wave toward the second terahertz element. The first reflective surface is opened toward the first terahertz element and is curved to be recessed in a direction away from the first terahertz element. The second reflective surface is opened toward the second terahertz element and is curved to be recessed in a direction away from the second terahertz element. The first reflective surface and the second reflective surface are arranged adjacent to each other in a first direction. When a direction parallel to the thickness-wise direction of each of the terahertz elements is referred to as a height-wise direction of the terahertz device, as viewed in the height-wise direction of the terahertz device, at least one of the first reflective surface and the second reflective surface is smaller in the first direction than in a second direction that differs from the first direction.

This structure decreases the distance between the first terahertz element and the second terahertz element that are located adjacent in the first direction. This improves the resolution of the terahertz device in a detection range of electromagnetic waves.

To solve the problem described above, a terahertz device includes terahertz elements including a first terahertz element and a second terahertz element configured to generate an electromagnetic wave; and reflective surfaces including a first reflective surface and a second reflective surface, the first reflective surface being opposed to the first terahertz element in a thickness-wise direction of the first terahertz element to reflect the electromagnetic wave generated by the first terahertz element in one direction, and the second reflective surface being opposed to the second terahertz element in a thickness-wise direction of the second terahertz element to reflect the electromagnetic wave generated by the second terahertz element in one direction. The first reflective surface is opened toward the first terahertz element and is curved to be recessed in a direction away from the first terahertz element. The second reflective surface is opened toward the second terahertz element and is curved to be recessed in a direction away from the second terahertz element. The first reflective surface and the second reflective surface are arranged adjacent to each other in a first direction. When a direction parallel to the thickness-wise direction of each of the terahertz elements is referred to as a height-wise direction of the terahertz device, as viewed in the height-wise direction of the terahertz device, at least one of the first reflective surface and the second reflective surface is smaller in the first direction than in a second direction that differs from the first direction.

In this structure, the terahertz device includes multiple terahertz elements. Thus, when the terahertz device is used as a light source configured to output an electromagnetic wave having a frequency in the terahertz band, the light source produces high output. In addition, the distance between the first terahertz element and the second terahertz element is decreased in the first direction. This eliminates or decreases the space in the first direction between electromagnetic waves that are unidirectionally output from the terahertz elements through the reflective surfaces. Thus, the electromagnetic waves are evenly output from the terahertz device in the first direction.

Advantageous Effects of Invention

The terahertz device described above produces high output or improves resolution.

DESCRIPTION OF EMBODIMENTS

Embodiments of a terahertz device will now be described with reference to the drawings. The embodiments described below exemplify configurations and methods for embodying a technical concept and are not intended to limit the material, shape, structure, layout, dimensions, and the like of each component to those described below. The embodiments described below may undergo various modifications. Portions of the drawings are shown schematically.

In the present disclosure, unless otherwise specified, a structure described as "A is formed on B" includes a structure in which A is directly formed on B and a structure in which A is formed on B with an intermediate element located between A and B. Also, unless otherwise specified, a structure described as "A is disposed on B" includes a structure in which A is directly disposed on B and a structure in which A is disposed on B with an intermediate element located between A and B. Also, unless otherwise specified, a structure described as "A overlaps B as viewed in a direction" includes a structure in which the entirety of A overlaps B and a structure in which a portion of A overlaps B.

First Embodiment

Structure of Terahertz Device

The structure of a first embodiment of a terahertz device 10 according to the present disclosure will now be described with reference to FIGS. 1 to 15.

Figure 1:
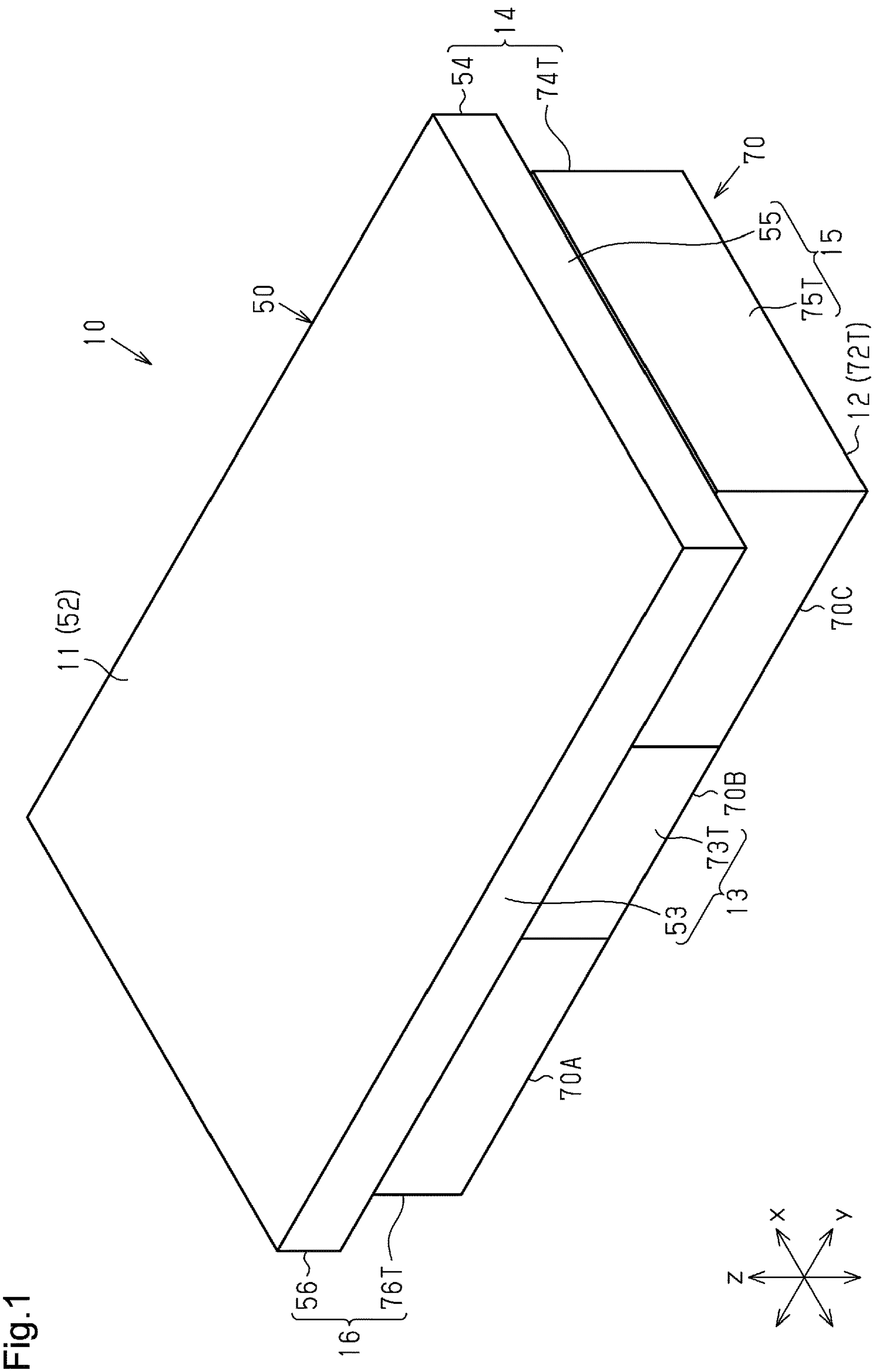
FIG. 1 is a perspective view showing a first embodiment of a terahertz device as viewed from above.
Figure 2:
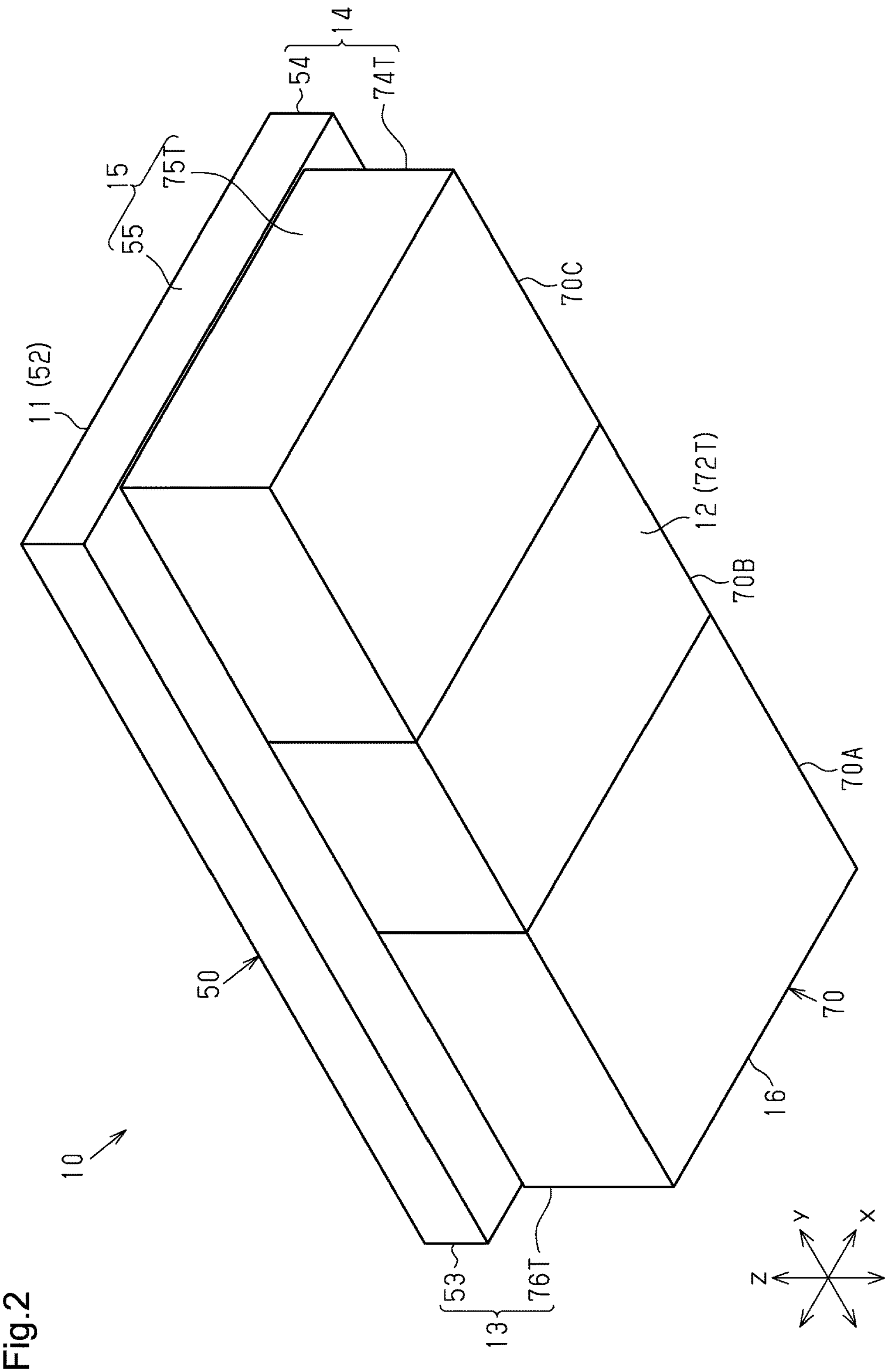
FIG. 2 is a perspective view of the terahertz device shown in FIG. 1 as viewed from below.

As shown in FIGS. 1 and 2, the terahertz device 10 of the present embodiment is entirely elongated and rectangular-box-shaped. The terahertz device 10 includes a device main surface 11, a device back surface 12 that is opposite the device main surface 11, and four device side surfaces 13 to 16. The device main surface 11 has the form of an elongated rectangle having a longitudinal direction and a lateral direction that are orthogonal to each other. The terahertz device 10 of the present embodiment receives an electromagnetic wave from the outside of the terahertz device 10. It is considered that the electromagnetic wave includes concepts of one or both of light and radio waves.

In the present embodiment, the longitudinal direction of the device main surface 11 is referred to as the x-direction, and the lateral direction of the device main surface 11 is referred to as the y-direction. A direction orthogonal to the x-direction and the y-direction is referred to as the z-direction. The z-direction is also referred to as the height-wise direction of the terahertz device 10.

Each of the device main surface 11 and the device back surface 12 intersects the z-direction. In the present embodiment, the device main surface 11 and the device back surface 12 are orthogonal to the z-direction. The device back surface 12 and the device main surface 11 face in opposite directions in the z-direction. That is, the device main surface 11 and the device back surface 12 may be referred to as opposite end surfaces of the terahertz device 10 in the height-wise direction.

For the sake of brevity, a direction extending from the device back surface 12 toward the device main surface 11 in the z-direction is referred to as "upward". The term "upward" also refers to a direction orthogonal to the device main surface 11 and extending from the device main surface 11 away from the device back surface 12. The four device side surfaces 13 to 16 may be also referred to as "the first device side surface 13", "the second device side surface 14", "the third device side surface 15" and "the fourth device side surface 16".

The first device side surface 13 and the second device side surface 14 are opposite end surfaces of the terahertz device 10 in the x-direction and intersect the x-direction. In the present embodiment, the first device side surface 13 and the second device side surface 14 are orthogonal to the x-direction and extend in the y-direction and the z-direction. In the present embodiment, each of the first device side surface 13 and the second device side surface 14 has a step. This point will be described later.

The third device side surface 15 and the fourth device side surface 16 are opposite end surfaces of the terahertz device 10 in the y-direction and intersect the y-direction. In the present embodiment, the third device side surface 15 and the fourth device side surface 16 are orthogonal to the y-direction and extend in the x-direction and the z-direction.

Figure 3:
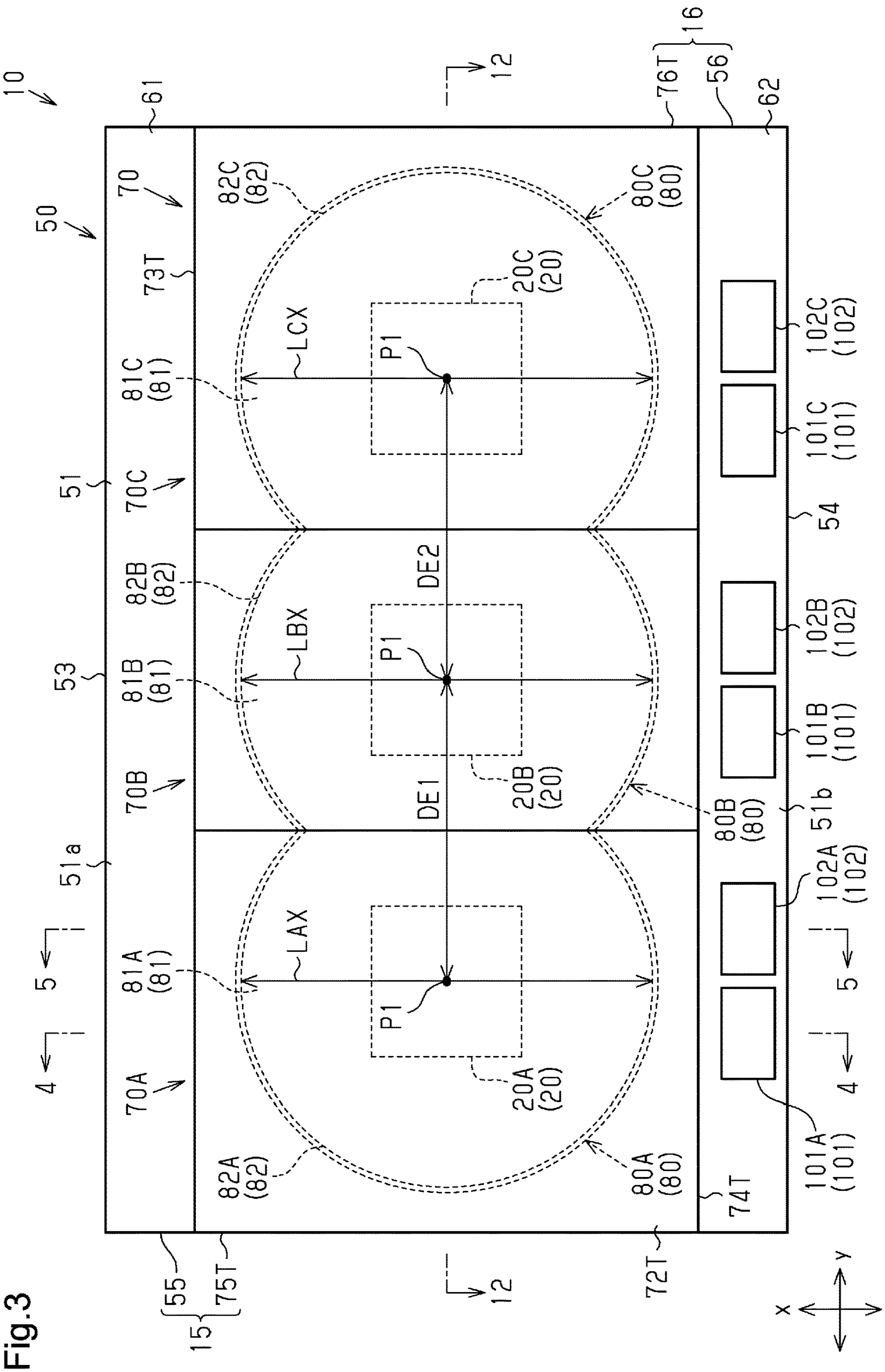
FIG. 3 is a back view of the terahertz device shown in FIG. 1.

As shown in FIG. 3, the terahertz device 10 includes terahertz elements 20. The terahertz elements 20 include a terahertz element 20A, a terahertz element 20B, and a terahertz element 20C. The terahertz elements 20A to 20C have the same structure. In the present embodiment, the terahertz elements 20A to 20C are aligned with each other in the x-direction and are separate from each other in the y-direction. The terahertz element 20A is disposed closer to the third device side surface 15 than the middle of the terahertz device 10 in the y-direction. The terahertz element 20C is disposed closer to the fourth device side surface 16 than the middle of the terahertz device 10 in the y-direction. The terahertz element 20B is disposed between the terahertz element 20A and the terahertz element 20C in the y-direction. In the present embodiment, the terahertz element 20B is located in the middle of the terahertz device 10 in the y-direction. In the present embodiment, the terahertz elements 20A to 20C are disposed in the middle of the terahertz device 10 in the x-direction.

For the sake of convenience, in the description common to the terahertz elements 20A to 20C, the terahertz elements 20A to 20C will be simply referred to as a terahertz element 20. When there is no need to distinguish between the terahertz elements 20A to 20C, the terahertz elements 20A to 20C will be referred to as terahertz elements 20.

The terahertz element 20 converts electromagnetic waves in the terahertz band and electrical energy to and from each other. The terahertz element 20 receives electromagnetic waves in the terahertz band (i.e., terahertz waves). Such electromagnetic waves in the terahertz band have frequencies of, for example, 0.1 Thz to 10 Thz.

Figure 4:
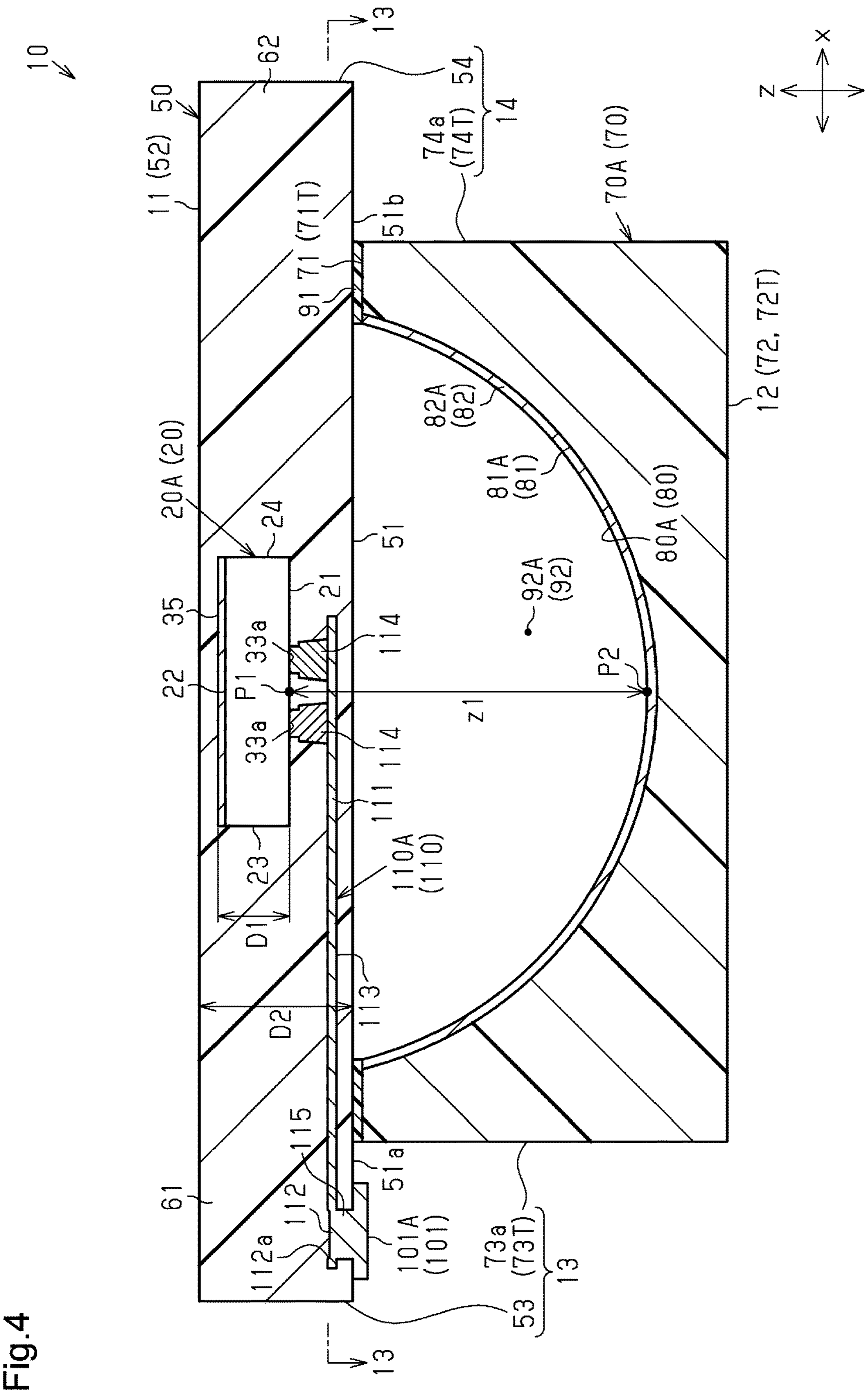
FIG. 4 is an end view of the terahertz device shown in FIG. 3 taken along line 4-4.
Figure 5:
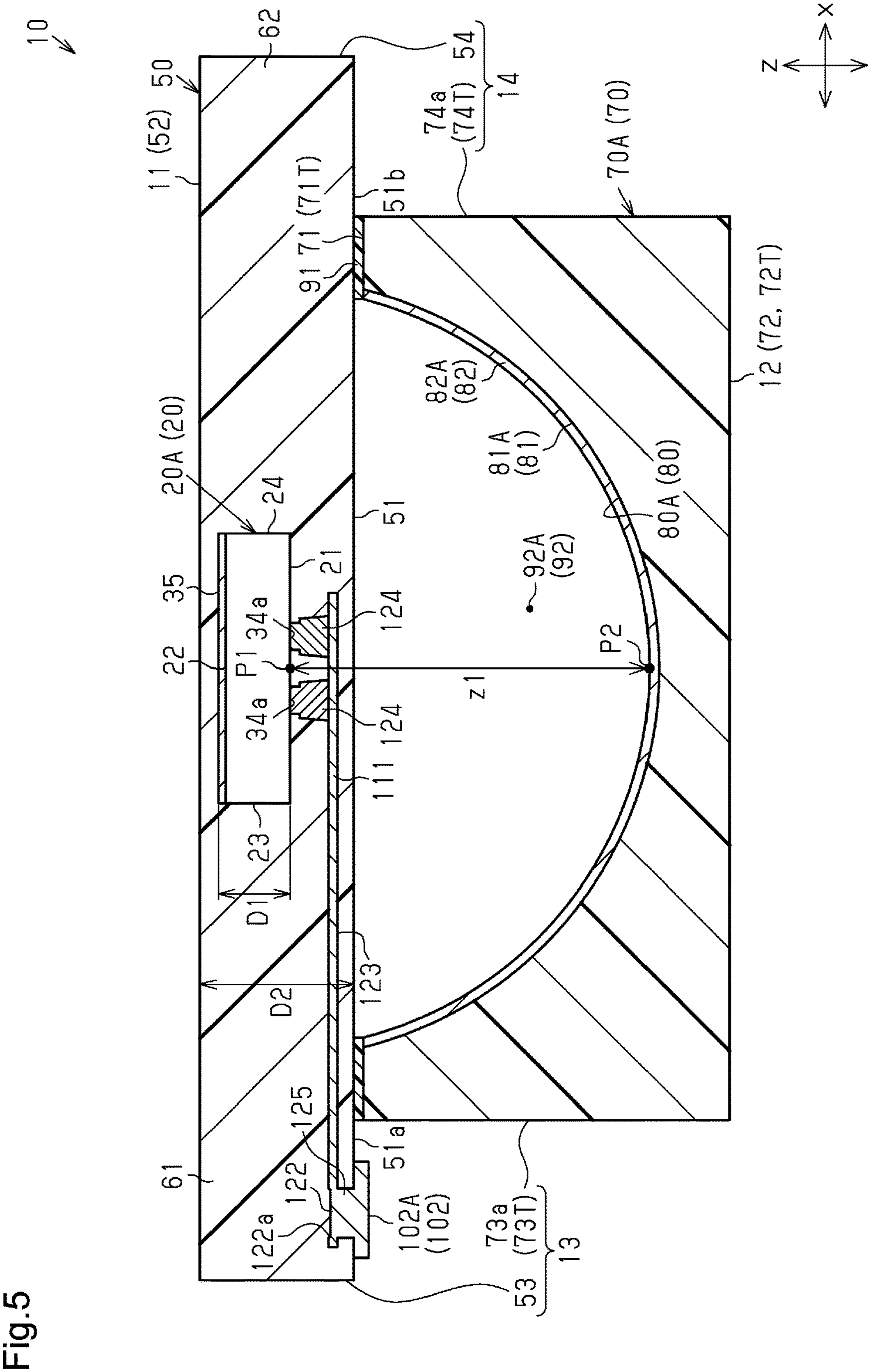
FIG. 5 is an end view of the terahertz device shown in FIG. 3 taken along line 5-5.
Figure 6:
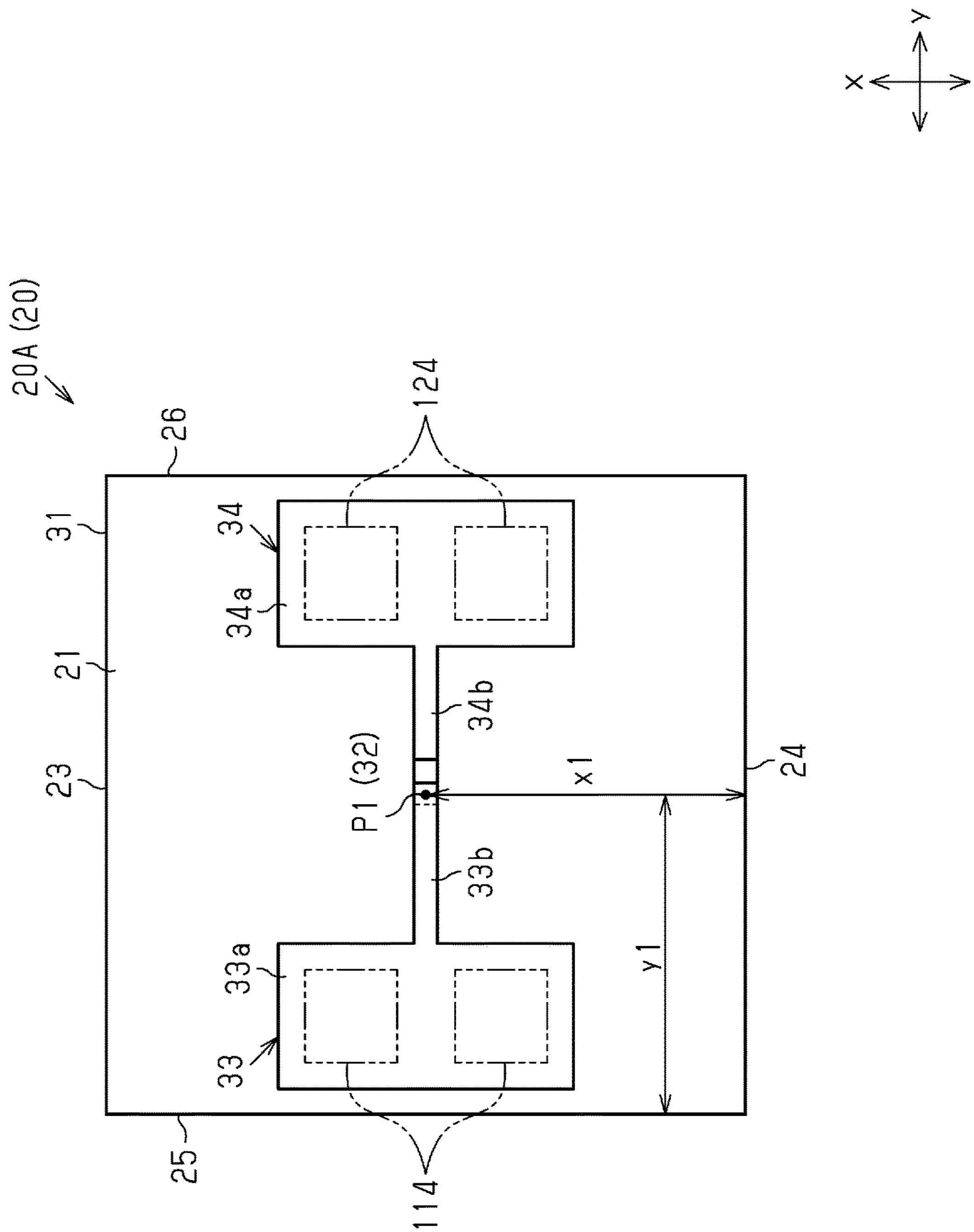
FIG. 6 is a front view of a terahertz element.

As shown in FIGS. 4 to 6, the terahertz element 20 has the form of a plate having a thickness-wise direction extending in the z-direction. In the present embodiment, the terahertz element 20 is rectangular as a whole. In the present embodiment, as shown in FIG. 6, the terahertz element 20 is square as viewed in the z-direction. The shape of the terahertz element 20 as viewed in the z-direction is not limited to a square and may be, for example, a rectangle, a circle, an ellipse, or a polygon. Since the z-direction conforms to the thickness-wise direction of the terahertz element 20, "as viewed in the z-direction" may be rephrased as "as viewed in the thickness-wise direction of the terahertz element 20". In addition, since the z-direction may be also referred to as the height-wise direction of the terahertz device 10, "as viewed in the z-direction" may be rephrased as "as viewed in the height-wise direction of the terahertz device 10".

As shown in FIGS. 4 and 5, the dimension of the terahertz element 20 in the z-direction is an element thickness D1 and is set based on, for example, the frequency of electromagnetic waves that are received. In an example, the element thickness D1 may be decreased as the electromagnetic waves have a higher frequency, and increased as the electromagnetic waves have a lower frequency.

The terahertz element 20 includes an element main surface 21 and an element back surface 22 that intersect the thickness-wise direction of the terahertz element 20. The element main surface 21 and the element back surface 22 intersect the z-direction. In the present embodiment, the element main surface 21 and the element back surface 22 are orthogonal to the z-direction. Thus, the z-direction also refers to a direction orthogonal to the element main surface 21.

The element main surface 21 and the element back surface 22 are rectangular as viewed in the z-direction and is, for example, square. However, the shape of the element main surface 21 and the element back surface 22 as viewed in the z-direction is not limited to this and may be changed in any manner.

As shown in FIGS. 4 and 5, in the present embodiment, the terahertz element 20 is arranged so that the element back surface 22 faces upward (i.e., the element main surface 21 faces downward). The element main surface 21 is disposed closer to the device back surface 12 than the element back surface 22. The element back surface 22 is disposed closer to the device main surface 11 than the element main surface 21.

As shown in FIG. 6, the terahertz element 20 includes a first element side surface 23 and a second element side surface 24, which are opposite end surfaces in the x-direction, and a third element side surface 25 and a fourth element side surface 26, which are opposite end surfaces in the y-direction. The first element side surface 23 and the second element side surface 24 intersect the x-direction. In the present embodiment, the first element side surface 23 and the second element side surface 24 are orthogonal to the x-direction. The third element side surface 25 and the fourth element side surface 26 intersect the y-direction. In the present embodiment, the third element side surface 25 and the fourth element side surface 26 are orthogonal to the y-direction. The first element side surface 23 and the second element side surface 24 are orthogonal to the third element side surface 25 and the fourth element side surface 26.

As shown in FIGS. 4 to 6, electromagnetic waves are received by a reception point P1. The reception point P1 also refers to a resonance point that resonates with an electromagnetic wave in the terahertz band. In the present embodiment, the reception point P1 is a point (in other words, region) that receives electromagnetic waves. The reception point P1 is formed on the element main surface 21. The element main surface 21 including the reception point P1 is configured to be an active surface that performs reception of an electromagnetic wave. The z-direction (in other words, the thickness-wise direction of the terahertz element 20 or the height-wise direction of the terahertz device 10) also refers to a direction orthogonal to the surface on which the reception point P1 is arranged.

In the present embodiment, the reception point P1 is disposed at the center of the element main surface 21. However, the position of the reception point P1 is not limited to the center of the element main surface 21 and may be any position.

As shown in FIG. 6, in the present embodiment, it is preferred that a first perpendicular distance x1 between the second element side surface 24 (or the first element side surface 23) and the reception point P1 is, for example, $(\lambda'_{InP}/2)+((\lambda'_{InP}/2)\times N)$, where N is an integer that is greater than or equal to 0: N=0, 1, 2, . . . .

Here, $\lambda'_{InP}$ represents the effective wavelength of electromagnetic waves propagated through the terahertz element 20. When n1 represents an element refractive index, which is the refractive index of the terahertz element 20, c represents the speed of light, and fc represents the center frequency of electromagnetic waves, $\lambda'_{InP}$ is $(1/n1)\times(c/fc)$. Alternatively, fc may represent the electromagnetic wave received by the terahertz element 20 and having a frequency having the maximum output.

The element refractive index n1 is greater than a dielectric refractive index n2, which is the refractive index of a dielectric 50 surrounding the terahertz element 20. Thus, when the terahertz element 20 receives an electromagnetic wave, free end reflection of the electromagnetic wave occurs at the second element side surface 24. This will be described later in detail. Thus, the first perpendicular distance x1 is set as described above so that the terahertz element 20 itself is designed as a resonator (primary resonator) in the terahertz device 10.

In the same manner, it is preferred that a second perpendicular distance y1 between the fourth element side surface 26 (or the third element side surface 25) and the reception point P1 is, for example, $(\lambda'_{InP}/2)+((\lambda'_{InP}/2)\times N)$, where N is an integer that is greater than or equal to 0: N=0, 1, 2, . . . .

The perpendicular distances x1 and y1 may have different values for each of the element side surfaces 23, 24, 25, and 26 as long as the values are calculated by the above equation. In an example, the first perpendicular distance x1 between the second element side surface 24 and the reception point P1 may differ from a first perpendicular distance between the first element side surface 23 and the reception point P1. In the same manner, the second perpendicular distance y1 between the fourth element side surface 26 and the reception point P1 may differ from a second perpendicular distance between the third element side surface 25 and the reception point P1.

Figure 7:
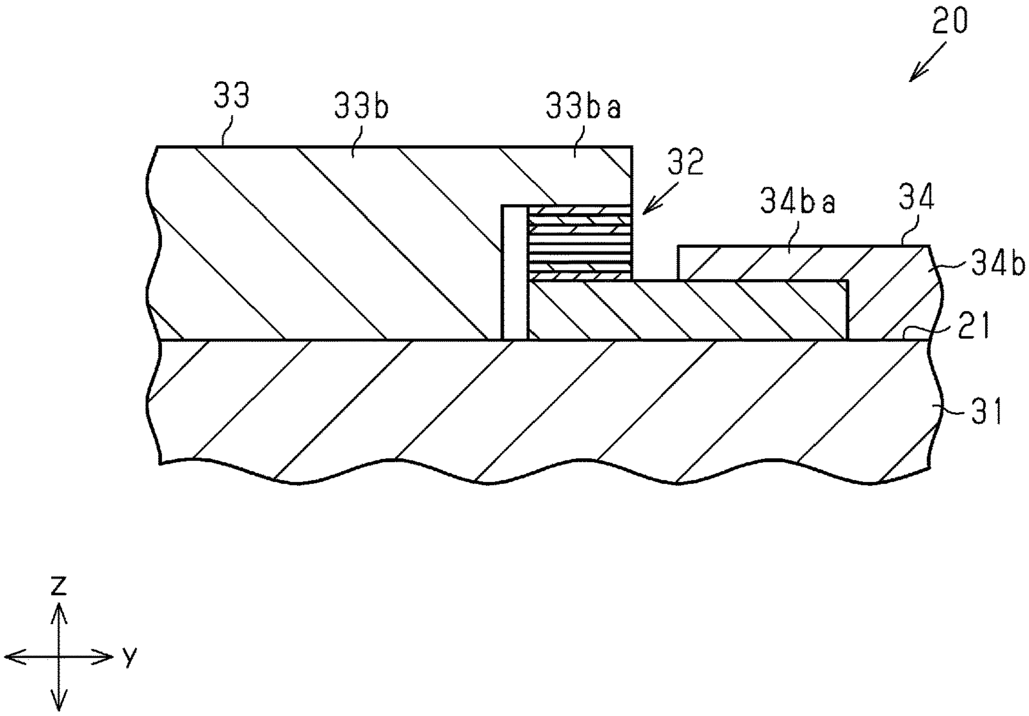
FIG. 7 is a schematic end view of an active element and its surroundings.
Figure 8:
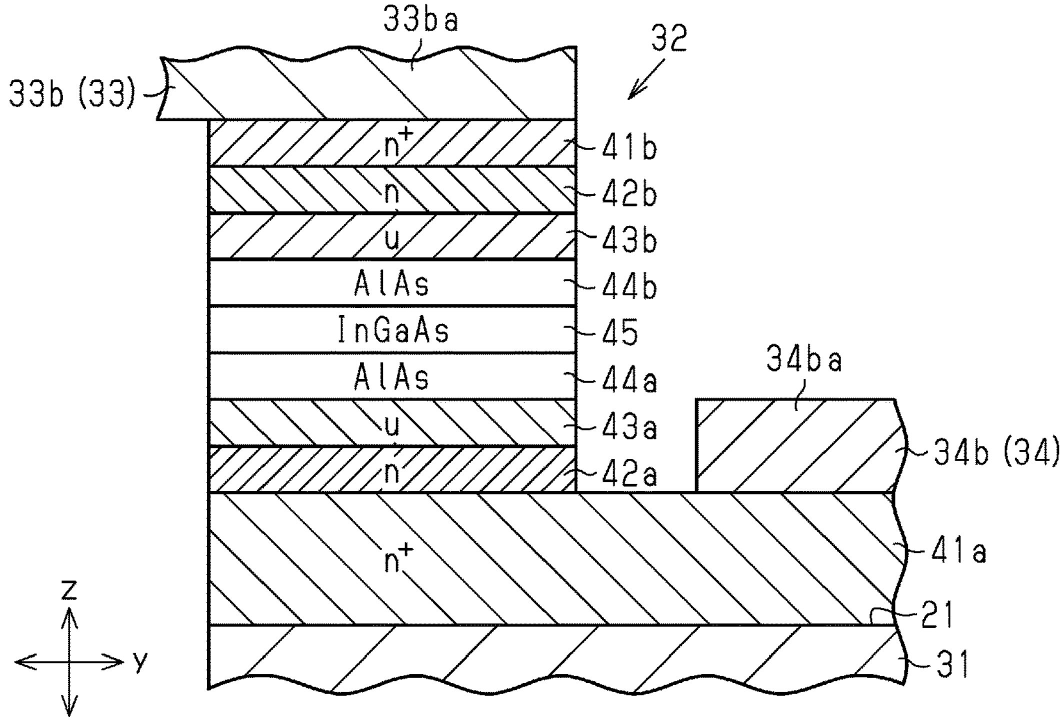
FIG. 8 is an enlarged partial view of FIG. 7.

As shown in FIGS. 7 and 8, the terahertz element 20 includes an element substrate 31, an active element 32, a first element conductive layer 33, and a second element conductive layer 34.

The element substrate 31 is formed of a semiconductor and is semi-insulative. An example of the semiconductor forming the element substrate 31 is indium phosphide (InP).

The element refractive index n1 is the refractive index (absolute refractive index) of the element substrate 31. When the element substrate 31 is formed of InP, the element refractive index n1 is approximately 3.4.

In the present embodiment, the element substrate 31 is rectangular and is, for example, square as viewed in the z-direction. The element main surface 21 and the element back surface 22 are the main surface and the back surface of the element substrate 31. The element side surfaces 23 to 26 are side surfaces of the element substrate 31.

The active element 32 converts electromagnetic waves in the terahertz band and electrical energy to and from each other. The active element 32 is formed on the element substrate 31. In the present embodiment, the active element 32 is arranged at the center of the element main surface 21. The reception point P1 also refers to a position on which the active element 32 is arranged.

The active element 32 is typically a resonant tunneling diode (RTD). Alternatively, the active element 32 may be, for example, a tunnel injection transit time (TUNNETT) diode, an impact ionization avalanche transit time (IMPATT) diode, a GaAs-base field effect transistor (FET), a GAN-base FET, a high electron mobility transistor (HEMT), or hetero junction bipolar transistor (HBT).

An example of obtaining the active element 32 will be described.

As shown in FIG. 8, a semiconductor layer 41*a* is formed on the element substrate 31. The semiconductor layer 41*a* is formed of, for example, GaInAs. The semiconductor layer 41*a* is doped with an n-type impurity at a high concentration.

A GaInAs layer 42*a* is stacked on the semiconductor layer 41*a*. The GaInAs layer 42*a* is doped with an n-type impurity. For example, the GaInAs layer 42*a* has a lower impurity concentration than the semiconductor layer 41*a*.

A GaInAs layer 43*a* is stacked on the GaInAs layer 42*a*. The GaInAs layer 43*a* is not doped with impurities.

An AlAs layer 44*a* is stacked on the GaInAs layer 43*a*. An InGaAs layer 45 is stacked on the AlAs layer 44*a*. An AlAs layer 44*b* is stacked on the InGaAs layer 45. The AlAs layer 44*a*, the InGaAs layer 45, and the AlAs layer 44*b* form an RTD unit.

A GaInAs layer 43*b* is not doped with impurities and is stacked on the AlAs layer 44*b*. A GaInAs layer 42*b* is doped with an n-type impurity and is stacked on the GaInAs layer 43*b*. A GaInAs layer 41*b* is stacked on the GaInAs layer 42*b*. The GaInAs layer 41*b* is doped with an n-type impurity at a high concentration. For example, the GaInAs layer 41*b* has a higher impurity concentration than the GaInAs layer 42*b*.

The active element 32 may have any specific structure configured to receive electromagnetic waves (or generate electromagnetic waves or both receive and generate electromagnetic waves). In other words, the active element 32 may be configured to receive electromagnetic waves in the terahertz band.

As shown in FIGS. 4 and 5, in the present embodiment, an element reflective layer 35 is formed on the element back surface 22 to reflect electromagnetic waves. Electromagnetic waves that enter a portion of the terahertz element 20 located above the reception point P1 (the active element 32) are reflected downward by the element reflective layer 35.

The element thickness D1 may be set so that a resonance condition of electromagnetic waves is satisfied. Specifically, when the element reflective layer 35 is formed, an electromagnetic wave performs a fixed end reflection on the interface between the element back surface 22 and the element reflective layer 35. This results in a π phase shift. In the present embodiment, taking this into consideration, the element thickness D1 may be set to $(\lambda'_{InP}/4)+(\lambda'_{InP}/4)\times N$, where N is an integer that is greater than or equal to 0: N=0, 1, 2, . . . . When the element thickness D1 is set as described above, standing waves are excited in the terahertz element 20. However, the element thickness D1 is not limited to the above setting and may be changed in any manner.

As shown in FIG. 7, the first element conductive layer 33 and the second element conductive layer 34 are formed on the element main surface 21. Each of the first element conductive layer 33 and the second element conductive layer 34 has a stacked structure of metals. In an example, the stacked structure of each of the first element conductive layer 33 and the second element conductive layer 34 is obtained by stacking gold (Au), palladium (Pd), and titanium (Ti). In another example, the stacked structure of each of the first element conductive layer 33 and the second element conductive layer 34 is obtained by stacking Au and Ti. The first element conductive layer 33 and the second element conductive layer 34 are formed through vapor deposition or sputtering.

As shown in FIG. 6, the element conductive layers 33 and 34 respectively include pads 33*a* and 34*a* and element connection portions 33*b* and 34*b*. The pads 33*a* and 34*a* are spaced apart and opposed to each other at opposite sides of the reception point P1 (the active element 32) in a predetermined direction (in the present embodiment, the y-direction). The element connection portions 33*b* and 34*b* extend from the pads 33*a* and 34*a* toward the active element 32. In the description hereafter, the pad 33*a* may be referred to as the first pad 33*a*, the pad 34*a* may be referred to as the second pad 34*a*, the element connection portion 33*b* may be referred to as the first element connection portion 33*b*, and the element connection portion 34*b* may be referred to as the second element connection portion 34*b*.

The pads 33*a* and 34*a* extend, for example, in a direction (in the present embodiment, the x-direction) orthogonal to an opposing direction of the pads 33*a* and 34*a*. In an example, as viewed in the z-direction, each of the pads 33*a* and 34*a* is rectangular and has a longitudinal direction and a lateral direction. Specifically, the pads 33*a* and 34*a* have the form of a rectangle such that the longitudinal direction extends in the x-direction and lateral direction extends in the y-direction.

As viewed in the z-direction, the pads 33*a* and 34*a* are disposed so as not to overlap the reception point P1. In an example, the pads 33*a* and 34*a* are located at opposite sides of the reception point P1 (i.e., the active element 32) in the y-direction. In the present embodiment, the pads 33*a* and 34*a* are located closer to the element side surfaces 25 and 26 than the reception point P1.

In an example, the element connection portions 33*b* and 34*b* are elongated in the y-direction. The dimension of the element connection portions 33*b* and 33*b* in the x-direction is less than the dimension of the pads 33*a* and 34*a* in the x-direction.

As shown in FIG. 8, the element connection portions 33*b* and 34*b* respectively include distal ends 33*ba* and 34*ba* that overlap the active element 32 as viewed in the z-direction and are electrically connected to the active element 32. Specifically, the distal end 33*ba* of the first element connection portion 33*b* is disposed on the GaInAs layer 41*b* and in contact with the GaInAs layer 41*b*.

The semiconductor layer 41*a* extend toward the second pad 34*a* (refer to FIG. 6) in the y-direction further than other layers such as the GaInAs layer 42. The distal end 34*ba* of the second element connection portion 34*b* is stacked on the semiconductor layer 41*a* at a location where the GaInAs layer 42 and other layers are not stacked. Thus, the active element 32 is electrically connected to the element conductive layers 33 and 34 (i.e., the pads 33*a* and 34*a*). The second element connection portion 34*b* is spaced apart from the other layers such as the GaInAs layer 42 in the x-direction.

Although not shown in FIG. 8, alternatively, a GaInAs layer doped with an n-type impurity at a high concentration may be disposed between the GaInAs layer 41*b* and the distal end 33*ba* of the first element connection portion 33*b*. As a result, the first element conductive layer 33 may be in good contact with the GaInAs layer 41*b*.

As shown in FIGS. 4 and 5, the terahertz device 10 includes the dielectric 50, which is an example of a retaining member, an antenna base 70, a reflective film 82, which is an example of a reflector, and a gas cavity 92.

The dielectric 50 is formed of a dielectric material that is transmissive to electromagnetic waves received by the terahertz element 20. In the present embodiment, the dielectric 50 is formed from a resin material. In an example, the dielectric 50 is formed from an epoxy resin (e.g., glass epoxy resin). The dielectric 50 is insulative. The dielectric 50 may have any color and may be black.

The dielectric refractive index n2, which is the refractive index (absolute refractive index) of the dielectric 50, is less than the element refractive index n1. In an example, the dielectric refractive index n2 is 1.55. The dielectric 50 may have a monolayer structure or multilayer structure. That is, one or more interfaces may be formed in the dielectric 50.

As shown in FIGS. 3 to 5, the dielectric 50 surrounds each of the terahertz elements 20. In the present embodiment, the dielectric 50 entirely surrounds the terahertz elements 20A, 20B, and 20C and covers the element main surface 21, the element back surface 22, and the element side surfaces 23 to 26 of each of the terahertz elements 20A, 20B, and 20C (refer to FIG. 6).

The element main surface 21, the element back surface 22, and the element side surfaces 23 to 26 of the terahertz elements 20A, 20B, and 20C are in contact with the dielectric 50. More specifically, in the present embodiment, the dielectric 50 surrounds the terahertz elements 20A, 20B, and 20C so as not to include any gap between the dielectric 50 and the terahertz elements 20A, 20B, and 20C. In other words, the dielectric 50 encapsulates the terahertz elements 20A, 20B, and 20C.

In an example, the dielectric 50 has the form of a plate in which the thickness-wise direction extends in the z-direction. Specifically, as shown in FIG. 3, the dielectric 50 has the form of a rectangular plate such that the longitudinal direction extends in the y-direction and the lateral direction extends in the x-direction.

As shown in FIGS. 4 and 5, the dielectric 50 includes a dielectric main surface 51 and a dielectric back surface 52 that intersect the z-direction. In an example, the dielectric main surface 51 and the dielectric back surface 52 are orthogonal to the z-direction. The dielectric main surface 51 faces downward. The dielectric back surface 52 is a surface opposite the dielectric main surface 51 and faces upward. In the present embodiment, the dielectric back surface 52 defines the device main surface 11.

As shown in FIG. 3, the dielectric 50 includes a first dielectric side surface 53 and a second dielectric side surface 54, which are opposite end surfaces in the x-direction, and a third dielectric side surface 55 and a fourth dielectric side surface 56, which are opposite end surfaces in the y-direction. The dielectric side surfaces 53 to 56 partially define the device side surfaces 13 to 16. In the present embodiment, the first dielectric side surface 53 and the second dielectric side surface 54 are orthogonal to the third dielectric side surface 55 and the fourth dielectric side surface 56.

As shown in FIGS. 4 and 5, the terahertz element 20 is arranged in the dielectric 50 such that the element main surface 21 faces the dielectric main surface 51. The terahertz element 20 is disposed between the dielectric main surface 51 and the dielectric back surface 52. In the present embodiment, the dielectric 50 has a dielectric thickness D2, which is a dimension in the z-direction. The dielectric thickness D2 is set to satisfy the resonance condition of electromagnetic waves received by the terahertz element 20. More specifically, it is preferred that the dielectric thickness D2 is $(\lambda'_R/2)+(\lambda'_R/2)\times N$, where N is an integer that is greater than or equal to 0: N=0, 1, 2, . . . and $\lambda'_R$ represents the effective wavelength of electromagnetic waves propagated through the dielectric 50. An example of $\lambda'_R$ is $(1/n2)\times(c/fc)$. The dielectric thickness D2 also refers to the distance between the dielectric main surface 51 and the dielectric back surface 52 in the z-direction.

In the present embodiment, the dielectric 50 is separate from the antenna base 70. In other words, the dielectric 50 and the antenna base 70 are formed separately. The antenna base 70 and the dielectric 50 may be formed from the same material or different materials.

As shown in FIGS. 4 and 5, the antenna base 70 is arranged at the dielectric main surface 51 of the dielectric 50. The antenna base 70 is positioned to face the dielectric 50 in the z-direction. The z-direction is also referred to as the opposing direction of the antenna base 70 and the dielectric 50.

The dielectric 50 includes projections 61 and 62 projecting sideward beyond the antenna base 70 as viewed in the z-direction. Specifically, in the present embodiment, the dielectric 50 is longer than the antenna base 70 in the x-direction. Thus, the projections 61 and 62 project from opposite sides of the antenna base 70 in the x-direction. As viewed in the z-direction, the projections 61 and 62 are disposed at opposite sides of the antenna base 70 in the x-direction and are spaced apart in the x-direction. The terahertz element 20 is disposed between the projections 61 and 62.

In the present embodiment, the dimension of the dielectric 50 in the y-direction is set to be equal to the dimension of the antenna base 70 in the y-direction. That is, the dielectric 50 does not project from the antenna base 70 in the y-direction. The dimension of the antenna base 70 in the z-direction is set to be greater than the dielectric thickness D2.

The antenna base 70 will now be described.

Figure 9:
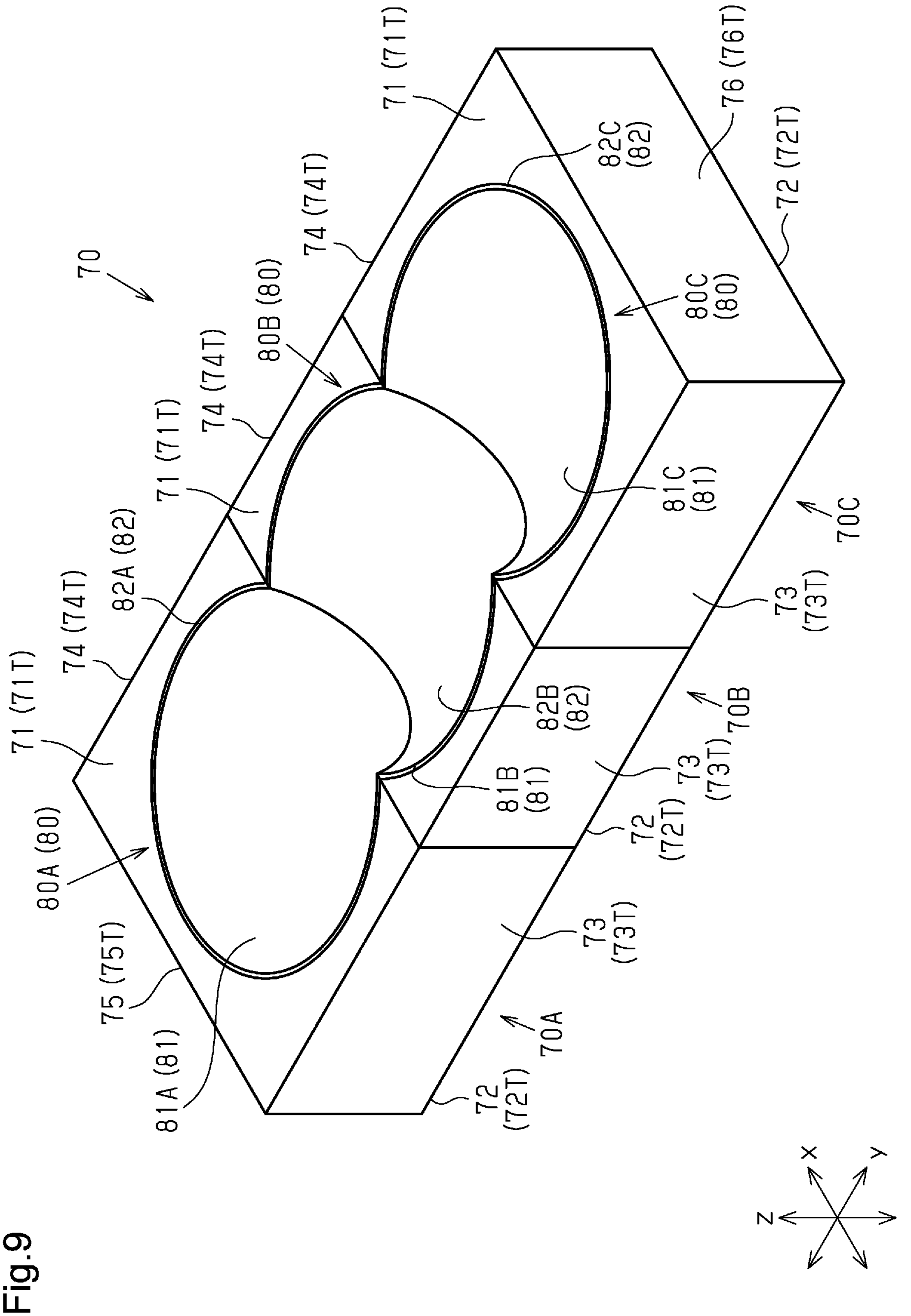
FIG. 9 is a perspective view of an antenna base of the terahertz device shown in FIG. 1 as viewed from above.

As shown in FIG. 9, in the present embodiment, the antenna base 70 is, for example, elongated-rectangular-box-shaped as a whole. The antenna base 70 has a longitudinal direction conforming to the longitudinal direction of the terahertz device 10. The antenna base 70 has a lateral direction extending in the lateral direction of the terahertz device 10.

The antenna base 70 is formed of, for example, an insulative material. Specifically, the antenna base 70 is formed of a dielectric, for example, a synthetic resin such as an epoxy resin. An example of the epoxy resin is a glass epoxy resin. However, the material of the antenna base 70 is not limited to this and may be any material, for example, Si, Teflon®, or glass. The antenna base 70 may have any color and may be black.

The antenna base 70 includes a base main surface 71T, a base back surface 72T that is opposite the base main surface 71T, and four base side surfaces 73T to 76T. Each of the base main surface 71T and the base back surface 72T has the form of an elongated rectangle and has a longitudinal direction and a lateral direction that are orthogonal to each other. In the present embodiment, the antenna base 70 is arranged so that the longitudinal direction of the base main surface 71T and the base back surface 72T extend in the y-direction and the lateral direction of the base main surface 71T and the base back surface 72T extend in the x-direction. The four base side surfaces 73T to 76T may be referred to as a first base side surface 73T, a second base side surface 74T, a third base side surface 75T, and a fourth base side surface 76T.

The base main surface 71T and the base back surface 72T intersect the z-direction. In the present embodiment, the base main surface 71T and the base back surface 72T are orthogonal to the z-direction. The base back surface 72T and the base main surface 71T face in opposite directions in the z-direction. As shown in FIGS. 4 and 5, the base main surface 71T and the device main surface 11 face in the same direction. The base back surface 72T and the device back surface 12 face in the same direction. The base main surface 71T is opposed to the dielectric main surface 51. The base back surface 72T defines the device back surface 12. In the present embodiment, the base main surface 71T and the base back surface 72T are, for example, identical in shape. However, the base main surface 71T and the base back surface 72T may have different shapes.

As shown in FIGS. 4 and 5, the dielectric 50 is mounted on the base main surface 71T. Thus, the base main surface 71T faces the dielectric main surface 51 of the dielectric 50 and refers to a surface on which the dielectric 50 is mounted. The base main surface 71T is smaller than the dielectric main surface 51 in the x-direction. Thus, the dielectric main surface 51 partially projects beyond the base main surface 71T in the x-direction. The dimension of the base main surface 71T in the y-direction is set to be equal to the dimension of the dielectric main surface 51 in the y-direction.

The first base side surface 73T and the second base side surface 74T are opposite ends surfaces in the x-direction. The first base side surface 73T and the second base side surface 74T intersect the x-direction. In the present embodiment, the first base side surface 73T and the second base side surface 74T are orthogonal to the x-direction.

The first base side surface 73T defines the first device side surface 13. Specifically, the first device side surface 13 is defined by the first dielectric side surface 53 and the first base side surface 73T. The first dielectric side surface 53 is disposed sideward from the first base side surface 73T, that is, in a direction away from the terahertz element 20. Thus, the first device side surface 13 has a step. The dielectric main surface 51 is partially exposed as a step surface between the first dielectric side surface 53 and the first base side surface 73T. More specifically, the dielectric main surface 51 includes a first overhang surface 51*a* projecting sideward beyond the antenna base 70 (i.e., the first base side surface 73T). The first overhang surface 51*a* is a portion of the dielectric main surface 51 corresponding to the first projection 61.

The second base side surface 74T defines the second device side surface 14. Specifically, the second device side surface 14 is defined by the second dielectric side surface 54 and the second base side surface 74T. The second dielectric side surface 54 is disposed sideward from the second base side surface 74T, that is, in a direction away from the terahertz element 20. Thus, the second device side surface 14 has a step. The dielectric main surface 51 is partially exposed as a step surface between the second dielectric side surface 54 and the second base side surface 74T. More specifically, the dielectric main surface 51 includes a second overhang surface 51*b* projecting sideward beyond the antenna base 70 (i.e., the second base side surface 74T). The second overhang surface 51*b* is a portion of the dielectric main surface 51 corresponding to the second projection 62.

Figure 10:
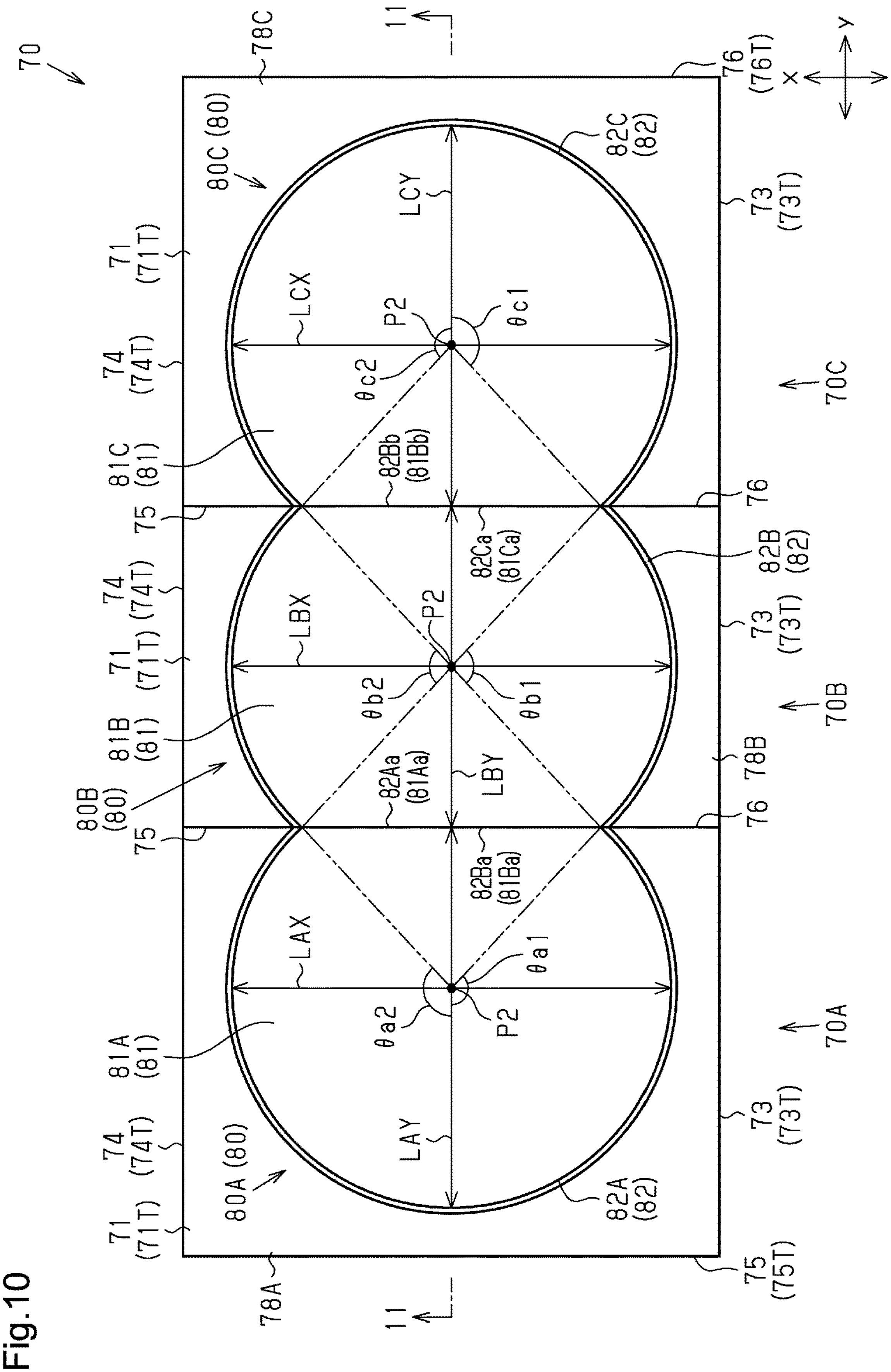
FIG. 10 is a plan view of the antenna base shown in FIG. 9.

As shown in FIGS. 9 and 10, the third base side surface 75T and the fourth base side surface 76T are opposite end surfaces in the y-direction. The third base side surface 75T and the fourth base side surface 76T intersect the y-direction. In the present embodiment, the third base side surface 75T and the fourth base side surface 76T are orthogonal to the y-direction.

Figure 12:
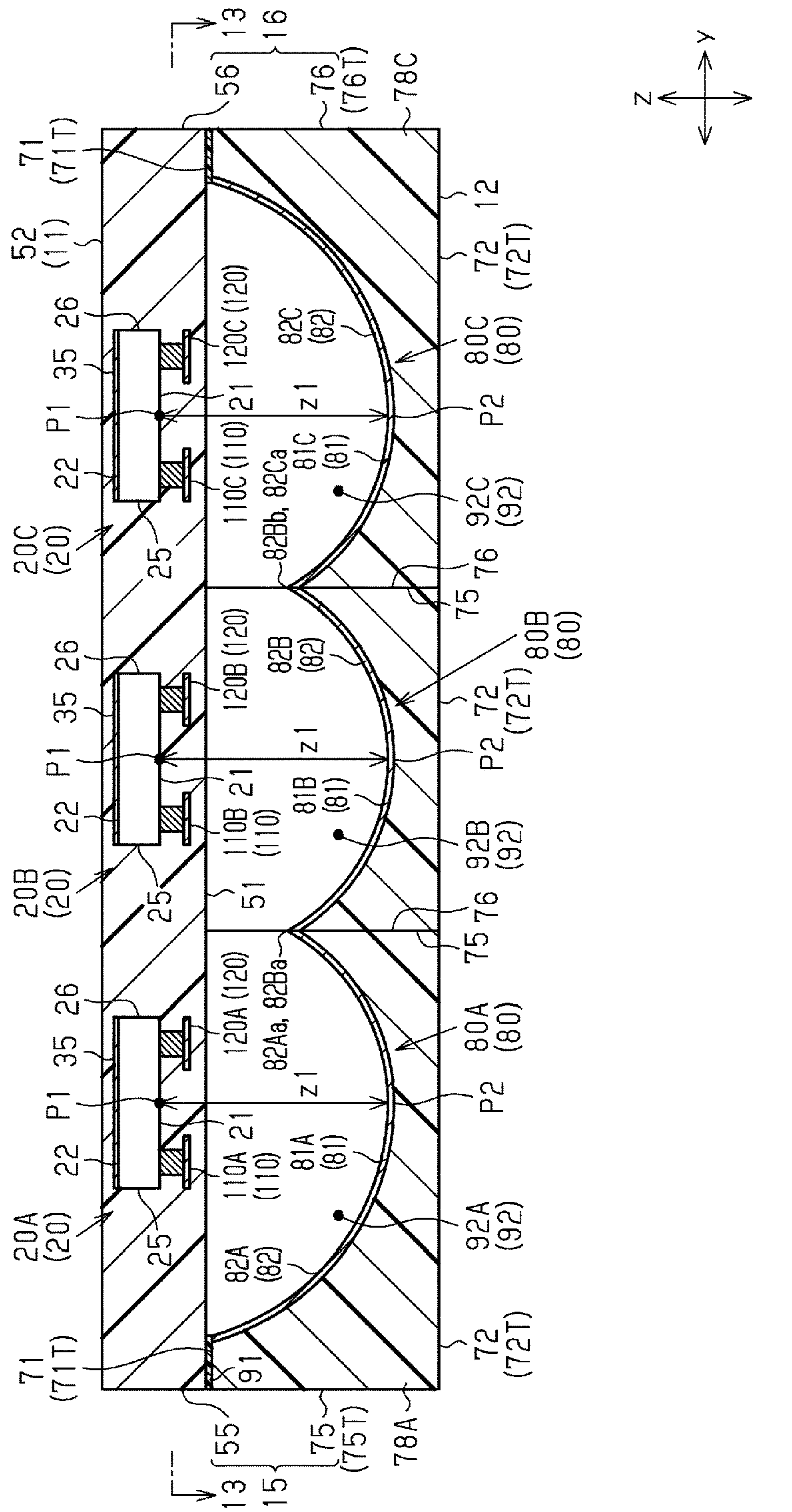
FIG. 12 is a cross-sectional view of the terahertz device shown in FIG. 3 taken along line 12-12.

As shown in FIG. 12, the third base side surface 75T defines the third device side surface 15. Specifically, the third device side surface 15 is defined by the third dielectric side surface 55 and the third base side surface 75T. In the present embodiment, the third dielectric side surface 55 is flush with the third base side surface 75T. Thus, the third device side surface 15 is flat and does not have a step.

The fourth base side surface 76T defines the fourth device side surface 16. Specifically, the fourth device side surface 16 is defined by the fourth dielectric side surface 56 and the fourth base side surface 76T. In the present embodiment, the fourth dielectric side surface 56 is flush with the fourth base side surface 76T. Thus, the fourth device side surface 16 is flat and does not have a step.

As shown in FIGS. 9 and 10, the antenna base 70 is obtained by combining separate antenna bases. In the present embodiment, the antenna base 70 is obtained by combining separate antenna bases 70A, 70B, and 70C. In the present embodiment, as shown in FIGS. 9 and 10, the separate antenna bases 70A, 70B, and 70C are combined to be in a row in the y-direction. As shown in FIG. 10, the separate antenna base 70A and the separate antenna base 70C have the same structure. The separate antenna base 70B differs in structure from the separate antenna bases 70A and 70C. More specifically, the antenna base 70 includes a combination of two types of antenna bases.

As shown in FIG. 12, the separate antenna base 70A is positioned to be opposed to the terahertz element 20A in the thickness-wise direction of the terahertz element 20A (the z-direction). The separate antenna base 70B is positioned to be opposed to the terahertz element 20B in the thickness-wise direction of the terahertz element 20B (the z-direction). The separate antenna base 70C is positioned to be opposed to the terahertz element 20C in the thickness-wise direction of the terahertz element 20C (the z-direction). In the present embodiment, the separate antenna bases 70A to 70C are disposed below the terahertz elements 20A to 20C.

As shown in FIG. 9, each of the separate antenna bases 70A to 70C includes a base main surface 71 and a base back surface 72 that intersect the z-direction. The base main surface 71 and the base back surface 72 intersect the z-direction. In the present embodiment, the base main surface 71 and the base back surface 72 are orthogonal to the z-direction. The base main surface 71 and the base back surface 72 are, for example, rectangular (e.g., square). When the separate antenna bases 70A to 70C are combined, the base main surfaces 71 and the base back surfaces 72 of the separate antenna bases 70A to 70C define the base main surface 71T and the base back surface 72T of the antenna base 70. In the present embodiment, the base main surface 71 and the base back surface 72 are, for example, identical in shape. However, the base main surface 71 and the base back surface 72 may have different shapes.

As shown in FIG. 10, each of the separate antenna bases 70A to 70C includes a first base side surface 73, a second base side surface 74, a third base side surface 75, and a fourth base side surface 76. The base side surfaces 73 to 76 are surfaces of the terahertz device 10 (the antenna base 70) facing sideward. The base side surfaces 73 to 76 are disposed in directions orthogonal to the opposing direction of the base main surface 71 and the base back surface 72. The base side surfaces 73 to 76 join the base main surface 71 and the base back surface 72 (refer to FIG. 9). The base side surfaces 73 to 76 of the separate antenna bases 70A to 70C are specified in accordance with the base side surfaces 73T to 76T of the antenna base 70 when the separate antenna bases 70A to 70C are combined. More specifically, although the separate antenna base 70A and the separate antenna base 70C are identical in shape, the base side surfaces 73 and 74 are located at inverse positions, and the base side surfaces 75 and 76 are located at inverse positions.

The first base side surface 73 and the second base side surface 74 of the separate antenna bases 70A to 70C are opposite end surfaces of the separate antenna bases 70A to 70C in the x-direction. The first base side surface 73 and the second base side surface 74 intersect the x-direction. In the present embodiment, the first base side surface 73 and the second base side surface 74 are orthogonal to the x-direction. The first base side surfaces 73 and the second base side surfaces 74 of the separate antenna bases 70A to 70C define the first base side surface 73T and the second base side surface 74T of the antenna base 70.

The third base side surface 75 and the fourth base side surface 76 of the separate antenna bases 70A to 70C are opposite end surfaces of the separate antenna bases 70A to 70C in the y-direction. The third base side surface 75 and the fourth base side surface 76 intersect the y-direction. In the present embodiment, the third base side surface 75 and the fourth base side surface 76 are orthogonal to the y-direction.

As viewed in the z-direction, each of the separate antenna bases 70A to 70C is rectangular and has a longitudinal direction and a lateral direction. Each of the separate antenna bases 70A to 70C is arranged so that the longitudinal direction extends in the x-direction and the lateral direction extends in the y-direction. In the present embodiment, the separate antenna bases 70A to 70C are equal in dimension in the x-direction. The dimension of the separate antenna base 70B in the y-direction is less than the dimension of each of the separate antenna bases 70A and 70B in the y-direction.

In the present embodiment, the separate antenna bases 70A to 70C are arranged so that the fourth base side surface 76 of the separate antenna base 70A faces the third base side surface 75 of the separate antenna base 70B and the fourth base side surface 76 of the separate antenna base 70B faces the third base side surface 75 of the separate antenna base 70C in the y-direction. That is, the third base side surface 75 of the separate antenna base 70A and the fourth base side surface 76 of the separate antenna base 70C define opposite end surfaces of the antenna base 70 in the y-direction. In other words, the third base side surface 75 of the separate antenna base 70A defines the third base side surface 75T of the antenna base 70, and the fourth base side surface 76 of the separate antenna base 70C defines the fourth base side surface 76T of the antenna base 70. In the present embodiment, the separate antenna bases 70A and 70B are fixed by, for example, adhesive, and the separate antenna bases 70B and 70C are fixed by, for example, adhesive. That is, the fourth base side surface 76 of the separate antenna base 70A and the third base side surface 75 of the separate antenna base 70B are joined by the adhesive, and the fourth base side surface 76 of the separate antenna base 70B and the third base side surface 75 of the separate antenna base 70C are joined by the adhesive.

As shown in FIG. 9, the antenna base 70 includes antenna recesses 80. In the present embodiment, the separate antenna base 70A includes an antenna recess 80A. The separate antenna base 70B includes an antenna recess 80B. The separate antenna base 70C includes an antenna recess 80C. That is, the antenna base 70 includes one antenna recess 80 for each separate antenna base. As shown in FIG. 9, the antenna recesses 80A and 80C differ from the antenna recess 80B in shape. In the description hereafter, when the description is common to the antenna recesses 80A, 80B, and 80C, that is, when there is no need to distinguish between the antenna recesses 80A, 80B, and 80C, the antenna recesses 80A, 80B, and 80C will be referred to as antenna recesses 80.

As shown in FIGS. 4 and 5, the antenna recess 80 is recessed from the base main surface 71T in a direction toward the base back surface 72T, that is, downward. In other words, the antenna recess 80 is recessed from the base main surface 71T in a direction away from the dielectric 50 (or the dielectric main surface 51) or in a direction away from the terahertz element 20. As shown in FIGS. 4 and 5, in the present embodiment, in a cross-sectional view of the antenna base 70 cut along a plane extending in the x-direction and the z-direction, the antenna recess 80 is curved to project toward the device back surface 12. The antenna recess 80 is open upward.

Figure 11:
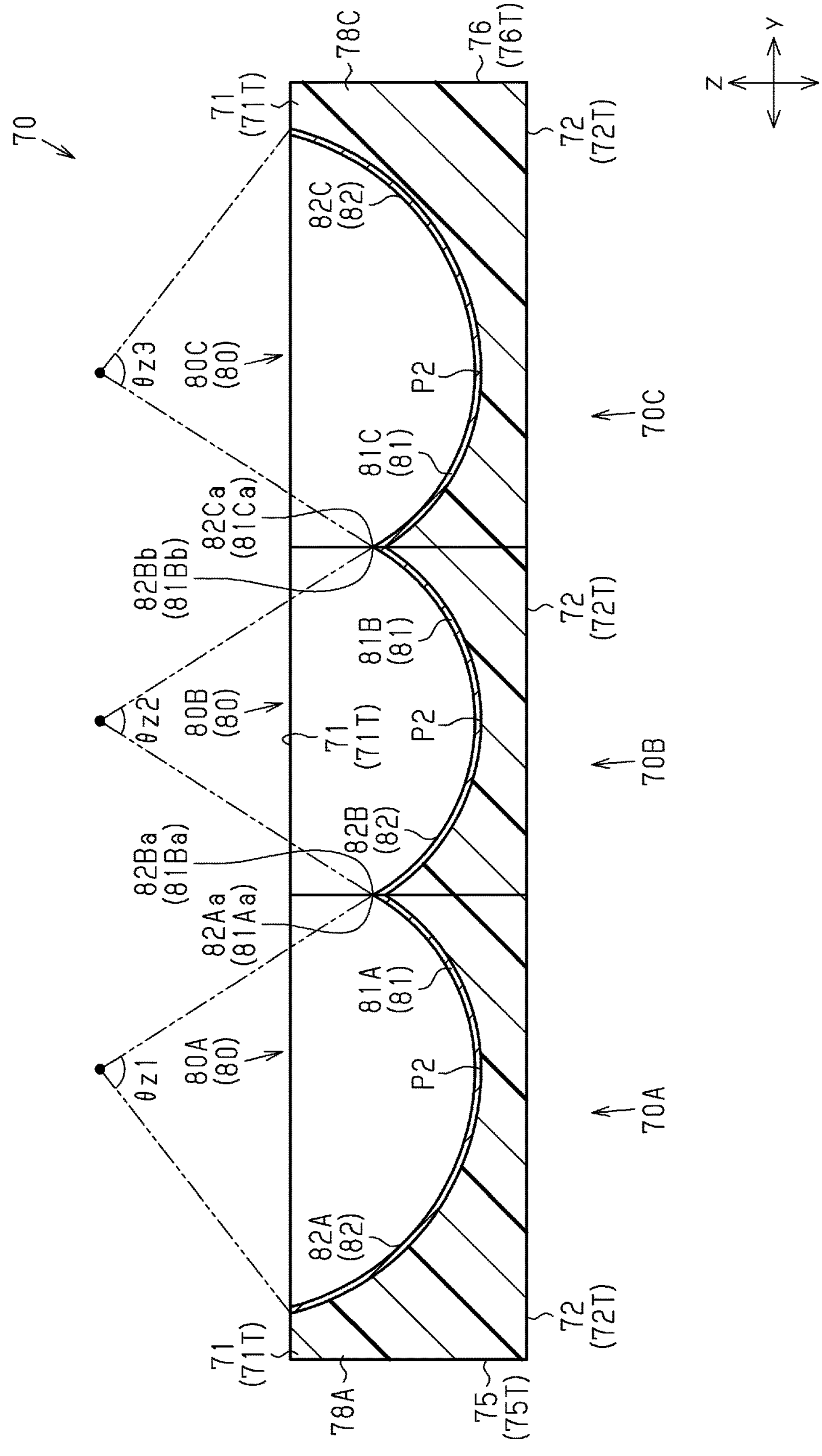
FIG. 11 is a cross-sectional view of the antenna base shown in FIG. 10 taken along line 11-11.

As shown in FIGS. 4 and 5, the antenna recess 80 includes an antenna surface 81 opposed to the terahertz element 20 through the dielectric 50 and the gas cavity 92. In the present embodiment, as shown in FIG. 11, the antenna recess 80A includes an antenna surface 81A, the antenna recess 80B includes an antenna surface 81B, and the antenna recess 80C includes an antenna surface 81C. The antenna surfaces 81A to 81C are formed in conformance with the shape of an antenna. Specifically, as shown in FIG. 12, the antenna surface 81A is curved to be recessed in a direction away from the terahertz element 20A, the antenna surface 81B is curved to be recessed in a direction away from the terahertz element 20B, and the antenna surface 81C is curved to be recessed in a direction away from the terahertz element 20C. As shown in FIG. 9, each of the antenna surfaces 81A to 81C is curved and bowl-shaped. In an example, each of the antenna surfaces 81A to 81C is curved to form a portion of the shape of a parabolic antenna. In the description hereafter, when the description is common to the antenna surfaces 81A to 81C, that is, when there is no need to distinguish between the antenna surfaces 81A to 81C, the antenna surfaces 81A to 81C will be referred to as an antenna surface 81.

As shown in FIG. 10, as viewed from above, each of the antenna recesses 80A to 80C has an opening having the form of a circle that is partially cut away. That is, as viewed from above, each of the antenna surfaces 81A to 81C has an opening having the form of a circle that is partially cut away. More specifically, in the present embodiment, the opening of each of the antenna surfaces 81A to 81C has the form of a circle that is cut away at one or both of the opposite open ends of the antenna surfaces 81A to 81C in an arrangement direction of the antenna surfaces 81A to 81C.

As viewed from above, the opening of the antenna surface 81A is cut away at an open end 81Aa, which is one of the opposite ends of the opening of the antenna surface 81A in the y-direction located closer to the fourth base side surface 76. As viewed from above, the open end 81Aa and the fourth base side surface 76 of the separate antenna base 70A are formed in the same position. As viewed from above, the open end 81Aa linearly extends in the x-direction.

As viewed from above, the antenna surface 81B includes opposite open ends 81Ba and 81Bb in the y-direction, and the opening of the antenna surface 81B is cut away at the opposite open ends 81Ba and 81Bb. The open end 81Ba is one of the opposite ends of the opening of the antenna surface 81B in the y-direction located closer to the third base side surface 75. The open end 81Bb is one of the opposite ends of the opening of the antenna surface 81B in the y-direction located closer to the fourth base side surface 76. As viewed from above, the open end 81Ba and the third base side surface 75 of the separate antenna base 70B are formed in the same position, and the open end 81Bb and the fourth base side surface 76 of the separate antenna base 70B are formed in the same position. As viewed from above, the open ends 81Ba and 81Bb linearly extend in the x-direction.

As viewed from above, the opening of the antenna surface 81C is cut away at an open end 81Ca, which is one of the opposite ends of the opening of the antenna surface 81C in the y-direction located closer to the third base side surface 75. As viewed from above, the open end 81Ca and the third base side surface 75 of the separate antenna base 70C are formed in the same position. As viewed from above, the open end 81Ca linearly extends in the x-direction.

As shown in FIG. 10, as viewed from above, the antenna surface 81A, the antenna surface 81B, and the antenna surface 81C have the same diameter.

The open end 81Aa of the antenna surface 81A is joined to the open end 81Ba of the antenna surface 81B. The open end 81Bb of the antenna surface 81B is joined to the open end 81Ca of the antenna surface 81C. In the present embodiment, the open end 81Aa is equal in length in the x-direction to the open end 81Ba. The open end 81Bb is equal in length in the x-direction to the open end 81Ca. The open end 81Ba is equal in length in the x-direction to the open end 81Bb. Thus, in the present embodiment, the open end 81Aa is equal in length in the x-direction to the open end 81Ca.

As shown in FIG. 11, the open end 81Aa of the antenna surface 81A is located at a position lower than the base main surface 71 of the separate antenna base 70A (the base main surface 71T of the antenna base 70). The open end 81Aa of the antenna surface 81A is aligned with the open end 81Ba of the antenna surface 81B in the z-direction. The open end 81Ca of the antenna surface 81C is located at a position lower than the base main surface 71 of the separate antenna base 70C (the base main surface 71T of the antenna base 70). The open end 81Ca of the antenna surface 81C is aligned with the open end 81Bb of the antenna surface 81B in the z-direction. The open end 81Ba and the open end 81Bb of the antenna surface 81B are aligned in the z-direction. Thus, the open end 81Aa of the antenna surface 81A is aligned with the open end 81Ca of the antenna surface 81C in the z-direction.

The reflective film 82 will now be described.

The reflective film 82 is configured to reflect electromagnetic waves propagated to the antenna recess 80 toward the terahertz element 20 corresponding to the antenna recess 80.

As shown in FIG. 11, the reflective film 82 is formed on the antenna surface 81. The reflective film 82 is formed of a material that reflects electromagnetic waves, for example, a metal such as copper (Cu) or an alloy. The reflective film 82 may have a monolayer structure or a multilayer structure. In the present embodiment, the reflective film 82 is formed on the entire antenna surface 81. The reflective film 82 is not formed on the base main surface 71T.

In the present embodiment, the reflective film 82 includes a reflective film 82A formed on the antenna surface 81A, a reflective film 82B formed on the antenna surface 81B, and a reflective film 82C formed on the antenna surface 81C. In the present embodiment, the reflective films 82A to 82C are integrally formed to be a single component. In the description hereafter, when the description is common to the reflective films 82A to 82C, that is, when there is no need to distinguish between the reflective films 82A to 82C, the reflective films 82A to 82C will be referred to as a reflective film 82.

In the present embodiment, the reflective film 82 is formed on the antenna surface 81. Thus, the reflective film 82 is substantially identical in shape to the antenna surface 81. More specifically, the reflective film 82A is substantially identical in shape to the antenna surface 81A, the reflective film 82B is substantially identical in shape to the antenna surface 81B, and the reflective film 82C is substantially identical in shape to the antenna surface 81C. In other words, each of the reflective films 82A to 82C is a parabolic reflector and is curved to be bowl-shaped. In the present embodiment, the reflective film 82A includes a surface that is in contact with the antenna surface 81A and a surface opposite the contact surface, that is, a surface of the reflective film 82A facing toward the terahertz element 20A, which corresponds to "the first reflective surface". The reflective film 82B includes a surface that is in contact with the antenna surface 81B and a surface opposite the contact surface, that is, a surface of the reflective film 82B facing toward the terahertz element 20B, which corresponds to "the second reflective surface". The reflective film 82C includes a surface that is in contact with the antenna surface 81C and a surface opposite the contact surface, that is, a surface of the reflective film 82C facing toward the terahertz element 20C, which corresponds to "the third reflective surface".

The reflective films 82A to 82C are curved to project toward the device back surface 12 (the base back surface 72 of the separate antenna bases 70A to 70C). The reflective films 82A to 82C are open upward in one direction (in the present embodiment, upward).

As shown in FIG. 12, the reflective film 82 and the dielectric 50 are opposed to each other in the z-direction. In other words, the reflective film 82 is disposed to be opposed to the dielectric 50. Electromagnetic waves reflected by the reflective film 82 are emitted toward the reception point P1. Specifically, electromagnetic waves reflected by the reflective film 82A are emitted toward the reception point P1 of the terahertz element 20A. Electromagnetic waves reflected by the reflective film 82B are emitted toward the reception point P1 of the terahertz element 20B. Electromagnetic waves reflected by the reflective film 82C are emitted toward the reception point P1 of the terahertz element 20C.

The reflective film 82 is not disposed at the side of the element back surface 22 but at the side of the element main surface 21, where the reception point P1 exists, and is opposed to the terahertz element 20 (in the present embodiment, the element main surface 21). In other words, the terahertz element 20 is disposed in the dielectric 50 such that the element main surface 21 is opposed to the reflective film 82. With regard to the positional relationship of the pads 33*a* and 34*a* with the reflective film 82, the pads 33*a* and 34*a* face toward the reflective film 82.

The reflective film 82 is disposed, for example, so that the focal point of the reflective film 82 is the reception point P1. More specifically, as shown in FIG. 12, the terahertz elements 20 are arranged corresponding to the antenna surfaces 81A to 81C (the reflective films 82A to 82C). The terahertz element 20A is disposed corresponding to the antenna surface 81A (the reflective film 82A). The terahertz element 20B is disposed corresponding to the antenna surface 81B (the reflective film 82B). The terahertz element 20C is disposed corresponding to the antenna surface 81C (the reflective film 82C). In this case, the reflective film 82A is disposed so that the focal point of the reflective film 82A is the reception point P1 of the terahertz element 20A. The reflective film 82B is disposed so that the focus of the reflective film 82B is the reception point P1 of the terahertz element 20B. The reflective film 82C is disposed so that the focal point of the reflective film 82C is the reception point P1 of the terahertz element 20C. In the present embodiment, as viewed in the z-direction, the reflective film 82A has a center point P2 conforming to the reception point P1 of the terahertz element 20A, the reflective film 82B has a center point P2 conforming to the reception point P1 of the terahertz element 20B, and the reflective film 82C has a center point P2 conforming to the reception point P1 of the terahertz element 20C. In the present embodiment, the reception points P1 of the terahertz elements 20A to 20C are aligned with each other in the z-direction. Therefore, the center points P2 of the reflective films 82A to 82C are aligned with each other in the z-direction.

It is preferred that the reflective film 82 is curved so that the condition $Z=(1/(4z1))X^2$ is satisfied when a specified distance z1 represents the perpendicular distance from the reception point P1 to the reflective film 82, Z represents the coordinate of the reflective film 82 in the z-direction, and X represents the position of the reflective film 82 in the x-direction. At the center point P2, X is 0. The same applies to the position of the reflective film 82 in the y-direction. However, the curvature of the reflective film 82 is not limited to this mode and may be changed in any manner.

The z-direction refers to the opposing direction of the reflective film 82 and the terahertz element 20 (the element main surface 21). The z-direction also refers to the opposing direction of the center point P2 of the reflective film 82 and the reception point P1. The specified distance z1 refers to the distance between the reception point P1 and a position of the reflective film 82 corresponding to the center point P2.

The reflective film 82 may be disposed at a position corresponding to the frequency of electromagnetic waves received by the terahertz element 20 so that the electromagnetic waves resonate. Specifically, the specified distance z1 is set to satisfy the resonance condition of the electromagnetic waves received by the terahertz element 20.

As shown in FIG. 10, as viewed from above, the reflective films 82A to 82C include openings that are identical in shape to the openings of the antenna surfaces 81A to 81C. That is, as viewed from above, the opening of each of the reflective films 82A to 82C has the form of a circle that is cut away at one or both of the opposite open ends of the reflective films 82A to 82C in an arrangement direction of the reflective films 82A to 82C.

As viewed from above, the opening of the reflective film 82A is cut away at an open end 82Aa, which overlaps the open end 81Aa of the antenna surface 81A. As viewed from above, the open end 82Aa linearly extends in the x-direction.

As viewed from above, the opening of the reflective film 82B is cut away at open ends 82Ba and 82Bb, which respectively overlap the open ends 81Ba and 81Bb of the antenna surface 81B. As viewed from above, the open ends 82Ba and 82Bb linearly extend in the x-direction.

As viewed from above, the opening of the reflective film 82C is cut away at an open end 82Ca, which overlaps the open end 81Ca of the antenna surface 81C. As viewed from above, the open end 82Ca linearly extends in the x-direction.

In the same manner as the antenna surfaces 81A to 81C, as viewed from above, the reflective film 82A, the reflective film 82B, and the reflective film 82C have the same diameter.

The open end 82Aa of the reflective film 82A is joined to the open end 82Ba of the reflective film 82B. The open end 82Bb of the reflective film 82B is joined to the open end 82Ca of the reflective film 82C. In the present embodiment, the open end 82Aa is equal in length in the x-direction to the open end 82Ba. The open end 82Ba is equal in length in the x-direction to the open end 82Ca. The open end 82Ba is equal in length in the x-direction to the open end 82Bb. Thus, in the present embodiment, the open end 81Aa is equal in length in the x-direction to the open end 82Ca.

As shown in FIG. 11, the open end 82Aa of the reflective film 82A is located at a position lower than the base main surface 71 of the separate antenna base 70A (the base main surface 71T of the antenna base 70). The position of the open end 82Aa of the reflective film 82A in the z-direction conforms to the position of the open end 82Ba of the reflective film 82B in the z-direction. The open end 82Ca of the reflective film 82C is located at a position lower than the base main surface 71 of the separate antenna base 70C (the base main surface 71T of the antenna base 70). The open end 82Ca of the reflective film 82C is aligned with the open end 82Bb of the reflective film 82B in the z-direction. The open end 82Ba of the reflective film 82B is aligned with the open end 82Bb in the z-direction. Thus, the open end 82Aa of the reflective film 82A is aligned with the open end 82Ca of the reflective film 82C in the z-direction.

As shown in FIG. 10, as viewed from above, the reflective film 82A is formed so that the center point P2 is located at a position differing from the middle of the separate antenna base 70A. In the present embodiment, as viewed from above, the center point P2 of the reflective film 82A is the center of the reflective film 82A having the form of a circle that is partially cut away and coincides with the center point of the antenna surface 81A. More specifically, as viewed from above, the reflective film 82A is formed so that the center point P2 is located in the middle of the separate antenna base 70A in the x-direction. As viewed from above, the reflective film 82A is formed so that the center point P2 is located closer to the fourth base side surface 76 of the separate antenna base 70A in the y-direction. In other words, as viewed from above, the center point P2 of the reflective film 82A is located closer to the separate antenna base 70B than the middle of the separate antenna base 70A in the y-direction.

As viewed from above, the center point P2 of the reflective film 82A coincides with the center point of the antenna surface 81A, and the reflective film 82A is substantially identical in shape to the antenna surface 81A. Thus, in the same manner as the reflective film 82A, as viewed from above, the antenna surface 81A is formed so that the center point of the antenna surface 81A is located at a position differing from the middle of the separate antenna base 70A.

As viewed from above, the reflective film 82A includes an arc-shaped circumference including a circumferential part that connects arc endpoints in a first direction, which is a direction in which the reflective films 82A to 82C are arranged (in the present embodiment, the y-direction). The circumferential part is arc-shaped and has a central angle of less than 180°. The first direction intersects the height-wise direction of the terahertz device 10 (the z-direction). In the present embodiment, the first direction is orthogonal to the height-wise direction of the terahertz device 10. In the present embodiment, the arc-shaped circumference of the reflective film 82A includes a circumferential part that connects an arc endpoint in the y-direction located close to the third base side surface 75 to one of the opposite endpoints of the open end 82Aa in the x-direction located closer to the first base side surface 73. The circumferential part is arc-shaped and has a central angle θa1 of less than 180°. In the present embodiment, the arc-shaped circumference of the reflective film 82A also includes a circumferential part that connects the arc endpoint in the y-direction located close to the third base side surface 75 to one of the opposite endpoints of the open end 82Aa in the x-direction located closer to the second base side surface 74. The circumferential part is arc-shaped and has a central angle θa2 of less than 180°. The central angle θa1 is equal to the central angle θa2. As viewed from above, the reflective film 82A is substantially identical in shape to the antenna surface 81A. Thus, in the same manner as the reflective film 82A, the antenna surface 81A includes an arc-shaped circumference including a circumferential part that connects arc endpoints in the first direction, which is a direction in which the antenna surfaces 81A to 81C are arranged. The circumferential part is arc-shaped and has a central angle of less than 180°.

As viewed from above, the reflective film 82A is smaller in the first direction, that is, the direction in which the reflective films 82A to 82C are arranged, than in a second direction that differs from the first direction. More specifically, as viewed from above, the dimension of the reflective film 82A in the first direction (in the present embodiment, the y-direction) extending through the center point P2 is less than the dimension of the reflective film 82A in the second direction extending through the center point P2. The second direction (in the present embodiment, the x-direction) is, for example, orthogonal to the first direction as viewed from above. In the present embodiment, as viewed from above, a length LAY of the reflective film 82A in the y-direction extending through the center point P2 is less than a length LAX of the reflective film 82A in the y-direction extending through the center point P2. The length LAX of the reflective film 82A extending through the center point P2 refers to the diameter of the reflective film 82A as viewed from above.

As viewed from above, the reflective film 82A is substantially identical in shape to the antenna surface 81A. Thus, the antenna surface 81A has the same dimensional relationship of the x-direction and the y-direction as the reflective film 82A, which is described above. More specifically, as viewed from above, the dimension of the antenna surface 81A in the first direction, that is, the direction in which the antenna surfaces 81A to 81C are arranged, extending through the center point of the antenna surface 81A is less than the dimension of the antenna surface 81A in a second direction that differs from the first direction extending through the center point of the antenna surface 81A. The second direction (in the present embodiment, the x-direction) is, for example, orthogonal to the first direction as viewed from above. In this case, the dimension of the antenna surface 81A in the second direction extending through the center point of the antenna surface 81A refers to the diameter of the antenna surface 81A as viewed from above.

As shown in FIG. 11, in a cross-sectional view of the separate antenna base 70A cut along a plane extending in the y-direction and the z-direction through the center point P2 of the reflective film 82A, the reflective film 82A includes an arc-shaped part that connects the opposite endpoints and has a central angle θz1 of less than 180°. In the same manner, in a cross-sectional view of the separate antenna base 70A cut along a plane extending in the y-direction and the z-direction through the center point of the antenna surface 81A, the antenna surface 81A includes an arc-shaped part that connects the opposite endpoints and has a central angle of less than 180°.

As shown in FIG. 10, as viewed from above, the reflective film 82B is formed so that the center point P2 is aligned with the middle of the separate antenna base 70B. In the present embodiment, as viewed from above, the center point P2 of the reflective film 82B is the center of the reflective film 82B having the form of a circle that is partially cut away and coincides with the center point of the antenna surface 81B.

As viewed from above, the center point P2 of the reflective film 82B coincides with the center point of the antenna surface 81B, and the reflective film 82B is substantially identical in shape to the antenna surface 81B. Thus, in the same manner as the reflective film 82B, as viewed from above, the antenna surface 81B is formed so that the center point of the antenna surface 81B is aligned with the middle of the separate antenna base 70B.

As viewed from above, the reflective film 82B includes an arc-shaped circumference including a circumferential part that connects arc endpoints in the first direction, that is, the direction in which the reflective films 82A to 82C are arranged (in the present embodiment, the y-direction). The circumferential part is arc-shaped and has a central angle of less than 180°. In the present embodiment, the arc-shaped circumference of the reflective film 82B includes a circumferential part that connects one of the opposite endpoints of the open end 82Ba in the x-direction located closer to the first base side surface 73 to one of the opposite endpoints of the open end 82Bb in the x-direction located closer to the first base side surface 73. The circumferential part is arc-shaped and has a central angle θb1 of less than 180°. In the present embodiment, the arc-shaped circumference of the reflective film 82B includes a circumferential part that connects one of the opposite endpoints of the open end 82Ba in the x-direction located closer to the second base side surface 74 to one of the opposite endpoints of the open end 82Bb in the x-direction located closer to the second base side surface 74. The circumferential part is arc-shaped and has a central angle θb2 of less than 180°. The central angles θb1 and θb2 are equal to each other. The central angles θb1 and θb2 are smaller than the central angles θa1 and θa2. As viewed from above, the reflective film 82B is substantially identical in shape to the antenna surface 81B. Thus, in the same manner as the reflective film 82B, the antenna surface 81A includes an arc-shaped circumference including a circumferential part that connects arc endpoints in the first direction, which is a direction in which the antenna surfaces 81A to 81C are arranged (in the present embodiment, the y-direction). The circumferential part is arc-shaped and has a central angle of less than 180°.

As viewed from above, the reflective film 82B is smaller in the first direction, that is, the direction in which the reflective films 82A to 82C are arranged, than in a second direction that differs from the first direction. More specifically, as viewed from above, the dimension of the reflective film 82B in the first direction (in the present embodiment, the y-direction) extending through the center point P2 is less than the dimension of the reflective film 82B in the second direction extending through the center point P2. The second direction (in the present embodiment, the x-direction) is, for example, orthogonal to the first direction as viewed from above. In the present embodiment, as viewed from above, a length LBY of the reflective film 82B in the y-direction extending through the center point P2 is less than a length LBX of the reflective film 82B in the y-direction extending through the center point P2. The length LBX of the reflective film 82B extending through the center point P2 refers to the diameter of the reflective film 82A as viewed from above. That is, as viewed from above, the length LBX of the reflective film 82B extending through the center point P2 is equal to the length LAX of the reflective film 82A extending through the center point P2.

As viewed from above, the reflective film 82B is substantially identical in shape to the antenna surface 81B. Thus, the antenna surface 81B has the same dimensional relationship of the x-direction and the y-direction as the reflective film 82B, which is described above. More specifically, as viewed from above, the dimension of the antenna surface 81B in the first direction, that is, the direction in which the antenna surfaces 81A to 81C are arranged (in the present embodiment, the y-direction), extending through the center point of the antenna surface 81B is less than the dimension of the antenna surface 81B in a second direction that differs from the first direction extending through the center point of the antenna surface 81B. The second direction (in the present embodiment, the x-direction) is, for example, orthogonal to the first direction as viewed from above. In this case, the dimension of the antenna surface 81B in the second direction extending through the center point of the antenna surface 81B refers to the diameter of the antenna surface 81B as viewed from above. That is, as viewed from above, the dimension of the antenna surface 81B in the second direction extending through the center point of the antenna surface 81B is equal to the dimension of the antenna surface 81A in the second direction extending through the center point of the antenna surface 81A.

As shown in FIG. 11, in a cross-sectional view of the separate antenna base 70B cut along a plane extending in the y-direction and the z-direction through the center point P2 of the reflective film 82B, the reflective film 82B includes an arc-shaped part that connects the opposite endpoints and has a central angle θz2 of less than 180°. In the present embodiment, the central angle θz2 is smaller than the central angle θz1 of the reflective film 82A. In the same manner, in a cross-sectional view of the separate antenna base 70B cut along a plane extending in the y-direction and the z-direction through the center point of the antenna surface 81B, the antenna surface 81B includes an arc-shaped part that connects the opposite endpoints and has a central angle of less than 180°.

As shown in FIG. 10, as viewed from above, the reflective film 82C is formed so that the center point P2 is located at a position differing from the middle of the separate antenna base 70C. In the present embodiment, as viewed from above, the center point P2 of the reflective film 82C is the center of the reflective film 82C having the form of a circle that is partially cut away and coincides with the center point of the antenna surface 81C. More specifically, as viewed from above, the reflective film 82C is formed so that the center point P2 is located in the middle of the separate antenna base 70C in the x-direction. As viewed from above, the reflective film 82C is formed so that the center point P2 is located closer to the third base side surface 75 of the separate antenna base 70C in the y-direction. In other words, as viewed from above, the center point P2 of the reflective film 82C is located closer to the separate antenna base 70B than the middle of the separate antenna base 70C in the y-direction.

As viewed from above, the center point P2 of the reflective film 82C coincides with the center point of the antenna surface 81C, and the reflective film 82C is substantially identical in shape to the antenna surface 81C. Thus, in the same manner as the reflective film 82C, as viewed from above, the antenna surface 81C is formed so that the center point of the antenna surface 81C is located at a position differing from the middle of the separate antenna base 70C.

As viewed from above, the reflective film 82C includes an arc-shaped circumference including a circumferential part that connects arc endpoints in the first direction, that is, the direction in which the reflective films 82A to 82C are arranged (in the present embodiment, the y-direction). The circumferential part is arc-shaped and has a central angle of less than 180°. In the present embodiment, the arc-shaped circumference of the reflective film 82C includes a circumferential part that connects an arc endpoint in the y-direction located close to the fourth base side surface 76 to one of the opposite endpoints of the open end 82Ca in the x-direction located closer to the first base side surface 73. The circumferential part is arc-shaped and has a central angle θc1 of less than 180°. In the present embodiment, the arc-shaped circumference of the reflective film 82C also includes a circumferential part that connects the arc endpoint in the y-direction located close to the fourth base side surface 76 to one of the opposite endpoints of the open end 82Ca in the x-direction located closer to the second base side surface 74. The circumferential part is arc-shaped and has a central angle θc2 of less than 180°. The central angle θc1 is equal to the central angle θc2. In the present embodiment, the central angles θc1 and θc2 are equal to the central angles Gal and θa2 of the reflective film 82A. As viewed from above, the reflective film 82C is substantially identical in shape to the antenna surface 81C. Thus, in the same manner as the reflective film 82C, the antenna surface 81C includes an arc-shaped circumference including a circumferential part that connects arc endpoints in the first direction, which is a direction in which the antenna surfaces 81A to 81C are arranged (in the present embodiment, the y-direction). The circumferential part is arc-shaped and has a central angle of less than 180°.

As viewed from above, the dimension of the reflective film 82C in the first direction, that is, the direction in which the reflective films 82A to 82C are arranged, is smaller than the dimension of the reflective film 82B in a second direction that differs from the first direction. More specifically, as viewed from above, the dimension of the reflective film 82C in the first direction extending through the center point P2 is less than the dimension of the reflective film 82C in the second direction extending through the center point P2. The second direction (in the present embodiment, the x-direction) is, for example, orthogonal to the first direction as viewed from above. In the present embodiment, as viewed from above, a length LCY of the reflective film 82C in the y-direction extending through the center point P2 is less than a length LCX of the reflective film 82C in the x-direction extending through the center point P2. The length LCX of the reflective film 82C extending through the center point P2 refers to the diameter of the reflective film 82C as viewed from above. That is, the length LCX of the reflective film 82C extending through the center point P2 is equal to the length LAX of the reflective film 82A extending through the center point P2. The length LCY of the reflective film 82C is greater than the length LBY of the reflective film 82B. Thus, the length LBY of the reflective film 82B is less than each of the length LAY of the reflective film 82A and the length LCY of the reflective film 82B.

As described above, the lengths LAY to LCY of the reflective films 82A to 82C are less than the lengths LAX to LCX of the reflective films 82A to 82C. Accordingly, the reflective films 82A to 82C are smaller in the first direction than in the second direction.

As viewed from above, the reflective film 82C is substantially identical in shape to the antenna surface 81C. Thus, the antenna surface 81C has the same dimensional relationship of the x-direction and the y-direction as the reflective film 82C, which is described above. More specifically, as viewed from above, the dimension of the antenna surface 81C in the first direction, that is, the direction in which the antenna surfaces 81A to 81C are arranged (in the present embodiment, the y-direction), extending through the center point of the antenna surface 81C is less than the dimension of the antenna surface 81C in a second direction that differs from the first direction extending through the center point of the antenna surface 81C. The second direction (in the present embodiment, the x-direction) is, for example, orthogonal to the first direction as viewed from above. In this case, the dimension of the antenna surface 81C in the second direction extending through the center point of the antenna surface 81C refers to the diameter of the antenna surface 81C as viewed from above. Thus, the dimension of the antenna surface 81C in the second direction extending through the center point of the antenna surface 81C is equal to the dimension of the antenna surface 81A in the second direction extending through the center point of the antenna surface 81A.

As shown in FIG. 11, in a cross-sectional view of the separate antenna base 70C cut along a plane extending in the y-direction and the z-direction through the center point P2 of the reflective film 82C, the reflective film 82C includes an arc-shaped part that connects the opposite endpoints and has a central angle θz3 of less than 180°. In the present embodiment, the central angle θz3 is equal to the central angle θz1 of the separate antenna base 70A. In the same manner, in a cross-sectional view of the separate antenna base 70C cut along a plane extending in the y-direction and the z-direction through the center point of the antenna surface 81C, the antenna surface 81C includes an arc-shaped part that connects the opposite endpoints and has a central angle of less than 180°.

As shown in FIGS. 3 and 12, the reflective film 82A is larger than the terahertz element 20A as viewed in the z-direction. Specifically, the reflective film 82A is greater in the dimensions in the x-direction and the y-direction than the terahertz element 20A. The length LAX of the reflective film 82A is set to be greater than the dimension of the terahertz element 20A in the x-direction. The length LAY of the reflective film 82A is set to be greater than the dimension of the terahertz element 20A in the y-direction.

The reflective film 82B is larger than the terahertz element 20B as viewed in the z-direction. Specifically, the reflective film 82B is greater in the dimensions in the x-direction and the y-direction than the terahertz element 20B. The length LBX of the reflective film 82B is set to be greater than the dimension of the terahertz element 20B in the x-direction. The length LBY of the reflective film 82B is set to be greater than the dimension of the terahertz element 20B in the y-direction.

The reflective film 82C is larger than the terahertz element 20C as viewed in the z-direction. Specifically, the reflective film 82C is greater in the dimensions in the x-direction and the y-direction than the terahertz element 20C. The length LCX of the reflective film 82C is set to be greater than the dimension of the terahertz element 20C in the x-direction. The length LCY of the reflective film 82C is set to be greater than the dimension of the terahertz element 20C in the y-direction.

As shown in FIG. 10, as viewed from above, the separate antenna base 70A includes a peripheral wall 78A extending around the opening of the antenna recess 80A except the cutaway portion that is in contact with the antenna recess 80B. As viewed from above, the separate antenna base 70B includes a peripheral wall 78B extending around the opening of the antenna recess 80B except the cutaway portions that are in contact with the antenna recesses 80A and 80C. As viewed from above, the separate antenna base 70C includes a peripheral wall 78C extending around the opening of the antenna recess 80C except the cutaway portion that is in contact with the antenna recess 80B.

Thus, as shown in FIG. 3, an inter-element distance DE1 between the reception point P1 of the terahertz element 20A and the reception point P1 of the terahertz element 20B in the y-direction is less than the lengths LAX and LBX, which are the diameters of the antenna surface 81A and the antenna surface 81B in the x-direction. An inter-element distance DE2 between the reception point P1 of the terahertz element 20B and the reception point P1 of the terahertz element 20C in the y-direction is less than the lengths LBX and LCX, which are diameters of the antenna surface 81B and the antenna surface 81C in the x-direction.

As shown in FIGS. 4, 5, and 12, in the present embodiment, the antenna base 70 and the dielectric 50 are formed separately and coupled in the z-direction. Specifically, the terahertz device 10 includes an adhesive layer 91 as a fixing portion that fixes the dielectric 50 to the antenna base 70. The adhesive layer 91 is formed of, for example, an insulative material and includes, for example, a resin adhesive agent. The adhesive layer 91 is disposed between the base main surface 71T and the dielectric main surface 51 along the circumference of the opening of the antenna recess 80A, the circumference of the opening of the antenna recess 80B, and the circumference of the opening of the antenna recess 80C.

The adhesive layer 91 adheres the dielectric 50 and the antenna base 70. That is, the dielectric 50 and the antenna base 70 are coupled with the adhesive layer 91 in the z-direction. This unitizes the dielectric 50 and the antenna base 70. The adhesive layer 91 limits misalignment of the dielectric 50 with the antenna base 70 in a direction orthogonal to the z-direction, thereby limiting positional misalignment of the terahertz elements 20A, 20B, and 20C in the dielectric 50 relative to the reflective films 82A, 82B, and 82C of the antenna base 70.

In particular, in the present embodiment, the inner circumferential end of the adhesive layer 91 is flush with the surface of the reflective film 82 and is formed over the base main surface 71T and the end of the reflective film 82. That is, the adhesive layer 91 is configured not to extend inward (in other words, toward the terahertz element 20) beyond the reflective film 82.

The inner circumferential end of the adhesive layer 91 refers to an end of the adhesive layer 91 located close to the terahertz element 20. More specifically, the adhesive layer 91 is formed on the base main surface 71 of the separate antenna base 70A and includes an inner circumferential end defining is the end of the adhesive layer 91 located close to the terahertz element 20A. The inner circumferential end of the adhesive layer 91 has the form of, for example, a circle that is partially cut away in conformance with the antenna recess 80A as viewed in the z-direction. The adhesive layer 91 is formed on the base main surface 71 of the separate antenna base 70B and includes an inner circumferential end defining the end of the adhesive layer 91 located close to the terahertz element 20B. The inner circumferential end of the adhesive layer 91 has the form of, for example, a circle that is partially cut away in conformance with the antenna recess 80B as viewed in the z-direction. The adhesive layer 91 is formed on the base main surface 71 of the separate antenna base 70C and includes an inner circumferential end defining the end of the adhesive layer 91 located close to the terahertz element 20C. The inner circumferential end of the adhesive layer 91 has the form of, for example, a circle that is partially cut away in conformance with the antenna recess 80C as viewed in the z-direction. The shape of the inner circumferential ends of the adhesive layer 91 described above may be changed in any manner.

The gas cavity 92 will now be described.

As shown in FIGS. 4, 5, and 12, in the present embodiment, the gas cavity 92 is defined by the dielectric main surface 51 and the antenna surface 81. Specifically, the openings of the antenna recesses 80 are closed by the dielectric main surface 51. Thus, the gas cavity 92 is defined by the dielectric main surface 51 and the antenna surfaces 81, which are the wall surfaces of the antenna recesses 80. More specifically, the gas cavity 92 is defined by the dielectric main surface 51 and the antenna surfaces 81A to 81C. Specifically, the openings of the antenna recesses 80A to 80C are closed by the dielectric main surface 51. In the present embodiment, the adhesive layer 91 is disposed along the circumference of the openings of the antenna recesses 80A to 80C. This hermetically seals the gas cavity 92. That is, the gas cavity 92 is hermetically sealed by the adhesive layer 91. The reflective films 82A to 82C are disposed in the gas cavity 92.

As shown in FIG. 12, the gas cavity 92 includes a gas cavity 92A defined by the antenna recess 80A and the dielectric main surface 51, a gas cavity 92B defined by the antenna recess 80B and the dielectric main surface 51, and a gas cavity 92C defined by the antenna recess 80C and the dielectric main surface 51. In the present embodiment, the gas cavity 92A, the gas cavity 92B, and the gas cavity 92C are connected to each other. More specifically, the gas cavity 92A is connected to the gas cavity 92B through the open end 81Aa of the antenna surface 81A (the open end 82Aa of the reflective film 82A) and the open end 81Ba of the antenna surface 81B (the open end 82Ba of the reflective film 82B). The gas cavity 92B is connected to the gas cavity 92C through the open end 81Bb of the antenna surface 81B (the open end 82Bb of the reflective film 82B) and the open end 81Ca of the antenna surface 81C (the open end 82Ca of the reflective film 82C).

The gas cavities 92A to 92C are semispherical. As viewed in the z-direction, the gas cavity 92A is larger than the terahertz element 20A in a direction orthogonal to the z-direction. As viewed in the z-direction, the gas cavity 92A is greater in dimension in the x-direction than the terahertz element 20A, and the gas cavity 92A is greater in dimension in the y-direction than the terahertz element 20A. As viewed in the z-direction, the gas cavity 92B is larger than the terahertz element 20B in a direction orthogonal to the z-direction. As viewed in the z-direction, the gas cavity 92B is greater in dimension in the x-direction than the terahertz element 20B, and the gas cavity 92B is greater in dimension in the y-direction than the terahertz element 20B. As viewed in the z-direction, the gas cavity 92C is larger than the terahertz element 20C in a direction orthogonal to the z-direction. As viewed in the z-direction, the gas cavity 92C is greater in dimension in the x-direction than the terahertz element 20C, and the gas cavity 92C is greater in dimension in the x-direction than the terahertz element 20C.

Each of the gas cavities 92A to 92C contains gas. The refractive index of the gas in the gas cavities 92A to 92C is referred to as a gas refractive index n3. The gas refractive index n3 is set to be less than the dielectric refractive index n2. That is, each of the gas cavities 92A to 92C contains gas having a lower refractive index than the dielectric refractive index n2. The gas contained in the gas cavities 92A to 92C is, for example, air. In this case, the gas refractive index n3 is approximately 1. The gas contained in the gas cavities 92A to 92C is not limited to air and may be any gas having a refractive index that is lower than the dielectric refractive index n2.

The reflective film 82A includes a part opposed to the terahertz element 20A through the dielectric 50 and the gas cavity 92A. In the present embodiment, the reflective film 82A is entirely opposed to the terahertz element 20A through the dielectric 50 and the gas cavity 92A.

In the present embodiment, when an electromagnetic wave is transmitted through the dielectric 50 and propagated through the gas cavity 92A to the reflective film 82A, the reflective film 82A reflects the electromagnetic wave toward the reception point P1 of the terahertz element 20A. In other words, the reflective film 82A is configured to guide an electromagnetic wave that is transmitted through the dielectric 50 and propagated through the gas cavity 92A toward the reception point P1 of the terahertz element 20A.

The reflective film 82B includes a part opposed to the terahertz element 20B through the dielectric 50 and the gas cavity 92B. In the present embodiment, the reflective film 82B is entirely opposed to the terahertz element 20B through the dielectric 50 and the gas cavity 92B.

In the present embodiment, when an electromagnetic wave is transmitted through the dielectric 50 and propagated through the gas cavity 92B to the reflective film 82B, the reflective film 82B reflects the electromagnetic wave toward the reception point P1 of the terahertz element 20B. In other words, the reflective film 82B is configured to guide an electromagnetic wave that is transmitted through the dielectric 50 and propagated through the gas cavity 92B toward the reception point P1 of the terahertz element 20B.

The reflective film 82C includes a part opposed to the terahertz element 20C through the dielectric 50 and the gas cavity 92C. In the present embodiment, the reflective film 82C is entirely opposed to the terahertz element 20C through the dielectric 50 and the gas cavity 92C.

In the present embodiment, when an electromagnetic wave is transmitted through the dielectric 50 and propagated through the gas cavity 92C to the reflective film 82C, the reflective film 82C reflects the electromagnetic wave toward the reception point P1 of the terahertz element 20C. In other words, the reflective film 82C is configured to guide an electromagnetic wave that is transmitted through the dielectric 50 and propagated through the gas cavity 92C toward the reception point P1 of the terahertz element 20C.

Figure 13:
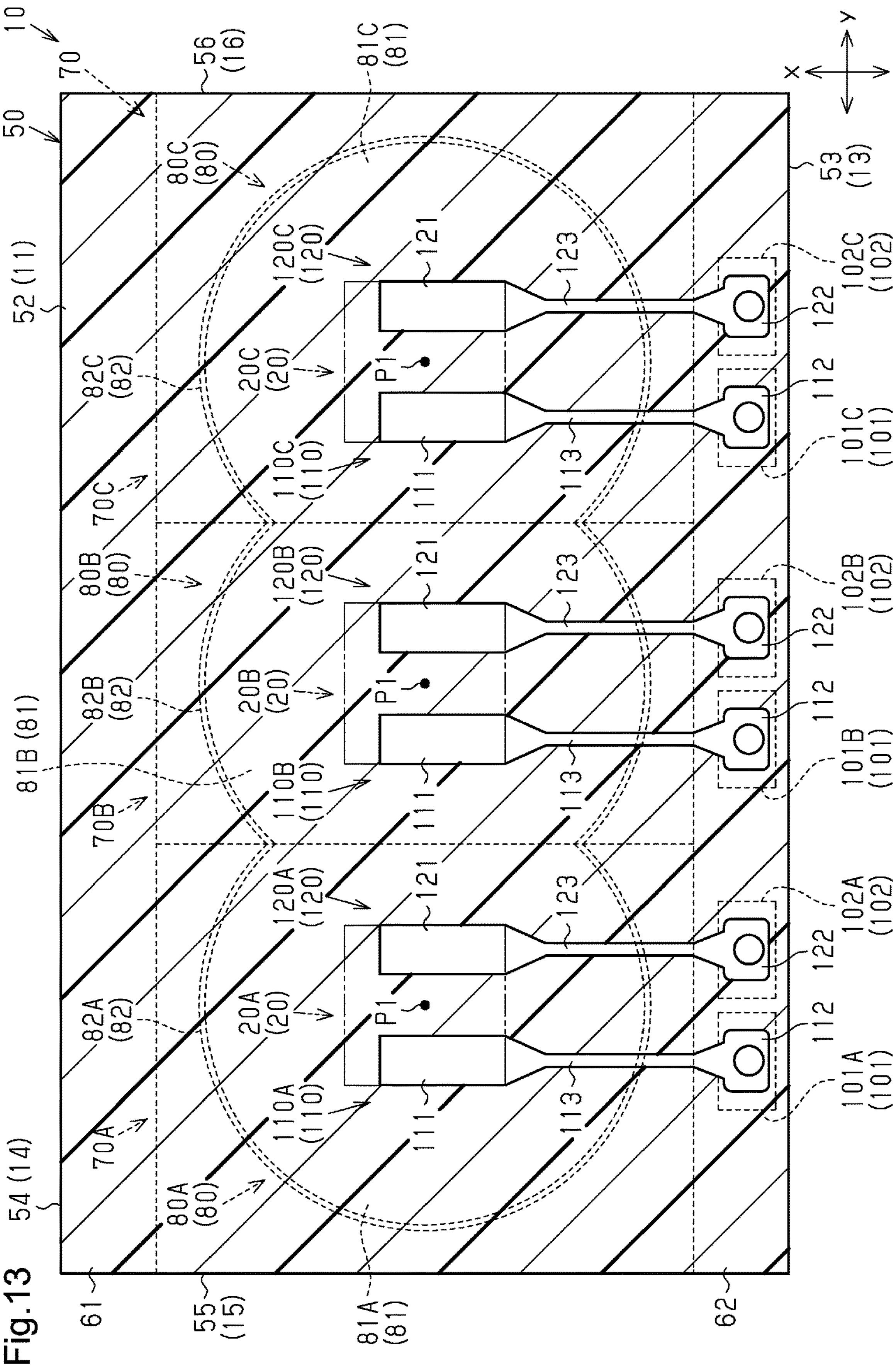
FIG. 13 is a cross-sectional view of the terahertz device shown in FIG. 12 taken along line 13-13.

As shown in FIG. 13, the terahertz device 10 includes a first electrode 101 and a second electrode 102, which are used for electrical connection with an external device, and a first conductive portion 110 and a second conductive portion 120, which are disposed in the dielectric 50 and electrically connected to the terahertz element 20. In the present embodiment, the two electrodes 101 and 102 are arranged for each of the separate antenna bases 70A to 70C. More specifically, the two electrodes 101 and 102 include a first electrode 101A and a second electrode 102A that are arranged on the separate antenna base 70A, a first electrode 101B and a second electrode 102B that are arranged on the separate antenna base 70B, and a first electrode 101C and a second electrode 102C that are arranged on the separate antenna base 70C. In the present embodiment, the two conductive portions 110 and 120 are arranged for each of the terahertz elements 20A to 20C. More specifically, the two conductive portions 110 and 120 include a first conductive portion 110A and a second conductive portion 120A that are electrically connected to the terahertz element 20A, a first conductive portion 110B and a second conductive portion 120B that are electrically connected to the terahertz element 20B, and a first conductive portion 110C and a second conductive portion 120C that are electrically connected to the terahertz element 20C.

In the present embodiment, the two electrodes 101A and 102A are disposed on a portion of the dielectric 50 that does not overlap the reflective film 82A as viewed in the z-direction but overlaps the reflective film 82A as viewed in the x-direction. In other words, the two electrodes 101A and 102A are disposed on the dielectric 50 at one side of the reflective film 82A in the x-direction.

In the present embodiment, the two electrodes 101A and 102A are disposed sideward from the antenna base 70 (the separate antenna base 70A). Specifically, the two electrodes 101A and 102A are formed on a portion of the dielectric main surface 51 corresponding to the first projection 61, that is, on the first overhang surface 51*a* (refer to FIGS. 4 and 5). The two electrodes 101A and 102A are aligned with each other in the x-direction and arranged next to each other in the y-direction. The two electrodes 101A and 102A face downward.

In the present embodiment, the two electrodes 101B and 102B are disposed on a portion of the dielectric 50 that does not overlap the reflective film 82B as viewed in the z-direction but overlaps the reflective film 82B as viewed in the x-direction. In other words, the two electrodes 101B and 102B are disposed on the dielectric 50 at one side of the reflective film 82B in the x-direction.

In the present embodiment, the two electrodes 101B and 102B are disposed sideward from the antenna base 70 (the separate antenna base 70B). Specifically, the two electrodes 101B and 102B are formed on a portion of the dielectric main surface 51 corresponding to the first projection 61, that is, on the first overhang surface 51*a*. The two electrodes 101B and 102B are aligned with each other in the x-direction and arranged next to each other in the y-direction. The two electrodes 101B and 102B face downward.

In the present embodiment, the two electrodes 101C and 102C are disposed on a portion of the dielectric 50 that does not overlap the reflective film 82C as viewed in the z-direction but overlaps the reflective film 82C as viewed in the x-direction. In other words, the two electrodes 101C and 102C are disposed on the dielectric 50 at one side of the reflective film 82C in the x-direction.

In the present embodiment, the two electrodes 101C and 102C are disposed sideward from the antenna base 70 (the separate antenna base 70C). Specifically, the two electrodes 101C and 102C are formed on a portion of the dielectric main surface 51 corresponding to the first projection 61, that is, on the first overhang surface 51*a*. The two electrodes 101C and 102C are aligned with each other in the x-direction and arranged next to each other in the y-direction. The two electrodes 101C and 102C face downward.

In the present embodiment, the electrodes 101A and 102A, the electrodes 101B and 102B, and the electrodes 101C and 102C are aligned with each other in the x-direction and separate from each other in the y-direction.

In the present embodiment, each of the electrodes 101A, 102A, 101B, 102B, 101C, and 102C has, for example, a stacked structure including a Ni layer and a Au layer. However, the electrodes 101A, 102A, 101B, 102B, 101C, and 102C are not limited to this structure and may have any structure. For example, the structure may include a Pd layer or a Sn layer. The electrodes 101A, 102A, 101B, 102B, 101C, and 102C may have any shape as viewed in the z-direction and are, for example, rectangular such that the longitudinal direction extends in the y-direction and the lateral direction extends in the x-direction. The shape of the electrodes 101A and 102A as viewed in the z-direction, the shape of the electrodes 101B and 102B as viewed in the z-direction, the shape of the electrodes 101C and 102C as viewed in the z-direction may differ from each other.

As shown in FIG. 12, the dimension of the antenna base 70 (the separate antenna bases 70A, 70B, and 70C) in the z-direction is greater than the thickness of the dielectric 50. Thus, the electrodes 101A, 102A, 101B, 102B, 101C, and 102C are located at an upper side of the middle of the terahertz device 10 (in other words, toward the device main surface 11) in the z-direction.

The conductive portions 110A, 110B, 110C, 120A, 120B, and 120C are entirely disposed in the dielectric 50. That is, the dielectric 50 encapsulates the terahertz elements 20A to 20C including the conductive portions 110A, 110B, 110C, 120A, 120B, and 120C. Thus, the conductive portions 110A, 110B, 110C, 120A, 120B, and 120C disposed in the dielectric 50 are configured not to contact the reflective films 82A to 82C disposed outside the dielectric 50. The dielectric 50 is used to insulate the conductive portions 110A, 110B, 110C, 120A, 120B, and 120C from the reflective films 82A to 82C.

As shown in FIG. 13, as viewed in the z-direction, the conductive portions 110A and 120A extend in the x-direction, which is the projection direction of the first projection 61, to overlap both the terahertz element 20A and the electrodes 101A and 102A. As viewed in the z-direction, the two conductive portions 110B and 120B extend in the x-direction to overlap both the terahertz element 20B and the electrodes 101B and 102B. As viewed in the z-direction, the conductive portions 110C and 120C extend in the x-direction to overlap both the terahertz element 20C and the electrodes 101C and 102C.

In the present embodiment, each of the conductive portions 110A, 120A, 110B, 120B, 110C, and 120C has the form of a belt having a width in the y-direction and extending in the x-direction.

In the present embodiment, each of the conductive portions 110A, 120A, 110B, 120B, 110C, and 120C has the form of a thin film having a thickness in the z-direction. However, the conductive portions 110A, 120A, 110B, 120B, 110C, and 120C may have any specific shape and may have the form of a plate having a predetermined thickness. In the present embodiment, the terahertz element 20A is flip-chip-mounted on the conductive portions 110A and 120A. The terahertz element 20B is flip-chip-mounted on the conductive portions 110B and 120B. The terahertz element 20C is flip-chip-mounted on the conductive portions 110C and 120C.

Figure 14:
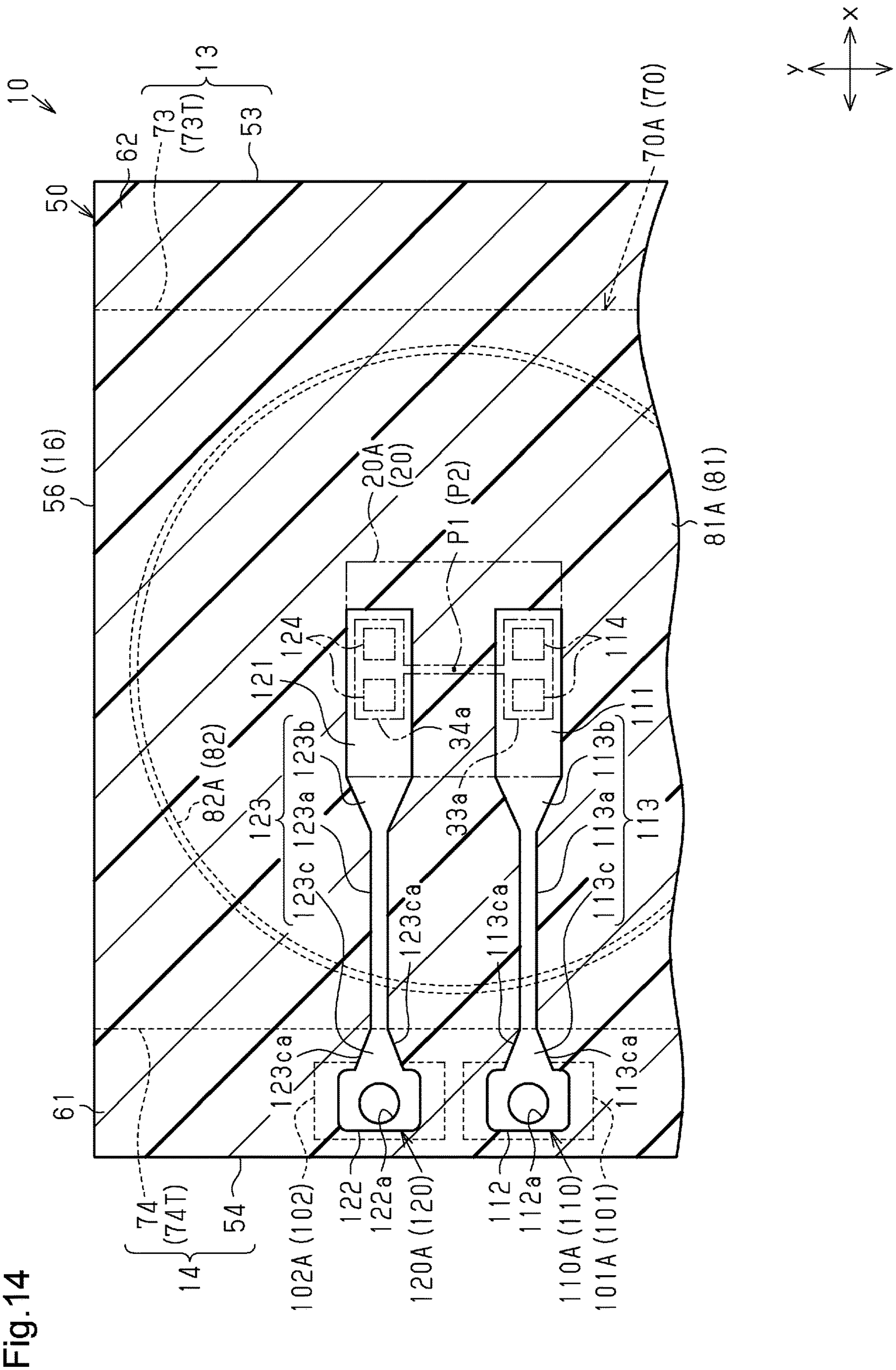
FIG. 14 is an enlarged partial view of conductive portions shown in FIG. 13 and its surroundings.

As shown in FIG. 14, the first conductive portion 110A electrically connects the terahertz element 20A and the first electrode 101A. The first conductive portion 110A extends in the x-direction, which is the projection direction of the first projection 61, to be opposed to both the first pad 33*a* of the terahertz element 20A and the first electrode 101A.

As shown in FIG. 4, the first conductive portion 110A includes a first element opposing part 111 opposed to the first pad 33*a* of the terahertz element 20A in the z-direction, a first electrode opposing part 112 opposed to the first electrode 101A in the z-direction, a first connector 113 connecting the first element opposing part 111 and the first electrode opposing part 112, and a first post 115 connecting the first electrode opposing part 112 and the first electrode 101A. In the present embodiment, the first element opposing part 111 and the first electrode opposing part 112 define opposite ends of the first conductive portion 110A in the x-direction.

Figure 15:
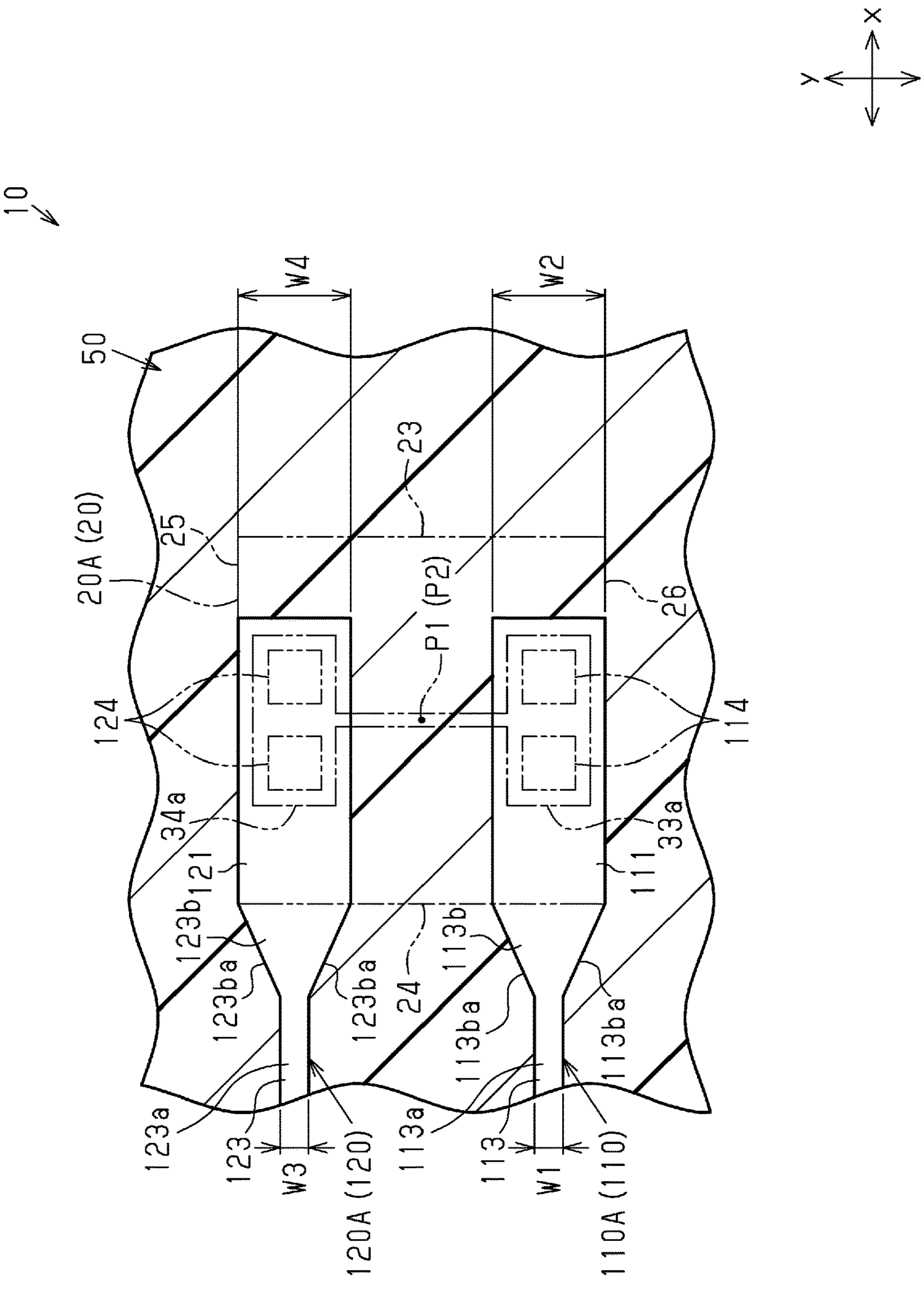
FIG. 15 is an enlarged partial view of conductive portions shown in FIG. 14 and its surroundings.

As shown in FIGS. 14 and 15, the first element opposing part 111 is disposed between the terahertz element 20A and the reflective film 82A in the z-direction. As viewed in the z-direction, the first element opposing part 111 at least partially overlaps the first pad 33*a* of the terahertz element 20A. The first element opposing part 111 is opposed to the reflective film 82A in the z-direction. The first element opposing part 111 extends in the x-direction in accordance with the first pad 33*a* of the terahertz element 20A extending in the x-direction. In an example, as viewed in the z-direction, the first element opposing part 111 is rectangular such that the longitudinal direction extends in the x-direction and the lateral direction extends in the y-direction.

The first conductive portion 110A includes a first bump 114 disposed between the first element opposing part 111 and the first pad 33*a* of the terahertz element 20A. The terahertz element 20A is flip-chip-mounted on the first element opposing part 111 via the first bump 114. The first pad 33*a* and the first element opposing part 111 are electrically connected by the first bump 114.

In the present embodiment, multiple first bumps 114 are provided. In an example, the multiple (in the present embodiment, two) first bumps 114 are arranged in the x-direction in accordance with the first pad 33*a* of the terahertz element 20A and the first element opposing part 111 extending in the x-direction. As viewed in the z-direction, the first element opposing part 111 and the first bump 114 are disposed so as not to overlap the reception point P1. The shape of the first bump 114 is, for example, a tetragonal rod. However, the first bump 114 is not limited to this shape and may have any shape.

The first bump 114 may have a monolayer structure or a multilayer structure. In an example, the first bump 114 may have a multilayer structure including a metal layer including Cu, a metal layer including Ti, and an alloy layer including Sn. An example of the alloy layer including Sn is a Sn—Sb-based alloy layer or a Sn—Ag-based alloy layer.

A first insulation layer may be formed on the first element opposing part 111 to surround the first bump 114. The first insulation layer may be frame-shaped and open upward so that the first bump 114 is accommodated in the first insulation layer. This limits undesirable sideward spreading of the first bump 114. The first insulation layer may be omitted.

As viewed in the z-direction, the first electrode opposing part 112 at least partially overlaps the first electrode 101A. In an example, the first electrode opposing part 112 is formed at a position projecting sideward from the antenna base 70 (the separate antenna base 70A). Specifically, the first electrode opposing part 112 is formed in the first projection 61. Thus, the first electrode opposing part 112 is disposed so as not to overlap the reflective film 82A as viewed in the z-direction.

In the present embodiment, as viewed in the z-direction, the first electrode opposing part 112 is rectangular and extends in the x-direction and the y-direction. As viewed in the z-direction, the first electrode 101A has a larger width than the first electrode opposing part 112. However, the first electrode 101A is not limited to the shape and size described above and may be smaller than the first electrode opposing part 112 or may be identical in shape to the first electrode opposing part 112.

As shown in FIGS. 13 and 14, the first connector 113 is disposed between the first element opposing part 111 and the first electrode opposing part 112 and has a width in the y-direction and extends in the x-direction. The first connector 113 is partially opposed to the reflective film 82A in the z-direction. That is, the first connector 113 is positioned to partially overlap the reflective film 82A. In other words, as viewed in the z-direction, the first connector 113 has a part that overlaps the reflective film 82A and a part that does not overlap the reflective film 82A.

In the present embodiment, the width of the first connector 113 is smaller than the width of the first element opposing part 111. Specifically, the width of the first connector 113 (dimension in the y-direction) is set to be smaller than the width of the first element opposing part 111 (dimension in the y-direction). In the present embodiment, for example, the width of the first connector 113 is smaller than the width of the first electrode opposing part 112. In other words, the first electrode opposing part 112 extends wider than the first connector 113 in the y-direction.

The first connector 113 includes a first connector body 113*a*, which has a smaller width than the first element opposing part 111 and the first electrode opposing part 112, and a first element tapered part 113*b* and a first electrode tapered part 113*c* that are located at opposite longitudinal sides of the first connector body 113*a*.

The longitudinal direction of the first connector body 113*a* extends in the x-direction, and the first connector body 113*a* has a fixed width in the y-direction. As viewed in the z-direction, the first connector body 113*a* overlaps the reflective film 82A. The first connector body 113*a* joins the first element opposing part 111 and the first electrode opposing part 112. As shown in FIG. 15, a width W1 of the first connector body 113*a* is smaller than a width W2 of the first element opposing part 111.

The first element tapered part 113*b* joins the first connector body 113*a* and the first element opposing part 111. In an example, as viewed in the z-direction, the first element tapered part 113*b* is disposed adjacent to the terahertz element 20A in the x-direction and overlaps the reflective film 82A.

The width of the first element tapered part 113*b* is gradually increased from the first connector body 113*a* toward the first element opposing part 111. In the present embodiment, the first element tapered part 113*b* includes two first element inclined surfaces 113*ba* that are gradually inclined away from each other from the first connector body 113*a* toward the first element opposing part 111.

As shown in FIG. 13, the first electrode tapered part 113*c* joins the first connector body 113*a* and the first electrode opposing part 112. In an example, as viewed in the z-direction, the first electrode tapered part 113*c* is formed so as not to overlap the reflective film 82A and is, for example, formed in the first projection 61.

The width of the first electrode tapered part 113*c* is gradually increased from the first connector body 113*a* toward the first electrode opposing part 112. In the present embodiment, the first electrode tapered part 113*c* includes two first electrode inclined surfaces 113*ca* that are gradually inclined away from each other from the first connector body 113*a* toward the first electrode opposing part 112.

As shown in FIG. 4, the first post 115 is disposed between the first electrode 101A and the first electrode opposing part 112. The first post 115 has a height extending in the z-direction and is joined to the first electrode 101A and the first electrode opposing part 112.

The first post 115 is, for example, cylindrical. However, the first post 115 may have any specific shape and may be, for example, prismatic. In the present embodiment, the first electrode opposing part 112 includes a first depression 112*a* in a position overlapping the first post 115. The first depression 112*a* may be omitted.

In this structure, the first pad 33*a* of the terahertz element 20A and the first electrode 101A are electrically connected by the first bump 114, the first element opposing part 111, the first connector 113, the first electrode opposing part 112, and the first post 115.

The shape of the first conductive portions 110B and 110C as viewed in the z-direction is identical to the shape of the first conductive portion 110A as viewed in the z-direction. That is, in the same manner as the first conductive portion 110A, each of the first conductive portions 110B and 110C includes a first element opposing part 111, a first electrode opposing part 112, a first connector 113, a first bump 114, and a first post 115. The first pad 33*a* of the terahertz element 20B and the first electrode 101B are electrically connected by the first bump 114, the first element opposing part 111, the first connector 113, the first electrode opposing part 112, and the first post 115 of the first conductive portion 110B. Thus, the first conductive portion 110B electrically connects the terahertz element 20B and the first electrode 101B. Also, the first pad 33*a* of the terahertz element 20C and the first electrode 101C are electrically connected by the first bump 114, the first element opposing part 111, the first connector 113, the first electrode opposing part 112, and the first post 115 of the first conductive portion 110C. Thus, the first conductive portion 110C electrically connects the terahertz element 20C and the first electrode 101C.

As shown in FIGS. 5 and 13, the second conductive portion 120A electrically connects the terahertz element 20A and the second electrode 102A. As shown in FIGS. 13 and 14, in the present embodiment, as viewed in the z-direction, the first conductive portion 110A and the second conductive portion 120A are arranged next to each other in the y-direction. As viewed in the z-direction, the conductive portions 110A and 120A extend from the terahertz element 20A in one direction in a radial direction of the reflective film 82A.

In particular, in the present embodiment, as viewed in the z-direction, the conductive portions 110A and 120A extend away from the terahertz element 20A. Specifically, as viewed in the z-direction, the two conductive portions 110A and 120A extend from the terahertz element 20A toward the first projection 61 in the x-direction.

As shown in FIG. 5, the second conductive portion 120A includes a second element opposing part 121 opposed to the second pad 34*a* of the terahertz element 20A in the z-direction, a second electrode opposing part 122 opposed to the second electrode 102A in the z-direction, and a second post 125 connecting the second element opposing part 121 and the second electrode 102A. In the present embodiment, the second element opposing part 121 and the second electrode opposing part 122 define opposite ends of the second conductive portion 120A in the x-direction.

The second element opposing part 121 is disposed between the terahertz element 20A and the reflective film 82A in the z-direction. As viewed in the z-direction, the second element opposing part 121 at least partially overlaps the second pad 34*a* of the terahertz element 20A. The second element opposing part 121 is opposed to the reflective film 82A in the z-direction. The second element opposing part 121 extends in the x-direction in accordance with the second pad 34*a* of the terahertz element 20A extending in the x-direction. In an example, the second element opposing part 121 is rectangular such that the longitudinal direction extends in the x-direction and the lateral direction extends in the y-direction.

In the present embodiment, the element opposing parts 111 and 121 are arranged next to each other in the y-direction in accordance with the pads 33*a* and 34*a* of the terahertz element 20A being separated in the y-direction. The dielectric 50 is disposed between the element opposing parts 111 and 121, and the element opposing parts 111 and 121 are insulated by the dielectric 50.

The second conductive portion 120A includes a second bump 124 disposed between the second element opposing part 121 and the second pad 34*a* of the terahertz element 20A. The terahertz element 20A is flip-chip-mounted on the second element opposing part 121 via the second bump 124. The second pad 34*a* of the terahertz element 20A and the second element opposing part 121 are electrically connected by the second bump 124.

As shown in FIGS. 14 and 15, in the present embodiment, multiple second bumps 124 are provided. In an example, the multiple (in the present embodiment, two) second bumps 124 are arranged in the x-direction in accordance with the second pad 34*a* of the terahertz element 20A and the second element opposing part 121 extending in the x-direction. As viewed in the z-direction, the second element opposing part 121 and the second bump 124 are disposed so as not to overlap the reception point P1. The first bump 114 and the second bump 124 are separated and opposed to each other in the y-direction and are aligned with each other in the x-direction. However, the first bump 114 and the second bump 124 are not limited to the arrangement described above. In an example, the first bump 114 and the second bump 124 may be located at different positions in the y-direction.

As shown in FIG. 14, as viewed in the z-direction, the second electrode opposing part 122 at least partially overlaps the second electrode 102A. In an example, the second electrode opposing part 122 is formed at a position projecting sideward from the antenna base 70 (the separate antenna base 70A). Specifically, the second electrode opposing part 122 is formed in the second projection 62. Thus, the second electrode opposing part 122 is disposed so as not to overlap the reflective film 82A as viewed in the z-direction.

In the present embodiment, as viewed in the z-direction, the second electrode opposing part 122 is rectangular and extends in the x-direction and the y-direction. As viewed in the z-direction, the second electrode 102A has a larger width than the second electrode opposing part 122. However, the second electrode 102A is not limited to the size and shape described above and may be smaller than the second electrode opposing part 122 or may be identical in shape to the second electrode opposing part 122.

A second connector 123 is disposed between the second element opposing part 121 and the second electrode opposing part 122 and has a width in the y-direction and extends in the x-direction. The second connector 123 is partially opposed to the reflective film 82A in the z-direction. That is, the second connector 123 is positioned to partially overlap the reflective film 82A. In other words, as viewed in the z-direction, the second connector 123 has a part that overlaps the reflective film 82A and a part that does not overlap the reflective film 82A.

In the present embodiment, the width of the second connector 123 is smaller than the width of the second element opposing part 121. Specifically, the width of the second connector 123 (dimension in the y-direction) is set to be smaller than the width of the second element opposing part 121 (dimension in the y-direction). In the present embodiment, for example, the width of the second connector 123 is smaller than the width of the second electrode opposing part 122. In other words, the second electrode opposing part 122 extends wider than the second connector 123 in the y-direction.

The second connector 123 includes a second connector body 123*a*, which has a smaller width than the second element opposing part 121 and the second electrode opposing part 122, and a second element tapered part 123*b* and a second electrode tapered part 123*c* that are located at opposite longitudinal sides of the second connector body 123*a*.

The second connector body 123*a* has a longitudinal direction extending in the x-direction and has a fixed width in the y-direction. As viewed in the z-direction, the second connector body 123*a* overlaps the reflective film 82A. The second connector body 123*a* joins the second element opposing part 121 and the second electrode opposing part 122. As shown in FIG. 15, a width W3 of the second connector body 123*a* is smaller than a width W4 of the second element opposing part 121.

The second element tapered part 123*b* joins the second connector body 123*a* and the second element opposing part 121. In an example, as viewed in the z-direction, the second element tapered part 123*b* is disposed adjacent to the terahertz element 20A in the x-direction and overlaps the reflective film 82A.

As shown in FIG. 15, the width of the second element tapered part 123*b* is gradually increased from the second connector body 123*a* toward the second element opposing part 121. In the present embodiment, the second element tapered part 123*b* includes two second element inclined surfaces 123*ba* that are gradually inclined away from each other from the second connector body 123*a* toward the second element opposing part 121.

As shown in FIG. 14, the second electrode tapered part 123*c* joins the second connector body 123*a* and the second electrode opposing part 122. In an example, as viewed in the z-direction, the second electrode tapered part 123*c* is formed so as not to overlap the reflective film 82A and is, for example, formed in the second projection 62.

The width of the second electrode tapered part 123*c* is gradually increased from the second connector body 123*a* toward the second electrode opposing part 122. In the present embodiment, the second electrode tapered part 123*c* includes two second electrode inclined surfaces 123*ca* that are gradually inclined away from each other from the second connector body 123*a* toward the second electrode opposing part 122.

As shown in FIG. 5, the second post 125 is disposed between the second electrode 102A and the second electrode opposing part 122. The second post 125 has a height extending in the z-direction and is joined to the second electrode 102A and the second electrode opposing part 122.

The second post 125 is, for example, cylindrical. However, the second post 125 may have any specific shape and may be, for example, prismatic. In the present embodiment, the second electrode opposing part 122 includes a second depression 122*a* in a position overlapping the second post 125. The second depression 122*a* may be omitted.

In this structure, the second pad 34*a* of the terahertz element 20A and the second electrode 102A are electrically connected by the second bump 124, the second element opposing part 121, the second connector 123, the second electrode opposing part 122, and the second post 125.

The shape of the second conductive portions 120B and 120C as viewed in the z-direction is identical to the shape of the second conductive portion 120A as viewed in the z-direction. That is, in the same manner as the second conductive portion 120A, each of the second conductive portions 120B and 120C includes a second element opposing part 121, a second electrode opposing part 122, a second connector 123, a second bump 124, and a second post 125. The second pad 34*a* of the terahertz element 20B and the second electrode 102B are electrically connected by the second bump 124, the second element opposing part 121, the second connector 123, the second electrode opposing part 122, and the second post 125 of the second conductive portion 120B. Thus, the second conductive portion 120B electrically connects the terahertz element 20B and the second electrode 102B. The second pad 34*a* of the terahertz element 20C and the second electrode 102C are electrically connected by the second bump 124, the second element opposing part 121, the second connector 123, the second electrode opposing part 122, and the second post 125 of the second conductive portion 120C. Thus, the second conductive portion 120C electrically connects the terahertz element 20C and the second electrode 102C.

As shown in FIG. 13, in the present embodiment, as viewed in the z-direction, the first conductive portion 110B and the second conductive portion 120B are arranged next to each other in the y-direction. As viewed in the z-direction, the two conductive portions 110B and 120B extend from the terahertz element 20B in one direction in a radial direction of the reflective film 82B.

In particular, in the present embodiment, as viewed in the z-direction, the conductive portions 110B and 120B extend away from the terahertz element 20B. Specifically, as viewed in the z-direction, the conductive portions 110B and 120B extend from the terahertz element 20B toward the first projection 61 in the x-direction.

In the present embodiment, as viewed in the z-direction, the first conductive portion 110C and the second conductive portion 120C are arranged next to each other in the y-direction. As viewed in the z-direction, the two conductive portions 110C and 120C extend from the terahertz element 20C in one direction in a radial direction of the reflective film 82C.

In particular, in the present embodiment, as viewed in the z-direction, the conductive portions 110C and 120C extend away from the terahertz element 20C. Specifically, as viewed in the z-direction, the two conductive portions 110C and 120C extend from the terahertz element 20C toward the first projection 61 in the x-direction.

As shown in FIG. 13, in the present embodiment, the conductive portions 110A and 120A, the conductive portions 110B and 120B, and the conductive portions 110C and 120C are aligned with each other in the x-direction and separate from each other in the y-direction.

In the present embodiment, the reflective film 82A is electrically isolated. Specifically, the separate antenna base 70A, on which the reflective film 82A is formed, is insulative. The conductive portions 110A and 120A are disposed in the dielectric 50. Thus, the reflective film 82A is insulated from the conductive portions 110A and 120A. In addition, the reflective film 82A is separate from the electrodes 101A and 102A, and the separate antenna base 70A is disposed between the reflective film 82A and the two electrodes 101A and 102A. Thus, the reflective film 82A is insulated from the two electrodes 101A and 102A. Accordingly, the reflective film 82A is electrically isolated. In the same manner as the reflective film 82A, the reflective films 82B and 82C are electrically isolated.

Manufacturing Method of Terahertz Device

A method for manufacturing the terahertz device 10 of the present embodiment will now be described with reference to FIGS. 16 to 30. To simplify the description, a method for manufacturing one terahertz device 10 will be described.

The method for manufacturing the terahertz device 10 generally includes a step of forming the dielectric 50 encapsulating the terahertz element 20 and the like, a step of forming the antenna base 70, and a step of coupling the dielectric 50 to the antenna base 70.

The step of forming the dielectric 50 encapsulating the terahertz element 20 will now be described with reference to FIGS. 16 to 26.

Figure 16:
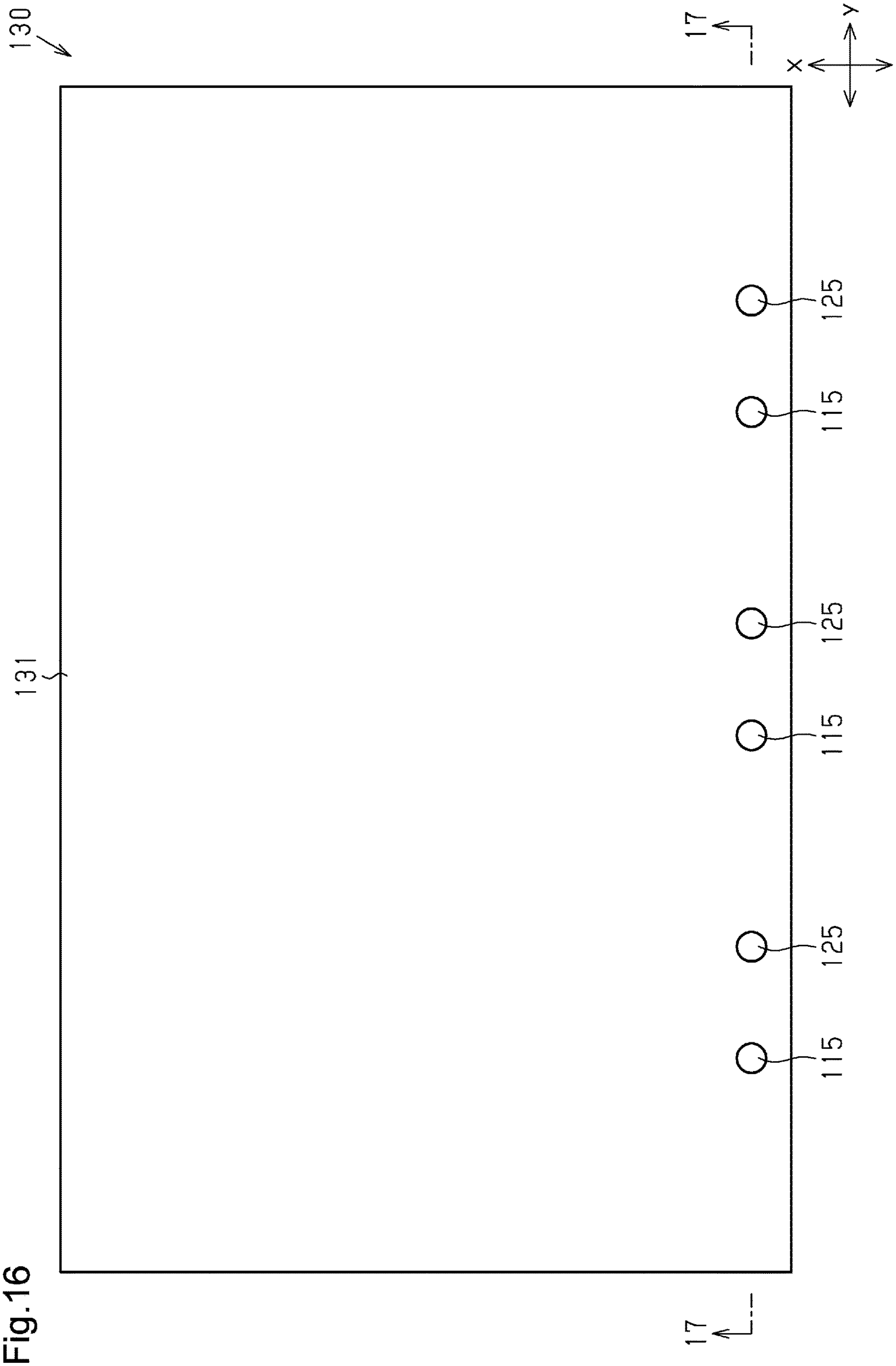
FIG. 16 is a diagram showing an example of a step in a method for manufacturing the terahertz device of the first embodiment.
Figure 17:
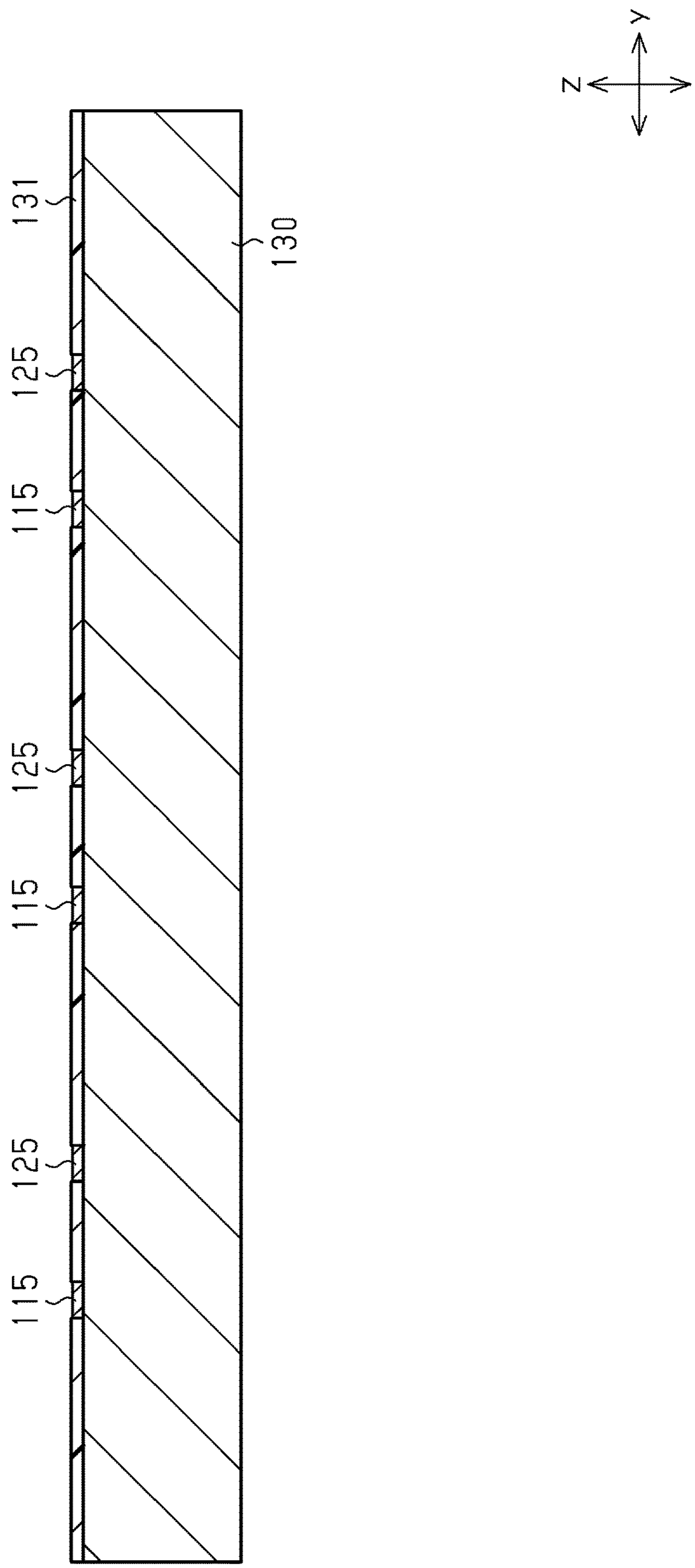
FIG. 17 is a cross-sectional view of a support substrate shown in FIG. 16 and its surroundings taken along line 17-17.

As shown in FIGS. 16 and 17, the method for manufacturing the terahertz device 10 includes a step of forming the posts 115 and 125 on a support substrate 130.

The support substrate 130 is formed from a semiconductor material that is a monocrystalline material. In the present embodiment, the support substrate 130 is formed from a monocrystalline silicon (Si) material. In the present embodiment, the thickness of the support substrate 130 is, for example, approximately 725 to 775 The support substrate 130 is not limited to a Si wafer and may be, for example, a glass substrate.

The step of forming the posts 115 and 125 includes, for example, a step of forming a base layer on the support substrate 130. The base layer is formed through sputtering. In the present embodiment, the base layer is obtained by forming a Ti layer on the support substrate 130 and then forming a Cu layer in contact with the Ti layer. That is, the base layer is formed of the Ti layer and the Cu layer stacked one on the other. In the present embodiment, the thickness of the Ti layer is approximately 10 to 30 and the thickness of the Cu layer is approximately 200 to 800 However, the material of the base layer is not limited to that described above.

Next, a plating layer is formed in contact with the base layer. The plating layer is formed by forming a resist pattern through photolithography and performing electrolytic plating. Specifically, a photosensitive resist is applied to cover the entire surface of the base layer, and the photosensitive resist undergoes light exposure and development. This forms a patterned resist layer (hereafter, referred to as "the resist pattern"). The photosensitive resist is applied using, for example, a spin coater, but is not limited to this. In this case, the base layer is partially exposed from the resist pattern. Then, electrolytic plating is performed when the base layer is used as a conductive path. As a result, a plating layer is formed on the base layer exposed from the resist pattern. In the present embodiment, the material of the plating layer is, for example, Cu. After the plating layer is formed, the resist pattern is removed. Through the steps, the posts 115 and 125 are formed. The posts 115 and 125 extend upward from the support substrate 130.

As shown in FIGS. 16 and 17, the method for manufacturing the terahertz device 10 includes a first encapsulating step of forming a first dielectric layer 131 that covers the posts 115 and 125. In the first encapsulating step, the first dielectric layer 131 is formed, for example, through molding. In the present embodiment, the first dielectric layer 131 is electrically insulative and is, for example, a synthetic resin including an epoxy resin as a main material. The first dielectric layer 131 partially forms the dielectric 50.

The first dielectric layer 131 may be formed by any specific step. In an example, the first dielectric layer 131 having a greater height than the posts 115 and 125 is formed. Subsequently, the first dielectric layer 131 is polished to expose distal surfaces of the posts 115 and 125. In this case, polish scratches, that is, polish marks, are formed on the upper surface of the first dielectric layer 131.

In addition, when the first dielectric layer 131 is polished, the distal surfaces of the posts 115 and 125 may be polished. In this case, burrs may be formed on the distal surfaces of the posts 115 and 125. The method for manufacturing the terahertz device 10 may further include a step of removing the burrs from the posts 115 and 125. In this case, as shown in FIG. 17, the distal surfaces of the posts 115 and 125 are located at a position slightly recessed from the upper surface of the first dielectric layer 131.

Figure 18:
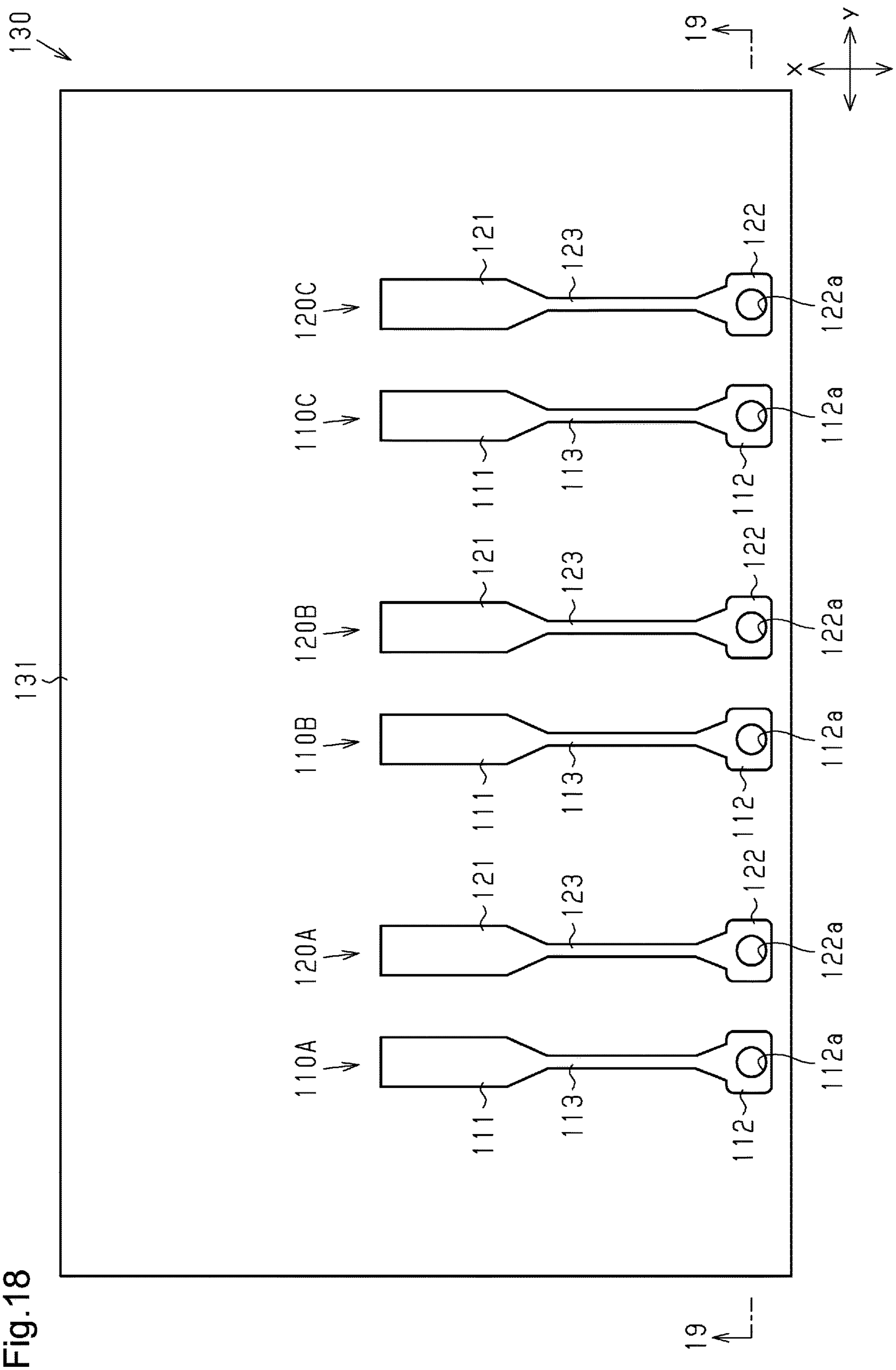
FIG. 18 is a diagram showing an example of a step in the method for manufacturing the terahertz device.
Figure 19A:
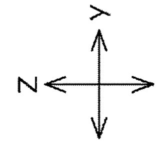
FIG. 19A is a cross-sectional view of the support substrate shown in FIG. 18 and its surroundings taken along line 19-19.
Figure 19A:
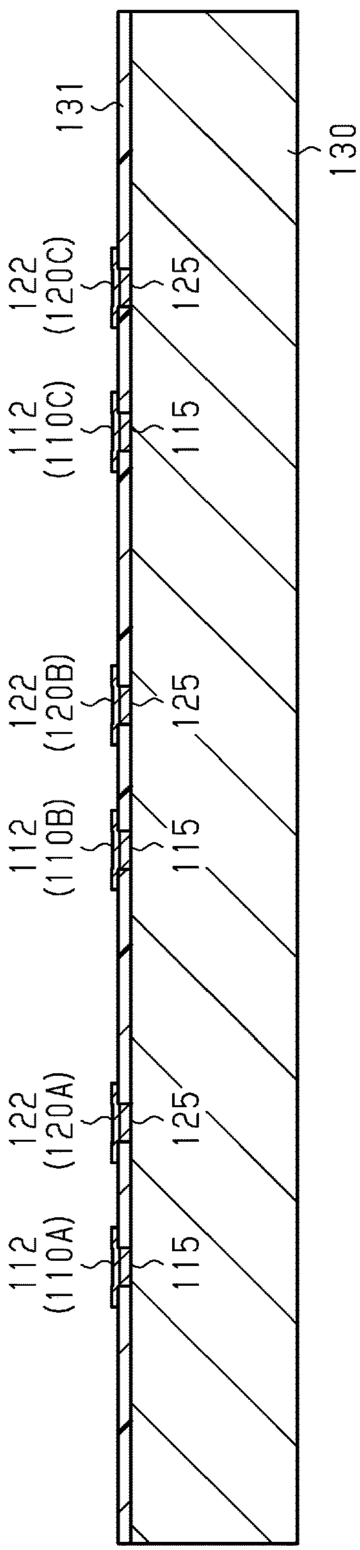

As shown in FIGS. 18 and 19A, the method for manufacturing the terahertz device 10 includes a step of forming the conductive portions 110A and 120A, a step of forming the conductive portions 110B and 120B, and a step of forming the conductive portions 110C and 120C. The steps of forming these conductive portions are common. The step of forming the conductive portions 110A and 120A will be described. The step of forming the conductive portions 110B and 120B and the step of forming the conductive portions 110C and 120C will not be described.

As shown in FIG. 18, the step of forming the conductive portions 110A and 120A includes a step of forming the element opposing parts 111 and 121, the electrode opposing parts 112 and 122, and the connectors 113 and 123. In this step, patterning is performed on the first dielectric layer 131 to form the element opposing parts 111 and 121, the electrode opposing parts 112 and 122, and the connectors 113 and 123. The element opposing parts 111 and 121, the electrode opposing parts 112 and 122, and the connectors 113 and 123 may be formed of a base layer and a plating layer.

Figure 19B:
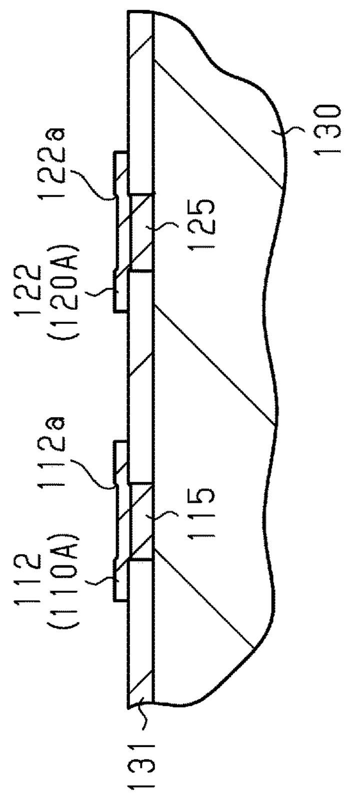
FIG. 19B is an enlarged partial view of FIG. 19A.

As shown in FIG. 19B, in the conductive portions 110A and 120A, distal surfaces of the posts 115 and 125 are recessed from the upper surface of the first dielectric layer 131. Thus, the electrode opposing parts 112 and 122 formed on the distal surfaces of the posts 115 and 125 include the depressions 112*a* and 122*a*. In the same manner as the conductive portions 110A and 120A, in the conductive portions 110B, 120B, 110C, and 120C, the electrode opposing parts 112 and 122 include depressions 112*a* and 122*a*.

As shown in FIGS. 20 to 23, the method for manufacturing the terahertz device 10 includes an element mounting step of mounting the terahertz element 20A, the terahertz element 20B, and the terahertz element 20C. The element mounting step is performed by, for example, flip-chip bonding.

Figure 20:
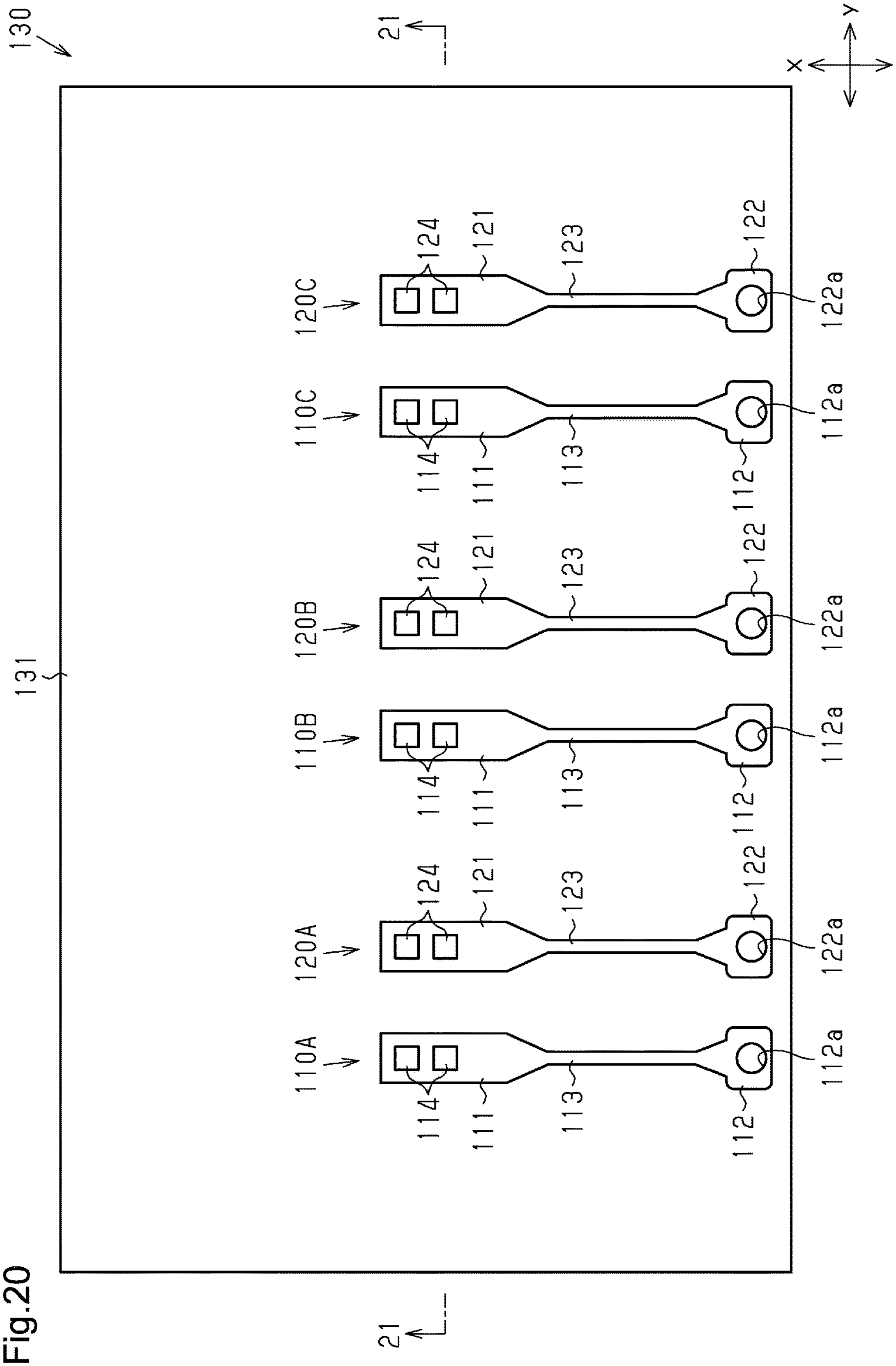
FIG. 20 is a diagram showing an example of a step in the method for manufacturing the terahertz device.
Figure 21:
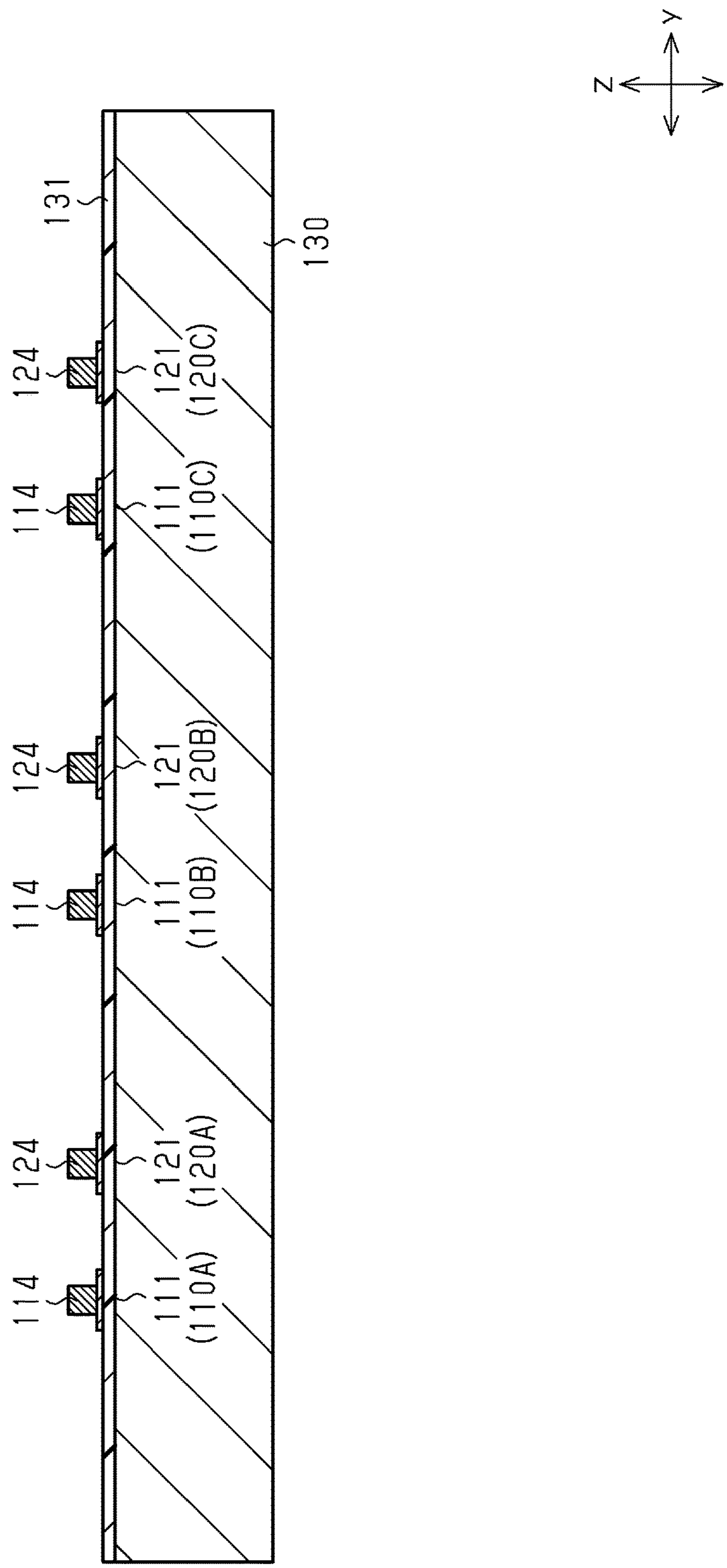
FIG. 21 is a cross-sectional view of the support substrate shown in FIG. 20 and its surroundings taken along line 21-21.

As shown in FIGS. 20 and 21, the element mounting step includes a step of forming the bumps 114 and 124 on the conductive portions 110A, 120A, 110B, 120B, 110C, and 120C. In an example, the step of forming the bumps 114 and 124 includes a step of forming a resist layer on a region excluding a bump formation region where the bumps 114 and 124 are formed, a step of forming a conductive layer on the bump formation region to form the bumps 114 and 124, and a step of removing the resist layer. In an example, the resist layer is formed of a photosensitive resist and is patterned by exposure and development.

When an unwanted base layer is formed in the conductive portions 110A, 120A, 110B, 120B, 110C, and 120C, the method for manufacturing the terahertz device 10 may include a step of removing the unwanted base layer. In an example, the unwanted base layer may be removed by wet-etching that uses a mixture solution of sulfuric acid ($H_2SO_4$) and hydrogen peroxide ($H_2O_2$).

Figure 22:
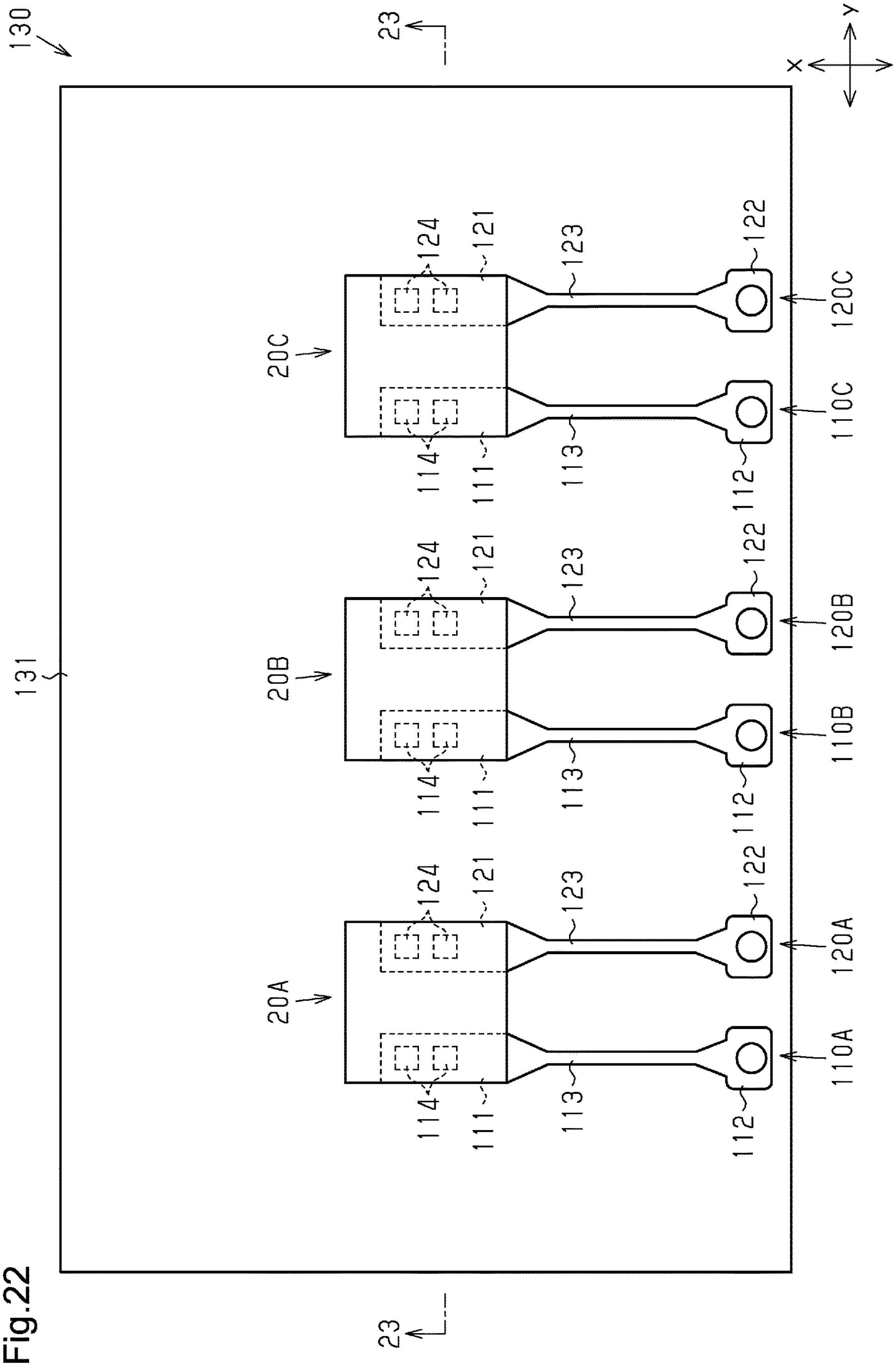
FIG. 22 is a diagram showing an example of a step in the method for manufacturing the terahertz device.
Figure 23:
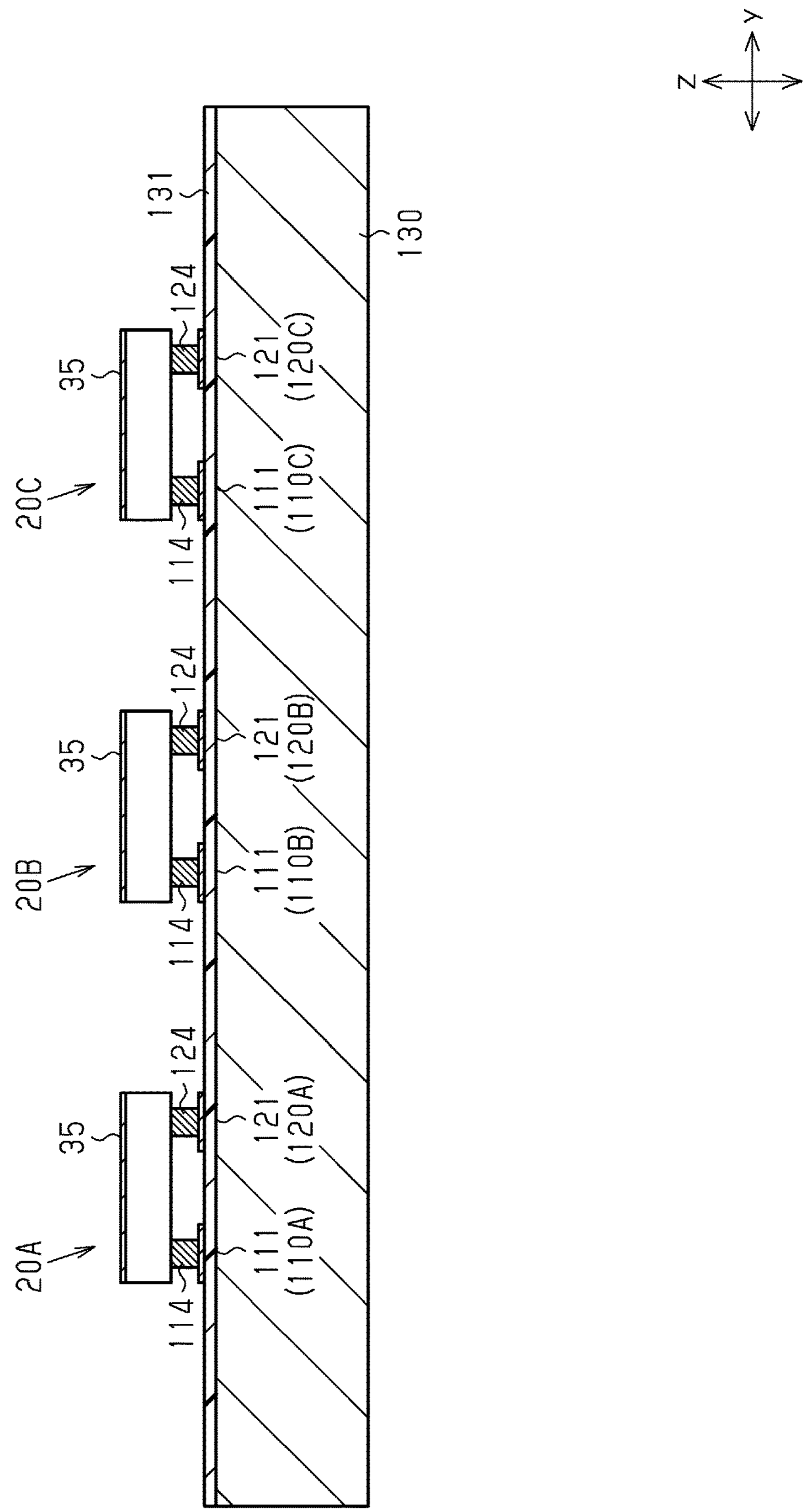
FIG. 23 is a cross-sectional view of the support substrate shown in FIG. 22 and its surroundings taken along line 23-23.

As shown in FIGS. 22 and 23, the element mounting step includes a step of joining the terahertz element 20A to the conductive portions 110A and 120A with the bumps 114 and 124, a step of joining the terahertz element 20B to the conductive portions 110B and 120B with the bumps 114 and 124, and a step of joining the terahertz element 20C to the conductive portions 110C and 120C with the bumps 114 and 124. As a result, the terahertz element 20A is flip-chip-mounted on the conductive portions 110A and 120A. This electrically connects the terahertz element 20A to the conductive portions 110A and 120A. The terahertz element 20B is flip-chip-mounted on the two conductive portions 110B and 120B. This electrically connects the terahertz element 20B to the two conductive portions 110B and 120B. The terahertz element 20C is flip-chip-mounted on the conductive portions 110C and 120C. This electrically connects the terahertz element 20C to the conductive portions 110C and 120C.

Figure 24:
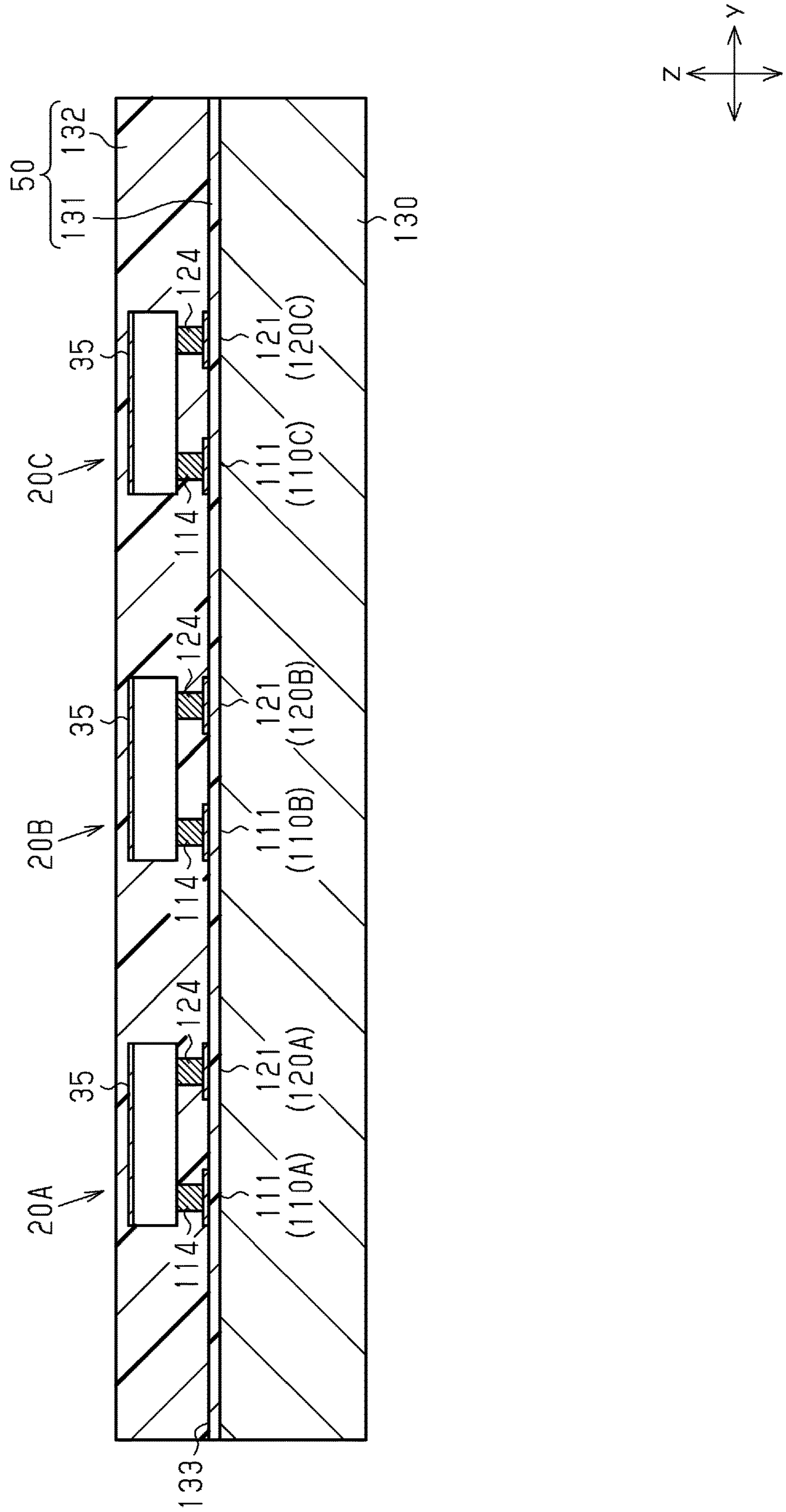
FIG. 24 is a diagram showing an example of a step in the method for manufacturing the terahertz device.

As shown in FIG. 24, the method for manufacturing the terahertz device 10 includes a second encapsulating step of forming a second dielectric layer 132 that encapsulates the conductive portions 110A, 120A, 110B, 120B, 110C, and 120C and the terahertz elements 20A to 20C. The second dielectric layer 132 is formed on the first dielectric layer 131. In the present embodiment, the second dielectric layer 132 and the first dielectric layer 131 are formed from the same material. That is, the second dielectric layer 132 is electrically insulative and is, for example, a synthetic resin including an epoxy resin as a main material. The dielectric 50 includes the first dielectric layer 131 and the second dielectric layer 132. The lower surface of the first dielectric layer 131 defines the dielectric main surface 51. The upper surface of the second dielectric layer 132 defines the dielectric back surface 52. The terahertz elements 20A to 20C and the conductive portions 110A, 120A, 110B, 120B, 110C, and 120C are encapsulated by the dielectric layers 131 and 132.

Before the second dielectric layer 132 is formed, an underfill, for example, the main component of which is an epoxy resin, may fill gaps under the terahertz elements 20A to 20C (between the terahertz element 20A and the first dielectric layer 131 or the conductive portions 110A and 120A, between the terahertz element 20B and the first dielectric layer 131 or the conductive portions 110B and 120B, between and the terahertz element 20C and the first dielectric layer 131 or the conductive portions 110C and 120C).

In the present embodiment, an interface 133 may be formed between the first dielectric layer 131 and the second dielectric layer 132. However, when the dielectric layers 131 and 132 are completely integrated, the interface 133 does not necessarily have to be formed.

Figure 25:
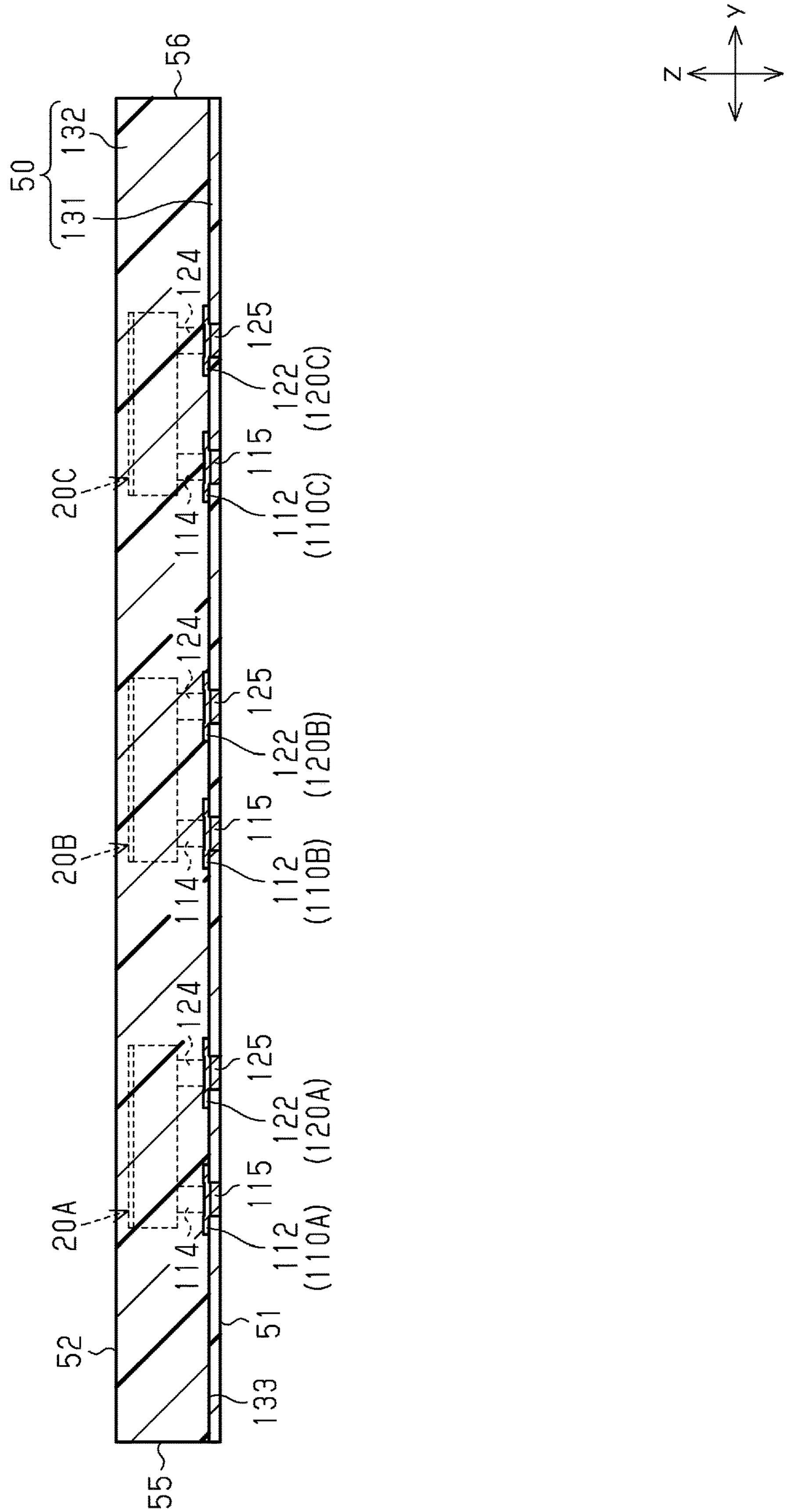
FIG. 25 is a diagram showing an example of a step in the method for manufacturing the terahertz device.

As shown in FIG. 25, the method for manufacturing the terahertz device 10 includes a step of removing the support substrate 130 to expose the dielectric main surface 51 of the dielectric 50 and basal surfaces of the posts 115 and 125. The step of removing the support substrate 130 uses, for example, a grinding machine. However, the method of removing the support substrate 130 is not limited to a structure that uses a grinding machine.

Figure 26:
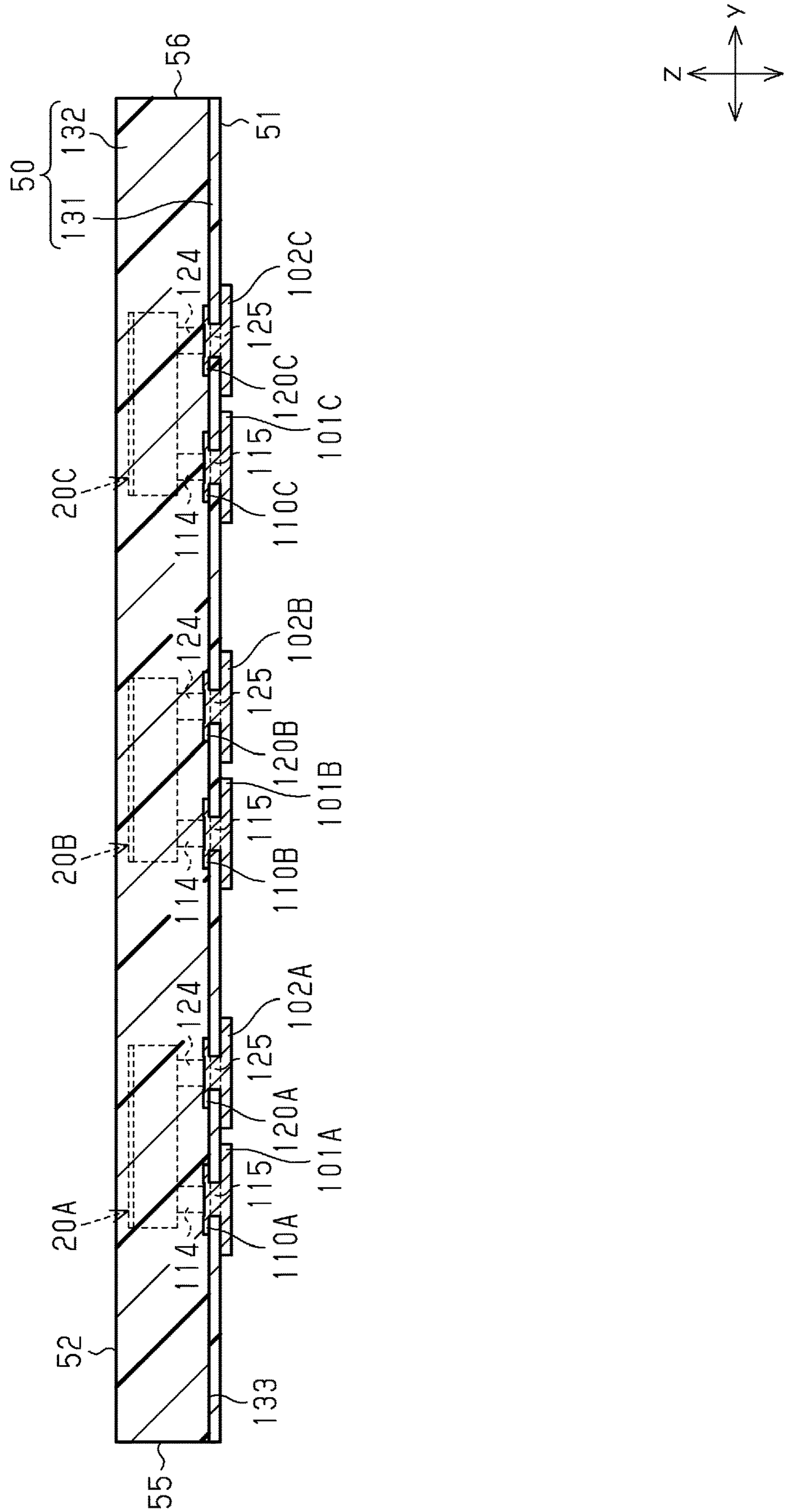
FIG. 26 is a diagram showing an example of a step in the method for manufacturing the terahertz device.

As shown in FIG. 26, the method for manufacturing the terahertz device 10 includes a step of forming the electrodes 101A, 102A, 101B, 102B, 101C, and 102C. The step of forming the electrodes 101A, 102A, 101B, 102B, 101C, and 102C is performed through, for example, electroless plating. In the present embodiment, for example, a Ni layer, a Pd layer, and a Au layer are formed on one another in this order through electroless plating to form the electrodes 101A, 102A, 101B, 102B, 101C, and 102C.

The step of forming the electrodes 101A, 102A, 101B, 102B, 101C, and 102C is not limited to that described above. Alternatively, the Ni layer and the Au layer may be formed on each other in this order, only the Au layer may be formed, only Sn may be formed, or Sn may be formed on the Ni layer.

With reference to FIGS. 27 to 30, the step of forming the antenna base 70 will be described.

The method for manufacturing the terahertz device 10 includes a step of forming the antenna recess 80A in the separate antenna base 70A, a step of forming the antenna recess 80B in the separate antenna base 70B, and a step of forming the antenna recess 80C in the separate antenna base 70C. In the present embodiment, the separate antenna bases 70A and 70C are identical in shape. The process for forming the separate antenna base 70A and the process for forming the separate antenna base 70B will be described together.

Figure 27:
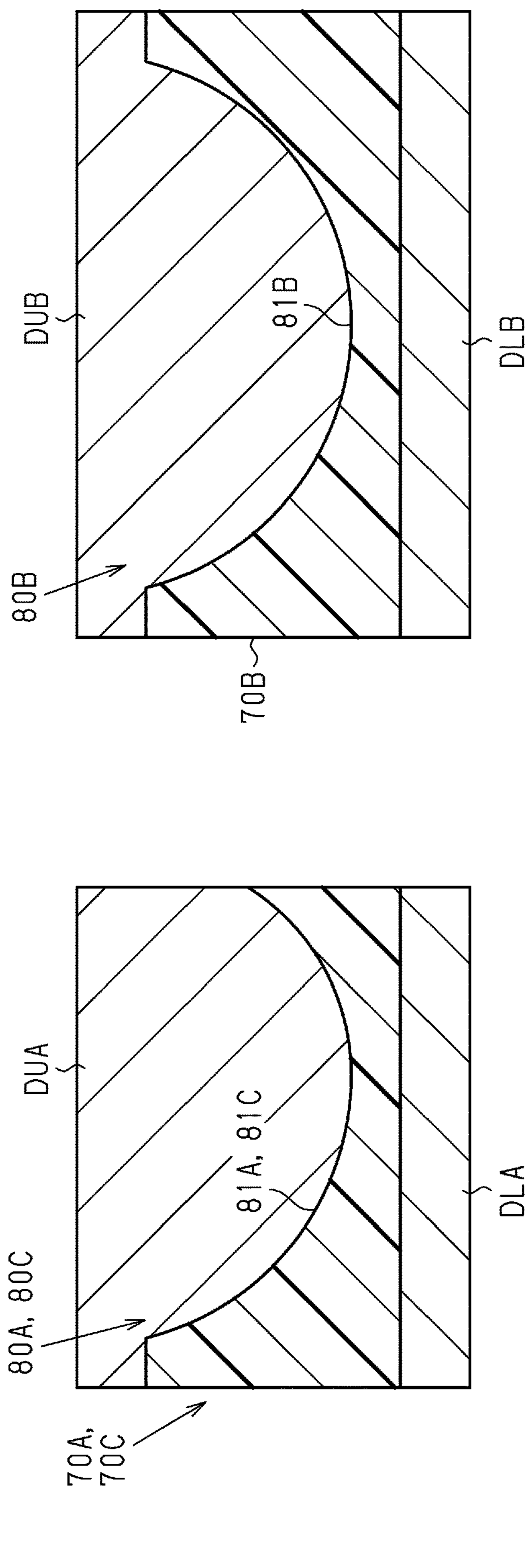
FIG. 27 is a diagram showing an example of a step in the method for manufacturing the terahertz device.

As shown in FIG. 27, in the step of forming the antenna recesses 80A and 80C, molds DUA and DLA that are formed in conformance with the antenna surfaces 81A and 81C are used to form the antenna recess 80A including the antenna surface 81A and the antenna recess 80C including the antenna surface 81C. In the step of forming the antenna recess 80B, molds DUB and DLB that are formed in conformance with the antenna surface 81B are used to form the antenna recess 80B including the antenna surface 81B.

The method for manufacturing the terahertz device 10 includes a step of forming metal films 134A, 134B, and 134C that form the reflective films 82A, 82B, and 82C. This step is performed after the antenna recesses 80A to 80C are formed.

Figure 28:
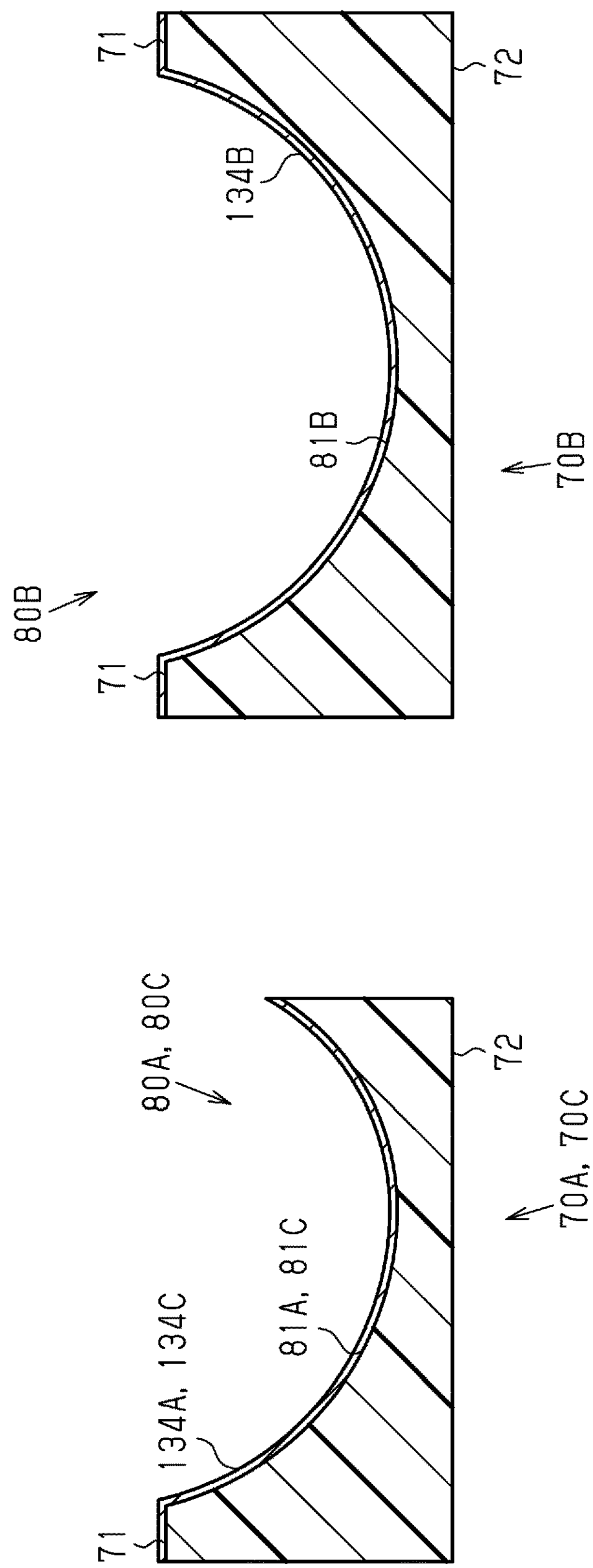
FIG. 28 is a diagram showing an example of a step in the method for manufacturing the terahertz device.

As shown in FIG. 28, in this step, the metal films 134A and 134C are formed on the base main surface 71 and the antenna surfaces 81A and 81C of the separate antenna bases 70A and 70C. Also, the metal film 134B is formed on the base main surface 71 and the antenna surface 81B of the separate antenna base 70B.

Figure 29:
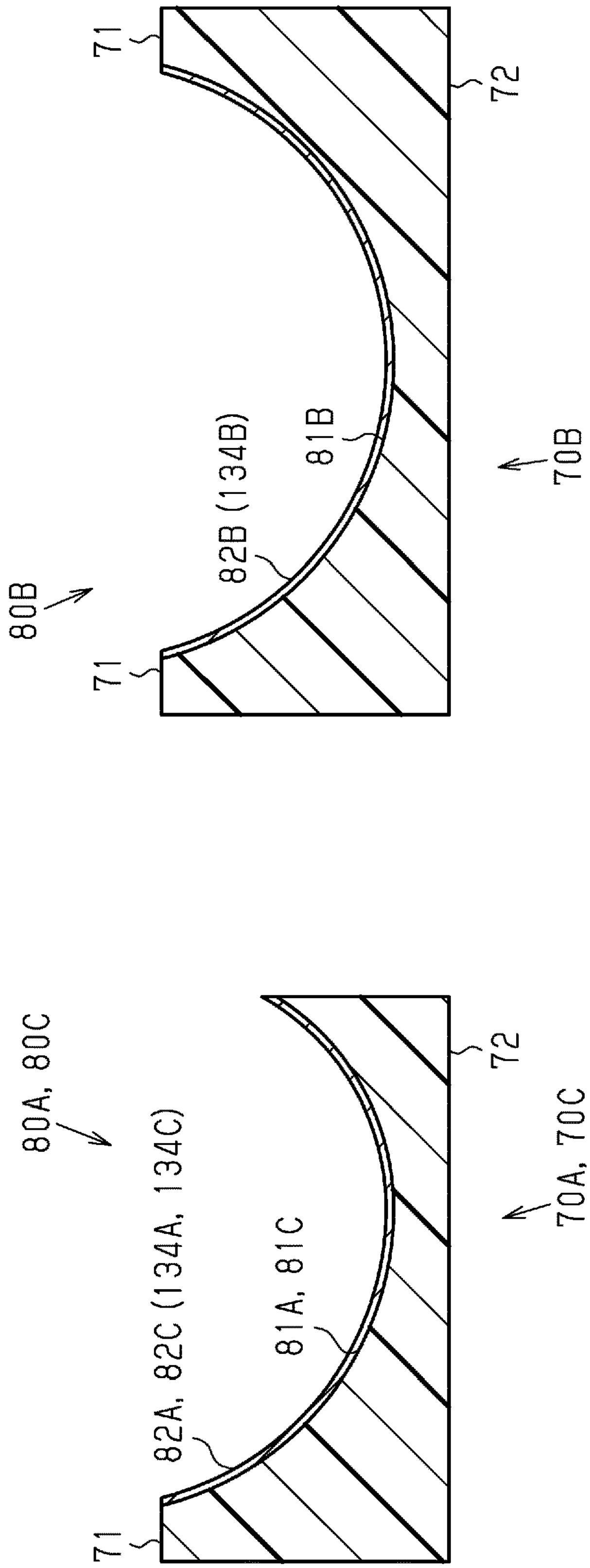
FIG. 29 is a diagram showing an example of a step in the method for manufacturing the terahertz device.

Subsequently, as shown in FIG. 29, the metal films 134A and 134C are removed from the base main surfaces 71 of the separate antenna bases 70A and 70C, and the metal film 134B is removed from the base main surface 71 of the separate antenna base 70B. Any specific process for removing the metal films 134A to 134C from the base main surfaces 71 may be used. For example, the metal films 134A to 134C may be removed by patterning or an abrasive process. As a result, the reflective film 82A is formed on only the antenna surface 81A, the reflective film 82B is formed on only the antenna surface 81B, and the reflective film 82C is formed on only the antenna surface 81C.

The step of forming the reflective films 82A to 82C is not limited to the above-described steps. For example, the method for manufacturing the terahertz device 10 may include a step of masking the base main surfaces 71 of the separate antenna bases 70A to 70C and a step of forming the reflective films 82A to 82C on the antenna surfaces 81A to 81C by vapor deposition using electron beams. This case eliminates the need for the step of removing the reflective films 82A to 82C from the base main surfaces 71.

Figure 30:
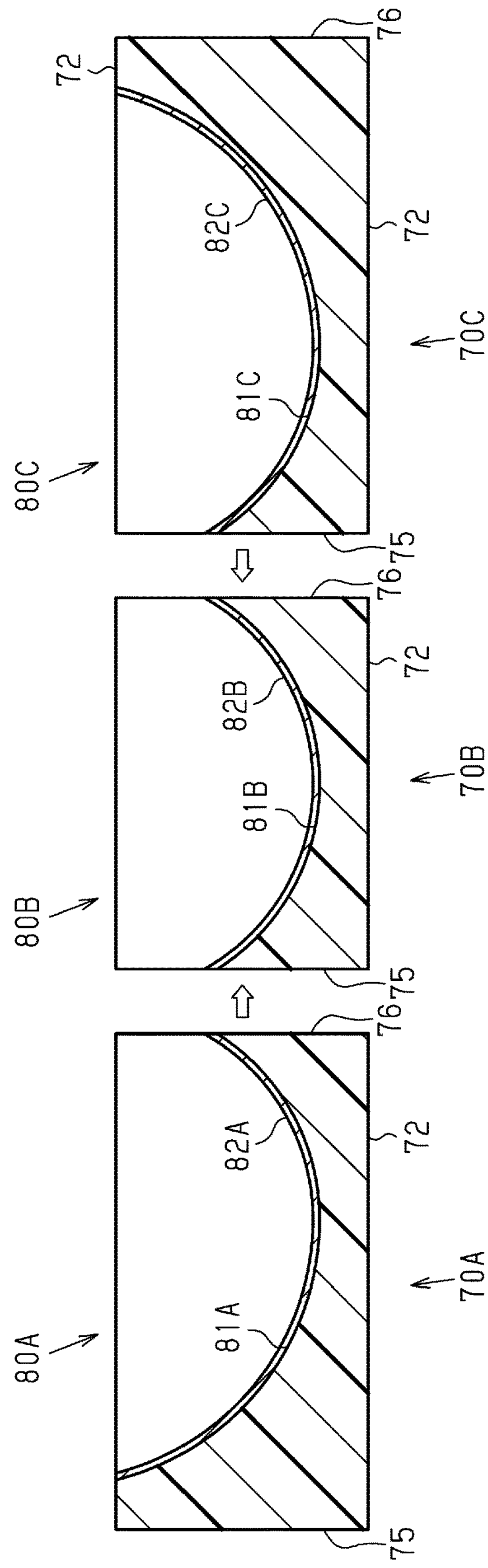
FIG. 30 is a diagram showing an example of a step in the method for manufacturing the terahertz device.

As shown in FIG. 30, the method for manufacturing the terahertz device 10 includes a step of coupling the separate antenna base 70A and the separate antenna base 70B and a step of coupling the separate antenna base 70B and the separate antenna base 70C after the separate antenna bases 70A to 70C are formed. Specifically, in these steps, an adhesive layer is used to adhere the separate antenna base 70A to the separate antenna base 70B and adhere the separate antenna base 70B to the separate antenna base 70C.

A step of coupling the dielectric 50 to the antenna base 70 will now be described. Although not shown, the method for manufacturing the terahertz device 10 includes a step of coupling the dielectric 50 to the antenna bases 70 including the reflective films 82A, 82B, and 82C. In this step, the adhesive layer 91 is used to adhere the antenna bases 70 to the dielectric 50. The steps described above manufacture the terahertz device 10.

Operation

The operation of the terahertz device 10 of the present embodiment will now be described with reference to FIGS. 31 to 34.

Figure 31A:
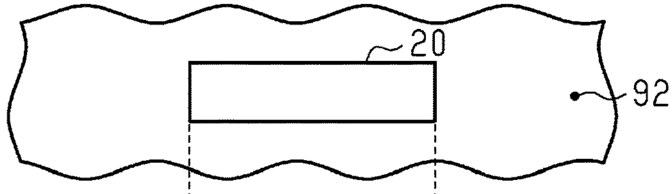
FIG. 31A is a diagram showing a terahertz element surrounded by gas.
Figure 31B:
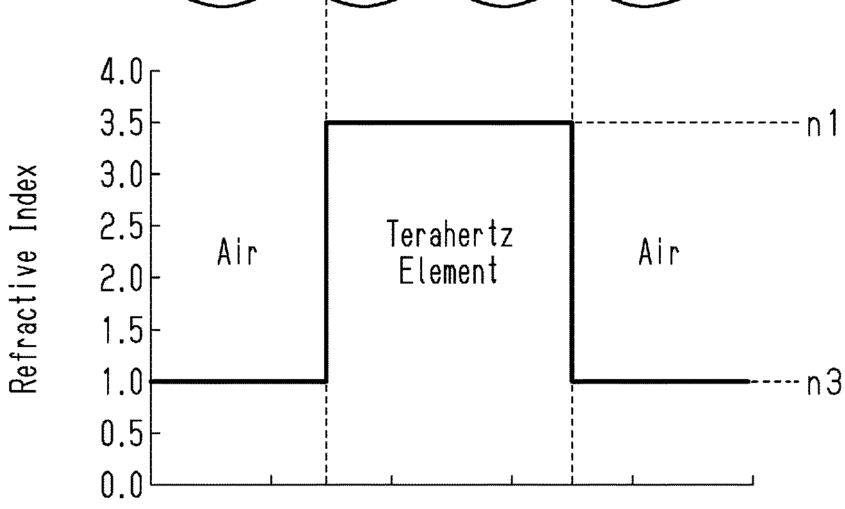
FIG. 31B is a graph showing changes in refractive index in the case of FIG. 31A.
Figure 32A:
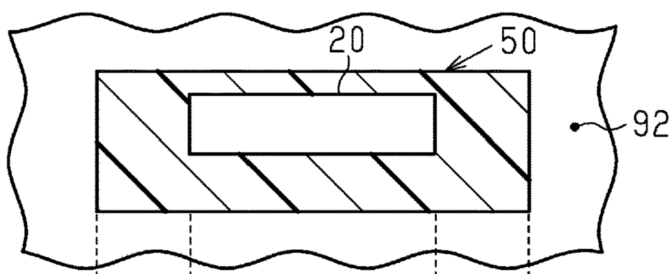
FIG. 32A is a diagram showing a terahertz element surrounded by a dielectric and gas.
Figure 32B:
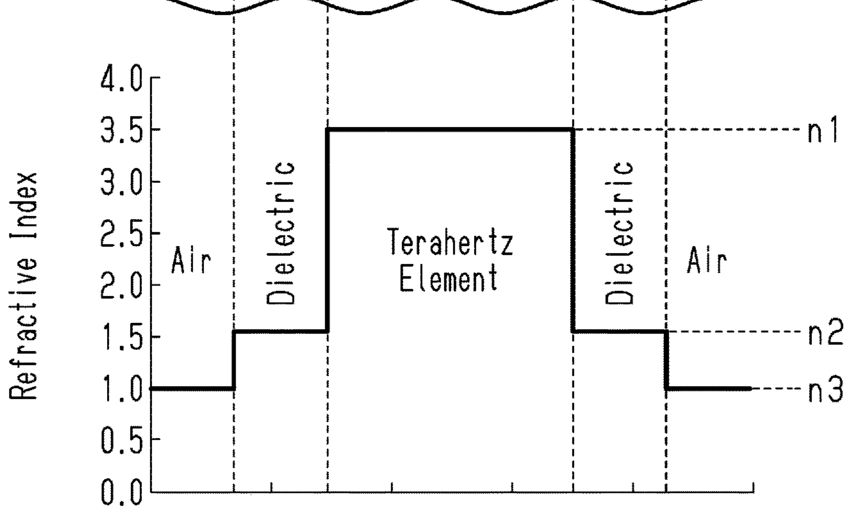
FIG. 32B is a graph showing changes in refractive index in the case of FIG. 32A.

FIG. 31A is a diagram showing the terahertz element 20 surrounded by gas. FIG. 31B is a graph showing changes in refractive index in the case of FIG. 31A. FIG. 32A is a diagram showing the terahertz element 20 surrounded by gas and the dielectric 50. FIG. 32B is a graph showing changes in refractive index in the case of FIG. 32A.

In the present embodiment, when electromagnetic waves propagate toward the terahertz device 10, the electromagnetic waves propagate through the dielectric 50 and the gas cavity 92 to the reflective film 82. The reflective film 82 reflects the electromagnetic waves toward the terahertz element 20 (preferably, the reception point P1). Thus, the terahertz element 20 receives the electromagnetic waves. In this structure, the device main surface 11 may be referred to as an incident surface that receives an electromagnetic wave. The inner surface of the reflective film 82 may be referred to as a reflective surface that reflects an electromagnetic wave incident from the device main surface 11 toward the terahertz element 20. The device main surface 11 may be referred to as an input surface into which an electromagnetic wave is input. The terahertz device 10 may be referred to as a receiver that receives the electromagnetic wave from the device main surface 11.

Propagation of electromagnetic waves from the reflective film 82 toward the terahertz element 20 through the dielectric 50 will be described based on a comparison with propagation of electromagnetic waves from the reflective film 82 toward the terahertz element 20 without using the dielectric 50.

As shown in FIGS. 31A and 31B, if there is no dielectric 50 and the terahertz element 20 is surrounded by gas, the refractive index greatly changes at the interface between the inside and the outside of the terahertz element 20, more specifically, the interface between the terahertz element 20 and the air. In this case, electromagnetic waves are likely to reflect in the interface between the inside and the outside of the terahertz element 20, and the electromagnetic waves are likely to be confined in the terahertz element 20. As a result, a number of resonance modes is likely to be produced in the terahertz element 20. Thus, electromagnetic waves having a frequency other than a target frequency may be generated in the terahertz element 20, and the electromagnetic waves may be received.

In this regard, in the present embodiment, as shown in FIGS. 32A and 32B, the terahertz element 20 is surrounded by the dielectric 50 having the dielectric refractive index n2 that is lower than the element refractive index n1 and higher than the gas refractive index n3. Thus, the refractive index is decreased in a stepped manner as the terahertz element 20 becomes farther. This reduces the change in refractive index at the interface between the inside and the outside of the terahertz element 20, more specifically, the interface between the terahertz element 20 and the dielectric 50. Thus, reflection of electromagnetic waves in the interface between the inside and the outside of the terahertz element 20 is somewhat limited, and a number of resonance modes is less likely to be produced.

Figure 33:
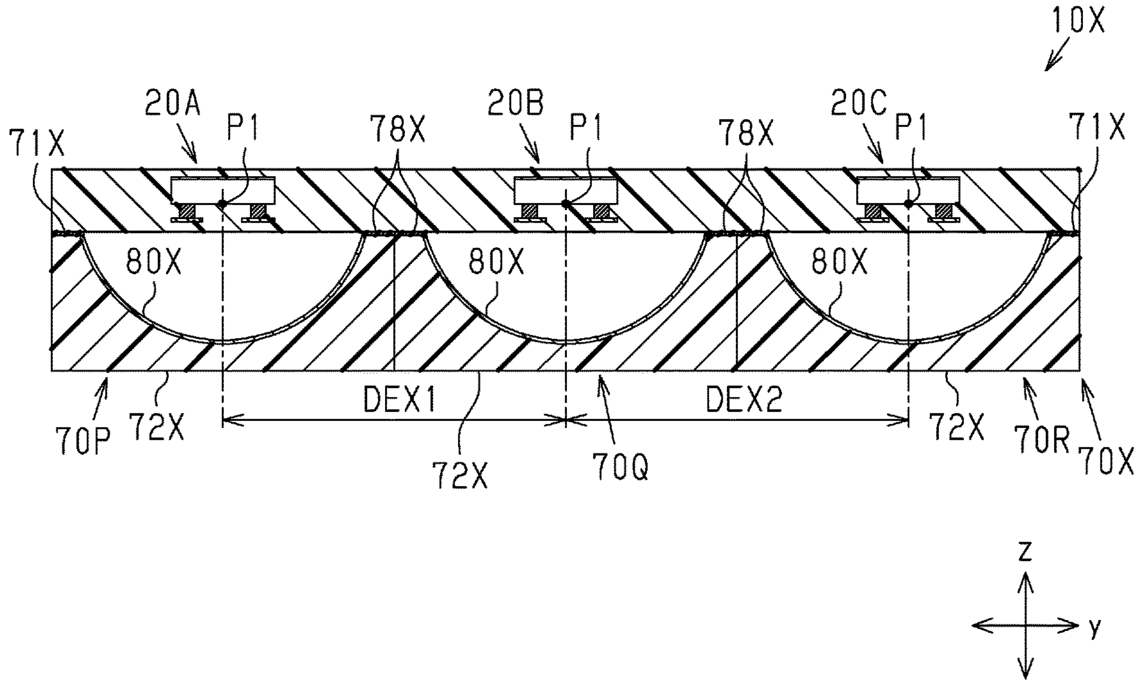
FIG. 33 is a schematic cross-sectional view showing a comparative example of a terahertz device indicating inter-element distances between terahertz elements located adjacent to each other.
Figure 34:
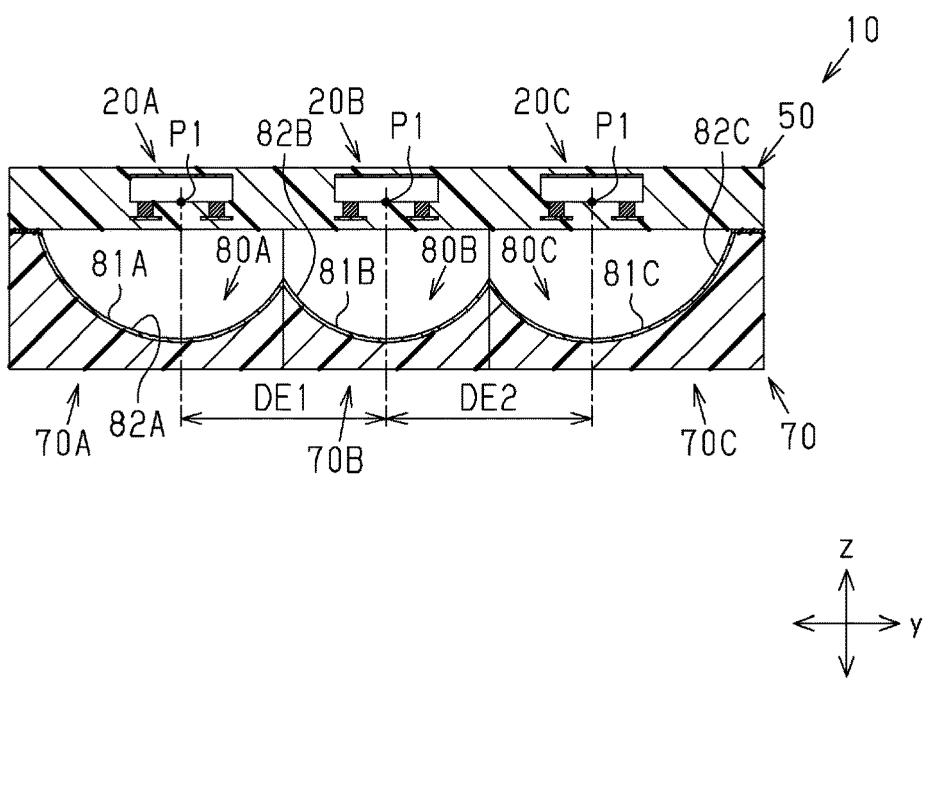
FIG. 34 is a schematic cross-sectional view showing the terahertz device of the first embodiment indicating inter-element distances between terahertz elements located adjacent to each other.

FIG. 33 is a diagram showing a cross-sectional structure of a comparative example of a terahertz device 10X. FIG. 34 is a diagram showing a cross-sectional structure of the terahertz device 10 of the present embodiment. Each of FIGS. 33 and 34 shows a cross-sectional structure that is obtained by cutting at a position where the terahertz elements 20 are arranged along a plane extending in the arrangement direction of the antenna bases 70 (70X) and the height-wise direction of the terahertz device 10 (10X).

As shown in FIG. 33, the terahertz device 10X of the comparative example includes the antenna base 70X. The antenna base 70X is obtained by combining a separate antenna base 70P, a separate antenna base 70Q, and a separate antenna base 70R in a row. As shown in FIG. 33, in the antenna base 70X, the separate antenna base 70Q is located between the separate antenna base 70P and the separate antenna base 70R.

The separate antenna bases 70P, 70Q, and 70R are identical in shape and include a semispherical antenna recess 80X. The antenna recess 80X is recessed from a base main surface 71X toward a base back surface 72X of each of the separate antenna bases 70P, 70Q, and 70R and is open in the base main surface 71X. More specifically, in each of the separate antenna bases 70P, 70Q, and 70R, the open end of the antenna recess 80X is entirely surrounded by the base main surface 71X. Each of the separate antenna bases 70P, 70Q, and 70R includes a peripheral wall 78X extending around the open end of the antenna recess 80X including the base main surface 71X.

As shown in FIG. 33, the peripheral wall 78X of the separate antenna base 70P and the peripheral wall 78X of the separate antenna base 70Q are located between the antenna recess 80X of the separate antenna base 70P and the antenna recess 80X of the separate antenna base 70Q. Also, the peripheral wall 78X of the separate antenna base 70Q and the peripheral wall 78X of the separate antenna base 70R are located between the antenna recess 80X of the separate antenna base 70Q and the antenna recess 80X of the separate antenna base 70R.

In this regard, in the present embodiment, as shown in FIG. 34, the peripheral walls 78X are not disposed between the separate antenna base 70A and the separate antenna base 70B, and the peripheral walls 78X are not disposed between the separate antenna base 70B and the separate antenna base 70C. In other words, the antenna recesses 80A and 80B, which are located adjacent to each other in the arrangement direction of the separate antenna bases 70A and 70B (y-direction), are in contact with each other. Also, the antenna recesses 80B and 80C, which are located adjacent to each other in the arrangement direction of the separate antenna bases 70B and 70C (the y-direction), are in contact with each other. In addition, the antenna surfaces 81A to 81C of the antenna recesses 80A to 80C are cut away in the arrangement direction of the separate antenna bases 70A to 70C (in the present embodiment, the y-direction). With the structures shown in FIGS. 33 and 34, the inter-element distance DE1 between the reception point P1 of the terahertz element 20A and the reception point P1 of the terahertz element 20B in the present embodiment is shorter than an inter-element distance DEX1 between the terahertz element 20A and the terahertz element 20B in the comparative example. Also, the inter-element distance DE2 between the reception point P1 of the terahertz element 20B and the reception point P1 of the terahertz element 20C in the present embodiment is shorter than an inter-element distance DEX2 between the terahertz element 20B and the terahertz element 20C in the comparative example. Thus, in the terahertz device 10 of the present embodiment, the adjacent terahertz elements 20A and 20B are located closer to each other, and the adjacent terahertz elements 20B and 20C are located closer to each other as compared to the terahertz device 10X of the comparative example.

Advantages

The terahertz device 10 of the present embodiment has the following advantages.

(1-1) As viewed in the z-direction, the reflective film 82A and the reflective film 82B are smaller in the first direction, which is the arrangement direction of the antenna surfaces 81A to 81C or the arrangement direction of the reflective films 82A to 82C, than in the second direction, which differs from the first direction. In the present embodiment, the length LAY of the reflective film 82A and the length LBY of the reflective film 82B in the y-direction, which is the arrangement direction of the reflective films 82A to 82C, are less than the length LAX of the reflective film 82A and the length LBX of the reflective film 82B in the x-direction, which differs from the y-direction.

With this structure, the inter-element distance DE1 between the reception point P1 of the terahertz element 20A and the reception point P1 of the terahertz element 20B, which are located adjacent to each other in the first direction (in the present embodiment, the y-direction), is decreased as compared to that in a structure in which the length LAY of the reflective film 82A and the length LBY of the reflective film 82B are equal to the length LAX of the reflective film 82A and the length LBX of the reflective film 82B. This improves the resolution of the terahertz device 10 in the detection range of electromagnetic waves.

(1-2) As viewed from above, the arc-shaped circumference of the reflective film 82A includes the circumferential parts that connect the arc endpoints in the first direction (in the present embodiment, the y-direction). The circumferential parts are arc-shaped and have the central angles $\theta a1$ and $\theta a2$ that are less than 180°. As viewed from above, the circumferential parts of the reflective film 82B that connect the arc endpoints in the first direction are arc-shaped and have the central angles $\theta b1$ and $\theta b2$ that are less than 180°.

This structure allows the reflective film 82A and the reflective film 82B to have a relationship such that the length LAY of the reflective film 82A and the length LBY of the reflective film 82B are less than the length LAX of the reflective film 82A and the length LBY of the reflective film 82B, respectively, while the reflective film 82A and the reflective film 82B maintain a spherical shape having a fixed curvature.

(1-3) The gas cavity 92A defined by the antenna surface 81A and the dielectric 50 is continuous with the gas cavity 92B defined by the antenna surface 81B and the dielectric 50 in the interface between the reflective film 82A (the antenna surface 81A) and the reflective film 82B (the antenna surface 81B) in the first direction (in the present embodiment, the y-direction). This structure has the advantage (1-1) described above.

(1-4) In a cross-sectional view of the separate antenna base 70A cut along a plane extending in the y-direction and the z-direction through the center point P2 of the reflective film 82A and the center point P2 of the reflective film 82B, the part of the reflective film 82A connecting the opposite endpoints in the y-direction and the part of the reflective film 82B connecting the opposite endpoints in the y-direction are arc-shaped and respectively have the central angles $\theta z1$ and $\theta z2$ that are less than 180°.

This structure allows the reflective film 82A and the reflective film 82B to have a relationship such that the length LAY of the reflective film 82A and the length LBY of the reflective film 82B are less than the length LAX of the reflective film 82A and the length LBY of the reflective film 82B, respectively, while the reflective film 82A and the reflective film 82B maintain a spherical shape having a fixed curvature.

(1-5) As viewed in the z-direction, the open end 82Aa of the reflective film 82A and the open end 82Ba of the reflective film 82B extend linearly and define the interface between the reflective film 82A and the reflective film 82B.

This structure allows the reflective film 82A and the reflective film 82B to have a relationship such that the length LAY of the reflective film 82A and the length LBY of the reflective film 82B are less than the length LAX of the reflective film 82A and the length LBY of the reflective film 82B, respectively, while the reflective film 82A and the reflective film 82B maintain a spherical shape having a fixed curvature.

(1-6) As viewed in the z-direction, the reflective film 82B and the reflective film 82C are smaller in the first direction than in the second direction. In the present embodiment, the length LBY of the reflective film 82B and the length LCY of the reflective film 82C in the y-direction, which is the arrangement direction of the reflective films 82A to 82C, are less than the length LBX of the reflective film 82B and the length LCX of the reflective film 82C in the x-direction, which differs from the y-direction.

With this structure, the inter-element distance DE2 between the reception point P1 of the terahertz element 20B and the reception point P1 of the terahertz element 20C, which are located adjacent to each other in the first direction (in the present embodiment, the y-direction), is decreased as compared to that in a structure in which the length LBY of the reflective film 82B and the length LCY of the reflective film 82 are equal to the length LBX of the reflective film 82B and the length LCX of the reflective film 82C. This improves the resolution of the terahertz device 10 in the detection range of electromagnetic waves.

(1-7) In a cross-sectional view of the separate antenna base 70C cut along a plane extending in the y-direction and the z-direction through the center point P2 of the reflective film 82C, the part of the reflective film 82C connecting the opposite endpoints in the y-direction is arc-shaped and has the central angle $\theta z3$ of less than 180°.

This structure allows the reflective film 82C to have a relationship such that the length LCY of the reflective film 82C is less than the length LCX of the reflective film 82C while maintaining a spherical shape having a fixed curvature.

(1-8) As viewed in the z-direction, the open end 82Bb of the reflective film 82B and the open end 82Ca of the reflective film 82C extend linearly and define the interface between the reflective film 82B and the reflective film 82C.

This structure allows the reflective film 82C to have a relationship such that the length LCY of the reflective film 82C is less than the length LCX of the reflective film 82C while maintaining a spherical shape having a fixed curvature.

(1-9) The terahertz device 10 includes the dielectric 50 that is used as a retaining member coupled to the base main surface 71 of the separate antenna bases 70A to 70C. The dielectric 50 retains the terahertz elements 20A to 20C.

In this structure, the terahertz elements 20A to 20C are retained by the dielectric 50, that is, the common retaining member. Thus, the amount of work for coupling the dielectric 50 and the antenna base 70 is reduced as compared to a structure in which separate dielectrics, or separate retaining members, are arranged for the terahertz elements 20A to 20C.

(1-10) The terahertz device 10 includes the terahertz elements 20A to 20C configured to receive electromagnetic waves, the dielectric 50 formed from a dielectric material and surrounding the terahertz elements 20A to 20C, the gas cavities 92A to 92C containing gas, and the reflective films 82A to 82C defining the first to third reflective surfaces. The reflective film 82A includes a portion opposing the terahertz element 20A through the dielectric 50 and the gas cavity 92A. When electromagnetic waves propagate through the dielectric 50 and the gas cavity 92A, the reflective film 82A reflects the electromagnetic waves toward the reception point P1 of the terahertz element 20A. The reflective film 82B includes a portion opposing the terahertz element 20B through the dielectric 50 and the gas cavity 92B. When electromagnetic waves propagate through the dielectric 50 and the gas cavity 92B, the reflective film 82B reflects the electromagnetic waves toward the reception point P1 of the terahertz element 20B. The reflective film 82C includes a portion opposing the terahertz element 20C through the dielectric 50 and the gas cavity 92C. When electromagnetic waves propagate through the dielectric 50 and the gas cavity 92C, the reflective film 82C reflects the electromagnetic waves toward the reception point P1 of the terahertz element 20C. When the refractive index of the terahertz elements 20A to 20C is referred to as the element refractive index n1, the refractive index of gas contained in the gas cavities 92A to 92C is referred to as the gas refractive index n3, and the refractive index of the dielectric 50 is referred to as the dielectric refractive index n2, n1>n2>n3 is satisfied.

In this structure, the terahertz elements 20A to 20C are surrounded by the dielectric 50 having a refractive index that is greater than the gas refractive index n3 and less than the element refractive index n1. This reduces the changes in refractive index at the interface between the inside and the outside of the terahertz elements 20A to 20C. Thus, undue reflection of electromagnetic waves in the interface between the inside and the outside of the terahertz elements 20A to 20C is limited, and a number of resonance modes is less likely to be produced in the terahertz elements 20A to 20C. As a result, electromagnetic waves having a frequency other than the target frequency are less likely to be generated.

(1-11) The dielectric 50 includes the dielectric main surface 51 opposed to the reflective films 82A to 82C and the dielectric back surface 52 located opposite the dielectric main surface 51. The terahertz device 10 includes the separate antenna base 70A including the antenna surface 81A that is curved to be recessed in a direction away from the terahertz element 20A, the separate antenna base 70B including the antenna surface 81B that is curved to be recessed in a direction away from the terahertz element 20B, and the separate antenna base 70C including the antenna surface 81C that is curved to be recessed in a direction away from the terahertz element 20C. The reflective films 82A to 82C are formed on the antenna surfaces 81A to 81C. The gas cavities 92A to 92C are defined by the dielectric main surface 51 and the antenna surfaces 81A to 81C.

In this structure, since the gas cavities 92A to 92C are defined by the dielectric main surface 51 and the antenna surfaces 81A to 81C, electromagnetic waves transmitted out of the dielectric main surface 51 will travel through the gas cavities 92A to 92C and reach the reflective films 82A to 82C. This structure has the advantage (1-10) described above.

(1-12) The dielectric 50 and the antenna base 70 are formed separately. The terahertz device 10 includes the adhesive layer 91 as a fixing portion that fixes the dielectric 50 to the antenna base 70. In this structure, the adhesive layer 91 limits misalignment of the dielectric 50 with the antenna base 70, thereby limiting misalignment of the terahertz element 20A with the reflective film 82A, misalignment of the terahertz element 20B with the reflective film 82B, and misalignment of the terahertz element 20C with the reflective film 82C.

(1-13) The reflective film 82A is formed on the antenna surface 81A but is not formed on the base main surface 71 of the separate antenna base 70A. The reflective film 82B is formed on the antenna surface 81B but is not formed on the base main surface 71 of the separate antenna base 70B. The reflective film 82C is formed on the antenna surface 81C but is not formed on the base main surface 71 of the separate antenna base 70C.

This structure obviates reflection of electromagnetic waves by the reflective films 82A to 82C formed on the base main surfaces 71 of the separate antenna bases 70A to 70C. Thus, disadvantages caused by unwanted reflection waves, for example, occurrence of unwanted standing waves, are limited.

(1-14) The reflective films 82A to 82C are each parabolic-antenna-shaped. With this structure, electromagnetic waves are appropriately reflected toward the reception points P1 of the terahertz elements 20A to 20C.

(1-15) The reflective films 82A to 82C are electrically isolated. This structure obviates disadvantages such as absorption of electromagnetic waves by the reflective films 82A to 82C.

(1-16) The separate antenna bases 70A to 70C are formed of an insulative material. This structure obviates electrical connection of the reflective films 82A to 82C with another member through the separate antenna bases 70A to 70C.

(1-17) The terahertz device 10 includes the conductive portions 110A, 120A, 110B, 120B, 110C, and 120C, which are disposed in the dielectric 50 and are electrically connected to the terahertz elements 20. In this structure, the conductive portions 110A, 120A, 110B, 120B, 110C, and 120C are less likely to contact the reflective films 82A to 82C disposed outside the dielectric 50. This obviates electrical connection of the conductive portions 110A, 120A, 110B, 120B, 110C, and 120C with the reflective films 82A to 82C.

(1-18) The dielectric 50 includes the projections 61 and 62 projecting sideward beyond the antenna base 70 as viewed in the z-direction. The electrodes 101A, 102A, 101B, 102B, 101C, and 102C are formed on the overhang surfaces 51*a* and 51*b*, which are the portions of the dielectric main surface 51 corresponding to the projections 61 and 62, and are electrically connected to the conductive portions 110A, 120A, 110B, 120B, 110C, and 120C. In this structure, the terahertz elements 20A to 20C are electrically connected to an external device by the electrodes 101A, 102A, 101B, 102B, 101C, and 102C and the conductive portions 110A, 120A, 110B, 120B, 110C, and 120C.

(1-19) Each of the terahertz elements 20A to 20C includes the pads 33*a* and 34*a* formed on the element main surface 21. As viewed in the z-direction, the conductive portions 110A, 120A, 110B, 120B, 110C, and 120C extend in the x-direction, which is the projection direction of the projections 61 and 62, to overlap both the terahertz elements 20A to 20C and the electrodes 101A, 102A, 101B, 102B, 101C, and 102C. The conductive portions 110A, 120A, 110B, 120B, 110C, and 120C include the pads 33*a* and 34*a* opposed to the element opposing parts 111 and 121 in the z-direction. The terahertz elements 20A to 20C are flip-chip-mounted on the element opposing parts 111 and 121 via the bumps 114 and 124, which are disposed between the pads 33*a* and 34*a* and the element opposing parts 111 and 121 of the conductive portions 110A, 120A, 110B, 120B, 110C, and 120C. Thus, the terahertz elements 20A to 20C are electrically connected to the electrodes 101A, 102A, 101B, 102B, 101C, and 102C.

In particular, since flip-chip-mounting is used as the mode for mounting the terahertz elements 20A to 20C, transmission speed of signals may be increased as compared to wire-bonding-mounting. More specifically, when wire-bonding-mounting is used in a high frequency band, that is, the terahertz band of electromagnetic waves, the wires may be disadvantageous and limit transmission speed of signals. The above disadvantage will not occur in the flip-chip-mounting, which does not use wires. Therefore, transmission speed of signals may be increased.

(1-20) The conductive portions 110A and 120A include the electrode opposing parts 112 and 122, which are opposed to the electrodes 101A and 102A, and the connectors 113 and 123, which extend in the x-direction and connect the element opposing parts 111 and 121 to the electrode opposing parts 112 and 122. When the width-wise direction of the conductive portions 110A and 120A extends in the y-direction, at least part of the connectors 113 and 123 has a smaller width than the element opposing parts 111 and 121. In this structure, since the connectors 113 and 123 partially or entirely overlap the reflective film 82A, the connectors 113 and 123 may block electromagnetic waves (hereafter, may be referred to as blocking).

In this regard, in the present embodiment, at least part of the connectors 113 and 123 has a smaller width than the element opposing parts 111 and 121. This reduces the area that is blocked. Thus, the blocking is reduced.

In addition, the element opposing parts 111 and 121 have a larger width than the connectors 113 and 123. This increases the area of contact. Thus, the pads 33*a* and 34*a* are electrically connected to the element opposing parts 111 and 121 by the bumps 114 and 124 in a preferred manner.

In the same manner as the conductive portions 110A and 120A, the conductive portions 110B, 120B, 110C, and 120C include the electrode opposing parts 112 and 122 and the connectors 113 and 123. Therefore, in the same manner as the conductive portions 110A and 120A, the blocking is reduced, and the pads 33*a* and 34*a* are electrically connected to the element opposing parts 111 and 121 by the bumps 114 and 124 in a preferred manner.

(1-21) The electrode opposing parts 112 and 122 of the conductive portions 110A and 120A have a smaller width than the connectors 113 and 123. With this structure, the area of contact is increased. Thus, the electrode opposing parts 112 and 122 are electrically connected to the electrodes 101A and 102A in a preferred manner. Also, the electrode opposing parts 112 and 122 of the conductive portions 110B, 120B, 110C, and 120C have a smaller width than the connectors 113 and 123. Thus, the same advantage is obtained.

(1-22) The first connector 113 includes the first connector body 113*a*, which has a smaller width than the first element opposing part 111, and the first element tapered part 113*b*, which joins the first connector body 113*a* to the first element opposing part 111. The width of the first element tapered part 113*b* is gradually increased from the first connector body 113*a* toward the first element opposing part 111. This structure reduces reflection waves generated in the first conductive portions 110A to 110C. The same applies to the second connector 123.

(1-23) The first connector body 113*a* has a smaller width than the first electrode opposing part 112. The first connector 113 includes the first electrode tapered part 113*c*, which joins the first connector body 113*a* and the first electrode opposing part 112. The width of the first electrode tapered part 113*c* is gradually increased from the first connector body 113*a* toward the first electrode opposing part 112. This structure reduces reflection waves generated in the first conductive portions 110A to 110C. The same applies to the second connector 123.

(1-24) The first pad 33*a* and the first element opposing part 111 extend in the x-direction. The first bumps 114 are arranged in the x-direction. In the same manner, the second pad 34*a* and the second element opposing part 121 extend in the x-direction. The second bumps 124 are arranged in the x-direction. This increase the area of contact, thereby reducing contact resistance.

When the pads 33*a* and 34*a* are arranged separated in the y-direction, if the pads 33*a* and 34*a* extend in the y-direction, the distance between the pads 33*a* and 34*a* will be decreased. This may form a short circuit and hinder the propagation of electromagnetic waves caused by interference of the pads 33*a* and 34*a* with the reception point P1. In the present embodiment, the pads 33*a* and 34*a* extend in the x-direction, which is orthogonal to the opposing direction of the pads 33*a* and 34*a*. Thus, the above disadvantages are not likely to occur.

Second Embodiment

A second embodiment of a terahertz device 10 will be described with reference to FIGS. 35 to 45. The present embodiment of the terahertz device 10 mainly differs from the first embodiment of the terahertz device 10 in the structure of the antenna base 70. In the description below, the same reference characters are given to those components that are the same as the corresponding components of the terahertz device 10 of the first embodiment. Such components may not be described in detail. Although the structure of the antenna base 70 differs from the structure of the antenna base 70 of the first embodiment, separate antenna bases of the present embodiment are denoted by 70A, 70B, 70C, and so on and distinguished from each other.

Figure 35:
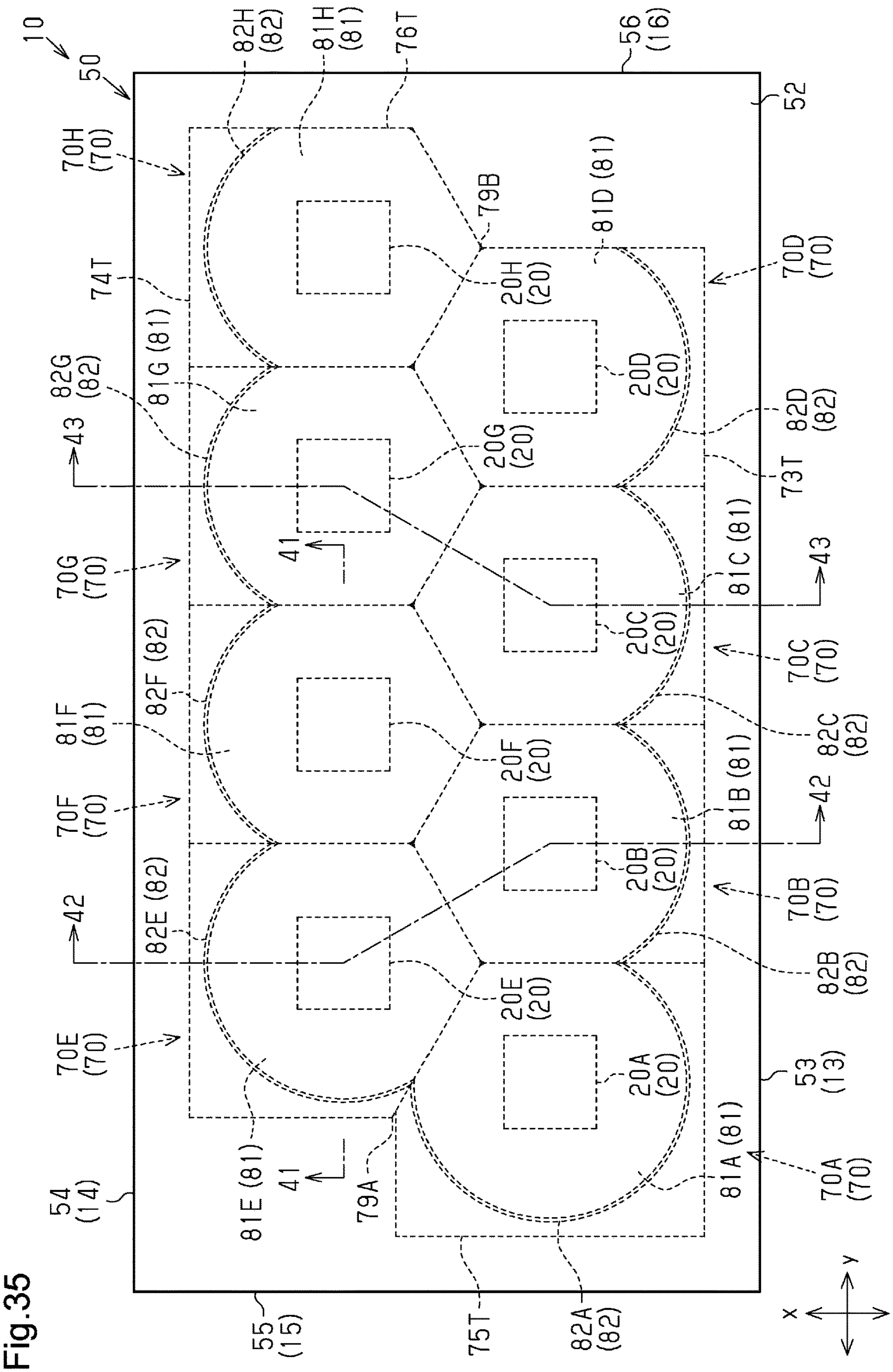
FIG. 35 is a plan view showing a second embodiment of a terahertz device.
Figure 41:
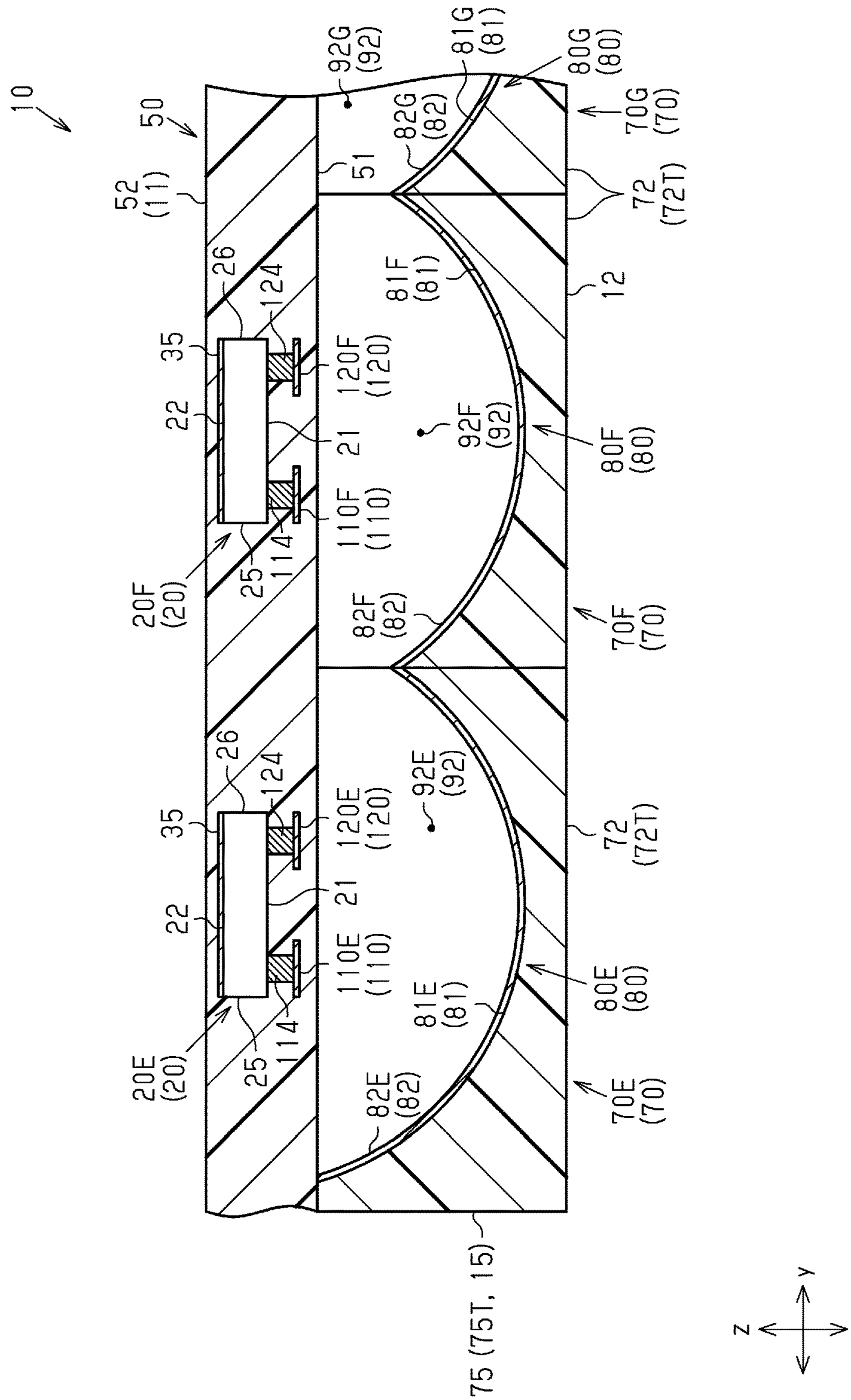
FIG. 41 is a cross-sectional view of the terahertz device shown in FIG. 35 taken along line 41-41.

As shown in FIGS. 35 and 41, the terahertz device 10 includes multiple (in the present embodiment, eight) terahertz elements 20, a dielectric 50, which is an example of a retaining member, an antenna base 70, a reflective film 82, and a gas cavity 92.

As shown in FIG. 35, the terahertz elements 20 include a terahertz element 20A, a terahertz element 20B, a terahertz element 20C, a terahertz element 20D, a terahertz element 20E, a terahertz element 20F, a terahertz element 20G and a terahertz element 20H. The terahertz elements 20A to 20H are identical to each other in structure and have the same structure of the terahertz element 20 of the first embodiment.

Figure 42:
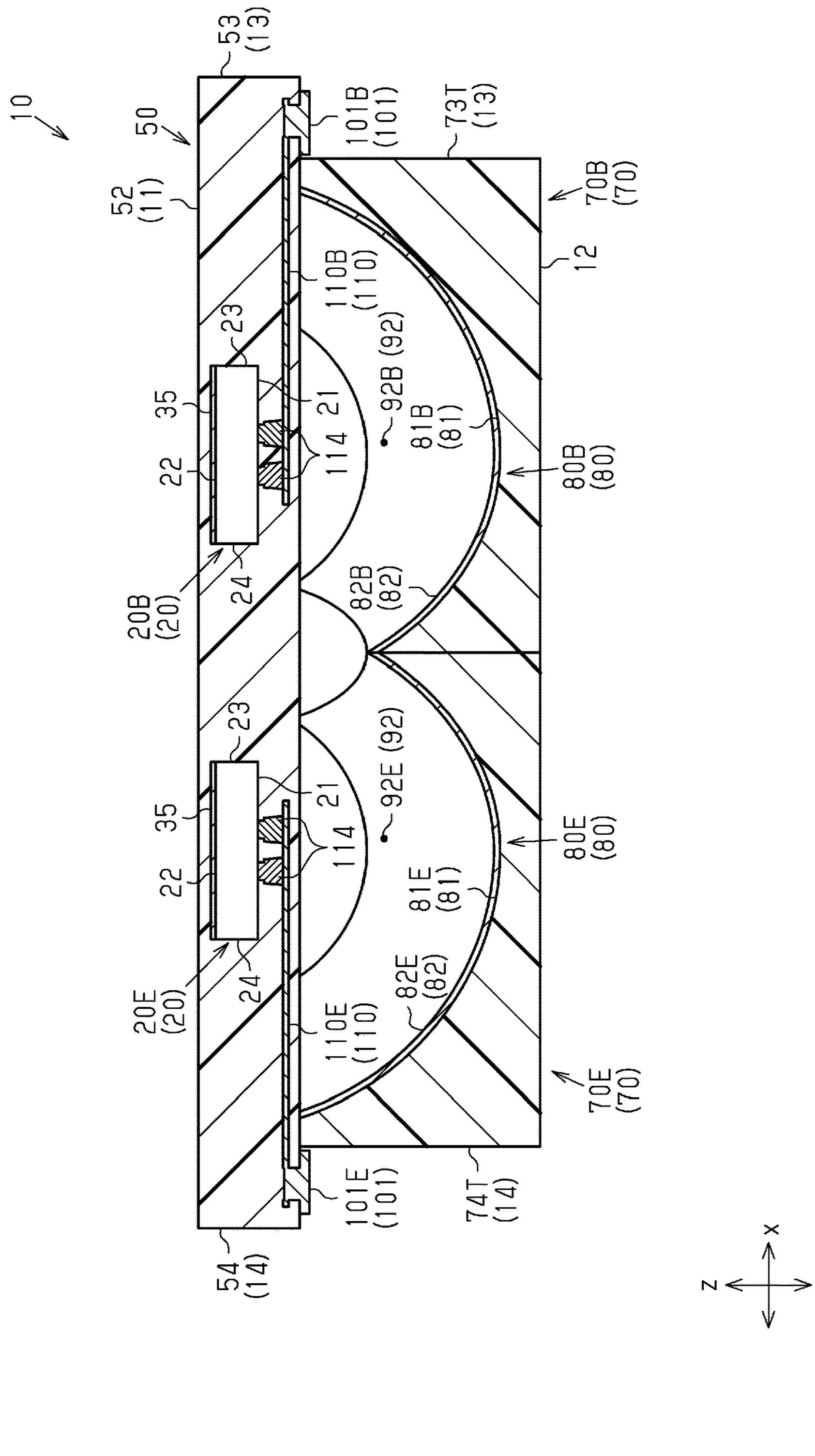
FIG. 42 is a cross-sectional view of the terahertz device shown in FIG. 35 taken along line 42-42.

The dielectric 50 surrounds the terahertz elements 20. As shown in FIGS. 41 and 42, the dielectric 50 entirely surrounds the terahertz element 20E and covers the element main surface 21, the element back surface 22, and the element side surfaces 23 to 26 of the terahertz element 20E.

The element main surface 21, the element back surface 22, and the element side surfaces 23 to 26 of the terahertz element 20E are in contact with the dielectric 50. More specifically, in the same manner as the first embodiment, the present embodiment of the dielectric 50 surrounds the terahertz element 20E so as not to include any gap between the dielectric 50 and the terahertz element 20E. In other words, the dielectric 50 encapsulates the terahertz element 20E.

Although not shown, in the same manner as the terahertz element 20E, the dielectric 50 entirely surrounds the terahertz elements 20A to 20D and 20F to 20H and covers the element main surface 21, the element back surface 22, and the element side surfaces 23 to 26 of each of the terahertz elements 20A to 20D and 20F to 20H. That is, the dielectric 50 encapsulates the terahertz elements 20A to 20D and 20F to 20H.

As shown in FIG. 35, in an example, the dielectric 50 has the form of a plate in which the thickness-wise direction extends in the z-direction. Specifically, the dielectric 50 has the form of a rectangular plate such that the longitudinal direction extends in the y-direction and the lateral direction extends in the x-direction. The dielectric 50 is configured to cover the entirety of the antenna base 70 from above. In the present embodiment, the dielectric 50 projects from opposite sides of the antenna base 70 in the x-direction and opposite sides of the antenna base 70 in the y-direction.

As shown in FIGS. 41 and 42, the dielectric 50 includes a dielectric main surface 51 and a dielectric back surface 52 that intersect the z-direction. In an example, the dielectric main surface 51 and the dielectric back surface 52 are orthogonal to the z-direction. The dielectric main surface 51 faces downward. The dielectric back surface 52 is a surface opposite the dielectric main surface 51 and faces upward. In the present embodiment, the dielectric back surface 52 defines the device main surface 11.

As shown in FIG. 35, the dielectric 50 includes a first dielectric side surface 53 and a second dielectric side surface 54, which are opposite end surfaces in the x-direction, and a third dielectric side surface 55 and a fourth dielectric side surface 56, which are opposite end surfaces in the y-direction. The dielectric side surfaces 53 to 56 partially define the device side surfaces 13 to 16. In the present embodiment, the first dielectric side surface 53 and the second dielectric side surface 54 are orthogonal to the third dielectric side surface 55 and the fourth dielectric side surface 56.

As shown in FIGS. 41 and 42, in the same manner as the first embodiment, the terahertz element 20E is arranged in the dielectric 50 such that the element main surface 21 faces the dielectric main surface 51. The terahertz element 20E is disposed between the dielectric main surface 51 and the dielectric back surface 52. In the same manner as the first embodiment, the dielectric 50 of the present embodiment has a dielectric thickness D2, which is a dimension in the z-direction. The dielectric thickness D2 is set to satisfy the resonance condition of electromagnetic waves received by the terahertz element 20E. In the same manner as the terahertz element 20E, the terahertz elements 20A to 20D and 20F to 20H are also disposed in the dielectric 50.

As shown in FIG. 35, the terahertz element 20A, the terahertz element 20B, the terahertz element 20C, and the terahertz element 20D are aligned with each other in the x-direction and are separate from each other in the y-direction.

The terahertz element 20E, the terahertz element 20F, the terahertz element 20G, and the terahertz element 20H are aligned with each other in the x-direction and are separate from each other in the y-direction. In the present embodiment, a pitch between the terahertz elements 20E to 20H (inter-element distance) in the y-direction is equal to a pitch between the terahertz elements 20A to 20D (inter-element distance) in the y-direction. It is considered that the pitch between the terahertz elements 20E to 20H in the y-direction is equal to the pitch between the terahertz elements 20A to 20D in the y-direction, for example, when the difference between an average value of pitches between the terahertz elements 20E to 20H in the y-direction and an average value of pitches between the terahertz elements 20A to 20D in the y-direction is within 5% of the average value of the pitches between the terahertz elements 20A to 20D in the y-direction. The pitch (inter-element distance) in the y-direction refers to the distance between the reception points P1 of the terahertz elements 20 located adjacent in the y-direction.

The terahertz elements 20A to 20D are disposed separated from the terahertz elements 20E to 20H in the x-direction. In the present embodiment, the terahertz elements 20A to 20D are located closer to the first dielectric side surface 53 than the terahertz elements 20E to 20H.

The terahertz elements 20A to 20D and the terahertz elements 20E to 20H are separate in the x-direction and disposed at different positions in the y-direction. In the present embodiment, as viewed from above, the terahertz elements 20A to 20D and the terahertz elements 20E to 20H are alternately disposed in the y-direction. The terahertz elements 20A to 20D are located closer to the third dielectric side surface 55 than the terahertz elements 20E to 20H. More specifically, the terahertz element 20A is located closer to the third dielectric side surface 55 than the terahertz element 20E in the y-direction. The terahertz element 20B is disposed between the terahertz element 20E and the terahertz element 20F in the y-direction. The terahertz element 20C is disposed between the terahertz element 20F and the terahertz element 20G in the y-direction. The terahertz element 20D is disposed between the terahertz element 20G and the terahertz element 20H in the y-direction.

Figure 36:
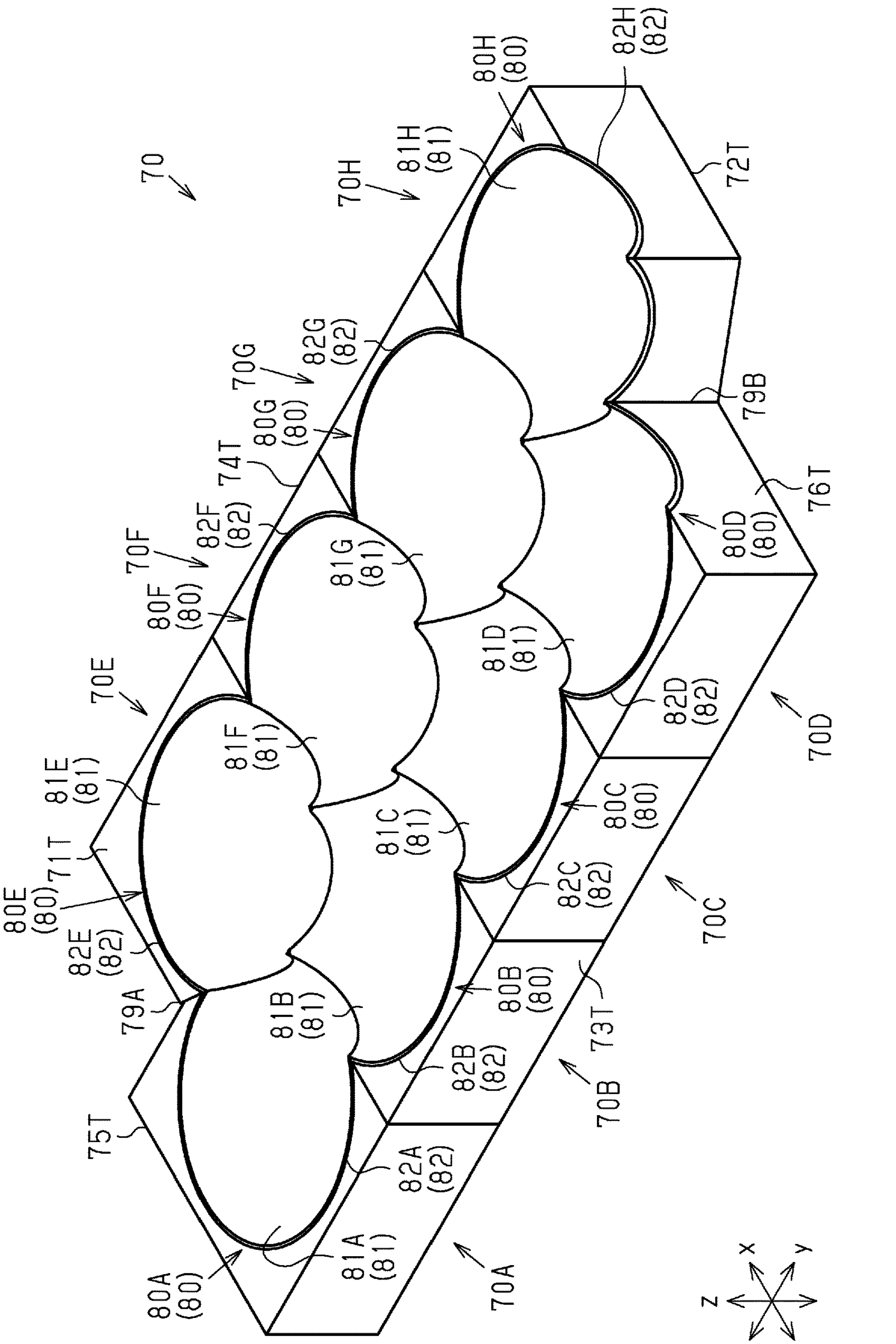
FIG. 36 is a perspective view of an antenna base of the terahertz device shown in FIG. 35 as viewed from above.
Figure 37:
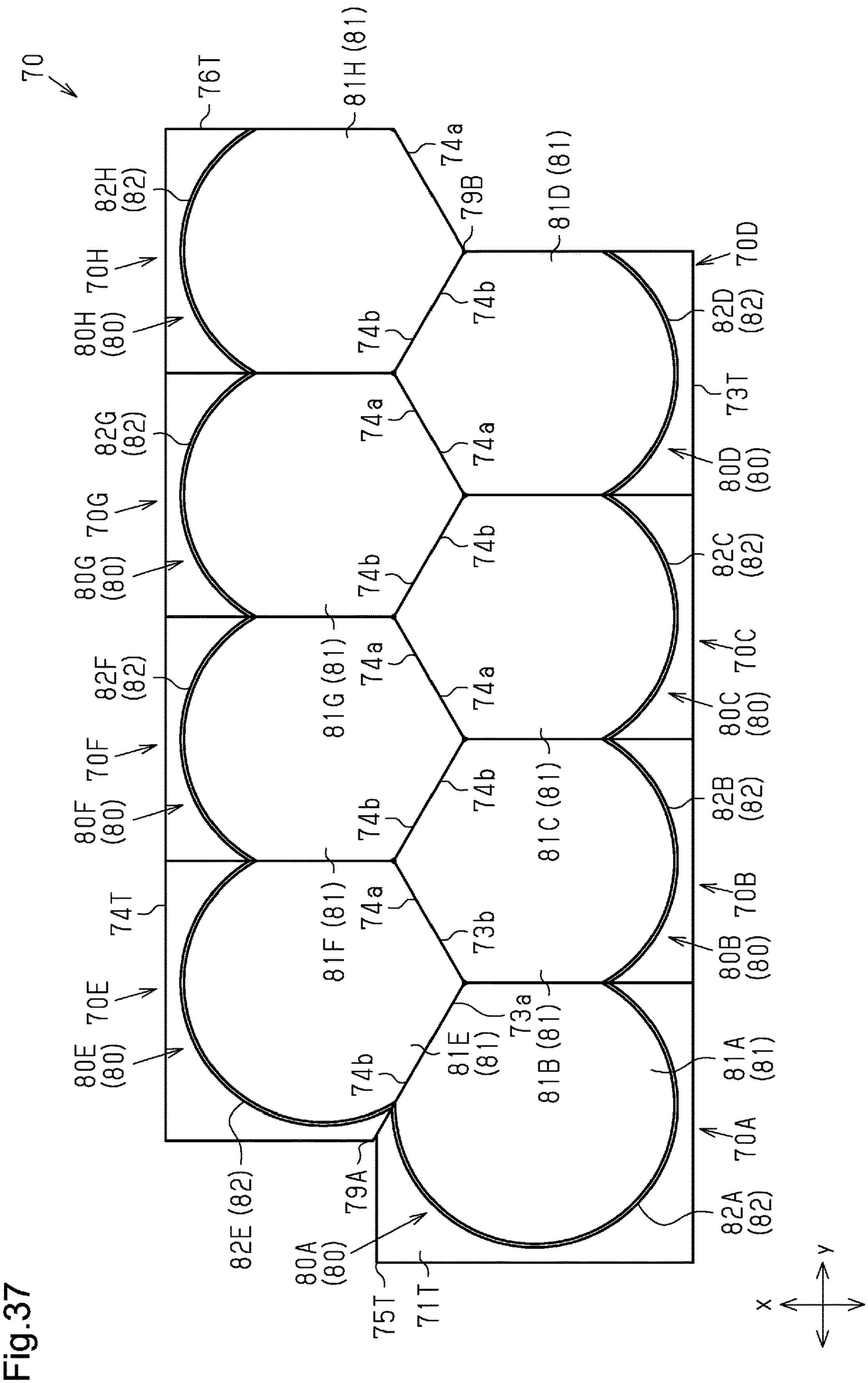
FIG. 37 is a plan view of the antenna base shown in FIG. 36.

As shown in FIGS. 36 and 37, in the present embodiment, as viewed from above, the antenna base 70 is substantially rectangular so that the longitudinal direction extends in the y-direction and the lateral direction extends in the x-direction. More specifically, the antenna base 70 includes a first step 79A and a second step 79B separately disposed on opposite ends of the antenna base 70 in the y-direction. The first step 79A is disposed on the third base side surface 75T of the antenna base 70. The second step 79B is disposed on the fourth base side surface 76T of the antenna base 70. The first step 79A is disposed so that a portion of the third base side surface 75T located toward the first base side surface 73T is arranged closer to the first dielectric side surface 53 of the dielectric 50 than a portion of the third base side surface 75T located toward the second base side surface 74T. The second step 79B is disposed so that a portion of the fourth base side surface 76T located toward the first base side surface 73T is arranged closer to the first dielectric side surface 53 than a portion of the fourth base side surface 76T located toward the second base side surface 74T. Thus, the first base side surface 73T of the antenna base 70 is disposed closer to the first dielectric side surface 53 than the second base side surface 74T in the y-direction.

The present embodiment of the antenna base 70 is formed of, for example, an insulative material in the same manner as the first embodiment of the antenna base 70. Specifically, the antenna base 70 is formed of a dielectric, for example, a synthetic resin such as an epoxy resin. An example of the epoxy resin is a glass epoxy resin. However, the material of the antenna base 70 is not limited to this and may be any material, for example, Si, Teflon®, or glass. The antenna base 70 may have any color and may be black.

In the present embodiment, the antenna base 70 includes a combination of multiple (in the present embodiment, eighth) separate antenna bases 70A to 70H. More specifically, the antenna base 70 includes the separate antenna bases 70A to 70D and the separate antenna bases 70E to 70H.

The separate antenna bases 70A to 70D include the first base side surface 73T and are arranged in the y-direction. The separate antenna base 70A includes the third base side surface 75T. The separate antenna base 70D includes the fourth base side surface 76T. The separate antenna base 70B abuts the separate antenna base 70A and the separate antenna base 70C. In other words, the separate antenna base 70B is sandwiched between the separate antenna base 70A and the separate antenna base 70C. The separate antenna base 70C abuts the separate antenna base 70B and the separate antenna base 70D. In other words, the separate antenna base 70C is sandwiched between the separate antenna base 70B and the separate antenna base 70D.

The separate antenna bases 70E to 70H include the second base side surface 74T and are arranged in the y-direction. The separate antenna base 70E includes the third base side surface 75T. Thus, the third base side surface 75T is defined by the separate antenna base 70A and the separate antenna base 70E. The separate antenna base 70H includes the fourth base side surface 76T. Thus, the fourth base side surface 76T is defined by the separate antenna base 70D and the separate antenna base 70H. The separate antenna base 70F abuts the separate antenna base 70E and the separate antenna base 70G. In other words, the separate antenna base 70F is sandwiched between the separate antenna base 70E and the separate antenna base 70G. The separate antenna base 70G abuts the separate antenna base 70F and the separate antenna base 70H. In other words, the separate antenna base 70G is sandwiched between the separate antenna base 70F and the separate antenna base 70H.

In the present embodiment, the separate antenna bases 70A to 70D and the separate antenna bases 70E to 70H are located at different positions in the y-direction. More specifically, as viewed in the x-direction, the separate antenna base 70A overlaps the separate antenna bases 70E and 70F, the separate antenna base 70B overlaps the separate antenna bases 70F and 70G, and the separate antenna base 70C overlaps the separate antenna bases 70G and 70H. Specifically, in the y-direction, the separate antenna base 70A is disposed closer to the third base side surface 75T than the separate antenna base 70E and closer to the fourth base side surface 76T than the separate antenna base 70F. The separate antenna base 70A is in contact with the separate antenna base 70E. The separate antenna base 70B is disposed closer to the third base side surface 75T than the separate antenna base 70F and closer to the fourth base side surface 76T than the separate antenna base 70G. The separate antenna base 70B is in contact with the separate antenna bases 70E and 70F. The separate antenna base 70C is disposed closer to the third base side surface 75T than the separate antenna base 70G and closer to the fourth base side surface 76T than the separate antenna base 70H. The separate antenna base 70C is in contact with the separate antenna bases 70F and 70G. The separate antenna base 70H is disposed closer to the third base side surface 75T than the separate antenna base 70D. The separate antenna base 70D is in contact with the separate antenna bases 70G and 70H.

As shown in FIG. 35, the separate antenna base 70A is positioned to be opposed to the terahertz element 20A in the thickness-wise direction of the terahertz element 20A (the z-direction). The separate antenna base 70B is positioned to be opposed to the terahertz element 20B in the thickness-wise direction of the terahertz element 20B (the z-direction). The separate antenna base 70C is positioned to be opposed to the terahertz element 20C in the thickness-wise direction of the terahertz element 20C (the z-direction). The separate antenna base 70D is positioned to be opposed to the terahertz element 20D in the thickness-wise direction of the terahertz element 20D (the z-direction). The separate antenna base 70E is positioned to be opposed to the terahertz element 20E in the thickness-wise direction of the terahertz element 20E (the z-direction). The separate antenna base 70F is positioned to be opposed to the terahertz element 20F in the thickness-wise direction of the terahertz element 20F (the z-direction). The separate antenna base 70G is positioned to be opposed to the terahertz element 20G in the thickness-wise direction of the terahertz element 20G (the z-direction). The separate antenna base 70H is positioned to be opposed to the terahertz element 20H in the thickness-wise direction of the terahertz element 20H (the z-direction). In the present embodiment, the separate antenna bases 70A to 70H are disposed at a position lower than the terahertz elements 20A to 20H.

Figure 43:
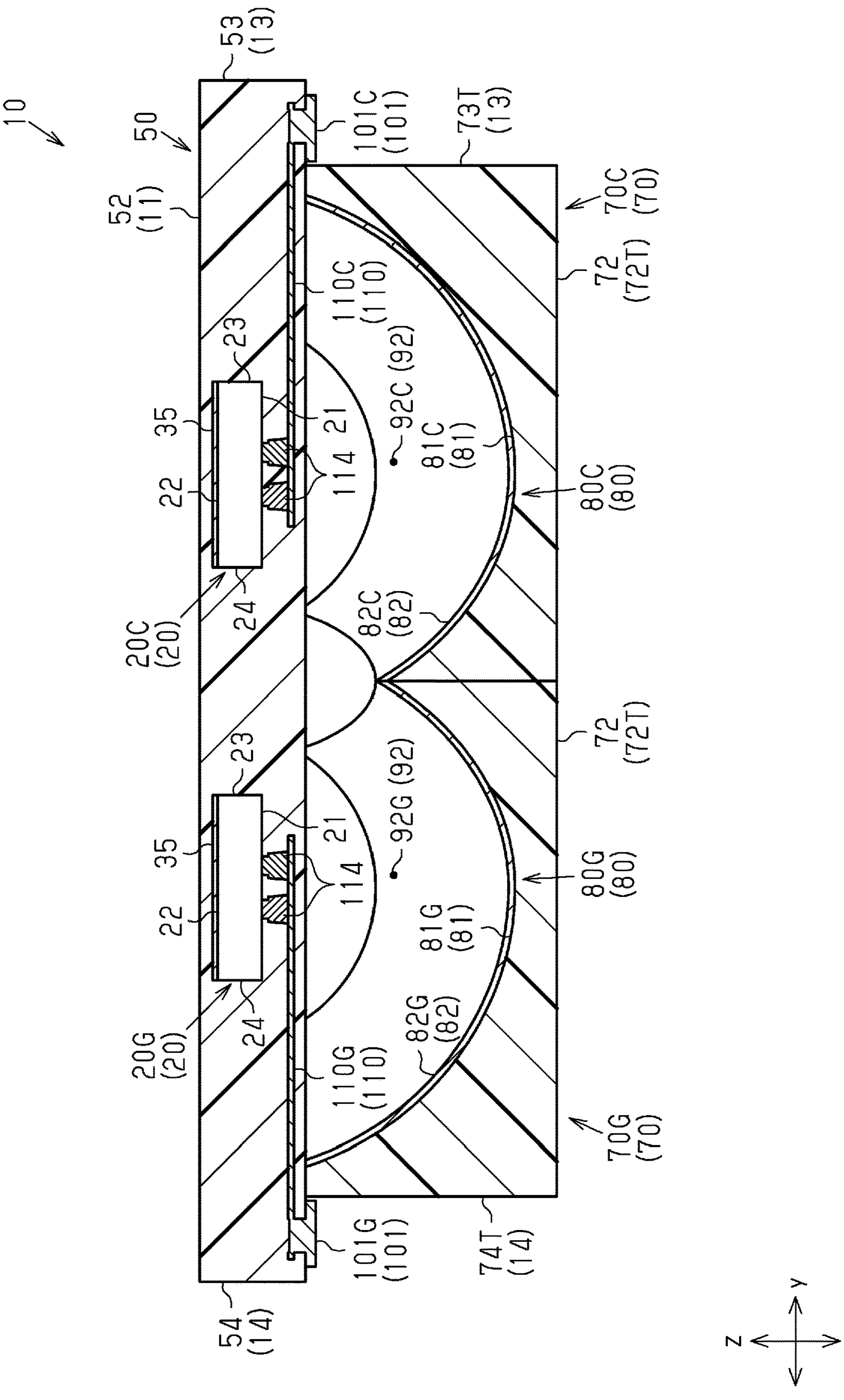
FIG. 43 is a cross-sectional view of the terahertz device shown in FIG. 35 taken along line 43-43.

As shown in FIGS. 41 to 43, in the same manner as the first embodiment, the antenna base 70 includes antenna recesses 80 that are recessed from the base main surface 71T toward the base back surface 72T. Specifically, as shown in FIGS. 36 and 37, in the present embodiment, the separate antenna base 70A includes an antenna recess 80A, the separate antenna base 70B includes an antenna recess 80B, the separate antenna base 70C includes an antenna recess 80C, the separate antenna base 70D includes an antenna recess 80D, the separate antenna base 70E includes an antenna recess 80E, the separate antenna base 70F includes an antenna recess 80F, the separate antenna base 70G includes an antenna recess 80G, and the separate antenna base 70H includes an antenna recess 80H. That is, the antenna base 70 includes one antenna recess 80 for each separate antenna base.

As shown in FIGS. 41 to 43, in the same manner as the first embodiment, each antenna recess 80 includes an antenna surface 81 opposed to the terahertz element 20 through the dielectric 50 and the gas cavity 92. Specifically, as shown in FIGS. 36 and 37, in the present embodiment, the antenna recess 80A includes an antenna surface 81A, the antenna recess 80B includes an antenna surface 81B, the antenna recess 80C includes an antenna surface 81C, and the antenna recess 80D includes an antenna surface 81D. The antenna recess 80E includes an antenna surface 81E. The antenna recess 80F includes an antenna surface 81F. The antenna recess 80G includes an antenna surface 81G. The antenna recess 80H includes an antenna surface 81H. As viewed from above, the antenna surfaces 81A to 81H are identical in shape to the openings of the antenna recesses 80A to 80H, respectively.

As shown in FIGS. 41 to 43, in the same manner as the first embodiment, the reflective film 82 is formed on the antenna surface 81. The reflective film 82 is formed on the entire antenna surface 81. The reflective film 82 is not formed on the base main surface 71T. Thus, the reflective film 82 is substantially identical in shape to the antenna surface 81. The reflective film 82 is formed from the same material as the first embodiment of the reflective film 82.

The reflective film 82 includes the reflective film 82A formed on the antenna surface 81A, the reflective film 82B formed on the antenna surface 81B, the reflective film 82C formed on the antenna surface 81C, the reflective film 82D formed on the antenna surface 81D, the reflective film 82E formed on the antenna surface 81E, the reflective film 82F formed on the antenna surface 81F, the reflective film 82G formed on the antenna surface 81G, and the reflective film 82H formed on the antenna surface 81H. In the present embodiment, the reflective films 82A to 82H are integrally formed to be a single component.

The reflective film 82A is substantially identical in shape to the antenna surface 81A. The reflective film 82B is substantially identical in shape to the antenna surface 81B. The reflective film 82C is substantially identical in shape to the antenna surface 81C. The reflective film 82D is substantially identical in shape to the antenna surface 81D. The reflective film 82E is substantially identical in shape to the antenna surface 81E. The reflective film 82F is substantially identical in shape to the antenna surface 81F. The reflective film 82G is substantially identical in shape to the antenna surface 81G. The reflective film 82H is substantially identical in shape to the antenna surface 81H. In other words, each of the reflective films 82A to 82H is a parabolic reflector and is curved to be bowl-shaped. As viewed from above, each of the reflective films 82A to 82H has the form of a circle that is partially cut away. Each of the reflective films 82A to 82H is curved to project toward the device back surface 12. The reflective film 82 is open in one direction (in the present embodiment, upward).

As shown in FIGS. 41 to 43, the reflective film 82 and the dielectric 50 are opposed to each other in the z-direction. In other words, the reflective film 82 is disposed to be opposed to the dielectric 50.

Electromagnetic waves reflected by the reflective film 82 are emitted toward the reception point P1. Specifically, electromagnetic waves reflected by the reflective film 82A are emitted toward the reception point P1 of the terahertz element 20A. Electromagnetic waves reflected by the reflective film 82B are emitted toward the reception point P1 of the terahertz element 20B. Electromagnetic waves reflected by the reflective film 82C are emitted toward the reception point P1 of the terahertz element 20C. Electromagnetic waves reflected by the reflective film 82D are emitted toward the reception point P1 of the terahertz element 20D. Electromagnetic waves reflected by the reflective film 82E are emitted toward the reception point P1 of the terahertz element 20E. Electromagnetic waves reflected by the reflective film 82F are emitted toward the reception point P1 of the terahertz element 20F. Electromagnetic waves reflected by the reflective film 82G are emitted toward the reception point P1 of the terahertz element 20G. Electromagnetic waves reflected by the reflective film 82H are emitted toward the reception point P1 of the terahertz element 20H.

The positional relationship of the reflective film 82 with the terahertz element 20 is the same as the first embodiment. Also, the size relationship of the reflective film 82 and the terahertz element 20 is the same as the first embodiment. Thus, as viewed from above, the reflective films 82A to 82H are larger than the terahertz elements 20A to 20H, respectively.

The antenna base 70 and the dielectric 50 are fixed by the adhesive layer 91 in the same manner as the first embodiment. The adhesive layer 91 is configured not to extend inward (in other words, toward the terahertz element 20) beyond the reflective film 82.

Figure 38:
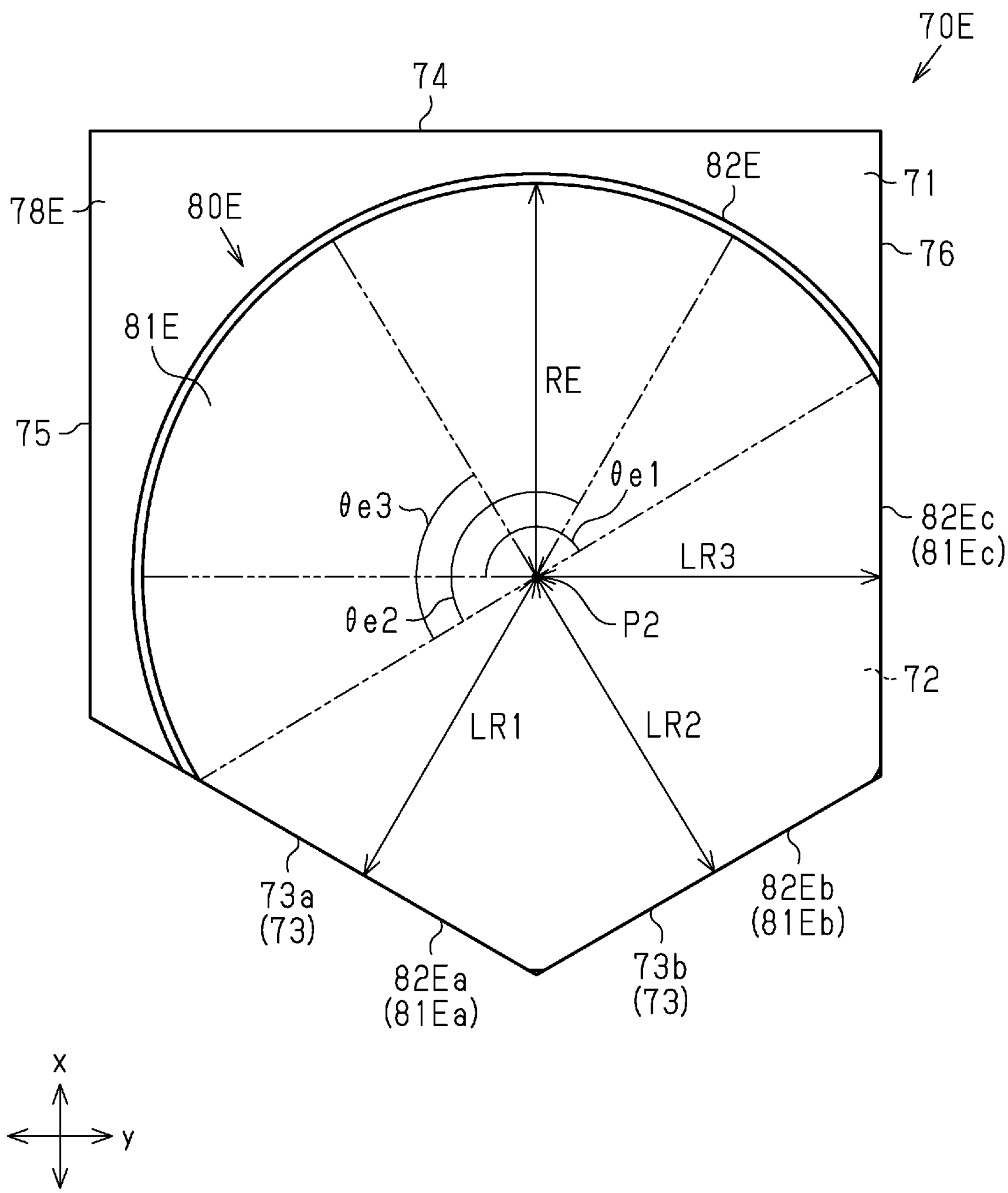
FIG. 38 is a plan view showing one type of separate antenna bases forming the antenna base shown in FIG. 37.
Figure 39:
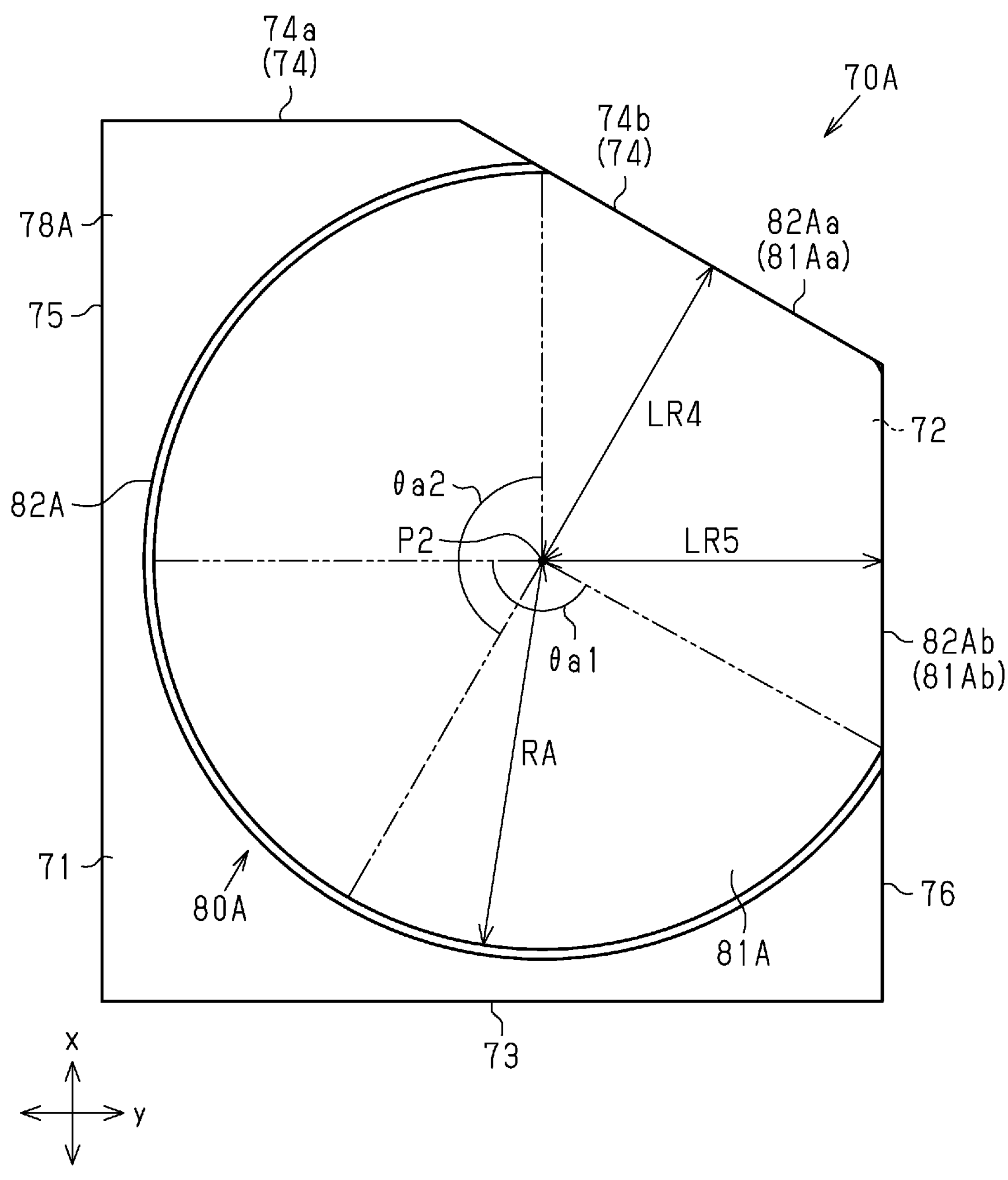
FIG. 39 is a plan view showing another type of separate antenna bases forming the antenna base shown in FIG. 37.
Figure 40:
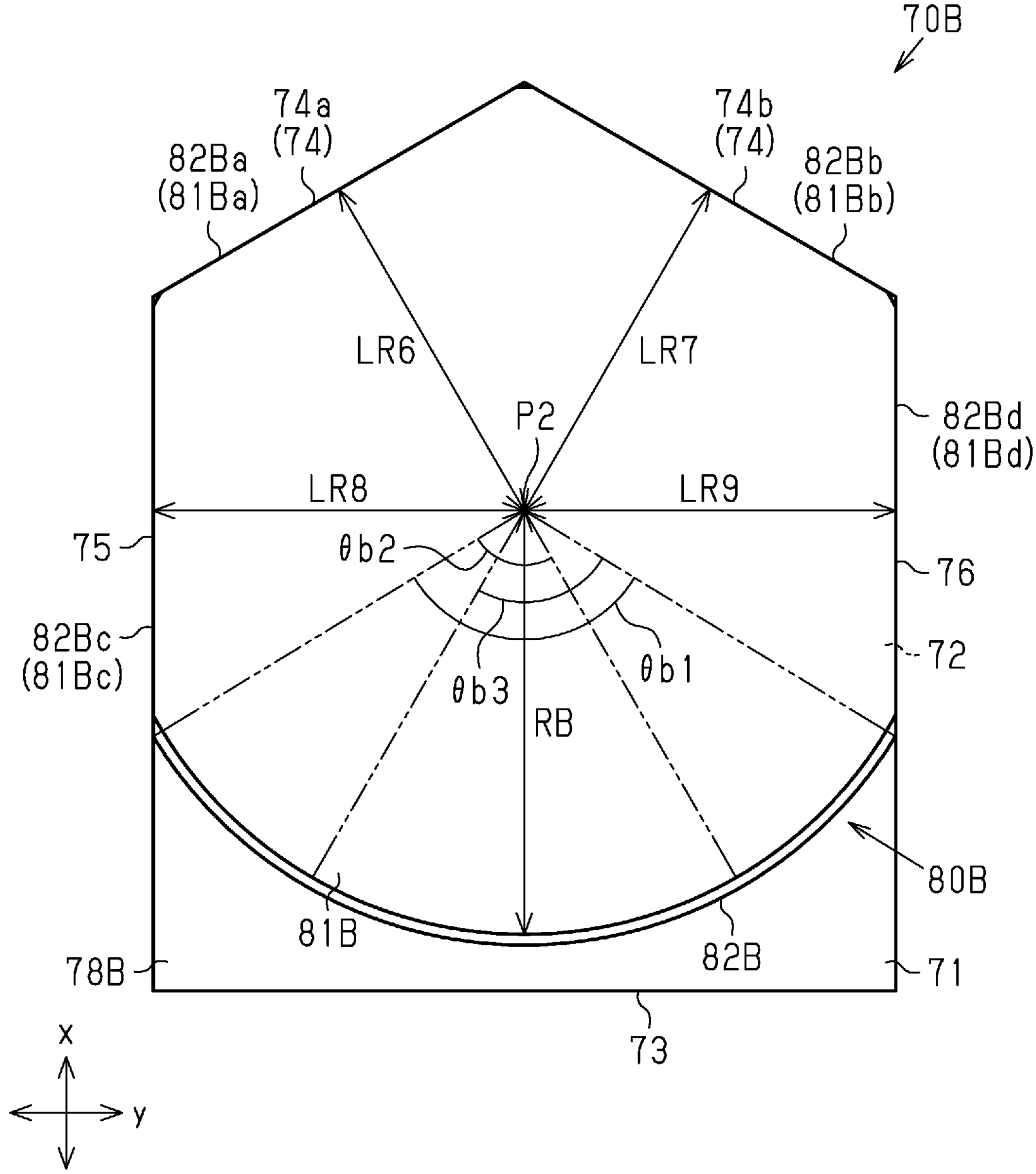
FIG. 40 is a plan view showing a further type of separate antenna bases forming the antenna base shown in FIG. 37.

As shown in FIGS. 38 to 40, in the present embodiment, three types of separate antenna bases are used in the antenna base 70.

As shown in FIG. 38, the separate antenna base 70E includes a base main surface 71 and a base back surface 72 that intersect the z-direction. The base main surface 71 and the base back surface 72 intersect the z-direction. In the present embodiment, the base main surface 71 and the base back surface 72 are orthogonal to the z-direction. As viewed in the z-direction, the base main surface 71 and the base back surface 72 are each pentagonal. In the present embodiment, the base main surface 71 and the base back surface 72 are, for example, identical in shape. However, the base main surface 71 and the base back surface 72 may have different shapes.

The separate antenna base 70E includes a first base side surface 73, a second base side surface 74, a third base side surface 75, and a fourth base side surface 76 as base side surfaces. The base side surfaces 73 to 76 are surfaces of the terahertz device 10 (the antenna base 70) facing sideward. The base side surfaces 73 to 76 are disposed in directions orthogonal to the opposing direction of the base main surface 71 and the base back surface 72. The base side surfaces 73 to 76 join the base main surface 71 and the base back surface 72.

The third base side surface 75 and the fourth base side surface 76 are opposite end surfaces of the separate antenna base 70E in the y-direction. The third base side surface 75 defines a portion of the third base side surface 75T of the antenna base 70. As viewed in the z-direction, the third base side surface 75 and the fourth base side surface 76 extend in the x-direction.

The first base side surface 73 and the second base side surface 74 are opposite end surfaces of the separate antenna base 70E in the x-direction.

The first base side surface 73 is a surface of the separate antenna base 70E located closer to the first base side surface 73T (refer to FIG. 37) of the antenna base 70. As viewed in the z-direction, the first base side surface 73 extends in a direction intersecting both the x-direction and the y-direction. Specifically, as viewed from above, the first base side surface 73 is V-shaped. The first base side surface 73 includes a base side surface portion 73*a*, which is a portion of the first base side surface 73 located toward the third base side surface 75, and a base side surface portion 73*b*, which is a portion of the first base side surface 73 located toward the fourth base side surface 76. The base side surface portion 73*a* is a surface inclined toward the third base side surface 75 as the base side surface portion 73*a* extends toward the second base side surface 74. The base side surface portion 73*b* is a surface inclined toward the fourth base side surface 76 as the base side surface portion 73*b* extends toward the second base side surface 74.

The second base side surface 74 defines a portion of the second base side surface 74T of the antenna base 70. As viewed in the z-direction, the second base side surface 74 extends in the y-direction.

The antenna surface 81E of the antenna recess 80E is recessed from the base main surface 71 of the separate antenna base 70E toward the base back surface 72. In the present embodiment, in a cross-sectional view of the separate antenna base 70E cut along a plane extending in the x-direction and the z-direction, the antenna surface 81E is curved to project toward the base back surface 72. The antenna surface 81E is open in the base main surface 71. That is, the antenna surface 81E is open upward.

As viewed from above, the opening of the antenna surface 81E has the form of a circle that is partially cut away. Specifically, the opening of the antenna surface 81E is cut away at an open end 81Ea, which is an end of the opening of the antenna surface 81E located at the base side surface portion 73*a*, at an open end 81Eb, which is an end of the opening of the antenna surface 81E located at the base side surface portion 73*b*, and at an open end 81Ec, which is an end of the opening of the antenna surface 81E located at the fourth base side surface 76. As viewed from above, each of the open ends 81Ea to 81Ec extends linearly.

As viewed from above, the open end 81Ea of the antenna surface 81E is positioned to overlap the base side surface portion 73*a*. The open end 81Eb is positioned to overlap the base side surface portion 73*b*. The open end 81Ec is positioned to overlap the fourth base side surface 76.

The reflective film 82E is formed on the antenna surface 81E. The reflective film 82E is formed on the entire antenna surface 81E. The reflective film 82E is not formed on the base main surface 71 of the separate antenna base 70E.

As viewed from above, the opening of the reflective film 82E is identical in shape to the opening of the antenna surface 81E. More specifically, as viewed from above, the opening of the reflective film 82E includes an open end 82Ea that overlaps the open end 81Ea of the antenna surface 81E, an open end 82Eb that overlaps the open end 81Eb of the antenna surface 81E, and an open end 82Ec that overlaps the open end 81Ec of the antenna surface 81E. As viewed from above, each of the open ends 82Ea to 82Ec extends linearly.

As viewed from above, the reflective film 82E is formed so that the center point P2 is located at a position differing from the middle of the separate antenna base 70E in each of the x-direction and the y-direction. In the present embodiment, as viewed from above, the reflective film 82E is formed so that the center point P2 in the x-direction is located closer to the first base side surface 73 than the middle of the separate antenna base 70E in the x-direction. As viewed from above, the reflective film 82E is formed so that the center point P2 in the y-direction is located closer to the fourth base side surface 76 than the middle of the separate antenna base 70E in the y-direction.

As viewed from above, the center point P2 of the reflective film 82E coincides with the center point of the antenna surface 81E, and the reflective film 82E is substantially identical in shape to the antenna surface 81E. Thus, in the same manner as the reflective film 82E, as viewed from above, the antenna surface 81E is formed so that the center point of the antenna surface 81E is located at a position differing from the middle of the separate antenna base 70E in each of the x-direction and the y-direction.

As viewed from above, the arc-shaped circumference of the reflective film 82E includes a circumferential part that connects the arc endpoints in the first direction, which is the arrangement direction of the reflective film 82E and the reflective film 82F. The circumferential part is arc-shaped and has a central angle of less than 180°. In the present embodiment, as viewed from above, the circumferential part of the reflective film 82E that connects the arc endpoints in the first direction (in the present embodiment, the y-direction) is arc-shaped and has a central angle θe1 of less than 180°.

As viewed from above, the arc-shaped circumference of the reflective film 82E includes a circumferential part that connects arc endpoints in a third direction, which is an arrangement direction of the reflective film 82E and the reflective film 82A. The circumferential part is arc-shaped and has a central angle of less than 180°. As viewed in the z-direction, the third direction differs from the x-direction and the y-direction. In an example, as viewed in the z-direction, the third direction intersects the x-direction and the y-direction. In the present embodiment, the third direction diagonally extends from the base side surface 75T of the antenna base 70 toward the base side surface 76T in a direction extending from the base side surface 73T toward the base side surface 74T.

In the present embodiment, as viewed from above, the circumferential part of the reflective film 82E that connects the arc endpoints in the third direction (in the present embodiment, as viewed from above, the direction orthogonal to the direction in which the base side surface portion 73*a* extends) is arc-shaped and has a central angle θe2 of less than 180°.

As viewed from above, the arc-shaped circumference of the reflective film 82E includes a circumferential part that connects arc endpoints in a fourth direction, which is an arrangement direction of the reflective film 82E and the reflective film 82B. The circumferential part is arc-shaped and has a central angle of less than 180°. As viewed in the z-direction, the fourth direction differs from the x-direction, the y-direction, and the third direction. In an example, as viewed in the z-direction, the fourth direction intersects the x-direction, the y-direction, and the third direction. In the present embodiment, the fourth direction diagonally extends from the base side surface 76T of the antenna base 70 toward the base side surface 75T in a direction extending from the base side surface 73T toward the base side surface 74T.

In the present embodiment, as viewed from above, the circumferential part of the reflective film 82E that connects the arc endpoints in the fourth direction (in the present embodiment, as viewed from above, the direction orthogonal to the direction in which the base side surface portion 73*b* extends) is arc-shaped and has a central angle θe3 of less than 180°.

As viewed from above, the reflective film 82E is substantially identical in shape to the antenna surface 81E. Thus, in the same manner as the reflective film 82E, the antenna surface 81E includes an arc-shaped circumference including a circumferential part that connects arc endpoints in the first direction, which is the arrangement direction of the antenna surface 81E and the antenna surface 81F. The circumferential part is arc-shaped and has a central angle of less than 180°. The arc-shaped circumference of the antenna surface 81E includes a circumferential part that connects arc endpoints in the third direction, which is the arrangement direction of the antenna surface 81E and the antenna surface 81A (in the present embodiment, as viewed from above, a direction orthogonal to the direction in which the base side surface portion 73*a* extends). The circumferential part is arc-shaped and has a central angle of less than 180°. The arc-shaped circumference of the antenna surface 81E includes a circumferential part that connects arc endpoints in the fourth direction, which is the arrangement direction of the antenna surface 81E and the antenna surface 81B (in the present embodiment, as viewed from above, a direction orthogonal to the direction in which the base side surface portion 73*b* extends). The circumferential part is arc-shaped and has a central angle of less than 180°.

As viewed from above, a perpendicular line to the open end 82Ea of the reflective film 82E extending through the center point P2 of the reflective film 82E has a length LR1 that is less than a radius RE of the reflective film 82E. As viewed from above, a perpendicular line to the open end 82Eb of the reflective film 82E extending the center point P2 of the reflective film 82E has a length LR2 that is less than the radius RE of the reflective film 82E. As viewed from above, a perpendicular line to the open end 82Ec of the reflective film 82E extending through the center point P2 of the reflective film 82E has a length LR3 that is less than the radius RE of the reflective film 82E. As viewed from above, the perpendicular line to the open end 82Ec of the reflective film 82E extending through the center point P2 of the reflective film 82E linearly extends in the y-direction. The length LR1 may be considered as a length in the third direction. The length LR2 may be considered as a length in the fourth direction. Therefore, the length (LR1+RE) of the reflective film 82E in the third direction is less than the diameter of the reflective film 82E. The length (LR2+RE) of the reflective film 82E in the fourth direction is less than the diameter of the reflective film 82E. Also, the length (LR3+RE) of the reflective film 82E in the first direction is less than the diameter of the reflective film 82E. As viewed from above, the reflective film 82E is smaller in the first direction, which is the direction in which the reflective films 82E to 82H (refer to FIG. 37) are arranged, than in the second direction differing from the first direction. As viewed from above, the second direction (in the present embodiment, the x-direction) is orthogonal to the first direction. As viewed from above, the reflective film 82E is smaller in the third direction, which is the direction in which the reflective films 82E and 82A are arranged, than in the second direction. As viewed from above, the reflective film 82E is smaller in the fourth direction, which is the direction in which the reflective films 82E and 82B are arranged, than in the second direction.

As viewed from above, the reflective film 82E is substantially identical in shape to the antenna surface 81E. Thus, the relationship of the radius of the antenna surface 81E with the lengths of the perpendicular lines to the open ends 81Ea to 81Ec of the antenna surface 81E extending through the center point of the antenna surface 81E is the same as the relationship of the radius RE of the reflective film 82E with the lengths LR1 to LR3 of the reflective film 82E.

As shown in FIG. 41, in a cross-sectional view of the separate antenna base 70E cut along a plane extending in the y-direction and the z-direction through the center point P2 of the reflective film 82E, the reflective film 82E includes an arc-shaped part that connects the opposite endpoints in the y-direction and has a central angle of less than 180°. Also, although not shown, in a cross-sectional view of the separate antenna base 70E cut along a plane extending in the third direction and the z-direction through the center point P2 of the reflective film 82E, the reflective film 82E includes an arc-shaped part that connects the opposite endpoints in the third direction and has a central angle of less than 180°. Also, although not shown, in a cross-sectional view of the separate antenna base 70E cut along a plane extending in the fourth direction and the z-direction through the center point P2 of the reflective film 82E, the reflective film 82E includes an arc-shaped part that connects the opposite endpoints in the fourth direction and has a central angle of less than 180°.

As shown in FIG. 41, in a cross-sectional view of the separate antenna base 70E cut along a plane extending in the y-direction and the z-direction through the center point of the antenna surface 81E, the antenna surface 81E includes an arc-shaped part that connects the opposite endpoints in the y-direction and has a central angle of less than 180°. Also, although not shown, in a cross-sectional view of the separate antenna base 70E cut along a plane extending in the third direction and the z-direction through the center point of the antenna surface 81E, the antenna surface 81E includes an arc-shaped part that connects the opposite endpoints in the third direction and has a central angle of less than 180°. Also, although not shown, in a cross-sectional view of the separate antenna base 70E cut along a plane extending in the fourth direction and the z-direction through the center point of the antenna surface 81E, the antenna surface 81E includes an arc-shaped part that connects the opposite endpoints in the fourth direction and has a central angle of less than 180°.

As viewed from above, the separate antenna base 70E includes a peripheral wall 78E extending around the opening of the antenna recess 80E except the cutaway portions of the opening. The peripheral wall 78E forms the base main surface 71 of the separate antenna base 70E.

As shown in FIG. 39, in the same manner as the separate antenna base 70E, the separate antenna base 70A includes a base main surface 71 and a base back surface 72 that intersect the z-direction. As viewed in the z-direction, the base main surface 71 and the base back surface 72 are rectangular so that one of the four sides extend in a direction intersecting both the x-direction and the y-direction. In the present embodiment, the base main surface 71 and the base back surface 72 are, for example, identical in shape. However, the base main surface 71 and the base back surface 72 may have different shapes.

The separate antenna base 70A includes a first base side surface 73, a second base side surface 74, a third base side surface 75, and a fourth base side surface 76 as four base side surfaces. The base side surfaces 73 to 76 are surfaces of the terahertz device 10 (the antenna base 70) facing sideward. The base side surfaces 73 to 76 are disposed in directions orthogonal to the opposing direction of the base main surface 71 and the base back surface 72 and join the base main surface 71 to the base back surface 72.

The third base side surface 75 and the fourth base side surface 76 define opposite end surfaces of the separate antenna base 70A in the y-direction. The third base side surface 75 defines a portion of the third base side surface 75T of the antenna base 70. As viewed from above, the third base side surface 75 and the fourth base side surface 76 extend in the x-direction. As viewed in the z-direction, the dimension of the fourth base side surface 76 in the x-direction is smaller than the dimension of the third base side surface 75 in the x-direction.

The first base side surface 73 and the second base side surface 74 define opposite end surfaces of the separate antenna base 70A in the x-direction.

The first base side surface 73 defines a portion of the first base side surface 73T of the antenna base 70. As viewed from above, the first base side surface 73 extends in the y-direction.

The second base side surface 74 is a side surface of the separate antenna base 70A located closer to the second base side surface 74T of the antenna base 70. As viewed from above, the second base side surface 74 extends in a direction intersecting both the x-direction and the y-direction. Specifically, the second base side surface 74 includes a base side surface portion 74*a* located toward the third base side surface 75 and a base side surface portion 74*b* located toward the fourth base side surface 76. As viewed in the z-direction, the base side surface portion 74*a* extends in the y-direction. As viewed in the z-direction, the base side surface portion 74*b* is an inclined surface that is inclined toward the first base side surface 73 as the inclined surface extends toward the fourth base side surface 76.

The antenna surface 81A of the antenna recesses 80A is recessed from the base main surface 71 of the separate antenna base 70A toward the base back surface 72. In the present embodiment, in a cross-sectional view of the separate antenna base 70A cut along a plane extending in the x-direction and the z-direction, the antenna surface 81A is curved to project toward the base back surface 72. The antenna surface 81A is open in the base main surface 71. That is, the antenna surface 81A is open upward.

As viewed from above, the opening of the antenna surface 81A has the shape of a circle that is partially cut away. Specifically, the opening of the antenna surface 81A is cut away at the open end 81Aa located at the second base side surface 74 and an open end 81Ab located at the fourth base side surface 76. As viewed from above, each of the open ends 81Aa and 81Ab extends linearly. As viewed from above, the open end 81Aa is positioned to overlap the base side surface portion 74*b*. The open end 81Ab is positioned to overlap the fourth base side surface 76.

As viewed from above, the reflective film 82A is formed so that the center point P2 is located at a position differing from the middle of the separate antenna base 70A in each of the x-direction and the y-direction. In the present embodiment, the reflective film 82A is formed so that the center point P2 in the x-direction is located closer to the base side surface portion 74*b* than the middle of the separate antenna base 70A in the x-direction. As viewed from above, the reflective film 82A is formed so that the center point P2 in the y-direction is located closer to the fourth base side surface 76 than the middle of the separate antenna base 70A in the y-direction.

As viewed from above, the center point P2 of the reflective film 82A coincides with the center point of the antenna surface 81A, and the reflective film 82A is substantially identical in shape to the antenna surface 81A. Thus, in the same manner as the reflective film 82A, as viewed from above, the antenna surface 81A is formed so that the center point of the antenna surface 81A is located at a position differing from the middle of the separate antenna base 70A in each of the x-direction and the y-direction.

As viewed from above, the arc-shaped circumference of the reflective film 82A includes a circumferential part that connects arc endpoints in the first direction, which is the arrangement direction of the reflective film 82A and the reflective film 82B. The circumferential part is arc-shaped and has a central angle of less than 180°. In the present embodiment, as viewed from above, the circumferential part of the reflective film 82A that connects the arc endpoints in the first direction (in the present embodiment, the y-direction) is arc-shaped and has a central angle $\theta a1$ of less than 180°.

As viewed from above, the arc-shaped circumference of the reflective film 82A includes a circumferential part that connects arc endpoints in a third direction, which is an arrangement direction of the reflective film 82A and the reflective film 82E. The circumferential part is arc-shaped and has a central angle of less than 180°. In the present embodiment, as viewed from above, the circumferential part of the reflective film 82A connecting the arc endpoints in the third direction (in the present embodiment, as viewed from above, the direction orthogonal to the direction in which the base side surface portion 74*b* extends) is arc-shaped and has a central angle $\theta a2$ of less than 180°.

As viewed from above, the reflective film 82A is substantially identical in shape to the antenna surface 81A. Thus, in the same manner as the reflective film 82A, the antenna surface 81A includes an arc-shaped circumference including a circumferential part that connects arc endpoints in the first direction, which is the arrangement direction of the antenna surface 81A and the antenna surface 81B, is arc-shaped and has a central angle of less than 180°. As viewed from above, the antenna surface 81A includes an arc-shaped circumference including a circumferential part that connects arc endpoints in the third direction, which is the arrangement direction of the antenna surface 81A and the antenna surface 81E. The circumferential part is arc-shaped and has a central angle of less than 180°.

As viewed from above, a perpendicular line to the open end 82Aa of the reflective film 82A extending through the center point P2 of the reflective film 82A has a length LR4 that is less than a radius RA of the reflective film 82A. As viewed from above, a perpendicular line to an open end 82Ab of the reflective film 82A extending through the center point P2 of the reflective film 82A has a length LR5 that is less than the radius RA of the reflective film 82A. In the present embodiment, the radius RA of the reflective film 82A is equal to the radius RE of the reflective film 82E. Also, a perpendicular line to the open end 82Ab of the reflective film 82A extending through the center point P2 of the reflective film 82A linearly extends in the y-direction. The length LR4 may be considered as a length in the third direction. Thus, the length (LR3+RA) of the reflective film 82A in the third direction is less than the diameter of the reflective film 82A. The length (LR5+RA) of the reflective film 82A in the first direction is less than the diameter of the reflective film 82A. As viewed from above, the reflective film 82A is smaller in the first direction, which is the direction in which the reflective films 82A to 82D (refer to FIG. 37) are arranged, than in the second direction differing from the first direction. As viewed from above, the second direction (in the present embodiment, the x-direction) is orthogonal to the first direction. As viewed from above, the reflective film 82A is smaller in the third direction, which is the direction in which the reflective films 82E and 82A are arranged, than in the second direction.

As viewed from above, the reflective film 82A is substantially identical in shape to the antenna surface 81A. Thus, the relationship of the radius of the antenna surface 81A with the lengths of the perpendicular lines to the open ends 81Aa and 81Ab of the antenna surface 81A extending through the center point of the antenna surface 81A is the same as the relationship of the radius RA of the reflective film 82A with the lengths LR4 and LR5 of the reflective film 82A.

Although not shown, in a cross-sectional view of the separate antenna base 70A cut along a plane extending in the y-direction and the z-direction through the center point P2 of the reflective film 82A, the reflective film 82A includes an arc-shaped part that connects the opposite endpoints in the y-direction and has a central angle of less than 180°. Also, in a cross-sectional view of the separate antenna base 70A cut along a plane extending in the third direction and the z-direction through the center point P2 of the reflective film 82A, the reflective film 82A includes an arc-shaped part that connects the opposite endpoints in the third direction and has a central angle of less than 180°.

Also, although not shown, in a cross-sectional view of the separate antenna base 70A cut along a plane extending in the y-direction and the z-direction through the center point of the antenna surface 81A, the antenna surface 81A includes an arc-shaped part that connects the opposite endpoints in the y-direction and has a central angle of less than 180°. Also, in a cross-sectional view of the separate antenna base 70A cut along a plane extending in the third direction and the z-direction through the center point of the antenna surface 81A, the antenna surface 81A includes an arc-shaped part that connects the opposite endpoints in the third direction and has a central angle of less than 180°.

The separate antenna bases 70B, 70C, 70D, 70F, 70G, and 70H are identical in shape. Hence, the structure of the separate antenna base 70B shown in FIG. 40 will be described as an example. The structure of the separate antenna bases 70C, 70D, and 70F to 70H will not be described.

As shown in FIG. 40, in the same manner as the separate antenna base 70A, the separate antenna base 70B includes a base main surface 71 and a base back surface 72 that intersect the z-direction. As viewed in the z-direction, the base main surface 71 and the base back surface 72 are pentagonal. In the present embodiment, the base main surface 71 and the base back surface 72 are, for example, identical in shape. However, the base main surface 71 and the base back surface 72 may have different shapes.

The separate antenna base 70B includes a first base side surface 73, a second base side surface 74, a third base side surface 75, and a fourth base side surface 76 as base side surfaces. The base side surfaces 73 to 76 are surfaces of the terahertz device 10 (the antenna base 70) facing sideward. The base side surfaces 73 to 76 are disposed in directions orthogonal to the opposing direction of the base main surface 71 and the base back surface 72 and join the base main surface 71 to the base back surface 72.

The third base side surface 75 and the fourth base side surface 76 are opposite end surfaces of the separate antenna base 70B in the y-direction. As viewed in the z-direction, the third base side surface 75 and the fourth base side surface 76 extend in the x-direction.

The first base side surface 73 and the second base side surface 74 are opposite end surfaces of the separate antenna base 70B in the x-direction.

As viewed from above, the first base side surface 73 extends in the y-direction.

As viewed from above, the second base side surface 74 extends in a direction intersecting the x-direction and the y-direction. Specifically, as viewed from above, the second base side surface 74 is V-shaped. The second base side surface 74 includes a base side surface portion 74*a* located toward the third base side surface 75 and a base side surface portion 74*b* located toward the fourth base side surface 76. The base side surface portion 74*a* is a surface inclined toward the third base side surface 75 as the base side surface portion 74*a* extends toward the first base side surface 73. The base side surface portion 74*b* is a surface inclined toward the fourth base side surface 76 as the base side surface portion 74*b* extends toward the first base side surface 73.

The antenna surface 81B of the antenna recess 80B is recessed from the base main surface 71 of the separate antenna base 70B toward the base back surface 72. In the present embodiment, in a cross-sectional view of the separate antenna base 70B cut along a plane extending in the x-direction and the z-direction, the antenna surface 81B is curved to project toward the base back surface 72. The antenna surface 81B is open in the base main surface 71. That is, the antenna surface 81B is open upward.

As viewed from above, the opening of the antenna surface 81B has the form of a circle that is partially cut away. Specifically, the opening of the antenna surface 81B is cut away at the open end 81Ba located at the base side surface portion 74*a*, the open end 81Bb located at the base side surface portion 74*b*, an open end 81Bc located at the third base side surface 75, and at an open end 81Bd located at the fourth base side surface 76. As viewed from above, each of the open ends 81Ba to 81Bd extends linearly.

As viewed from above, the open end 81Ba is positioned to overlap the base side surface portion 74*a*. The open end 81Bb is positioned to overlap the base side surface portion 74*b*. The open end 81Bc is positioned to overlap the third base side surface 75. The open end 81Bd is positioned to overlap the fourth base side surface 76.

As viewed from above, the opening of the reflective film 82B is identical in shape to the opening of the antenna surface 81B. As viewed from above, the opening of the reflective film 82B includes the open end 82Ba overlapping the open end 81Ba of the antenna surface 81B, the open end 82Bb overlapping the open end 81Bb of the antenna surface 81B, an open end 82Bc overlapping the open end 81Bc of the antenna surface 81B, and an open end 82Bd overlapping the open end 81Bd of the antenna surface 81B. As viewed from above, each of the open ends 82Ba to 82Bd extends linearly.

As viewed from above, the reflective film 82B is formed so that the center point P2 is located at a position differing from the middle of the separate antenna base 70B in each of the x-direction and the y-direction. As viewed from above, the reflective film 82B is formed so that the center point P2 in the x-direction is located closer to the first base side surface 73 than the middle of the separate antenna base 70B in the x-direction. As viewed from above, the reflective film 82B is formed so that the center point P2 in the y-direction is located in the middle of the separate antenna base 70B in the y-direction.

As viewed from above, the center point P2 of the reflective film 82B coincides with the center point of the antenna surface 81B, and the reflective film 82B is substantially identical in shape to the antenna surface 81B. Thus, in the same manner as the reflective film 82B, as viewed from above, the antenna surface 81B is formed so that the center point of the antenna surface 81B is located at a position differing from the middle of the separate antenna base 70B in each of the x-direction and the y-direction.

As viewed from above, the arc-shaped circumference of the reflective film 82B includes a circumferential part that connects arc endpoints in the first direction, which is the arrangement direction of the reflective film 82B and the reflective film 82A. The circumferential part is arc-shaped and has a central angle of less than 180°. In the present embodiment, as viewed from above, the circumferential part of the reflective film 82B that connects the arc endpoints in the first direction (in the present embodiment, the y-direction) is arc-shaped and has a central angle θb1 of less than 180°.

As viewed from above, the arc-shaped circumference of the reflective film 82B includes a circumferential part that connects arc endpoints in a fourth direction, which is an arrangement direction of the reflective film 82B and the reflective film 82E. The circumferential part is arc-shaped and has a central angle of less than 180°. In the present embodiment, as viewed from above, the circumferential part of the reflective film 82B that connects the arc endpoints in the fourth direction (in the present embodiment, as viewed from above, the direction orthogonal to the direction in which the base side surface portion 74*a* extends) is arc-shaped and has a central angle θb2 of less than 180°.

As viewed from above, the arc-shaped circumference of the reflective film 82B includes a circumferential part that connects arc endpoints in a third direction, which is an arrangement direction of the reflective film 82B and the reflective film 82F. The circumferential part is arc-shaped and has a central angle of less than 180°. In the present embodiment, as viewed from above, the circumferential part of the reflective film 82B connecting the arc endpoints in the third direction (in the present embodiment, as viewed from above, the direction orthogonal to the direction in which the base side surface portion 74*b* extends) is arc-shaped and has a central angle θb3 of less than 180°.

As viewed from above, the reflective film 82B is substantially identical in shape to the antenna surface 81B. Thus, the antenna surface 81B includes an arc-shaped circumference including a circumferential part that connects arc endpoints in the first direction, which is the arrangement direction of the antenna surface 81B and the antenna surface 81A, is arc-shaped and has a central angle of less than 180°. The arc-shaped circumference of the antenna surface 81B includes a circumferential part that connects arc endpoints in the fourth direction, which is the arrangement direction of the antenna surface 81B and the antenna surface 81E. The circumferential part is arc-shaped and has a central angle of less than 180°. The arc-shaped circumference of the antenna surface 81B includes a circumferential part that connects arc endpoints in the third direction, which is the arrangement direction of the antenna surface 81B and the antenna surface 81F. The circumferential part is arc-shaped and has a central angle of less than 180°.

As viewed from above, a perpendicular line to the open end 82Ba of the reflective film 82B extending through the center point P2 of the reflective film 82B has a length LR6 that is less than a radius RB of the reflective film 82B. As viewed from above, a perpendicular line to the open end 82Bb of the reflective film 82B extending through the center point P2 of the reflective film 82B has a length LR7 that is less than the radius RB of the reflective film 82B. As viewed from above, a perpendicular line to the open end 82Bc of the reflective film 82B extending through the center point P2 of the reflective film 82B has a length LR8 that is less than the radius RB of the reflective film 82B. As viewed from above, a perpendicular line to the open end 82Bd of the reflective film 82B extending through the center point P2 of the reflective film 82B has a length LR9 that is less than the radius RB of the reflective film 82B. In the present embodiment, the radius RB of the reflective film 82B is equal to the radius RA of the reflective film 82A. The perpendicular line to the open end 82Bc of the reflective film 82B extending through the center point P2 of the reflective film 82B and the perpendicular line to the open end 82Bd of the reflective film 82B extending through the center point P2 of the reflective film 82B each extend linearly in the y-direction. The sum (LR8+LR9) of the lengths LR8 and LR9 of the perpendicular lines is equal to the length of the separate antenna base 70B in the y-direction. Thus, the length of the separate antenna base 70B in the y-direction is less than the diameter of the reflective film 82B. The length LR7 may be considered as a length in the third direction. The length LR6 may be considered as a length in the fourth direction. Therefore, the length (LR7+RB) of the reflective film 82B in the third direction is less than the diameter of the reflective film 82B. The length (LR6+RB) of the reflective film 82B in the fourth direction is less than the diameter of the reflective film 82B. As viewed from above, the reflective film 82B is smaller in the first direction, which is the direction in which the reflective films 82A to 82D (refer to FIG. 37) are arranged, than in the second direction differing from the first direction. As viewed from above, the second direction (in the present embodiment, the x-direction) is orthogonal to the first direction. As viewed from above, the reflective film 82B is smaller in the third direction, which is the direction in which the reflective films 82E and 82A are arranged, than in the second direction. As viewed from above, the reflective film 82B is smaller in the fourth direction, which is the direction in which the reflective films 82E and 82B are arranged, than in the second direction.

As viewed from above, the reflective film 82B is substantially identical in shape to the antenna surface 81B. Thus, the relationship of the radius of the antenna surface 81B with the lengths of the perpendicular lines to the open ends 81Ba to 81Bd of the antenna surface 81B extending through the center point of the antenna surface 81B is the same as the relationship of the radius RB of the reflective film 82B with the lengths LR6 to LR9 of the reflective film 82B.

Although not shown, in a cross-sectional view of the separate antenna base 70B cut along a plane extending in the y-direction and the z-direction through the center point P2 of the reflective film 82B, the reflective film 82B includes an arc-shaped part that connects the opposite endpoints in the y-direction and has a central angle of less than 180°. Also, in a cross-sectional view of the separate antenna base 70B cut along a plane extending in the third direction and the z-direction through the center point P2 of the reflective film 82B, the reflective film 82B includes an arc-shaped part that connects the opposite endpoints in the third direction and has a central angle of less than 180°. Also, in a cross-sectional view of the separate antenna base 70B cut along a plane extending in the third direction and the z-direction through the center point P2 of the reflective film 82B, the reflective film 82B includes an arc-shaped part that connects the opposite endpoints in the fourth direction and has a central angle of less than 180°.

Also, although not shown, in a cross-sectional view of the separate antenna base 70B cut along a plane extending in the y-direction and the z-direction through the center point of the antenna surface 81B, the antenna surface 81B includes an arc-shaped part that connects the opposite endpoints in the y-direction and has a central angle of less than 180°. Also, in a cross-sectional view of the separate antenna base 70B cut along a plane extending in the third direction and the z-direction through the center point of the antenna surface 81B, the antenna surface 81B includes an arc-shaped part that connects the opposite endpoints in the third direction and has a central angle of less than 180°. Also, in a cross-sectional view of the separate antenna base 70B cut along a plane extending in the third direction and the z-direction through the center point of the antenna surface 81B, the antenna surface 81B includes an arc-shaped part that connects the opposite endpoints in the fourth direction and has a central angle of less than 180°.

As viewed from above, the separate antenna base 70B includes a peripheral wall 78B extending around the opening of the antenna recess 80B except the cutaway portions of the opening. The peripheral wall 78B forms the base main surface 71 of the separate antenna base 70B.

The antenna surface 81C of the antenna recess 80C in the separate antenna base 70C, the antenna surface 81D of the antenna recess 80D in the separate antenna base 70D, the antenna surface 81F of the antenna recess 80F in the separate antenna base 70F, the antenna surface 81G of the antenna recess 80G in the separate antenna base 70G, and the antenna surface 81H of the antenna recess 80H in the separate antenna base 70H are identical in shape to the antenna surface 81B of the antenna recess 80B. The reflective film 82C, the reflective film 82D, the reflective film 82F, the reflective film 82G, and the reflective film 82H are identical in shape to the reflective film 82B.

As shown in FIG. 37, the base side surface portion 74*b* of the separate antenna base 70A abuts the base side surface portion 73*a* of the separate antenna base 70E. More specifically, the separate antenna base 70A and the separate antenna base 70E are arranged in the third direction. In the same manner, the base side surface portion 74*b* of the separate antenna base 70B abuts the base side surface portion 74*b* of the separate antenna base 70F. The base side surface portion 74*b* of the separate antenna base 70C abuts the base side surface portion 74*b* of the separate antenna base 70G. The base side surface portion 74*b* of the separate antenna base 70D abuts the base side surface portion 74*b* of the separate antenna base 70H. More specifically, the separate antenna base 70B and the separate antenna base 70F are arranged in the third direction, the separate antenna base 70C and the separate antenna base 70G are arranged in the third direction, and the separate antenna base 70D and the separate antenna base 70H are arranged in the third direction.

The base side surface portion 74*a* of the separate antenna base 70B abuts the base side surface portion 73*b* of the separate antenna base 70E. More specifically, the separate antenna base 70B and the separate antenna base 70E are arranged in the fourth direction. In the same manner, the base side surface portion 74*a* of the separate antenna base 70 abuts the base side surface portion 74*a* of the separate antenna base 70F. The base side surface portion 74*a* of the separate antenna base 70D abuts the base side surface portion 74*a* of the separate antenna base 70G. More specifically, the separate antenna base 70C and the separate antenna base 70F are arranged in the fourth direction. The separate antenna base 70D and the separate antenna base 70G are arranged in the fourth direction.

The gas cavity 92 will now be described.

As shown in FIGS. 41 to 43, the gas cavity 92 is defined by the dielectric main surface 51 and the antenna surface 81 in the same manner as the first embodiment. Specifically, the opening of the antenna recesses 80 is covered by the dielectric main surface 51. Specifically, the openings of the antenna recesses 80A to 80H are covered by the dielectric main surface 51. In the present embodiment, the gas cavity 92 is connected to the outside of the device through the antenna recesses 80D and 80H in the separate antenna bases 70D and 70H. That is, in the present embodiment, the gas cavity 92 is not hermetically sealed. Alternatively, the gas cavity 92 may be hermetically sealed by changing the structure of the separate antenna base 70H to the structure of the separate antenna base 70A and the structure of the separate antenna base 70D to the structure of the separate antenna base 70E.

The gas cavity 92 is defined by the dielectric main surface 51 and the antenna surfaces 81, which are the wall surfaces of the antenna recesses 80. More specifically, the gas cavity 92 is defined by the dielectric main surface 51 and the antenna surfaces 81A to 81H. The reflective films 82A to 82H are disposed in the gas cavity 92. The gas cavity 92 includes multiple gas cavities 92 defined by the dielectric main surface 51 and each of the antenna recesses 80A to 80H. In the present embodiment, the gas cavities corresponding to adjacent ones of the separate antenna bases 70A to 70H are connected to each other. In an example, as shown in FIGS. 41 and 42, the gas cavity 92E, which is defined by the dielectric main surface 51 and the antenna surface 81E, the gas cavity 92F, which is defined by the dielectric main surface 51 and the antenna surface 81F, and the gas cavity 92G, which is defined by the dielectric main surface 51 and the antenna surface 81G, are connected to each other in the first direction (in the present embodiment, the y-direction), which is the arrangement direction of the reflective film 82F and the reflective film 82G. As shown in FIG. 42, the gas cavity 92E is connected to the gas cavity 92B, which is defined by the dielectric main surface 51 and the antenna surface 81B. More specifically, the gas cavity 92B and the gas cavity 92E are connected to each other in the fourth direction, which is the arrangement direction of the reflective film 82B and the reflective film 82E. As shown in FIG. 43, the gas cavity 92G is connected to the gas cavity 92C, which is defined by the dielectric main surface 51 and the antenna surface 81C. More specifically, the gas cavity 92C and the gas cavity 92G are connected to each other in the third direction, which is the arrangement direction of the reflective film 82C and the reflective film 82G. Since the gas cavity 92 contains gas, the relationship in the refractive index among the dielectric 50, the gas cavity 92, and the terahertz element 20 and the propagation path of electromagnetic waves are the same as the first embodiment. As described above, in the gas spaces 92 corresponding to the separate antenna bases 70A to 70H, the gas spaces 92 corresponding to the separate antenna bases arranged in the first direction (in the present embodiment, the y-direction) are connected in the first direction, the gas spaces 92 corresponding to the separate antenna bases arranged in the third direction are connected in the third direction, and the gas spaces 92 corresponding to the separate antenna bases arranged in the fourth direction are connected in the fourth direction.

Figure 44:
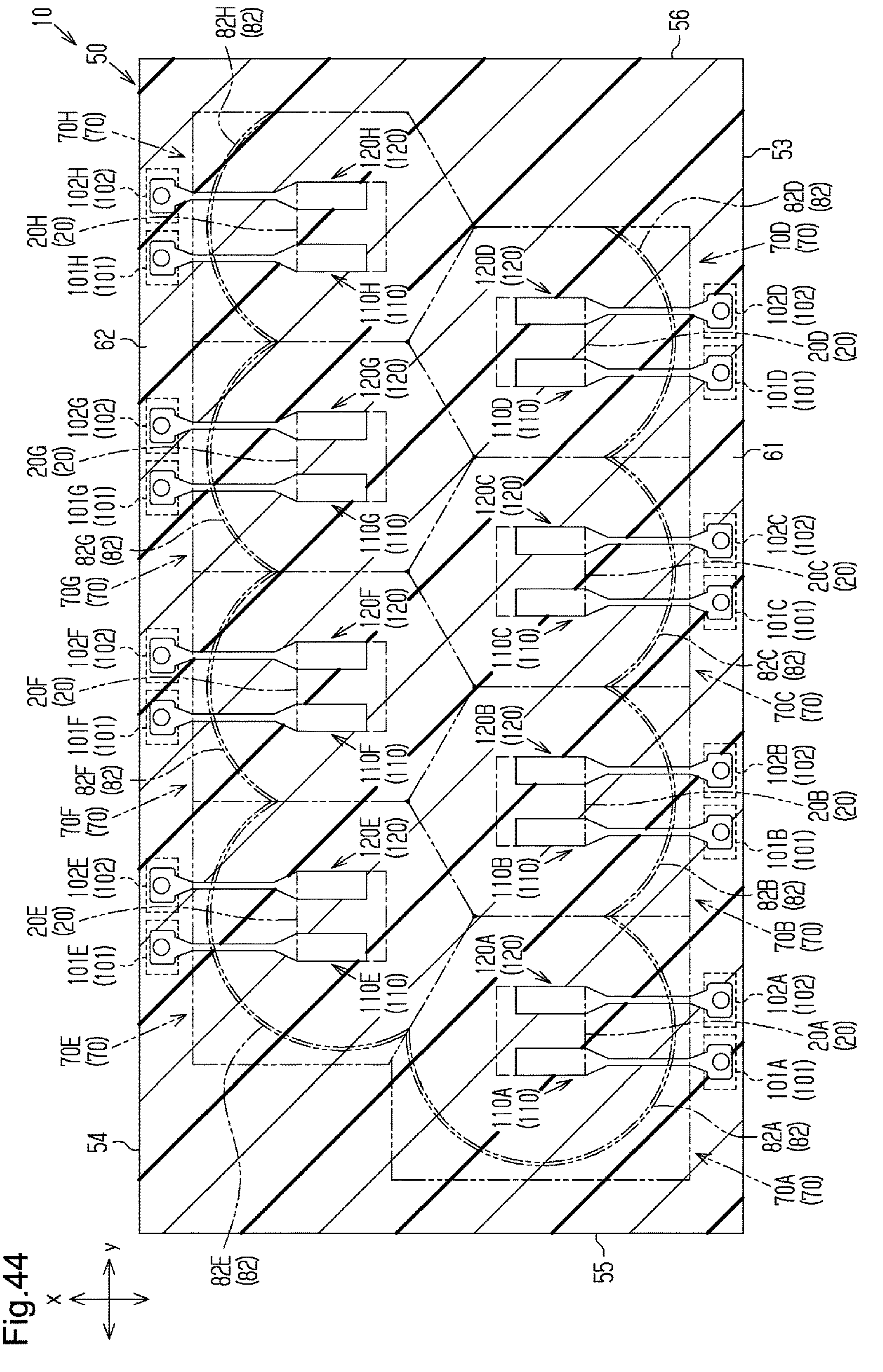
FIG. 44 is a cross-sectional view showing the positional relationship of conductive portions in the terahertz device shown in FIG. 35.

As shown in FIG. 44, in the same manner as the first embodiment, the terahertz device 10 includes a first electrode 101, a second electrode 102, a first conductive portion 110, and a second conductive portion 120. In the present embodiment, the two electrodes 101 and 102 are arranged for each of the terahertz elements 20A to 20H. The two electrodes 101 and 102 and the two conductive portions 110 and 120 are the same as the first embodiment. In the same manner as the first embodiment, the two conductive portions 110 and 120 are encapsulated by the dielectric 50. For the sake of brevity, the first electrode 101 and the second electrode 102 corresponding to the terahertz elements 20A to 20H are respectively referred to as first electrodes 101A to 101H and second electrodes 102A to 102H. The first conductive portion 110 and the second conductive portion 120 corresponding to the terahertz elements 20A to 20H are respectively referred to as first conductive portions 110A to 110H and second conductive portions 120A to 120H.

The first conductive portion 110A and the second conductive portion 120A connected to the terahertz element 20A, the first conductive portion 110B and the second conductive portion 120B connected to the terahertz element 20B, the first conductive portion 110C and the second conductive portion 120C connected to the terahertz element 20C, the first conductive portion 110D and the second conductive portion 120D connected to the terahertz element 20D extend toward the first projection 61 in the x-direction. Hence, the first electrode 101A and the second electrode 102A connected to the first conductive portion 110A and the second conductive portion 120A, the first electrode 101B and the second electrode 102B connected to the first conductive portion 110B and the second conductive portion 120B, the first electrode 101C and the second electrode 102C connected to the first conductive portion 110C and the second conductive portion 120C, and the first electrode 101D and the second electrode 102D connected to the first conductive portion 110D and the second conductive portion 120D are disposed on the first projection 61. More specifically, the conductive portions 110A to 110D and 120A to 120D are connected to the terahertz elements 20A to 20D arranged in accordance with the separate antenna bases 70A to 70D, which are the antenna bases 70 located toward the first projection 61. The conductive portions 110A to 110D and 120A to 120D extend toward the first projection 61, which is located closer to the separate antenna bases 70A to 70D than the second projection 62. The electrodes 101A to 101D and 102A to 102D are disposed on the first projection 61, which is located closer to the separate antenna bases 70A to 70D than the second projection 62.

The electrodes 101A to 101D and 102A to 102D are aligned with each other in the x-direction and are separate from each other in the y-direction. The conductive portions 110A to 110D and 120A to 120D are aligned with each other in the x-direction and are separate from each other in the y-direction.

The first conductive portion 110E and the second conductive portion 120E connected to the terahertz element 20E, the first conductive portion 110F and the second conductive portion 120F connected to the terahertz element 20F, the first conductive portion 110G and the second conductive portion 120G connected to the terahertz element 20G, and the first conductive portion 110H and the second conductive portion 120H connected to the terahertz element 20H extend toward the second projection 62 in the x-direction. Accordingly, the first electrode 101E and the second electrode 102E connected to the first conductive portion 110E and the second conductive portion 120E, the first electrode 101F and the second electrode 102F connected to the first conductive portion 110F and the second conductive portion 120F, the first electrode 101G and the second electrode 102G connected to the first conductive portion 110G and the second conductive portion 120G, and the first electrode 101H and the second electrode 102H connected to the first conductive portion 110H and the second conductive portion 120H are disposed on the second projection 62. More specifically, the conductive portions 110E to 110H and 120E to 120H are connected to the terahertz elements 20E to 20H arranged in accordance with the separate antenna bases 70E to 70H, which are the antenna bases 70 located toward the second projection 62. The conductive portions 110E to 110H and 120E to 120H extend toward the second projection 62, which is located closer to the separate antenna bases 70E to 70H than the first projection 61. The electrodes 101E to 101H and 102E to 102H are disposed on the second projection 62, which is located closer to the separate antenna bases 70E to 70H than the first projection 61.

The electrodes 101E to 101H and 102E to 102H are aligned with each other in the x-direction and are separate from each other in the y-direction. The conductive portions 110E to 110H and 120E to 120H are aligned with each other in the x-direction and are separate from each other in the y-direction.

In the present embodiment, the reflective films 82A to 82H are electrically isolated. More specifically, the reflective film 82A is electrically insulated from the electrodes 101A and 102A and the conductive portions 110A and 120A. The reflective film 82B is electrically insulated from the electrodes 101B and 102B and the conductive portions 110B and 120B. The reflective film 82C is electrically insulated from the electrodes 101C and 102C and the conductive portions 110C and 120C. The reflective film 82D is electrically insulated from the electrodes 101D and 102D and the conductive portions 110D and 120D. The reflective film 82E is electrically insulated from the electrodes 101E and 102E and the conductive portions 110E and 120E. The reflective film 82F is electrically insulated from the electrodes 101F and 102F and the conductive portions 110F and 120F. The reflective film 82G is electrically insulated from the electrodes 101G and 102G and the conductive portions 110G and 120G. The reflective film 82H is electrically insulated from the electrodes 101H and 102H and the conductive portions 110H and 120H.

Operation

The operation of the terahertz device 10 of the present embodiment will now be described with reference to FIG. 45.

Figure 45:
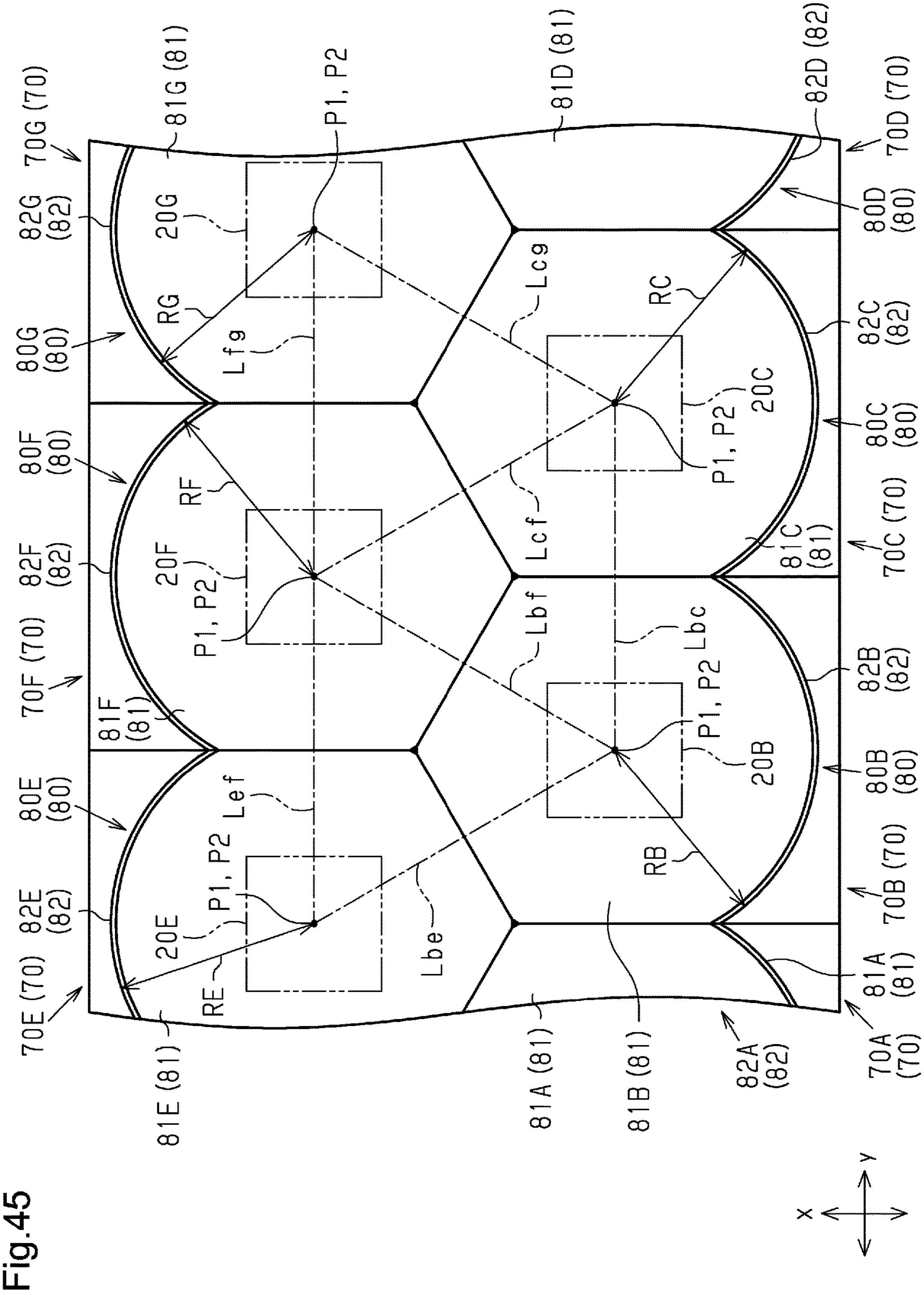
FIG. 45 is an enlarged partial view of an antenna base.

FIG. 45 is an enlarged view of the separate antenna bases 70B, 70C, and 70E to 70G and its surroundings.

As shown in FIG. 45, an inter-element distance Lef is the distance between the reception point P1 of the terahertz element 20E and the reception point P1 of the terahertz element 20F in the first direction, which is the arrangement direction of the reflective film 82E and the reflective film 82F (in the present embodiment, the y-direction). The inter-element distance Lef is less than the diameter of the reflective film 82E (2×radius RE of reflective film 82E). The inter-element distance Lef is also less than the diameter of the reflective film 82F (2×radius RF of reflective film 82F).

An inter-element distance Lbe is the distance between the reception point P1 of the terahertz element 20E and the reception point P1 of the terahertz element 20B in the fourth direction, which is the arrangement direction of the reflective film 82E and the reflective film 82B. The inter-element distance Lbe is less than the diameter of the reflective film 82E. The inter-element distance Lbe is also less than the diameter of the reflective film 82B (2×radius RB of reflective film 82B).

An inter-element distance Lbf is the distance between the reception point P1 of the terahertz element 20B and the reception point P1 of the terahertz element 20F in the third direction, which is the arrangement direction of the reflective film 82B and the reflective film 82F. The inter-element distance Lbf is less than the diameter of the reflective film 82B. The inter-element distance Lbf is also less than the diameter of the reflective film 82F.

An inter-element distance Lbc is the distance between the reception point P1 of the terahertz element 20B and the reception point P1 of the terahertz element 20C in the first direction, which is the arrangement direction of the reflective film 82B and the reflective film 82C. The inter-element distance Lbc is less than the diameter of the reflective film 82B. The inter-element distance Lbc is also less than the diameter of the reflective film 82C (2×radius RC of reflective film 82C).

An inter-element distance Lcf is the distance between the reception point P1 of the terahertz element 20C and the reception point P1 of the terahertz element 20F in the fourth direction, which is the arrangement direction of the reflective film 82C and the reflective film 82F. The inter-element distance Lcf is less than the diameter of the reflective film 82C. The inter-element distance Lcf is also less than the diameter of the reflective film 82F.

An inter-element distance Lfg is the distance between the reception point P1 of the terahertz element 20F and the reception point P1 of the terahertz element 20G in the first direction, which is the arrangement direction of the reflective film 82F and the reflective film 82G. The inter-element distance Lfg is less than the diameter of the reflective film 82F. The inter-element distance Lfg is also less than the diameter of the reflective film 82G (2×radius RG of reflective film 82G).

An inter-element distance Lcg refers to the distance between the reception point P1 of the terahertz element 20C and the reception point P1 of the terahertz element 20G in the third direction, which is the arrangement direction of the reflective film 82C and the reflective film 82G. The inter-element distance Lcg is less than the diameter of the reflective film 82C. The inter-element distance Lcg is also less than the diameter of the reflective film 82G.

Although not shown in the drawing, the inter-element distances between the terahertz elements 20A, 20B, and 20C, the inter-element distances between the terahertz elements 20C, 20D, and 20G, and the inter-element distances between the terahertz elements 20D, 20G, and 20H are the same as the inter-element distances between the terahertz elements 20B, 20C, and 20E to 20G described above.

As described above, in the arrangement direction of the reflective films 82, the inter-element distance, which is the distance connecting the reception points P1 of the terahertz elements 20 located adjacent to each other, is less than the diameter of the reflective film 82. As a result, the distance between adjacent ones of the terahertz elements 20 is decreased in the arrangement direction.

Advantages

The terahertz device 10 of the present embodiment has the following advantages in addition to the advantages of the first embodiment.

(2-1) As viewed in the z-direction, the row of the terahertz elements 20A to 20D arranged in line in the y-direction and the row of the terahertz elements 20E to 20H arranged in line in the y-direction are separate in the x-direction. This structure widens the detection range of the terahertz device 10 in the x-direction.

(2-2) As viewed in the z-direction, the row of the terahertz elements 20A to 20D and the row of the terahertz elements 20E to 20H are disposed at separate positions in the y-direction. More specifically, the terahertz element 20A, the terahertz element 20E, the terahertz element 20B, the terahertz element 20F, the terahertz element 20C, the terahertz element 20G, the terahertz element 20D, and the terahertz element 20H are disposed in this order in the y-direction from the third base side surface 75T of the antenna base 70 toward the fourth base side surface 76T.

This structure decreases the distance between the terahertz element 20E and the terahertz element 20B, the distance between the terahertz element 20F and the terahertz element 20C, and the distance between the terahertz element 20G and the terahertz element 20D in the fourth direction, which is the arrangement direction of the reflective film 82E and the reflective film 82B, the arrangement direction of the reflective film 82F and the reflective film 82C, and the arrangement direction of the reflective film 82G and the reflective film 82D.

Also, the structure decreases the distance between the terahertz element 20A and the terahertz element 20E, the distance between the terahertz element 20B and the terahertz element 20F, the distance between the terahertz element 20C and the terahertz element 20G, and the distance between the terahertz element 20D and the terahertz element 20H in the third direction, which is the arrangement direction of the reflective film 82A and the reflective film 82E, the arrangement direction of the reflective film 82B and the reflective film 82F, the arrangement direction of the reflective film 82C and the reflective film 82G, and the arrangement direction of the reflective film 82D and the reflective film 82H. Thus, the resolution of the terahertz device 10 in the detection range is improved.

(2-3) As viewed in the z-direction, the reflective film 82B is smaller in the fourth direction, which is the arrangement direction of the reflective film 82E and the reflective film 82B, and the third direction, which is the arrangement direction of the reflective film 82F and the reflective film 82B, than in the second direction (in the present embodiment, the x-direction). The same applies to the remaining reflective films 82A, 82C, 82D, and 82F to 82G.

This structure decreases the distance between adjacent ones of the terahertz elements 20 in the third direction and the fourth direction. Thus, the resolution of the terahertz device 10 in the detection range is improved.

(2-4) As viewed from above, the central angle of the circumferential part of the reflective film 82B connecting opposite endpoints in the fourth direction, which is the arrangement direction of the reflective film 82E and the reflective film 82B, is less than 180°, and the central angle of the circumferential part of the reflective film 82B connecting opposite endpoints in the third direction, which is the arrangement direction of the reflective film 82F and the reflective film 82B, is less than 180°.

This structure allows the reflective film 82B to have a relationship such that each of the lengths LR6 and LR7 of the reflective film 82B is less than the radius RB of the reflective film 82B while maintaining a spherical shape having a fixed curvature.

In the same manner as the reflective film 82B, each of the reflective films 82A and 82C to 82H includes a part connecting opposite endpoints in the third direction and a part connecting opposite endpoints in the fourth direction so that each of the parts is arc-shaped and has a central angle of less than 180°. This structure allows each of the reflective films 82A and 82C to 82H to have a relationship such that the length of the reflective films 82A and 82C to 82H in each of the third direction and the fourth direction is less than the radius of the reflective films 82A and 82C to 82H while the reflective films 82A and 82C to 82H maintain a spherical shape having a fixed curvature.

(2-5) As viewed from above, the interface between the reflective film 82A and the reflective film 82E, the interface between the reflective film 82B and the reflective film 82E, the interface between the reflective film 82B and the reflective film 82F, the interface between the reflective film 82C and the reflective film 82F, the interface between the reflective film 82C and the reflective film 82G, the interface between the reflective film 82D and the reflective film 82G, and the interface between the reflective film 82D and the reflective film 82H extend linearly.

This structure allows each of the reflective films 82A to 82H to have a relationship such that the length of the reflective films 82A to 82H in each of the third direction and the fourth direction is less than the radius of the reflective films 82A to 82H while the reflective films 82A to 82H maintain a spherical shape having a fixed curvature.

(2-6) The gas cavity 92B defined by the antenna surface 81B and the dielectric 50 is continuous with the gas cavity 92E defined by the antenna surface 81E and the dielectric 50 in the interface between the reflective film 82B (the antenna surface 81B) and the reflective film 82E (the antenna surface 81E) in the third direction. The gas cavity 92C defined by the antenna surface 81C and the dielectric 50 is continuous with the gas cavity 92F defined by the antenna surface 81F and the dielectric 50 in the interface between the reflective film 82C (the antenna surface 81C) and the reflective film 82F (the antenna surface 81F) in the third direction. The gas cavity defined by the antenna surface 81D and the dielectric 50 is continuous with the gas cavity defined by the antenna surface 81G and the dielectric 50 in the interface between the reflective film 82D (the antenna surface 81D) and the reflective film 82G (the antenna surface 81G) in the third direction. This structure has the advantage (2-3) described above.

(2-7) In a cross-sectional view of the antenna base 70 cut along a plane extending in the z-direction and the third direction, which is the arrangement direction of the reflective film 82B and the reflective film 82E, through the center point P2 of the reflective film 82B and the center point P2 of the reflective film 82E, the part of the reflective film 82B connecting opposite endpoints in the third direction and the part of the reflective film 82E connecting opposite endpoints in the third direction are arc-shaped and have a central angle that is less than 180°.

This structure allows the reflective film 82B and the reflective film 82E to have a relationship such that the length of the reflective film 82B in the third direction and the length of the reflective film 82E in the third direction are less than the radius of the reflective film 82B and the radius of the reflective film 82E, respectively, while the reflective film 82B and the reflective film 82E maintain a spherical shape having a fixed curvature.

The relationship between the reflective film 82C and the reflective film 82F and the relationship between the reflective film 82D and the reflective film 82G are the same as the relationship between the reflective film 82B and the reflective film 82E. Therefore, the reflective film 82C and the reflective film 82F and the reflective film 82D and the reflective film 82G also have the advantage described above.

(2-10) The gas cavity defined by the antenna surface 81A and the dielectric 50 is continuous with the gas cavity 92E defined by the antenna surface 81E and the dielectric 50 in the interface between the reflective film 82A (the antenna surface 81A) and the reflective film 82E (the antenna surface 81E) in the fourth direction. The gas cavity 92B defined by the antenna surface 81B and the dielectric 50 is continuous with the gas cavity 92F defined by the antenna surface 81F and the dielectric 50 in the interface between the reflective film 82B (the antenna surface 81B) and the reflective film 82F (the antenna surface 81F) in the fourth direction. The gas cavity 92C defined by the antenna surface 81C and the dielectric 50 is continuous with the gas cavity defined by the antenna surface 81G and the dielectric 50 in the interface between the reflective film 82C (the antenna surface 81C) and the reflective film 82G (the antenna surface 81G) in the fourth direction. The gas cavity defined by the antenna surface 81D and the dielectric 50 is continuous with the gas cavity defined by the antenna surface 81H and the dielectric 50 in the interface between the reflective film 82D (the antenna surface 81D) and the reflective film 82H (the antenna surface 81H) in the fourth direction. This structure has the advantage (2-3) described above.

(2-11) In a cross-sectional view of the antenna base 70 cut along a plane extending in the z-direction and the third direction, which is the arrangement direction of the reflective film 82B and the reflective film 82F, through the center point P2 of the reflective film 82B and the center point P2 of the reflective film 82F, the part of the reflective film 82B connecting opposite endpoints in the third direction and the part of the reflective film 82F connecting opposite endpoints in the third direction are arc-shaped and have a central angle that is less than 180°.

This structure allows the reflective film 82B and the reflective film 82F to have a relationship such that the length of the reflective film 82B in the third direction and the length of the reflective film 82F in the third direction are less than the radius of the reflective film 82B and the radius of the reflective film 82F, respectively, while the reflective film 82B and the reflective film 82F maintain a spherical shape having a fixed curvature.

The relationship between the reflective film 82A and the reflective film 82E, the relationship between the reflective film 82C and the reflective film 82G, the relationship between the reflective film 82D and the reflective film 82H are the same as the relationship between the reflective film 82B and the reflective film 82F. Therefore, the reflective film 82A and the reflective film 82E, the reflective film 82C and the reflective film 82G, and the reflective film 82D and the reflective film 82H have the advantage described above.

Third Embodiment

A third embodiment of a terahertz device 10 will be described with reference to FIGS. 46 to 56. The present embodiment of the terahertz device 10 mainly differs from the first embodiment of the terahertz device 10 in the structure of the antenna base 70. In the description below, the same reference characters are given to those components that are the same as the corresponding components of the terahertz device 10 of the first embodiment. Such components may not be described in detail. Although the structure of the antenna base 70 differs from the structure of the antenna base 70 of the first embodiment, separate antenna bases of the present embodiment are denoted by 70A, 70B, 70C, and so on and distinguished from each other.

Figure 46:
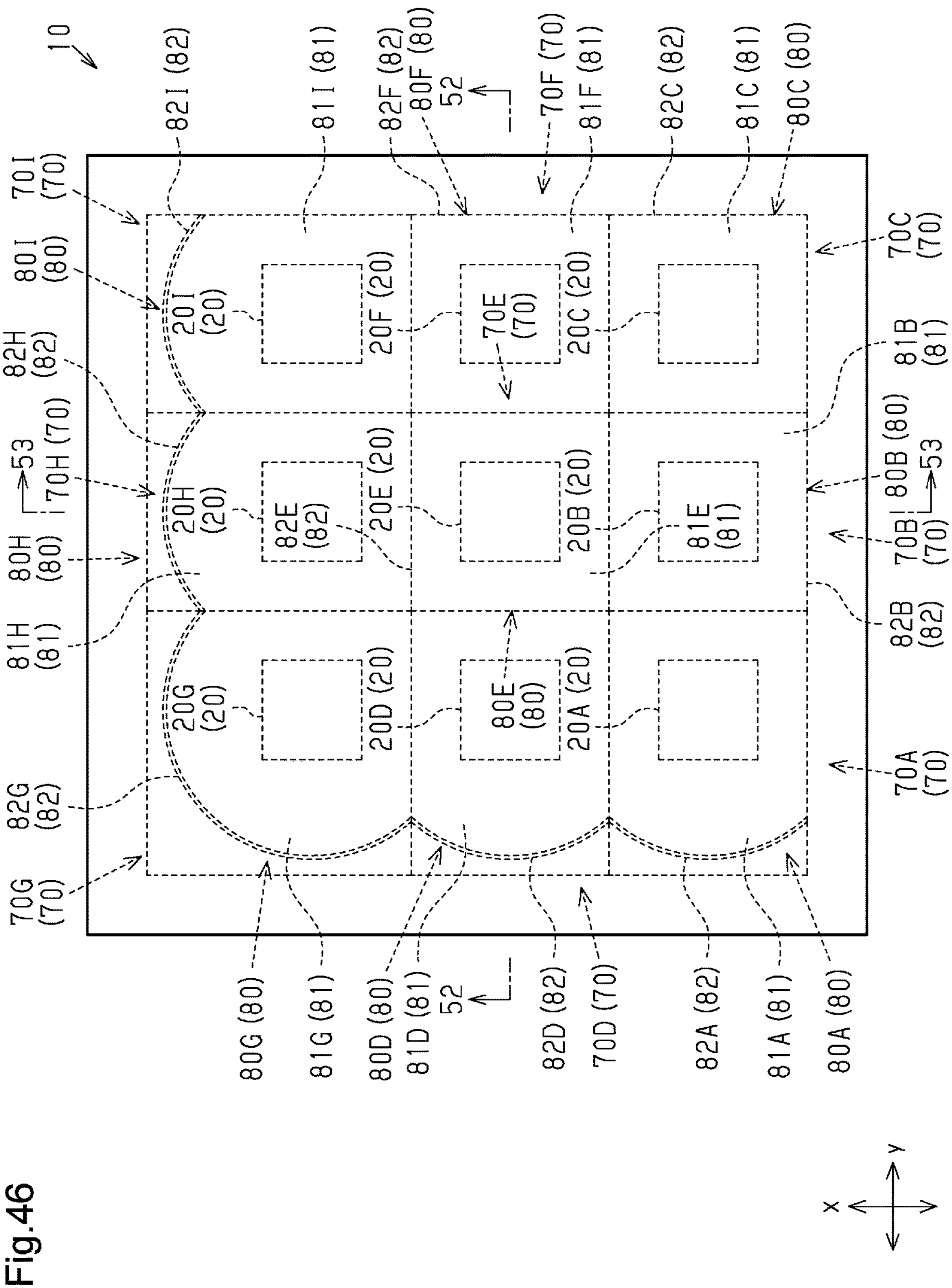
FIG. 46 is a plan view showing a third embodiment of a terahertz device.
Figure 52:
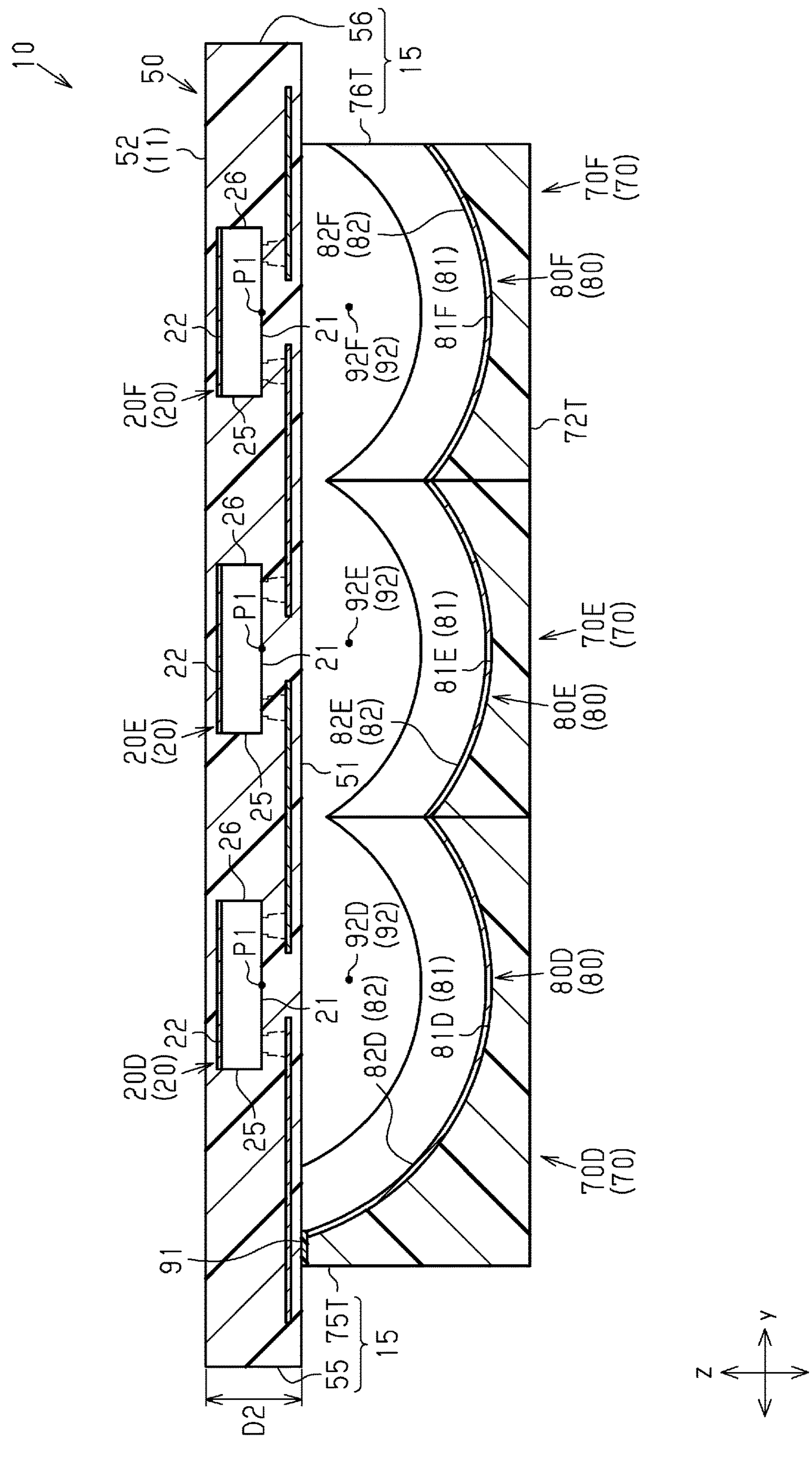
FIG. 52 is a cross-sectional view of the terahertz device shown in FIG. 46 taken along line 52-52.

As shown in FIGS. 46 and 52, the terahertz device 10 includes multiple terahertz elements 20, a dielectric 50, which is an example of a retaining member, an antenna base 70, a reflective film 82, and a gas cavity 92.

As shown in FIG. 46, the terahertz elements 20 include a terahertz element 20A, a terahertz element 20B, a terahertz element 20C, a terahertz element 20D, a terahertz element 20E, a terahertz element 20F, a terahertz element 20G, a terahertz element 20H, and a terahertz element 20I. The terahertz elements 20A to 20I are identical to each other in structure and have the same structure of the terahertz element 20 of the first embodiment.

Figure 53:
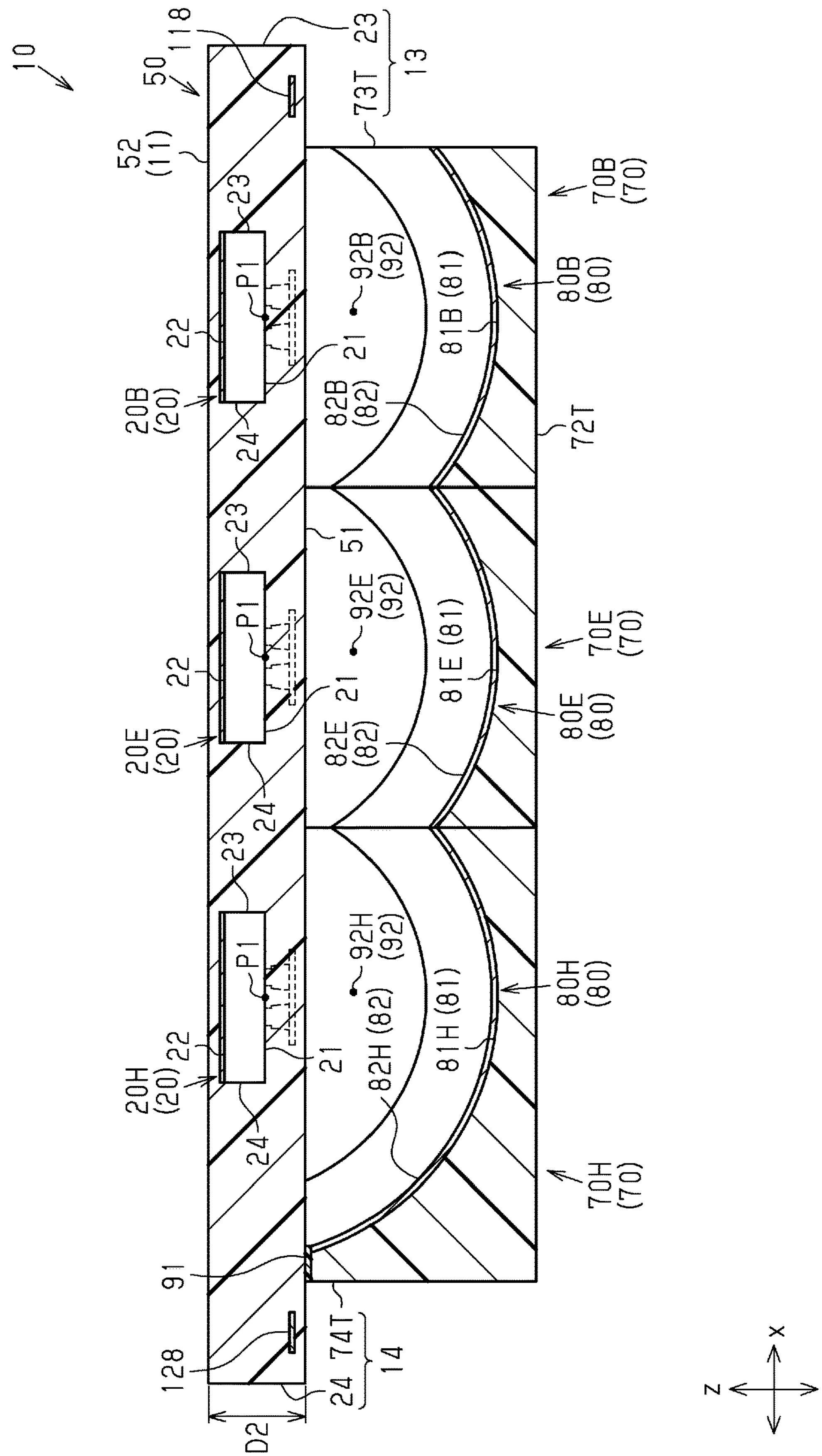
FIG. 53 is a cross-sectional view of the terahertz device shown in FIG. 46 taken along line 53-53.

The dielectric 50 surrounds the terahertz elements 20. In an example, as shown in FIGS. 52 and 53, the dielectric 50 entirely surrounds the terahertz element 20E and covers the element main surface 21, the element back surface 22, and the element side surfaces 23 to 26 of the terahertz element 20E. In the same manner, the dielectric 50 entirely surrounds the terahertz elements 20A to 20D and 20F to 20I and covers the element main surface 21, the element back surface 22, and the element side surfaces 23 to 26 of the terahertz elements 20A to 20D and 20F to 20I.

The element main surface 21, the element back surface 22, and the element side surfaces 23 to 26 of the terahertz elements 20A to 20I are in contact with the dielectric 50. More specifically, in the same manner as the first embodiment, the present embodiment of the dielectric 50 surrounds the terahertz elements 20A to 20I so as not to include any gap between the dielectric 50 and each of the terahertz elements 20A to 20I. In other words, the dielectric 50 encapsulates the terahertz elements 20A to 20I.

As shown in FIG. 46, in an example, the dielectric 50 has the form of a plate in which the thickness-wise direction extends in the z-direction. Specifically, the dielectric 50 has the form of a square plate in which the length in the x-direction is equal to the length in the y-direction. As viewed in the z-direction, the dielectric 50 is square and slightly larger than the antenna base 70. Thus, the dielectric 50 projects from opposite sides of the antenna base 70 in the x-direction and opposite sides of the antenna base 70 in the y-direction.

As shown in FIGS. 52 and 53, the dielectric 50 includes a dielectric main surface 51 and a dielectric back surface 52 that intersect the z-direction. In an example, the dielectric main surface 51 and the dielectric back surface 52 are orthogonal to the z-direction. The dielectric main surface 51 faces downward. The dielectric back surface 52 is a surface opposite the dielectric main surface 51 and faces upward. In the present embodiment, the dielectric back surface 52 defines the device main surface 11.

As shown in FIG. 46, the dielectric 50 includes a first dielectric side surface 53 and a second dielectric side surface 54, which are opposite end surfaces in the x-direction, and a third dielectric side surface 55 and a fourth dielectric side surface 56, which are opposite end surfaces in the y-direction. The dielectric side surfaces 53 to 56 partially define the device side surfaces 13 to 16. In the present embodiment, the first dielectric side surface 53 and the second dielectric side surface 54 are orthogonal to the third dielectric side surface 55 and the fourth dielectric side surface 56.

In the same manner as the first embodiment, the terahertz element 20 is arranged in the dielectric 50 such that the element main surface 21 faces the dielectric main surface 51. In an example, as shown in FIGS. 52 and 53, the terahertz elements 20B, 20D to 20F, and 20H are disposed between the dielectric main surface 51 and the dielectric back surface 52. Although not shown, the terahertz elements 20A, 20C, 20G, and 20I are also disposed between the dielectric main surface 51 and the dielectric back surface 52. In the same manner as the first embodiment, the dielectric 50 of the present embodiment has a dielectric thickness D2, which is a dimension in the z-direction. The dielectric thickness D2 is set to satisfy the resonance condition of electromagnetic waves received by the terahertz element 20.

As shown in FIG. 46, as viewed in the z-direction, the terahertz elements 20A to 20I are arranged in a grid. More specifically, the terahertz elements 20A to 20C are aligned with each other in the x-direction and are separate from each other in the y-direction. The terahertz elements 20D to 20F are aligned with each other in the x-direction and are separate from each other in the y-direction. The terahertz elements 20G to 20I are aligned with each other in the x-direction and are separate from each other in the y-direction. The row of the terahertz elements 20A to 20C, the row of the terahertz elements 20D to 20F, and the row of the terahertz elements 20G to 20I are aligned with each other in the y-direction and are separate from each other in the y-direction. More specifically, the terahertz element 20A, the terahertz element 20D, and the terahertz element 20G are aligned with each other in the y-direction and are separate from each other in the x-direction. The terahertz element 20B, the terahertz element 20E, and the terahertz element 20H are aligned with each other in the y-direction and are separate from each other in the x-direction. The terahertz element 20C, the terahertz element 20F, and the terahertz element 20I are aligned with each other in the y-direction and are separate from each other in the x-direction. In the present embodiment, the terahertz elements 20 that are adjacent to each other in the x-direction and the y-direction have the same pitch (inter-element distance). It is considered that the terahertz elements 20 adjacent in the x-direction and the y-direction have the same pitch (inter-element distance), for example, when the largest misalignment amount of the terahertz elements 20 adjacent to each other the x-direction and the y-direction is within 5% of an average value of the pitches of the terahertz elements 20 adjacent to each other in the x-direction and the y-direction. The pitch (inter-element distance) in the x-direction refers to the distance between the reception points P1 of the terahertz elements 20 adjacent to each other in the x-direction. The pitch (inter-element distance) in the y-direction refers to the distance between the reception points P1 of the terahertz elements 20 adjacent to each other in the y-direction.

Figure 47:
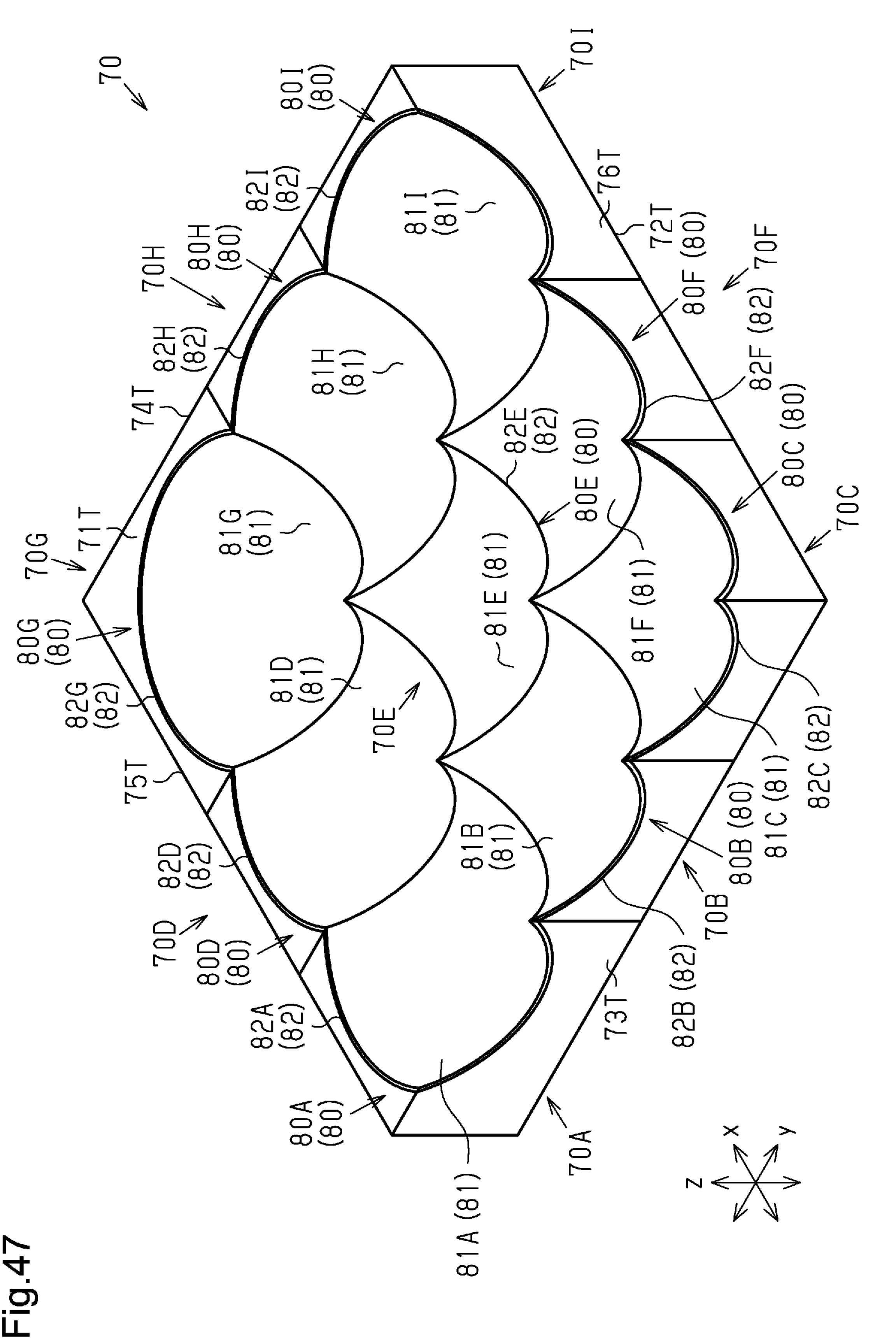
FIG. 47 is a perspective view of an antenna base of the terahertz device shown in FIG. 46 as viewed from above.
Figure 48:
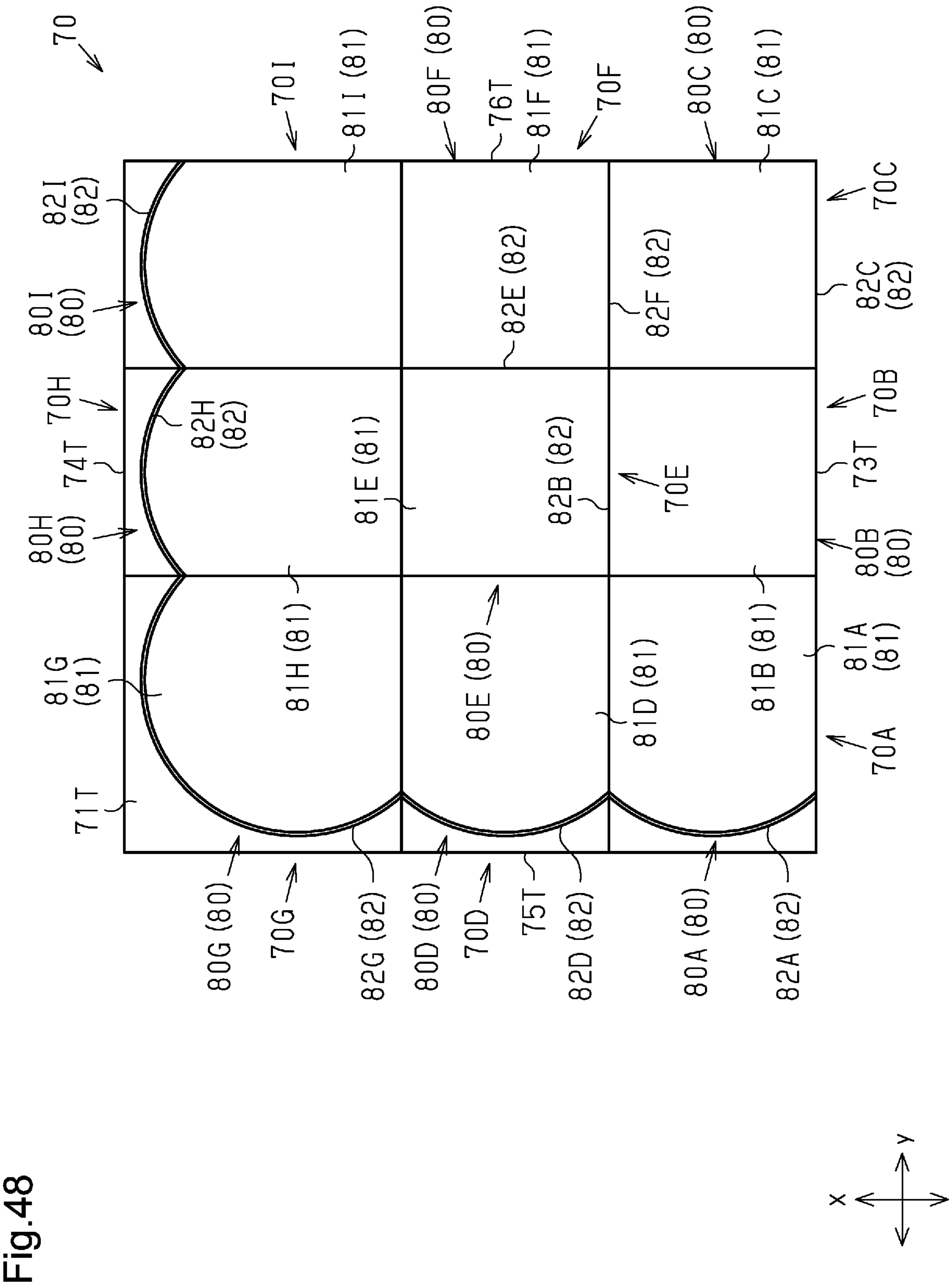
FIG. 48 is a plan view of the antenna base shown in FIG. 47.

As shown in FIGS. 46 to 48, in the present embodiment, as viewed from above, the antenna base 70 is square. More specifically, the first base side surface 73T and the second base side surface 74T are opposed to each other in the x-direction and extend in the y-direction. The third base side surface 75T and the fourth base side surface 76T are opposed to each other in the y-direction and extend in the x-direction. The antenna base 70 is formed from the same material as the antenna base 70 of the first embodiment.

In the present embodiment, the antenna base 70 includes a combination of multiple (in the present embodiment, nine) separate antenna bases 70A, 70B, 70C, 70D, 70E, 70F, 70G, 70H, and 70I. More specifically, the antenna base 70 includes the row of the separate antenna bases 70A, 70B, and 70C, the row of the separate antenna bases 70D, 70E, and 70F, and the row of the separate antenna bases 70G, 70H, and 70I. The rows of the separate antenna bases 70A to 70C, 70D to 70F, and 70G to 70I extend in the y-direction.

The separate antenna bases 70A to 70C include the first base side surface 73T. The separate antenna bases 70G to 70I include the second base side surface 74T. The separate antenna bases 70A, 70D, and 70G include the third base side surface 75T. The separate antenna bases 70C, 70F, and 70I include the fourth base side surface 76T. That is, the separate antenna bases 70A, 70C, 70G, and 70H define the four corners of the antenna base 70.

In the present embodiment, the separate antenna base 70B is sandwiched between the separate antenna base 70A and the separate antenna base 70C in the y-direction. The separate antenna base 70E is sandwiched between the separate antenna base 70D and the separate antenna base 70F in the y-direction. The separate antenna base 70H is sandwiched between the separate antenna base 70G and the separate antenna base 70I in the y-direction. The separate antenna base 70D is sandwiched between the separate antenna base 70A and the separate antenna base 70G in the x-direction. The separate antenna base 70E is sandwiched between the separate antenna base 70B and the separate antenna base 70H in the x-direction. The separate antenna base 70F is sandwiched between the separate antenna base 70C and the separate antenna base 70I in the x-direction.

As shown in FIG. 46, the separate antenna base 70A is positioned to be opposed to the terahertz element 20A in the thickness-wise direction of the terahertz element 20A (the z-direction). The separate antenna base 70B is positioned to be opposed to the terahertz element 20B in the thickness-wise direction of the terahertz element 20B (the z-direction). The separate antenna base 70C is positioned to be opposed to the terahertz element 20C in the thickness-wise direction of the terahertz element 20C (the z-direction). The separate antenna base 70D is positioned to be opposed to the terahertz element 20D in the thickness-wise direction of the terahertz element 20D (the z-direction). The separate antenna base 70E is positioned to be opposed to the terahertz element 20E in the thickness-wise direction of the terahertz element 20E (the z-direction). The separate antenna base 70F is positioned to be opposed to the terahertz element 20F in the thickness-wise direction of the terahertz element 20F (the z-direction). The separate antenna base 70G is positioned to be opposed to the terahertz element 20G in the thickness-wise direction of the terahertz element 20G (the z-direction). The separate antenna base 70H is positioned to be opposed to the terahertz element 20H in the thickness-wise direction of the terahertz element 20H (the z-direction). The separate antenna base 70I is positioned to be opposed to the terahertz element 20I in the thickness-wise direction of the terahertz element 20I (the z-direction). In the present embodiment, the separate antenna bases 70A to 70I are disposed at a position lower than the terahertz elements 20A to 20I.

As shown in FIG. 47, in the same manner as the first embodiment, the antenna base 70 includes antenna recesses 80 that are recessed from the base main surface 71T toward the base back surface 72T. Specifically, as shown in FIGS. 47 and 48, in the present embodiment, the separate antenna base 70A includes the antenna recess 80A, the separate antenna base 70B includes the antenna recess 80B, the separate antenna base 70C includes the antenna recess 80C, the separate antenna base 70D includes the antenna recess 80D, the separate antenna base 70E includes the antenna recess 80E, the separate antenna base 70F includes the antenna recess 80F, the separate antenna base 70G includes the antenna recess 80G, the separate antenna base 70H includes the antenna recess 80H, and the separate antenna base 70I includes the antenna recess 80I.

As shown in FIGS. 52 to 53, in the same manner as the first embodiment, each antenna recess 80 includes an antenna surface 81 opposed to the terahertz element 20 through the dielectric 50 and the gas cavity 92. Specifically, as shown in FIGS. 47 and 48, in the present embodiment, the antenna recess 80A includes an antenna surface 81A, the antenna recess 80B includes an antenna surface 81B, the antenna recess 80C includes an antenna surface 81C, and the antenna recess 80D includes an antenna surface 81D. Also, the antenna recess 80E includes the antenna surface 81E, the antenna recess 80F includes the antenna surface 81F, the antenna recess 80G includes the antenna surface 81G, the antenna recess 80H includes the antenna surface 81H, and the antenna recess 80I includes the antenna surface 81I. As viewed from above, the antenna surfaces 81A to 81I are identical in shape to the openings of the antenna recesses 80A to 80I, respectively.

As shown in FIGS. 52 and 53, in the same manner as the first embodiment, the reflective film 82 is formed on the antenna surface 81. The reflective film 82 is formed on the entire antenna surface 81. The reflective film 82 is not formed on the base main surface 71T. Thus, the reflective film 82 is substantially identical in shape to the antenna surface 81. The reflective film 82 is formed from the same material as the first embodiment of the reflective film 82.

As shown in FIGS. 47 and 48, the reflective film 82 includes the reflective film 82A formed on the antenna surface 81A, the reflective film 82B formed on the antenna surface 81B, the reflective film 82C formed on the antenna surface 81C, the reflective film 82D formed on the antenna surface 81D, the reflective film 82E formed on the antenna surface 81E, the reflective film 82F formed on the antenna surface 81F, the reflective film 82G formed on the antenna surface 81G, the reflective film 82H formed on the antenna surface 81H, and the antenna surface 81I formed on the reflective film 82I. In the present embodiment, the reflective films 82A to 82I are integrally formed to be a single component.

The reflective film 82A is substantially identical in shape to the antenna surface 81A. The reflective film 82B is substantially identical in shape to the antenna surface 81B. The reflective film 82C is substantially identical in shape to the antenna surface 81C. The reflective film 82D is substantially identical in shape to the antenna surface 81D. The reflective film 82E is substantially identical in shape to the antenna surface 81E. The reflective film 82F is substantially identical in shape to the antenna surface 81F. The reflective film 82G is substantially identical in shape to the antenna surface 81G. The reflective film 82H is substantially identical in shape to the antenna surface 81H. The reflective film 82I is substantially identical in shape to the antenna surface 81I. In other words, each of the reflective films 82A to 82I is a parabolic reflector and is curved to be bowl-shaped. As viewed from above, each of the reflective films 82A to 82I has the form of a circle that is partially cut away. The reflective films 82A to 82I are curved to project toward the device back surface 12 (the base back surface 72). The reflective films 82A to 82I are open upward in one direction (in the present embodiment, upward).

As shown in FIGS. 52 and 53, the reflective films 82A to 82I are opposed to the dielectric 50 in the z-direction. In other words, the reflective films 82A to 82I are disposed to be opposed to the dielectric 50.

Electromagnetic waves reflected by the reflective film 82 are emitted toward the reception point P1. In an example, as shown in FIG. 52, electromagnetic waves reflected by the reflective film 82D are emitted toward the reception point P1 of the terahertz element 20D. Electromagnetic waves reflected by the reflective film 82E are emitted toward the reception point P1 of the terahertz element 20E. Electromagnetic waves reflected by the reflective film 82F are emitted toward the reception point P1 of the terahertz element 20F. As shown in FIG. 53, electromagnetic waves reflected by the reflective film 82B are emitted toward the reception point P1 of the terahertz element 20B. Electromagnetic waves reflected by the reflective film 82H are emitted toward the reception point P1 of the terahertz element 20H. Although not shown, electromagnetic waves reflected by the reflective film 82A are emitted toward the reception point P1 of the terahertz element 20A. Electromagnetic waves reflected by the reflective film 82C are emitted toward the reception point P1 of the terahertz element 20C. Electromagnetic waves reflected by the reflective film 82G are emitted toward the reception point P1 of the terahertz element 20G. Electromagnetic waves reflected by the reflective film 82I are emitted toward the reception point P1 of the terahertz element 20I.

The positional relationship of the reflective film 82 with the terahertz element 20 is the same as the first embodiment. Also, the size relationship of the reflective film 82 and the terahertz element 20 is the same as the first embodiment. As viewed from above, the reflective films 82A to 82I are larger than the terahertz elements 20A to 20I, respectively.

As shown in FIGS. 52 and 53, the antenna base 70 and the dielectric 50 are fixed by the adhesive layer 91 in the same manner as the first embodiment. The adhesive layer 91 is configured not to extend inward (in other words, toward the terahertz element 20) beyond the reflective film 82.

Figure 49:
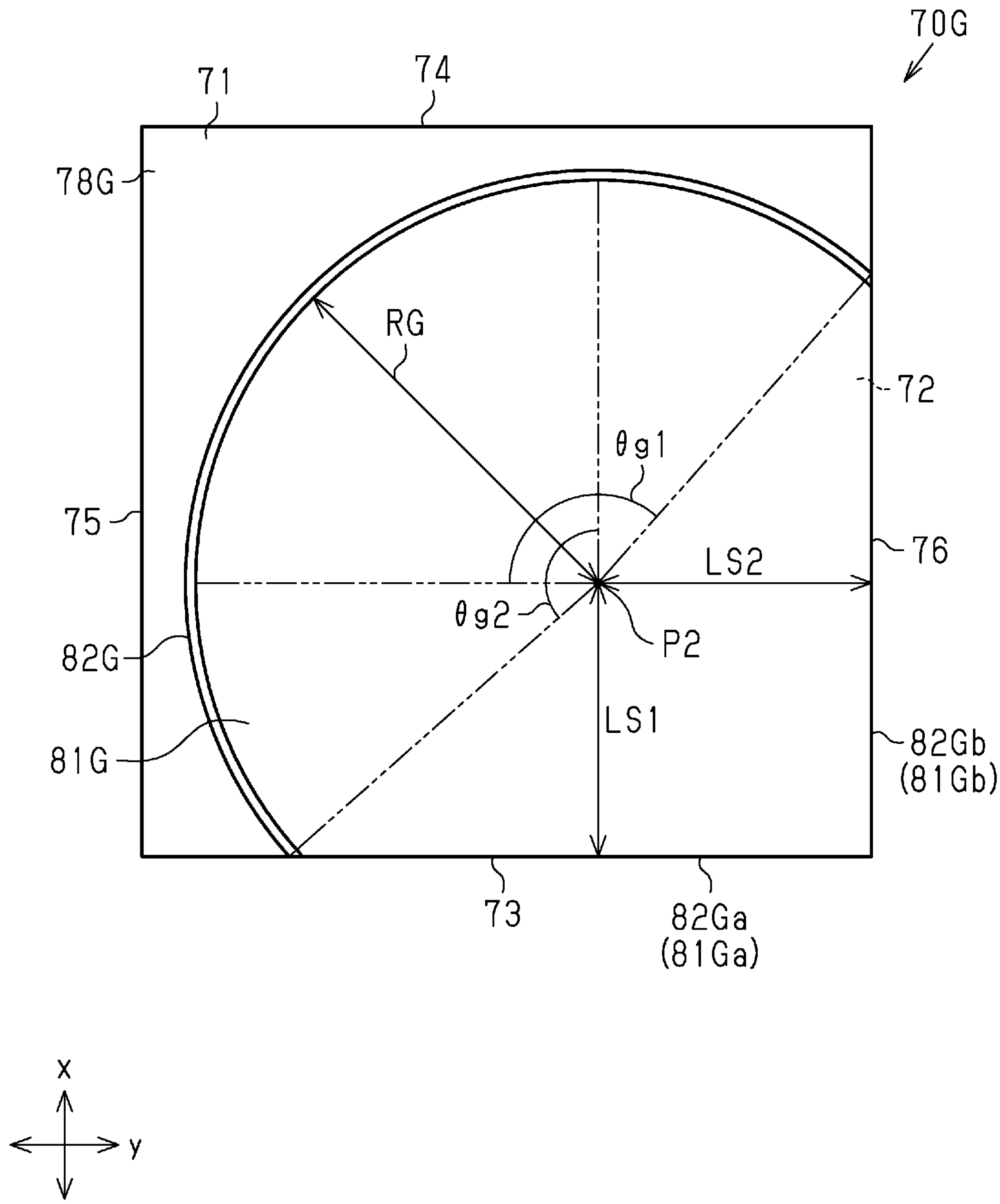
FIG. 49 is a plan view showing one type of separate antenna base forming the antenna base shown in FIG. 48.
Figure 50:
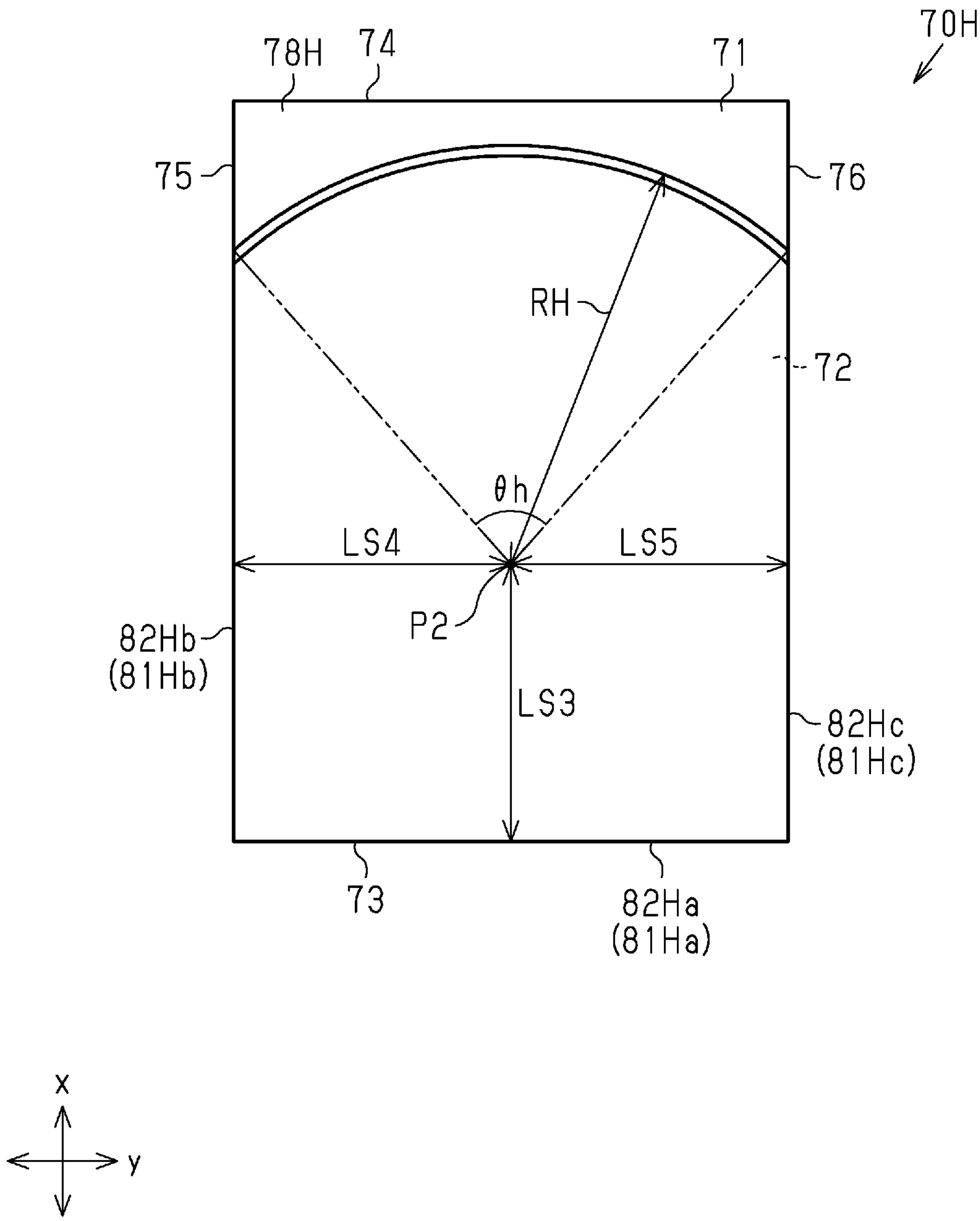
FIG. 50 is a plan view showing another type of separate antenna base forming the antenna base shown in FIG. 48.
Figure 51:
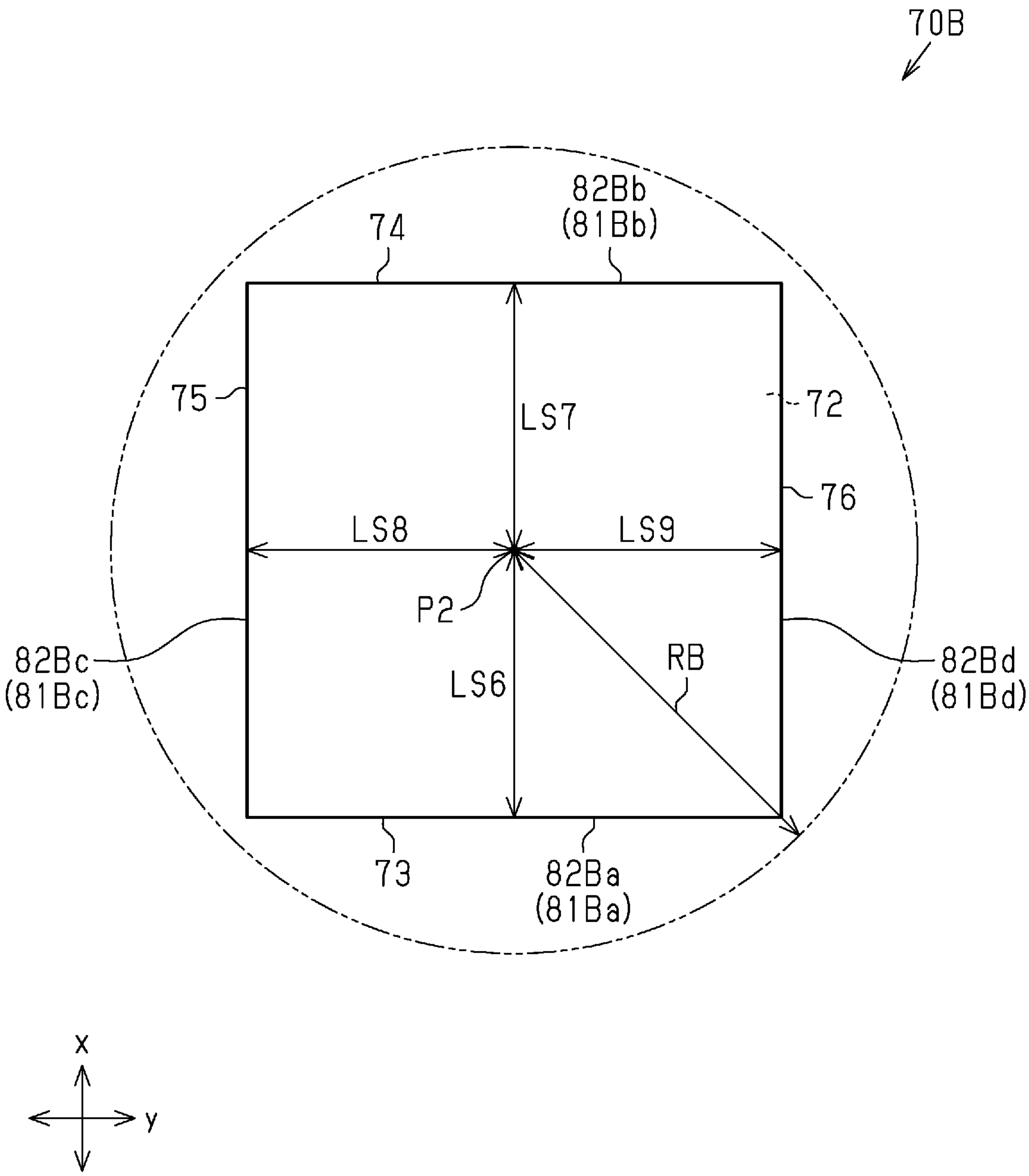
FIG. 51 is a plan view showing a further type of separate antenna base forming the antenna base shown in FIG. 48.

As shown in FIGS. 49 to 51, in the present embodiment, three types of separate antenna bases are used in the antenna base 70.

As shown in FIG. 49, the separate antenna base 70G includes a base main surface 71 and a base back surface 72 that intersect the z-direction. The base main surface 71 and the base back surface 72 intersect the z-direction. In the present embodiment, the base main surface 71 and the base back surface 72 are orthogonal to the z-direction. As viewed in the z-direction, the base main surface 71 and the base back surface 72 are each square. In the present embodiment, the base main surface 71 and the base back surface 72 are, for example, identical in shape. However, the base main surface 71 and the base back surface 72 may have different shapes.

The separate antenna base 70G includes a first base side surface 73, a second base side surface 74, a third base side surface 75, and a fourth base side surface 76 as four base side surfaces. The base side surfaces 73 to 76 are surfaces of the terahertz device 10 (the antenna base 70) facing sideward. The base side surfaces 73 to 76 are disposed in directions orthogonal to the opposing direction of the base main surface 71 and the base back surface 72 and join the base main surface 71 to the base back surface 72.

The first base side surface 73 and the second base side surface 74 are opposed to each other in the x-direction. As viewed in the z-direction, the base side surfaces 73 and 74 extend in the y-direction. The second base side surface 74 defines a portion of the second base side surface 74T (refer to FIG. 48) of the antenna base 70.

The third base side surface 75 and the fourth base side surface 76 are opposed to each other in the y-direction. As viewed in the z-direction, the base side surfaces 75 and 76 extend in the x-direction. The third base side surface 75 defines a portion of the third base side surface 75T of the antenna base 70.

The antenna surface 81G of the antenna recess 80G is recessed from the base main surface 71 of the separate antenna base 70G toward the base back surface 72. In the present embodiment, the antenna surface 81G is spherically recessed. In a cross-sectional view of the separate antenna base 70G cut along a plane extending in the x-direction and the z-direction, the antenna surface 81G is curved to project toward the base back surface 72. In a cross-sectional view of the separate antenna base 70G cut along a plane extending in the y-direction and the z-direction, the antenna surface 81G is curved to project toward the base back surface 72. The antenna surface 81G is open in the base main surface 71. That is, the antenna surface 81G is open upward.

As viewed from above, the opening of the antenna surface 81G has the form of a circle that is partially cut away. Specifically, the opening of the antenna surface 81G is cut away at an open end 81Ga, which is an end of the antenna surface 81G located at the first base side surface 73, and an open end 81Gb, which is an end of the antenna surface 81G located at the fourth base side surface 76. As viewed from above, each of the open ends 81Ga and 81Gb extends linearly.

As viewed from above, the open end 81Ga of the antenna surface 81G is positioned to overlap the first base side surface 73, and the open end 81Gb is positioned to overlap the fourth base side surface 76.

The reflective film 82G is formed on the antenna surface 81G. The reflective film 82G is formed on the entire antenna surface 81G. The reflective film 82G is not formed on the base main surface 71.

As viewed from above, the opening of the reflective film 82G is identical in shape to the opening of the antenna surface 81G. More specifically, as viewed from above, the opening of the reflective film 82G includes an open end 82Ga that overlaps the open end 81Ga of the antenna surface 81G and an open end 82Gb that overlaps the open end 81Gb of the antenna surface 81G. As viewed from above, each of the open ends 81Ga and 81Gb extends linearly.

As viewed from above, the reflective film 82G is formed so that the center point P2 is located at a position differing from the middle of the separate antenna base 70G in each of the x-direction and the y-direction. In the present embodiment, as viewed from above, the reflective film 82G is located closer to the first base side surface 73 and the fourth base side surface 76 than the middle of the separate antenna base 70G in each of the x-direction and the y-direction. More specifically, as viewed from above, the reflective film 82G is formed so that the center point P2 is located in the x-direction closer to the first base side surface 73 than the middle of the separate antenna base 70G in the x-direction. Also, as viewed from above, the reflective film 82G is formed so that the center point P2 is located in the y-direction closer to the fourth base side surface 76 than the middle of the separate antenna base 70G in the y-direction.

As viewed from above, the center point P2 of the reflective film 82G coincides with the center point of the antenna surface 81E, and the reflective film 82G is substantially identical in shape to the antenna surface 81G. Thus, in the same manner as the reflective film 82G, as viewed from above, the antenna surface 81G is formed so that the center point of the antenna surface 81G is located at a position differing from the middle of the separate antenna base 70G in each of the x-direction and the y-direction.

As viewed from above, the arc-shaped circumference of the reflective film 82G includes a circumferential part that connects arc endpoints in the first direction, which is the arrangement direction of the reflective film 82G and the reflective film 82H. The circumferential part is arc-shaped and has a central angle of less than 180°. In the present embodiment, as viewed from above, the circumferential part of the reflective film 82G that connects the arc endpoints in the first direction (in the present embodiment, the y-direction) is arc-shaped and has a central angle θg1 of less than 180°.

As viewed from above, the arc-shaped circumference of the reflective film 82G includes a circumferential part that connects arc endpoints in the second direction, which is the arrangement direction of the reflective film 82G and the reflective film 82D, is arc-shaped and has a central angle of less than 180°. In the present embodiment, as viewed from above, the circumferential part of the reflective film 82G that connects the arc endpoints in the second direction (in the present embodiment, the x-direction) is arc-shaped and has a central angle θg2 of less than 180°.

As viewed from above, the reflective film 82G is substantially identical in shape to the antenna surface 81G. Thus, in the same manner as the reflective film 82G, the antenna surface 81G includes an arc-shaped circumference including a circumferential part that connects arc endpoints in the first direction, which is the arrangement direction of the antenna surface 81G and the antenna surface 81H (in the present embodiment, the y-direction). The circumferential part is arc-shaped and has a central angle of less than 180°. As viewed from above, the antenna surface 81G includes an arc-shaped circumference including a circumferential part that connects arc endpoints in the second direction, which is the arrangement direction of the antenna surface 81G and the antenna surface 81D (in the present embodiment, the x-direction). The circumferential part is arc-shaped and has a central angle of less than 180°.

As viewed from above, a perpendicular line to the open end 82Ga of the reflective film 82G extending through the center point P2 of the reflective film 82G has a length LS1 that is less than the radius RG of the reflective film 82G. As viewed from above, a perpendicular line to the open end 82Gb of the reflective film 82G extending through the center point P2 of the reflective film 82G has a length LS2 that is less than the radius RG of the reflective film 82G. As viewed from above, the perpendicular line to the open end 82Ga of the reflective film 82G linearly extends in the x-direction, and the perpendicular line to the open end 82Gb of the reflective film 82G linearly extends in the y-direction. The length LS1 extends in the second direction (in the present embodiment, the x-direction). The length LS2 extends in the first direction (in the present embodiment, the y-direction). Therefore, the length (LS1+RG) of the reflective film 82G in the first direction is less than the diameter (2×RG) of the reflective film 82G. The length (LS2+RG) of the reflective film 82G in the second direction is less than the diameter of the reflective film 82G. As viewed from above, the reflective film 82G is smaller in the first direction, which is the direction in which the reflective films 82G to 82I (refer to FIG. 37) are arranged, than in a third direction that differs from the first direction and the second direction, which is the direction in which the reflective films 82G, 82D, and 82A are arranged. As viewed from above, the third direction intersects the first direction and the second direction. As viewed from above, the reflective film 82G is smaller in the second direction than in the third direction.

As viewed from above, the reflective film 82G is substantially identical in shape to the antenna surface 81G. Thus, the relationship of the radius of the antenna surface 81G with the lengths of the perpendicular lines to the open ends 81Ga and 81Gb of the antenna surface 81G extending through the center point of the antenna surface 81G is the same as the relationship of the radius RG of the reflective film 82G with the lengths LS1 and LS2 of the reflective film 82G.

Although not shown, in a cross-sectional view of the separate antenna base 70G cut along a plane extending in the y-direction and the z-direction through the center point P2 of the reflective film 82G, the reflective film 82G includes an arc-shaped part that connects the opposite endpoints in the y-direction and has a central angle of less than 180°. Also, in a cross-sectional view of the separate antenna base 70G cut along a plane extending in the x-direction and the z-direction through the center point P2 of the reflective film 82G, the reflective film 82G includes an arc-shaped part that connects the opposite endpoints in the x-direction and has a central angle of less than 180°.

Also, although not shown, in a cross-sectional view of the separate antenna base 70G cut along a plane extending in the y-direction and the z-direction through the center point of the antenna surface 81G, the antenna surface 81G includes an arc-shaped part that connects the opposite endpoints in the y-direction and has a central angle of less than 180°. Also, in a cross-sectional view of the separate antenna base 70G cut along a plane extending in the x-direction and the z-direction through the center point of the antenna surface 81G, the antenna surface 81G includes an arc-shaped part that connects the opposite endpoints in the x-direction and has a central angle of less than 180°.

As viewed from above, the separate antenna base 70G includes a peripheral wall 78G extending around the opening of the antenna recess 80G except the cutaway portions of the opening. The peripheral wall 78G forms the base main surface 71 of the separate antenna base 70G.

As shown in FIG. 48, the separate antenna bases 70A, 70D, 70H, and 70I are identical in shape. Hence, the structure of the separate antenna base 70H shown in FIG. 50 will be described as an example. The structure of the separate antenna bases 70A, 70D, and 70I will not be described.

As shown in FIG. 50, in the same manner as the separate antenna base 70G, the separate antenna base 70H includes a base main surface 71 and a base back surface 72 that intersect the z-direction. As viewed in the z-direction, the base main surface 71 and the base back surface 72 are rectangular. In the present embodiment, the base main surface 71 and the base back surface 72 are, for example, identical in shape. However, the base main surface 71 and the base back surface 72 may have different shapes.

The separate antenna base 70H includes a first base side surface 73, a second base side surface 74, a third base side surface 75, and a fourth base side surface 76 as four base side surfaces. The base side surfaces 73 to 76 are surfaces of the terahertz device 10 (the antenna base 70) facing sideward. The base side surfaces 73 to 76 are disposed in directions orthogonal to the opposing direction of the base main surface 71 and the base back surface 72. The base side surfaces 73 to 76 join the base main surface 71 and the base back surface 72.

The first base side surface 73 and the second base side surface 74 are opposed to each other in the x-direction. As viewed in the z-direction, the base side surfaces 73 and 74 extend in the y-direction. The dimension of each of the base side surfaces 73 and 74 of the separate antenna base 70H in the y-direction is less than the dimension of each of the base side surfaces 73 and 74 of the separate antenna base 70G in the y-direction.

The third base side surface 75 and the fourth base side surface 76 are opposed to each other in the y-direction. As viewed in the z-direction, the base side surfaces 75 and 76 extend in the x-direction. The dimension of each of the base side surfaces 75 and 76 of the separate antenna base 70H in the x-direction is equal to the dimension of each of the base side surfaces 75 and 76 of the separate antenna base 70G in the x-direction.

The antenna surface 81H of the antenna recess 80H is recessed from the base main surface 71 toward the base back surface 72. In the present embodiment, the antenna surface 81H is spherically recessed. In a cross-sectional view of the separate antenna base 70H cut along a plane extending in the x-direction and the z-direction, the antenna surface 81H is curved to project toward the base back surface 72. In a cross-sectional view of the separate antenna base 70H cut along a plane extending in the y-direction and the z-direction, the antenna surface 81H is curved to project toward the base back surface 72. The antenna surface 81H is open in the base main surface 71. That is, the antenna surface 81H is open upward.

As viewed from above, the opening of the antenna surface 81H has the form of a circle that is partially cut away. Specifically, the opening of the antenna surface 81H is cut away at an open end 81Ha located at the first base side surface 73, an open end 81Hb located at the third base side surface 75, and an open end 81Hc located at the fourth base side surface 76. As viewed from above, each of the open ends 81Ha to 81Hc extends linearly.

As viewed from above, the open end 81Ha of the antenna surface 81H is positioned to overlap the first base side surface 73. The open end 81Hb is positioned to overlap the third base side surface 75. The open end 81Hc is positioned to overlap the fourth base side surface 76.

The reflective film 82H is formed on the antenna surface 81H. The reflective film 82H is formed on the entire antenna surface 81H. The reflective film 82H is not formed on the base main surface 71 of the separate antenna base 70H.

As viewed from above, the opening of the reflective film 82H is identical in shape to the opening of the antenna surface 81H. More specifically, as viewed from above, the opening of the reflective film 82H includes an open end 82Ha that overlaps the open end 81Ha of the antenna surface 81H, an open end 82Hb that overlaps the open end 81Hb of the antenna surface 81H, and an open end 82Hc that overlaps the open end 81Hc of the antenna surface 81H. As viewed from above, each of the open ends 82Ha to 82Hc extends linearly.

As viewed from above, the reflective film 82H is formed so that the center point P2 is located at a position differing from the middle of the separate antenna base 70H in the x-direction. In the present embodiment, as viewed from above, the reflective film 82H is formed so that the center point P2 in the x-direction is located closer to the first base side surface 73 than the middle of the separate antenna base 70H in the x-direction. As viewed from above, the reflective film 82H is formed so that the center point P2 in the y-direction is located in the middle of the separate antenna base 70H in the y-direction.

As viewed from above, the center point P2 of the reflective film 82H coincides with the center point of the antenna surface 81H, and the reflective film 82H is substantially identical in shape to the antenna surface 81H. Thus, as viewed from above, the antenna surface 81H is formed so that the center point is located at a position differing from the middle of the separate antenna base 70H in the x-direction.

As viewed from above, the arc-shaped circumference of the reflective film 82H includes a circumferential part that connects arc endpoints in the first direction, which is the arrangement direction of the reflective film 82H and the reflective film 82G. The circumferential part is arc-shaped and has a central angle of less than 180°. In the present embodiment, as viewed from above, the circumferential part of the reflective film 82H that connects the opposite endpoints in the first direction (in the present embodiment, the y-direction) is arc-shaped and has a central angle θh of less than 180°. Preferably, the central angle θh is less than 90°.

As viewed from above, the reflective film 82H is substantially identical in shape to the antenna surface 81H. Thus, in the same manner as the reflective film 82H, the antenna surface 81H includes an arc-shaped circumference including a circumferential part that connects the opposite endpoints in the first direction, which is the arrangement direction of the antenna surface 81H and the antenna surface 81G (in the present embodiment, the y-direction), is arc-shaped and has a central angle of less than 180°.

As viewed from above, a perpendicular line to the open end 82Ha of the reflective film 82H extending through the center point P2 of the reflective film 82H has a length LS3 that is less than a radius RH of the reflective film 82H. As viewed from above, a perpendicular line to the open end 82Hb of the reflective film 82H extending through the center point P2 of the reflective film 82H has a length LS4 that is less than the radius RH of the reflective film 82H. As viewed from above, a perpendicular line to the open end 82Hc of the reflective film 82H extending through the center point P2 of the reflective film 82H has a length LS5 that is less than the radius RH of the reflective film 82H. The perpendicular line to the open end 82Ha of the reflective film 82H linearly extends in the x-direction. The perpendicular lines to the open end 82Hb of the reflective film 82H and the open end 82Hc of the reflective film 82H linearly extend in the y-direction. The length LS3 extends in the second direction, which is orthogonal to the first direction. The lengths LS4 and LS5 extend in the first direction. Thus, the length (LS3+RH) of the reflective film 82H in the second direction is less than the diameter (2×RH) of the reflective film 82H. The length (LS4+LS5) of the reflective film 82H in the first direction is less than the diameter of the reflective film 82H. As viewed from above, the reflective film 82H is smaller in the first direction, which is the direction in which the reflective films 82G to 82I (refer to FIG. 37) are arranged, than in a third direction that differs from the first direction and the second direction, which is the direction in which the reflective films 82H, 82E, and 82B are arranged. As viewed from above, the third direction intersects the first direction and the second direction. More specifically, the third direction is in the range of the central angle θh and excludes the second direction. As viewed from above, the reflective film 82H is smaller in the second direction than in the third direction.

As viewed from above, the reflective film 82H is substantially identical in shape to the antenna surface 81H. Thus, the relationship of the radius of the antenna surface 81H with the lengths of the perpendicular lines to the open ends 81Ha to 81Hc of the antenna surface 81H extending through the center point of the antenna surface 81H is the same as the relationship of the radius RH of the reflective film 82H with the lengths LR3 to LR5 of the reflective film 82H.

As shown in FIG. 53, in a cross-sectional view of the separate antenna base 70H cut along a plane extending in the x-direction and the z-direction through the center point P2 of the reflective film 82H, the reflective film 82H includes an arc-shaped part that connects the opposite endpoints in the x-direction and has a central angle of less than 180°. Also, although not shown, in a cross-sectional view of the separate antenna base 70H cut along a plane extending in the y-direction and the z-direction through the center point P2 of the reflective film 82H, the reflective film 82H includes an arc-shaped part that connects the opposite endpoints in the y-direction and has a central angle of less than 180°.

As shown in FIG. 53, in a cross-sectional view of the separate antenna base 70H cut along a plane extending in the x-direction and the z-direction through the center point of the antenna surface 81H, the antenna surface 81H includes an arc-shaped part that connects the opposite endpoints in the x-direction and has a central angle of less than 180°. Also, although not shown, in a cross-sectional view of the separate antenna base 70H cut along a plane extending in the y-direction and the z-direction through the center point of the antenna surface 81H, the antenna surface 81H includes an arc-shaped part that connects the opposite endpoints in the y-direction and has a central angle of less than 180°.

As viewed from above, the separate antenna base 70H includes a peripheral wall 78H extending around the opening of the antenna recess 80H except the cutaway portions of the opening. The peripheral wall 78H forms the base main surface 71 of the separate antenna base 70H.

The antenna surface 81A of the antenna recess 80A in the separate antenna base 70A, the antenna surface 81D of the antenna recess 80D in the separate antenna base 70D, and the antenna surface 81I of the antenna recess 80I in the separate antenna base 70I are identical in shape to the antenna surface 81H. The reflective films 82A, 82D, and 82I are identical in shape to the reflective film 82H.

As shown in FIG. 48, the separate antenna base 70I and the separate antenna base 70H are arranged in the same orientation. The separate antenna bases 70A and 70D and the separate antenna base 70H are arranged in different orientations. The second base side surfaces of the separate antenna bases 70A and 70D define the third base side surface 75T of the antenna base 70. The second base side surfaces of the separate antenna bases 70H and 70I define the second base side surface 74T of the antenna base 70. The third base side surface of the separate antenna base 70A defines the first base side surface 73T of the antenna base 70. The fourth base side surface of the separate antenna base 70H defines the fourth base side surface 76T of the antenna base 70.

As shown in FIG. 48, the separate antenna bases 70B, 70C, 70E, and 70F are identical in shape. Hence, the structure of the separate antenna base 70B shown in FIG. 51 will be described as an example. The structure of the separate antenna bases 70C, 70E, and 70F will not be described.

As shown in FIG. 51, the separate antenna base 70B includes a base back surface 72 as a surface intersecting the z-direction. In other words, the separate antenna base 70B does not include a base main surface. The base back surface 72 intersects the z-direction. In the present embodiment, the base back surface 72 is orthogonal to the z-direction. As viewed in the z-direction, the base back surface 72 is square.

The separate antenna base 70B includes a first base side surface 73, a second base side surface 74, a third base side surface 75, and a fourth base side surface 76 as four base side surfaces. The base side surfaces 73 to 76 are surfaces of the terahertz device 10 (the antenna base 70) facing sideward. The base side surfaces 73 to 76 extend in a direction orthogonal to the base back surface 72.

The first base side surface 73 and the second base side surface 74 are opposed to each other in the x-direction. As viewed in the z-direction, the base side surfaces 73 and 74 extend in the y-direction. The dimension of each of the base side surfaces 73 and 74 of the separate antenna base 70B in the y-direction is less than the dimension of each of the base side surfaces 73 and 74 of the separate antenna base 70G in the y-direction. The dimension of each of the base side surfaces 73 and 74 of the separate antenna base 70B in the y-direction is equal to the dimension of each of the base side surfaces 73 and 74 of the separate antenna base 70H in the y-direction.

The third base side surface 75 and the fourth base side surface 76 are opposed to each other in the y-direction. As viewed in the z-direction, the base side surfaces 75 and 76 extend in the x-direction. The dimension of each of the base side surfaces 75 and 76 of the separate antenna base 70B in the x-direction is less than the dimension of each of the base side surfaces 75 and 76 of the separate antenna bases 70G and 70H in the x-direction.

In the present embodiment, the antenna surface 81B of the antenna recess 80B is spherically recessed. As shown in FIG. 53, in a cross-sectional view of the separate antenna base 70B cut along a plane extending in the x-direction and the z-direction, the antenna surface 81B is curved to project toward the base back surface 72. Also, although not shown, in a cross-sectional view of the separate antenna base 70B cut along a plane extending in the y-direction and the z-direction, the antenna surface 81B is curved to project toward the base back surface 72. The antenna surface 81B is open upward.

As viewed from above, the opening of the antenna surface 81B is square. Specifically, the opening of the antenna surface 81B is cut away at the open end 81Ba, which is an end of the opening located at the first base side surface 73, the open end 81Bb, which is an end of the opening located at the second base side surface 74, the open end 81Bc, which is an end of the opening located at the third base side surface 75, and the open end 81Bd, which is an end of the opening located at the fourth base side surface 76. As viewed from above, each of the open ends 81Ba to 81Bd extends linearly.

As viewed from above, the open end 81Ba of the antenna surface 81 is positioned to overlap the first base side surface 73, the open end 81Bb is positioned to overlap the second base side surface 74, the open end 81Bc is positioned to overlap the third base side surface 75, and the open end 81Bd is positioned to overlap the fourth base side surface 76.

The reflective film 82B is formed on the antenna surface 81B. The reflective film 82B is formed on the entire antenna surface 81B. The reflective film 82B is not formed on the base main surface 71 of the separate antenna base 70B.

As viewed from above, the opening of the reflective film 82B is identical in shape to the opening of the antenna surface 81B. As viewed from above, the opening of the reflective film 82B includes the open end 82Ba overlapping the open end 81Ba of the antenna surface 81B, the open end 82Bb overlapping the open end 81Bb of the antenna surface 81B, an open end 82Bc overlapping the open end 81Bc of the antenna surface 81B, an open end 82Bd overlapping the open end 81Bd of the antenna surface 81B. As viewed from above, each of the open ends 82Ba to Bd extends linearly.

As viewed from above, the reflective film 82B is disposed so that the center point P2 coincides with the middle of the separate antenna base 70B in each of the x-direction and the y-direction. As viewed from above, the center point P2 of the reflective film 82B coincides with the center point of the antenna surface 81B. Thus, as viewed from above, the antenna surface 81B is disposed so that the center point coincides with the middle of the separate antenna base 70B in each of the x-direction and the y-direction.

As viewed from above, a perpendicular line to the open end 82Ba of the reflective film 82B extending through the center point P2 of the reflective film 82B has a length LS6 that is less than a radius RB of the reflective film 82B. As viewed from above, a perpendicular line to the open end 82Bb of the reflective film 82B extending through the center point P2 of the reflective film 82B has a length LS7 that is less than the radius RB of the reflective film 82B. As viewed from above, a perpendicular line to the open end 82Bc of the reflective film 82B extending through the center point P2 of the reflective film 82B has a length LS8 that is less than the radius RB of the reflective film 82B. As viewed from above, a perpendicular line to the open end 82Bd of the reflective film 82B extending through the center point P2 of the reflective film 82B has a length LS9 that is less than the radius RB of the reflective film 82B.

As shown in FIG. 51, as viewed from above, the radius RB of the reflective film 82B is indicated by a double-dashed line when the reflective film 82B is circular with no cutaway portion. The perpendicular line to the open end 82Ba of the reflective film 82B and the perpendicular line to the open end 82Bb of the reflective film 82B linearly extend in the x-direction. The perpendicular line to the open end 82Bc of the reflective film 82B and the perpendicular line to the open end 82Bd of the reflective film 82B linearly extend in the y-direction. The lengths LS6 and LS7 extend in the second direction (in the present embodiment, the x-direction), which is orthogonal to the first direction (in the present embodiment, the y-direction). Therefore, the length (LS6+LS7) of the reflective film 82B in the second direction is less than the diameter (2×RB) of the reflective film 82B. The lengths LS8 and LS9 extend in the first direction. Therefore, the length (LS8+LS9) of the reflective film 82B in the first direction is less than the diameter of the reflective film 82B. As viewed from above, the reflective film 82B is smaller in the first direction, which is the direction in which the reflective films 82A to 82C (refer to FIG. 37) are arranged, than in a third direction that differs from the first direction and the second direction, which is the direction in which the reflective films 82H, 82E, and 82B are arranged. As viewed from above, the third direction intersects the first direction and the second direction. As viewed from above, the reflective film 82B is smaller in the second direction than in the third direction.

As viewed from above, the reflective film 82B is substantially identical in shape to the antenna surface 81B. Thus, the relationship of the radius of the antenna surface 81B with the lengths of the perpendicular lines to the open ends 81Ba to 81Bd of the antenna surface 81B extending through the center point of the antenna surface 81B is the same as the relationship of the radius RB of the reflective film 82B with the lengths LR6 to LR9 of the reflective film 82B. The radius of the antenna surface 81B refers to the radius of the antenna surface 81B that is circular with no cutaway portion as viewed from above.

As shown in FIG. 53, in a cross-sectional view of the separate antenna base 70B cut along a plane extending in the x-direction and the z-direction through the center point P2 of the reflective film 82B, the reflective film 82B includes an arc-shaped part that connects the opposite endpoints in the x-direction and has a central angle of less than 180°. Also, although not shown, in a cross-sectional view of the separate antenna base 70B cut along a plane extending in the y-direction and the z-direction through the center point P2 of the reflective film 82B, the reflective film 82B includes an arc-shaped part that connects the opposite endpoints in the y-direction and has a central angle of less than 180°.

As shown in FIG. 53, in a cross-sectional view of the separate antenna base 70B cut along a plane extending in the x-direction and the z-direction through the center point of the antenna surface 81B, the antenna surface 81B includes an arc-shaped part that connects the opposite endpoints in the x-direction and has a central angle of less than 180°. Also, although not shown, in a cross-sectional view of the separate antenna base 70B cut along a plane extending in the y-direction and the z-direction through the center point of the antenna surface 81B, the antenna surface 81B includes an arc-shaped part that connects the opposite endpoints in the y-direction and has a central angle of less than 180°.

The antenna surface 81C of the antenna recess 80C in the separate antenna base 70C, the antenna surface 81E of the antenna recess 80E in the separate antenna base 70E, and the antenna surface 81F of the antenna recess 80F in the separate antenna base 70F are identical in shape to the antenna surface 81B. The reflective films 82C, 82E, and 82F are identical in shape to the reflective film 82B.

As shown in FIG. 48, the first base side surfaces of the separate antenna bases 70B and 70C define the first base side surface 73T of the antenna base 70. The fourth base side surfaces of the separate antenna bases 70C and 70F define the fourth base side surface 76T of the antenna base 70.

The gas cavity 92 will now be described.

The gas cavity 92 is defined by the dielectric main surface 51 and the antenna surface 81 in the same manner as the first embodiment. Specifically, the opening of the antenna recesses 80 is covered by the dielectric main surface 51. Thus, the gas cavity 92 is defined by the dielectric main surface 51 and the antenna surfaces 81, which are the wall surfaces of the antenna recesses 80. More specifically, the gas cavity 92 is defined by the dielectric main surface 51 and the antenna surfaces 81A to 81I. Specifically, the openings of the antenna recesses 80A to 80I are covered by the dielectric main surface 51. In the present embodiment, the adhesive layer 91 is disposed along the circumferences of the openings of the antenna recesses 80A, 80D, 80G, 80H, and 80I. The reflective films 82A to 82I are disposed in the gas cavity 92. The gas cavity 92 includes multiple gas cavities 92 defined by the dielectric main surface 51 and each of the antenna recesses 80A to 80I. In the present embodiment, the gas cavities corresponding to adjacent ones of the separate antenna bases 70A to 70I are connected to each other. In an example, as shown in FIG. 52, the gas cavity 92E defined by the dielectric main surface 51 and the antenna surface 81E is connected to the gas cavity 92D, which is defined by the dielectric main surface 51 and the antenna surface 81D, and the gas cavity 92F, which is defined by the dielectric main surface 51 and the antenna surface 81F. Thus, the gas cavities 92D to 92F are located adjacent to each other in the first direction and connected to each other in the first direction (in the present embodiment, the y-direction), which is the arrangement direction of the reflective films 82D to 82F. As shown in FIG. 53, the gas cavity 92E is connected to the gas cavity 92B, which is defined by the dielectric main surface 51 and the antenna surface 81B, and the gas cavity 92H, which is defined by the dielectric main surface 51 and the antenna surface 81H. Thus, the gas cavities 92B, 92E, and 92H are located adjacent to each other in the second direction and connected to each other in the second direction (in the present embodiment, the x-direction), which is the arrangement direction of the reflective films 82B, 82E, and 82H.

Since the gas cavity 92 contains gas, the relationship in the refractive index among the dielectric 50, the gas cavity 92, and the terahertz element 20 and the propagation path of electromagnetic waves are the same as the first embodiment. In the present embodiment, the gas cavity 92 corresponding to the antenna surfaces 81A to 81C, 81F, and 81H is connected to the outside of the antenna base 70 (the outside of the terahertz device 10).

Figure 54:
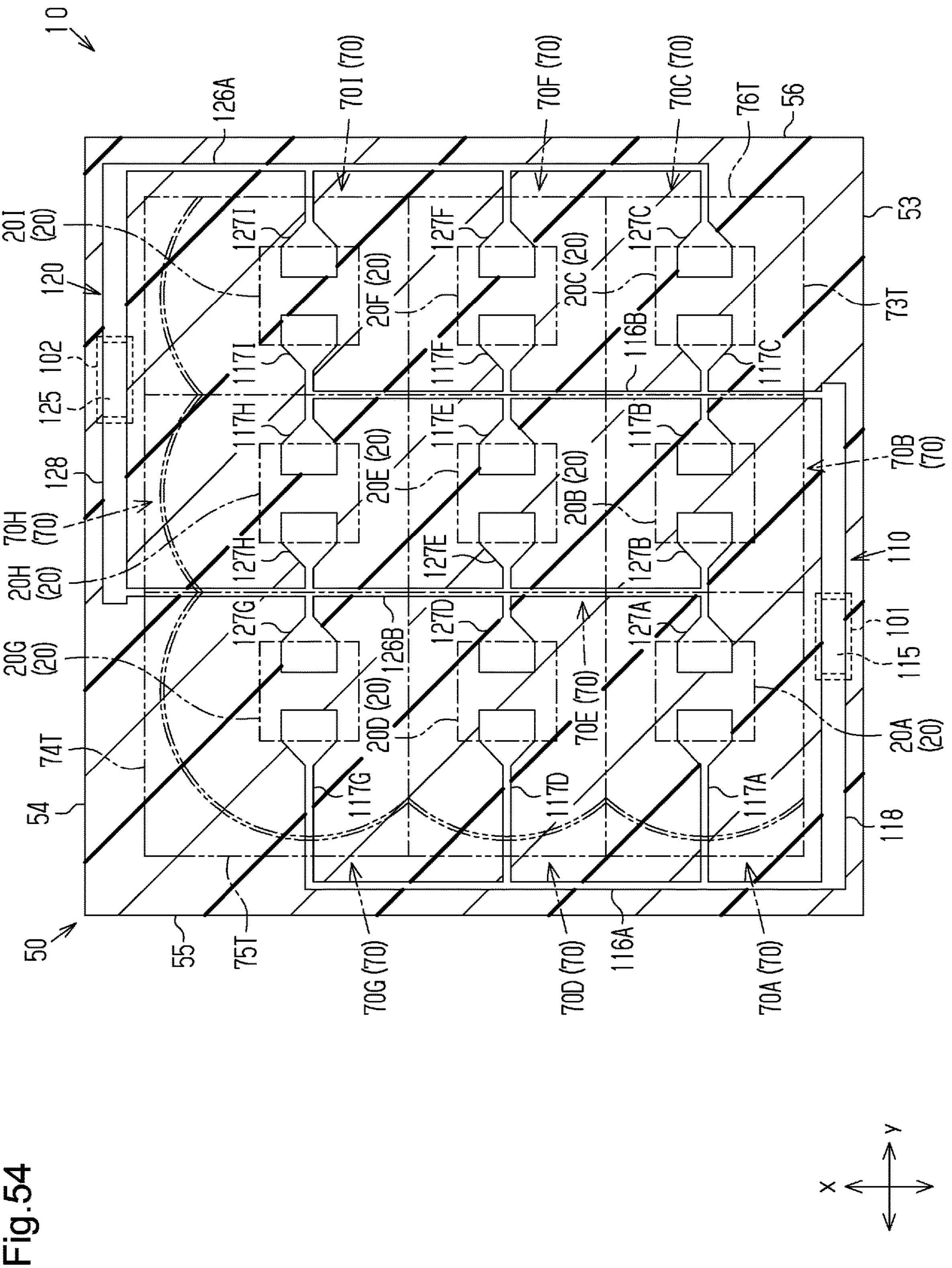
FIG. 54 is a cross-sectional view showing the positional relationship of conductive portions in the terahertz device shown in FIG. 46.

As shown in FIG. 54, in the same manner as the first embodiment, the terahertz device 10 includes a first electrode 101, a second electrode 102, a first conductive portion 110, and a second conductive portion 120. In the present embodiment, the two electrodes 101 and 102 and the two conductive portions 110 and 120 are electrodes common to the separate antenna bases 70A to 70I.

The first electrode 101 is disposed close to the first dielectric side surface 53 and the third dielectric side surface 55. The first electrode 101 is disposed closer to the first dielectric side surface 53 than the first base side surface 73T of the antenna base 70. As viewed in the z-direction, the first electrode 101 is rectangular so that the longitudinal direction extends in the y-direction and the lateral direction extends in the x-direction.

The second electrode 102 is disposed close to the second dielectric side surface 54 and the fourth dielectric side surface 56. The second electrode 102 is disposed closer to the second dielectric side surface 54 than the second base side surface 74T of the antenna base 70. As viewed in the z-direction, the second electrode 102 is rectangular so that the longitudinal direction extends in the y-direction and the lateral direction extends in the x-direction.

The first conductive portion 110 includes a first common wire part 116A, a second common wire part 116B, a first wire part 117A, a second wire part 117B, a third wire part 117C, a fourth wire part 117D, a fifth wire part 117E, a sixth wire part 117F, a seventh wire part 117G, an eighth wire part 117H, a ninth wire part 117I, and a wire base 118.

The wire base 118 is a wire part joined to the first electrode 101. As viewed in the z-direction, the wire base 118 overlaps the first electrode 101. As viewed in the z-direction, the wire base 118 is belt-shaped and extends in the y-direction. The wire base 118 includes a portion projecting beyond the third base side surface 75T of the antenna base 70 to a position close to the third dielectric side surface 55. The first conductive portion 110 includes a first post 115 that connects the wire base 118 and the first electrode 101. As viewed in the z-direction, the first post 115 overlaps both the wire base 118 and the first electrode 101. The first post 115 is disposed between the wire base 118 and the first electrode 101 in the z-direction and joins the wire base 118 to the first electrode 101.

The first common wire part 116A is a wire part joined to the wire base 118 and is disposed closer to the third dielectric side surface 55 than the third base side surface 75T of the antenna base 70. The first common wire part 116A extends in the x-direction. As viewed in the y-direction, the first common wire part 116A extends to overlap the terahertz element 20A, the terahertz element 20D, and the terahertz element 20G. The first common wire part 116A is joined to the first wire part 117A, the fourth wire part 117D, and the seventh wire part 117G.

The first wire part 117A connects the first common wire part 116A and the terahertz element 20A. The first wire part 117A extends from the first common wire part 116A toward the terahertz element 20A in the y-direction.

The fourth wire part 117D connects the first common wire part 116A and the terahertz element 20D. The fourth wire part 117D extends from the first common wire part 116A toward the terahertz element 20D in the y-direction.

The seventh wire part 117G connects the first common wire part 116A and the terahertz element 20G. The seventh wire part 117G extends from the first common wire part 116A toward the terahertz element 20G in the y-direction.

The second common wire part 116B is a wire part joined to the wire base 118 and is disposed closer to the fourth base side surface 76T than the middle of the antenna base 70 in the y-direction. Specifically, the second common wire part 116B is disposed between the terahertz element 20B and the terahertz element 20C, between the terahertz element 20E and the terahertz element 20F, and between the terahertz element 20H and the terahertz element 20I in the y-direction. More specifically, as viewed from above, the second common wire part 116B overlaps the interface between the separate antenna base 70B and the separate antenna base 70C, the interface between the separate antenna base 70E and the separate antenna base 70F, the interface between the separate antenna base 70H and the separate antenna base 70I. The second common wire part 116B is joined to the second wire part 117B, the third wire part 117C, the fifth wire part 117E, the sixth wire part 117F, the eighth wire part 117H and the ninth wire part 117I.

The second wire part 117B connects the second common wire part 116B and the terahertz element 20B. The second wire part 117B extends from the second common wire part 116B toward the terahertz element 20B in the y-direction.

The third wire part 117C connects the second common wire part 116B and the terahertz element 20C. The third wire part 117C extends from the second common wire part 116B toward the terahertz element 20C in the y-direction.

The fifth wire part 117E connects the second common wire part 116B and the terahertz element 20E. The fifth wire part 117E extends from the second common wire part 116B toward the terahertz element 20E in the y-direction.

The sixth wire part 117F connects the second common wire part 116B and the terahertz element 20F. The sixth wire part 117F extends from the second common wire part 116B toward the terahertz element 20F in the y-direction.

The eighth wire part 117H connects the second common wire part 116B and the terahertz element 20H. The eighth wire part 117H extends from the second common wire part 116B toward the terahertz element 20H in the y-direction.

The ninth wire part 117I connects the second common wire part 116B and the terahertz element 20I. The ninth wire part 117I extends from the second common wire part 116B toward the terahertz element 20I in the y-direction.

The second conductive portion 120 includes a first common wire part 126A, a second common wire part 126B, a first wire part 127A, a second wire part 127B, a third wire part 127C, a fourth wire part 127D, a fifth wire part 127E, a sixth wire part 127F, a seventh wire part 127G, an eighth wire part 127H, a ninth wire part 127I, and a wire base 128.

The wire base 128 is a wire part joined to the second electrode 102. As viewed in the z-direction, the wire base 128 overlaps the second electrode 102. As viewed in the z-direction, the wire base 128 is belt-shaped and extends in the y-direction. The wire base 118 includes a portion projecting beyond the second base side surface 74T of the antenna base 70 to a position close to the second dielectric side surface 54. The second conductive portion 120 includes a second post 125 that connects the wire base 128 and the second electrode 102. As viewed in the z-direction, the second post 125 overlaps both the wire base 128 and the second electrode 102. The second post 125 is disposed between the wire base 128 and the second electrode 102 in the z-direction and joins the wire base 128 and the second electrode 102.

The first common wire part 126A is a wire part joined to the wire base 128 and is disposed close to the fourth dielectric side surface 56 than the fourth base side surface 76T of the antenna base 70. The first common wire part 126A extends in the x-direction. As viewed in the y-direction, the first common wire part 126A extends to overlap the terahertz element 20I, the terahertz element 20F, and the terahertz element 20C. The first common wire part 126A is joined to the third wire part 127C, the sixth wire part 127F, and the ninth wire part 127I.

The third wire part 127C connects the first common wire part 126A and the terahertz element 20C. The third wire part 127C extends from the first common wire part 126A toward the terahertz element 20C in the y-direction.

The sixth wire part 127F connects the first common wire part 126A and the terahertz element 20F. The sixth wire part 127F extends from the first common wire part 126A toward the terahertz element 20F in the y-direction.

The ninth wire part 127I connects the first common wire part 126A and the terahertz element 20I. The ninth wire part 127I extends from the first common wire part 126A toward the terahertz element 20I in the y-direction.

The second common wire part 126B is a wire part joined to the second electrode 102 and is disposed closer to the third base side surface 75T than the middle of the antenna base 70 in the y-direction. Specifically, the second common wire part 126B is disposed between the terahertz element 20G and the terahertz element 20H, between the terahertz element 20D and the terahertz element 20E, and between the terahertz element 20A and the terahertz element 20B in the y-direction. More specifically, as viewed from above, the second common wire part 126B overlaps the interface between the separate antenna base 70G and the separate antenna base 70H, the interface between the separate antenna base 70D and the separate antenna base 70E, and the interface between the separate antenna base 70A and the separate antenna base 70B. The second common wire part 126B is joined to the first wire part 127A, the second wire part 127B, the fourth wire part 127D, the fifth wire part 127E, the seventh wire part 127G, and the eighth wire part 127H.

The first wire part 127A connects the second common wire part 126B and the terahertz element 20A. The first wire part 127A extends from the second common wire part 126B toward the terahertz element 20A in the y-direction.

The second wire part 127B connects the second common wire part 126B and the terahertz element 20B. The second wire part 127B extends from the second common wire part 126B toward the terahertz element 20B in the y-direction.

The fourth wire part 127D connects the second common wire part 126B and the terahertz element 20D. The fourth wire part 127D extends from the second common wire part 126B toward the terahertz element 20D in the y-direction.

The fifth wire part 127E connects the second common wire part 126B and the terahertz element 20E. The fifth wire part 127E extends from the second common wire part 126B toward the terahertz element 20E in the y-direction.

The seventh wire part 127G connects the second common wire part 126B and the terahertz element 20G. The seventh wire part 127G extends from the second common wire part 126B toward the terahertz element 20G in the y-direction.

The eighth wire part 127H connects the second common wire part 126B and the terahertz element 20H. The eighth wire part 127H extends from the second common wire part 126B toward the terahertz element 20H in the y-direction.

The connection structure of each of the wire parts 117A to 117I and 127A to 127I with the terahertz element 20 will now be described. The connection structure is common to the wire parts 117A to 117I and 127A to 127I. Thus, the structure of the first wire parts 117A and 127A will be described, while the structure of the wire parts 117B to 117I and 127B to 127I will not be described.

Figure 55:
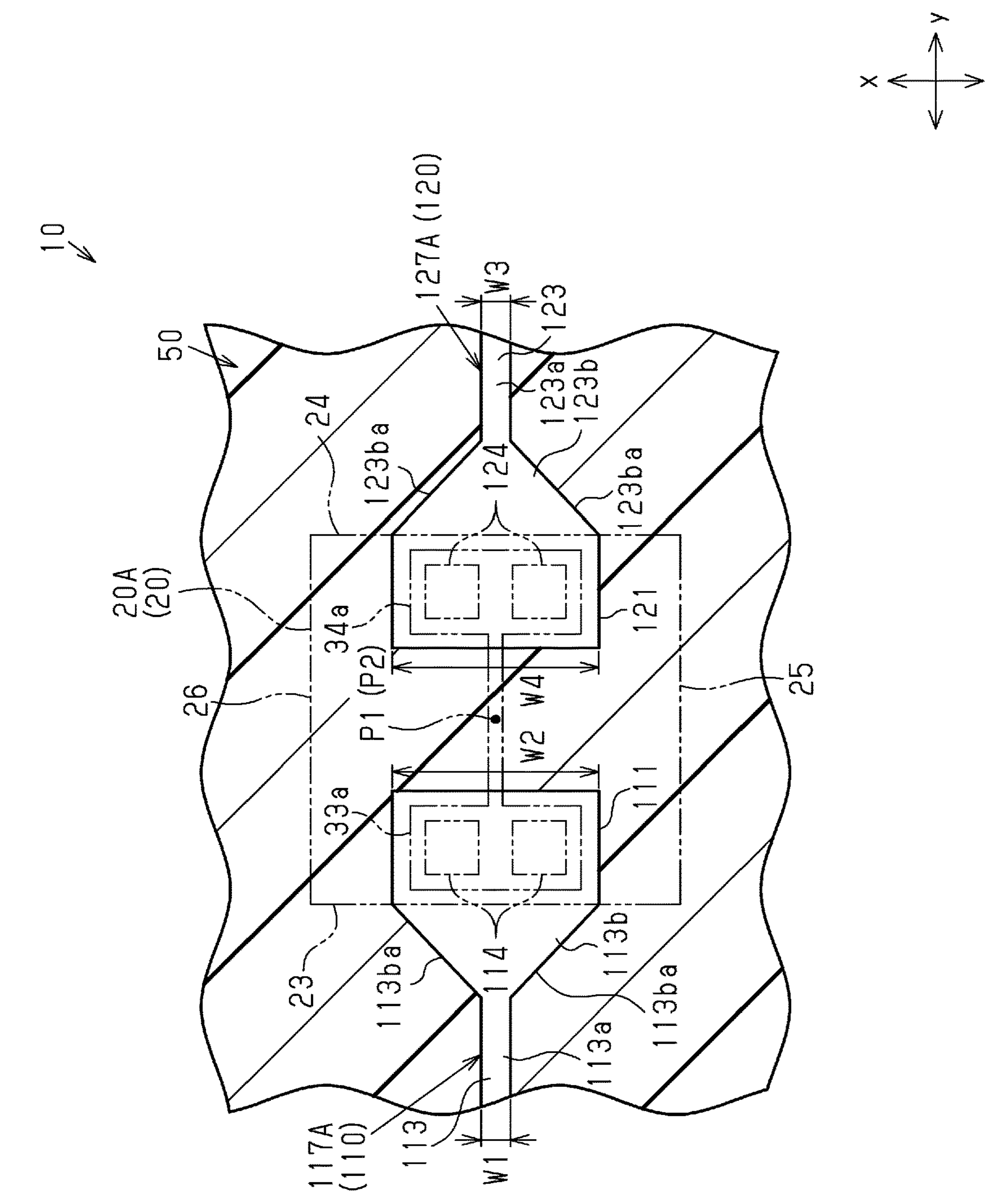
FIG. 55 is an enlarged partial view of conductive portions shown in FIG. 54.

As shown in FIG. 55, the first wire part 117A includes a first element opposing part 111, which is opposed to the first pad 33*a* of the terahertz element 20A in the z-direction, and a first connector 113, which connects the first element opposing part 111 and the first common wire part 116A. The first element opposing part 111 defines a distal end of the first wire part 117A.

The first element opposing part 111 is disposed between the terahertz element 20A and the reflective film 82A. As viewed in the z-direction, the first element opposing part 111 at least partially overlaps the first pad 33*a*. The first element opposing part 111 is opposed to the reflective film 82A in the z-direction. The first element opposing part 111 extends in the x-direction in accordance with the first pad 33*a* extending in the x-direction. In an example, the first element opposing part 111 is rectangular so that the longitudinal direction extends in the x-direction and the lateral direction extends in the y-direction.

The first wire part 117A includes a first bump 114 disposed between the first element opposing part 111 and the first pad 33*a*. The terahertz element 20A is flip-chip-mounted on the first element opposing part 111 via the first bump 114. The first pad 33*a* and the first element opposing part 111 are electrically connected by the first bump 114.

In the present embodiment, multiple first bumps 114 are provided. In an example, multiple (in the present embodiment, two) first bumps 114 are arranged in the x-direction in accordance with the first pad 33*a* and the first element opposing part 111 extending in the x-direction. As viewed in the z-direction, the first element opposing part 111 and the first bump 114 are disposed so as not to overlap the reception point P1. The shape of the first bump 114 is, for example, a tetragonal rod. However, the first bump 114 is not limited to this shape and may have any shape.

The first bump 114 may have a monolayer structure or a multilayer structure. In an example, the first bump 114 may have a multilayer structure including a metal layer including Cu, a metal layer including Ti, and an alloy layer including Sn. An example of the alloy layer including Sn is a Sn—Sb-based alloy layer or a Sn—Ag-based alloy layer.

A first insulation layer may be formed on the first element opposing part 111 to surround the first bump 114. The first insulation layer may be frame-shaped and open upward so that the first bump 114 is accommodated in the first insulation layer. This limits undesirable sideward spreading of the first bump 114. The first insulation layer may be omitted.

The first connector 113 is disposed between the first element opposing part 111 and the first common wire part 116A and has a width in the x-direction and extends in the y-direction. The first connector 113 is partially opposed to the reflective film 82A in the z-direction. That is, the first connector 113 is positioned to partially overlap the reflective film 82A. In other words, as viewed in the z-direction, the first connector 113 has a part that overlaps the reflective film 82A and a part that does not overlap the reflective film 82A.

In the present embodiment, the width of the first connector 113 is smaller than the width of the first element opposing part 111. Specifically, the width of the first connector 113 (dimension in the x-direction) is set to be smaller than the width of the first element opposing part 111 (dimension in the x-direction).

The first connector 113 includes a first connector body 113*a*, which has a smaller width than the first element opposing part 111, and a first element tapered part 113*b*, which is located close to the first element opposing part 111 in the longitudinal direction of the first connector body 113*a*.

The longitudinal direction of the first connector body 113*a* extends in the y-direction, and the first connector body 113*a* has a fixed width in the x-direction. As viewed in the z-direction, the first connector body 113*a* overlaps the reflective film 82A. The first connector body 113*a* joins the first element opposing part 111 and the first common wire part 116A. The width W1 of the first connector body 113*a* is smaller than the width W2 of the first element opposing part 111.

The first element tapered part 113*b* joins the first connector body 113*a* and the first element opposing part 111. In an example, as viewed in the z-direction, the first element tapered part 113*b* is disposed adjacent to the terahertz element 20A in the x-direction and overlaps the reflective film 82A.

The width of the first element tapered part 113*b* is gradually increased from the first connector body 113*a* toward the first element opposing part 111. In the present embodiment, the first element tapered part 113*b* includes two first element inclined surfaces 113*ba* that are gradually inclined away from each other from the first connector body 113*a* toward the first element opposing part 111.

In this structure, the first pad 33*a* of the terahertz element 20A and the first electrode 101 are electrically connected by the first bump 114, the first element opposing part 111, the first connector 113, the first common wire part 116A, the wire base 118, and the first post 115.

The first wire part 127A forms part of a conductive path that electrically connects the terahertz element 20A and the second electrode 102. In the present embodiment, as viewed in the z-direction, the first wire part 117A and the first wire part 127A are shifted from each other by 180° and are opposed to each other in the y-direction. As viewed in the z-direction, the wire parts 117A and 127A extend from the terahertz element 20A in a radial direction of the reflective film 82A.

In particular, in the present embodiment, as viewed in the z-direction, the wire parts 117A and 127A extend away from the terahertz element 20A. Specifically, as viewed in the z-direction, the first wire part 117A extends from the terahertz element 20A toward the third dielectric side surface 55 in the y-direction. As viewed in the z-direction, the first wire part 127A extends from the terahertz element 20A toward the fourth dielectric side surface 56 in the y-direction.

The first wire part 127A includes a second element opposing part 121, which is opposed to the second pad 34*a* of the terahertz element 20A in the z-direction, and a second connector 123, which connects the second element opposing part 121 and the second common wire part 126B. In the present embodiment, the second element opposing part 121 defines a distal end of the first wire part 127A.

The second element opposing part 121 is disposed between the terahertz element 20A and the reflective film 82A. As viewed in the z-direction, the second element opposing part 121 at least partially overlaps the second pad 34*a*. The second element opposing part 121 is opposed to the reflective film 82A in the z-direction. The second element opposing part 121 extends in the x-direction in accordance with the second pad 34*a* extending in the x-direction. In an example, the second element opposing part 121 is rectangular such that the longitudinal direction extends in the x-direction and the lateral direction extends in the y-direction.

In the present embodiment, the element opposing parts 111 and 121 are opposed to each other in the y-direction in accordance with the pads 33*a* and 34*a* being separated in the y-direction. The dielectric 50 is disposed between the two element opposing parts 111 and 121, and the two element opposing parts 111 and 121 are insulated by the dielectric 50. In other words, the two wire parts 117A and 127A extend away from each other in directions extending away from the element opposing parts 111 and 121, which are separated from each other.

In the present embodiment, the two wire parts 117A and 127A symmetrically arranged in the y-direction with respect to the reception point P1. Thus, effects on the radiation mode that would be caused by asymmetry of the two wire parts 117A and 127A are reduced. The two wire parts 117A and 127A may be asymmetrically arranged in the x-direction with respect to the reception point P1.

The first wire part 127A includes a second bump 124 disposed between the second element opposing part 121 and the second pad 34*a*. The terahertz element 20A is flip-chip-mounted on the second element opposing part 121 via the second bump 124. The second pad 34*a* and the second element opposing part 121 are electrically connected by the second bump 124.

In the present embodiment, multiple second bumps 124 are provided. In an example, multiple (in the present embodiment, two) second bumps 124 are arranged in the x-direction in accordance with the second pad 34*a* and the second element opposing part 121 extending in the x-direction. As viewed in the z-direction, the second element opposing part 121 and the second bump 124 are disposed so as not to overlap the reception point P1. The first bump 114 and the second bump 124 are separated and opposed to each other in the x-direction and are aligned with each other in the y-direction. However, the first bump 114 and the second bump 124 may be located at different positions in the y-direction.

The second connector 123 is disposed between the second element opposing part 121 and the second common wire part 126B and has a width in the x-direction and extends in the y-direction. The second connector 123 is partially opposed to the reflective film 82A in the z-direction. That is, the second connector 123 is positioned to partially overlap the reflective film 82A. In other words, as viewed in the z-direction, the second connector 123 has a part that overlaps the reflective film 82A and a part that does not overlap the reflective film 82A.

In the present embodiment, the width of the second connector 123 is smaller than the width of the second element opposing part 121. Specifically, the width of the second connector 123 (dimension in the x-direction) is set to be smaller than the width of the second element opposing part 121 (dimension in the x-direction).

The second connector 123 includes a second connector body 123*a*, which has a smaller width than the second element opposing part 121, and a second element tapered part 123*b*, which is located close to the second element opposing part 121 in the longitudinal direction of the second connector body 123*a*.

The longitudinal direction of the second connector body 123*a* extends in the y-direction, and the second connector body 123*a* has a fixed width in the x-direction. As viewed in the z-direction, the second connector body 123*a* overlaps the reflective film 82A. The second connector body 123*a* joins the second element opposing part 121 and the second common wire part 126B. The width W3 of the second connector body 123*a* is smaller than the width W4 of the second element opposing part 121.

The width of the second element tapered part 123*b* is gradually increased from the second connector body 123*a* toward the second element opposing part 121. In the present embodiment, the second element tapered part 123*b* includes two second element inclined surfaces 123*ba* that are gradually inclined away from each other from the second connector body 123*a* toward the second element opposing part 121.

In this structure, the second pad 34*a* of the terahertz element 20A and the second electrode 102 are electrically connected by the second bump 124, the second element opposing part 121, the second connector 123, the second common wire part 126B, the wire base 128, and the second post 125.

In the present embodiment, the reflective films 82A to 82I are electrically isolated. More specifically, the reflective films 82A to 82I are electrically insulated from the two electrodes 101 and 102 and the two conductive portions 110 and 120.

Operation

The operation of the terahertz device 10 of the present embodiment will now be described with reference to FIG. 56.

Figure 56:
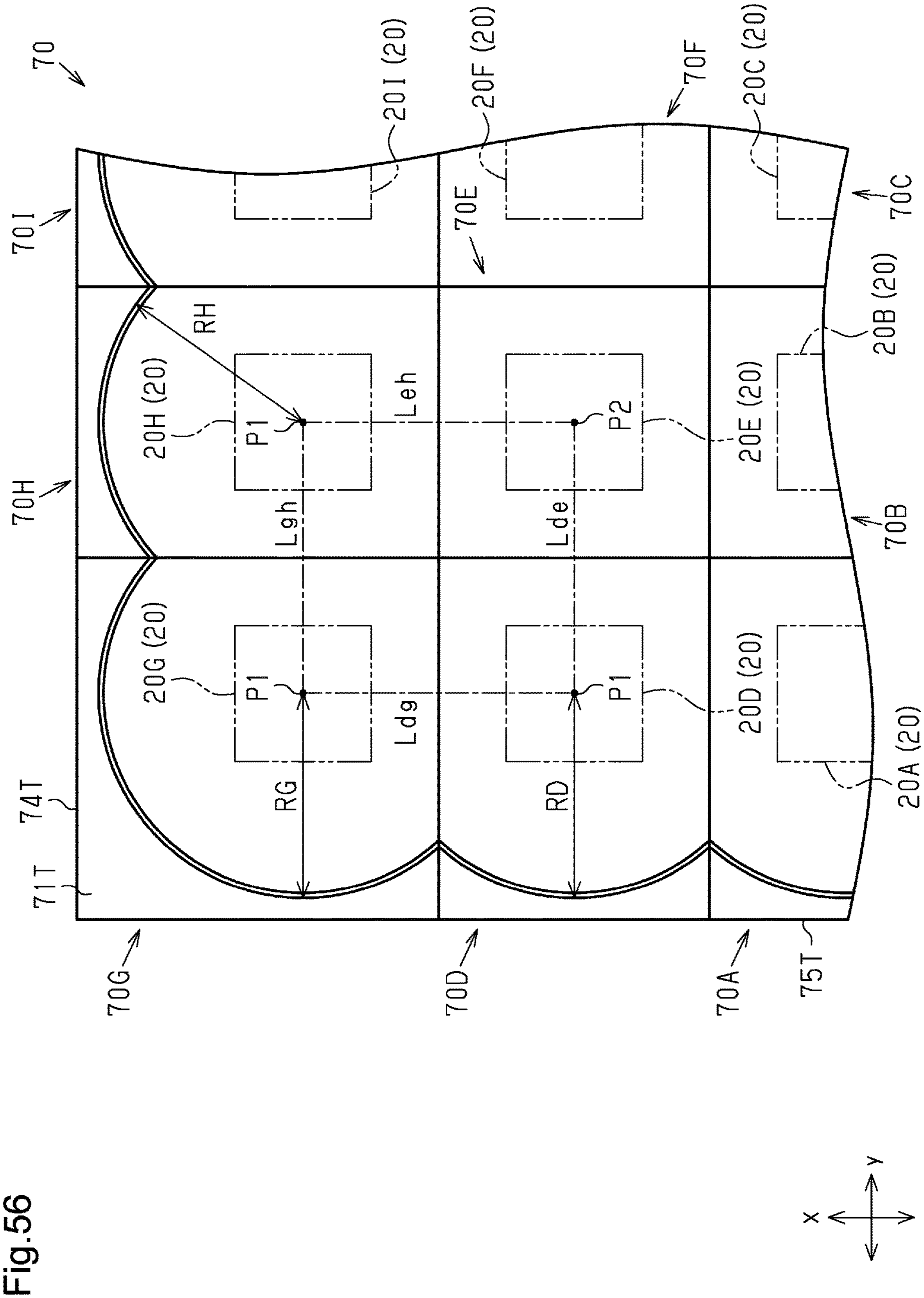
FIG. 56 is an enlarged partial view of an antenna base.

FIG. 56 is an enlarged view of the separate antenna bases 70D, 70E, 70G, and 70H and its surroundings.

As shown in FIG. 56, an inter-element distance Lde is the distance between the reception point P1 of the terahertz element 20D and the reception point P1 of the terahertz element 20E in the first direction (in the present embodiment, the y-direction), which is the arrangement direction of the reflective film 82D and the reflective film 82E. The inter-element distance Lde is less than the diameter (2×radius RD of reflective film 82D) of the reflective film 82D.

Although not shown, the inter-element distance Lde is less than the diameter of the reflective film 82E. Since the reflective film 82E is identical in shape to the reflective film 82B, the diameter of the reflective film 82E is two times the radius RB (refer to FIG. 51) of the reflective film 82B.

An inter-element distance Ldg is the distance between the reception point P1 of the terahertz element 20D and the reception point P1 of the terahertz element 20G in the second direction (in the present embodiment, the x-direction), which is the arrangement direction of the reflective film 82E and the reflective film 82G. The inter-element distance Ldg is less than the diameter of the reflective film 82D. The inter-element distance Ldg is also less than the diameter of the reflective film 82G (2×radius RG of reflective film 82G).

An inter-element distance Lgh is the distance between the reception point P1 of the terahertz element 20H and the reception point P1 of the terahertz element 20G in the first direction (in the present embodiment, the y-direction), which is the arrangement direction of the reflective film 82H and the reflective film 82G. The inter-element distance Lgh is less than the diameter of the reflective film 82G. The inter-element distance Lgh is less than the diameter of the reflective film 82H (2×radius RH of reflective film 82H).

An inter-element distance Leh is the distance between the reception point P1 of the terahertz element 20H and the reception point P1 of the terahertz element 20E in the second direction (in the present embodiment, the x-direction), which is the arrangement direction of the reflective film 82H and the reflective film 82E. The inter-element distance Leh is less than the diameter of the reflective film 82G. The inter-element distance Leh is also less than the diameter of the reflective film 82E.

Although not shown, the inter-element distances between the terahertz elements 20A, 20B, 20C, 20F, and 20I in the first direction and the second direction are the same as the inter-element distances between the terahertz elements 20D, 20E, 20G, and 20H in the first direction and the second direction.

As described above, in the arrangement directions of the separate antenna bases (the first direction and the second direction), the inter-element distance between the reception points P1 of the terahertz elements 20 located adjacent each other is less than the diameter of the reflective film 82. As a result, the distance between adjacent ones of the terahertz elements 20 is decreased in the arrangement direction.

Advantages

The terahertz device 10 of the present embodiment has the following advantages in addition to the advantages of the first embodiment.

(3-1) As viewed in the z-direction, the row of the terahertz elements 20A to 20C arranged in line in the y-direction, the row of the terahertz elements 20D to 20F arranged in line in the y-direction, and the row of the terahertz elements 20G to 20I arranged in line in the y-direction are separate in the x-direction. This structure widens the detection range of the terahertz device 10 in the x-direction.

(3-2) As viewed in the z-direction, the dimension of each of the reflective films 82A, 82D, and 82G is smaller in the second direction (in the present embodiment, the x-direction), which is the arrangement direction of the reflective film 82A of the separate antenna base 70A, the reflective film 82D of the separate antenna base 70D, and the reflective film 82G of the separate antenna base 70G, is less than the diameter of each of the reflective films 82A, 82D, and 82G. The same applies to the reflective films 82B, 82E, and 82H and the reflective films 82C, 82F, and 82I.

This structure decreases the distance between adjacent ones of the terahertz elements 20 in the second direction. Thus, the resolution of the terahertz device 10 in the detection range is improved.

(3-3) As viewed from above, the circumferential part of each of the reflective films 82A, 82D, and 82G that connects arc endpoints in the second direction, which is the arrangement direction of the reflective films 82A, 82D, and 82G, is arc-shaped and has a central angle of less than 180°.

This structure allows the reflective films 82A, 82D, and 82G to have a relationship such that the length LS3 of the reflective film 82A, the length of the reflective film 82D, and the length LS1 of the reflective film 82G are less than the radius of the reflective films 82A, 82D, and 82G while the reflective films 82A, 82D, and 82G maintain a spherical shape having a fixed curvature. Since the reflective film 82D is identical in shape to the reflective film 82A, the length of the reflective film 82D is equal to the length LS3 of the reflective film 82A.

(3-4) As viewed from above, the interface between adjacent ones of the reflective films 82A to 82I extends linearly. This structure allows each of the reflective films 82A to 82I to have a relationship such that the length of the reflective films 82A to 82I in each of the first direction and the second direction is less than the radius of the reflective films 82A to 82I while the reflective films 82A to 82I maintain a spherical shape having a fixed curvature.

(3-5) The gas cavity defined by the antenna surface 81A and the dielectric 50, the gas cavity 92D defined by the antenna surface 81D and the dielectric 50, and the gas cavity 92G defined by the antenna surface 81G and the dielectric 50 are joined at the interface between the reflective film 82A (the antenna surface 81A) and the reflective film 82D (the antenna surface 81D) and the interface between the reflective film 82D (the antenna surface 81D) and the reflective film 82G (the antenna surface 81G) in the second direction. The same applies to the gas cavity 92B defined by the antenna surface 81B and the dielectric 50, the gas cavity 92E defined by the antenna surface 81E and the dielectric 50, and the gas cavity 92H defined by the antenna surface 81H and the dielectric 50. The same applies to the gas cavity defined by the antenna surface 81C and the dielectric 50, the gas cavity defined by the antenna surface 81F and the dielectric 50, and the gas cavity defined by the antenna surface 81I and the dielectric 50. This structure has the advantage (3-2) described above.

Modified Examples

The embodiments exemplify, without any intention to limit, applicable forms of a terahertz device according to the present disclosure. The terahertz device according to the present disclosure may be applicable to forms differing from the above embodiments. In an example of such a form, the structure of the embodiments is partially replaced, changed, or omitted, or a further structure is added to the embodiments. The modified examples described below may be combined with one another as long as there is no technical inconsistency. For the sake of convenience, the following modified examples will be basically described using the first embodiment. However, other embodiments are applicable as long as there is no technical inconsistency.

Modified Examples Related to Wire

In the first and second embodiments, at least one of the first element tapered part 113_b_ and the first electrode tapered part 113*c* may be omitted. Also, at least one of the second element tapered part 123*b* and the second electrode tapered part 123*c* may be omitted.

In the third embodiment, the first element tapered part 113*b* may be omitted. Also, the second element tapered part 123*b* may be omitted.

In each embodiment, the connectors 113 and 123 may partially have the same width as the element opposing parts 111 and 121. More specifically, the connectors 113 and 123 may have any width that is at least partially smaller than the width of the element opposing parts 111 and 121.

In each embodiment, the widths W1 and W3 of the connector bodies 113*a* and 123*a* may be equal to the widths W2 and W4 of the element opposing parts 111 and 121. That is, the connectors 113 and 123 and the element opposing parts 111 and 121 may have the same width. Also, in the first and second embodiments, the widths W1 and W3 of the connector bodies 113*a* and 123*a* may be equal to the widths of the electrode opposing parts 112 and 122. The widths W2 and W4 of the element opposing parts 111 and 121 may be equal to or different from the widths of the electrode opposing parts 112 and 122.

In the first and second embodiments, the element opposing parts 111 and 121 and the electrode opposing parts 112 and 122 may have any specific shape and may be circular or elliptical as viewed in the z-direction. In the third embodiment, the element opposing parts 111 and 121 may have any specific shape and may be circular or elliptical as viewed in the z-direction.

In each embodiment, as viewed in the z-direction, the electrodes 101 and 102 may at least partially overlap the reflective film 82.

In the first embodiment, as viewed from above, the first electrode 101 and the conductive portion 110 may be shifted from the second electrode 102 and the conductive portion 120 by 180° about the reception point P1 of the terahertz element 20. In other words, as viewed from above, the first electrode 101 and the conductive portion 110 may be opposed to the second electrode 102 and the conductive portion 120 in a direction orthogonal to the arrangement direction of the separate antenna bases 70A to 70C.

Figure 57:
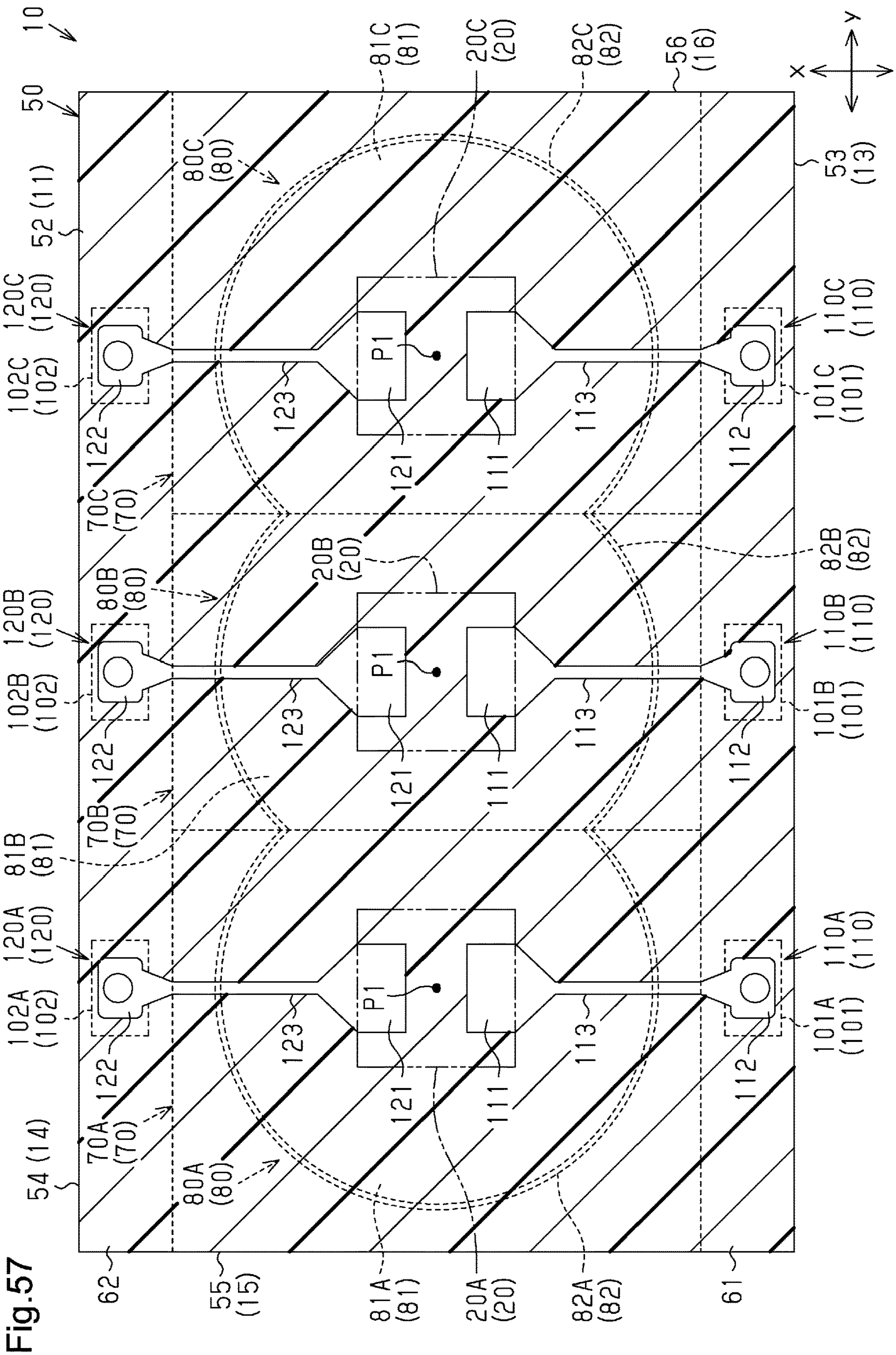
FIG. 57 is a cross-sectional view showing a modified example of the first embodiment of the terahertz device.

In an example, as shown in FIG. 57, the first electrode 101A and the conductive portion 110A are opposed to the second electrode 102A and the conductive portion 120A in the x-direction. The first electrode 101B and the conductive portion 110B are opposed to the second electrode 102B and the conductive portion 120B in the x-direction. The first electrode 101C and the conductive portion 110C are opposed to the second electrode 102C and the conductive portion 120C in the x-direction. In the shown example, the first electrodes 101A to 101C are arranged on the first projection 61 of the dielectric 50. The second electrodes 102A to 102C are arranged on the second projection 62 of the dielectric 50.

The conductive portions 110A to 110C and 120A to 120C are substantially identical in shape to the conductive portions 110A to 110C and 120A to 120C of the first embodiment. In the conductive portions 110A to 110C, the position and the shape of the first element opposing part 111 differ from those of the first element opposing part 111 in the first embodiment. In the conductive portions 120A to 120C, the position and the shape of the second element opposing part 121 differ from those of the second element opposing part 121 in the first embodiment.

As shown in FIG. 57, in the x-direction, the conductive portion 110A is located close to the element side surface 23 of the terahertz element 20A, and the conductive portion 120A is located close to the element side surface 24 of the terahertz element 20B. In the y-direction, the conductive portions 110A and 120A are disposed in the middle of the terahertz element 20A. The same applies to the positional relationship of the conductive portions 110B and 120B and the terahertz element 20B and the positional relationship of the conductive portions 110C and 120C and the terahertz element 20C.

The width (dimension in the y-direction) of the first element opposing part 111 of the conductive portion 110A is larger than the width of the first element opposing part 111 of the conductive portion 110A in the first embodiment. The width (dimension in the y-direction) of the second element opposing part 121 of the conductive portion 120A is larger than the width of the second element opposing part 121 of the conductive portion 120A in the first embodiment. The same applies to the element opposing parts 111 and 121 of the conductive portions 110B and 120B and the element opposing parts 111 and 121 of the conductive portions 110C and 120C.

In the second embodiment, as viewed from above, the electrodes 101 and 102 may be disposed on one of the first dielectric side surface 53 and the second dielectric side surface 54 of the dielectric 50 that is located farther from the terahertz element 20 in the x-direction.

Figure 58:
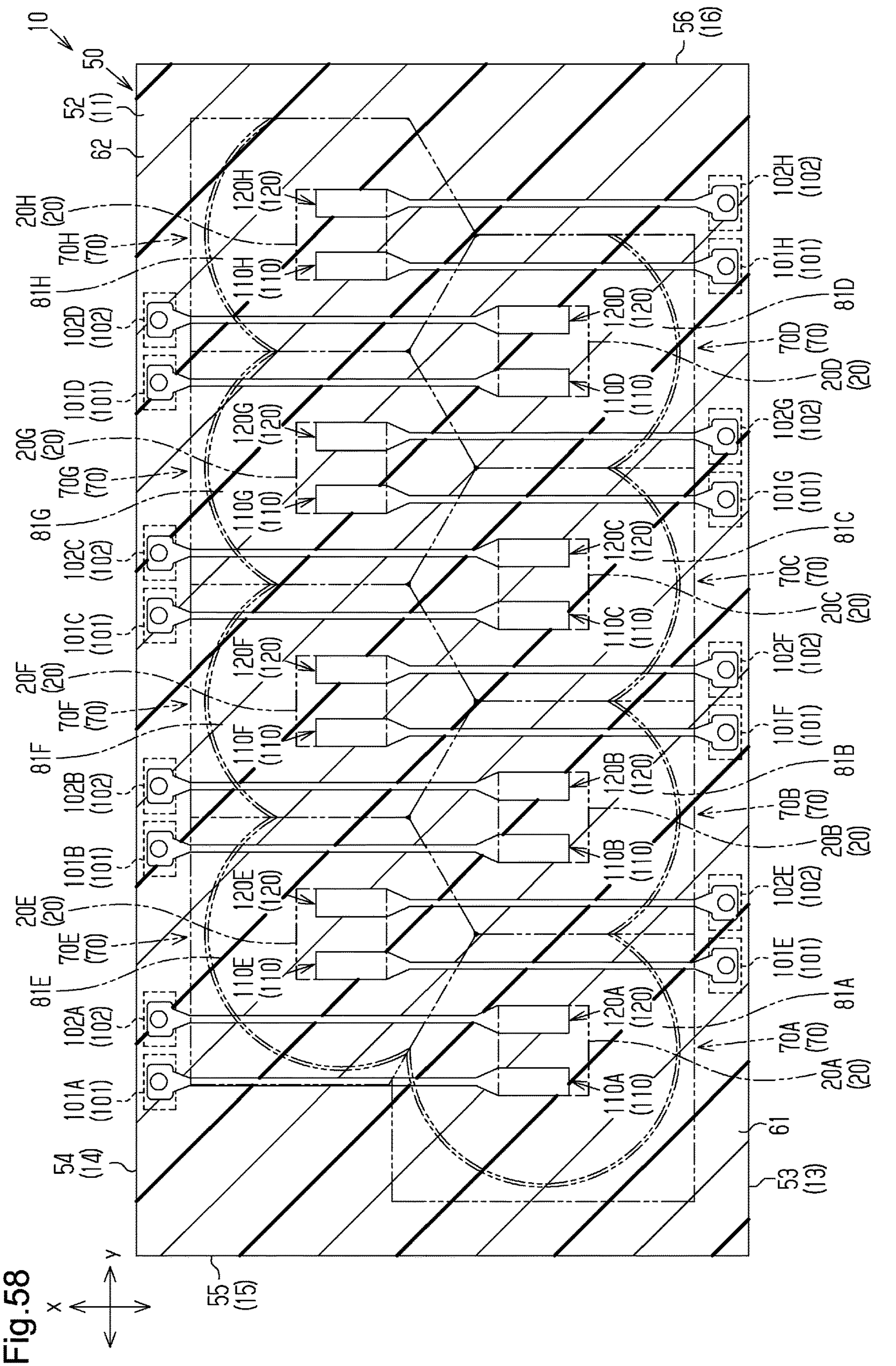
FIG. 58 is a cross-sectional view showing a modified example of the second embodiment of the terahertz device.

In an example, as shown in FIG. 58, the electrodes 101A to 101D and 102A to 102D corresponding to the terahertz elements 20A to 20D, which are located closer to the first dielectric side surface 53, are disposed in the proximity of the second dielectric side surface 54. Specifically, the electrodes 101A to 101D and 102A to 102D are disposed on the second projection 62 of the dielectric 50. Thus, as viewed from above, the conductive portions 110A to 110D and 120A to 120D extend over the separate antenna bases 70E to 70H in the x-direction.

As viewed from above, the conductive portion 110A is disposed to overlap the peripheral wall 78E of the separate antenna base 70E. As viewed from above, the conductive portion 120A is disposed to overlap one of the opposite ends of the antenna surface 81E of the separate antenna base 70E in the y-direction located closer to the third dielectric side surface 55.

As viewed from above, the conductive portions 110B and 120B are disposed to overlap the proximity of the interface between the separate antenna base 70E and the separate antenna base 70F. As viewed from above, the conductive portions 110C and 120C are disposed to overlap the proximity of the interface between the separate antenna base 70F and the separate antenna base 70G. As viewed from above, the conductive portions 110D and 120D are disposed to overlap the proximity of the interface between the separate antenna base 70G and the separate antenna base 70H.

The electrodes 101E to 101H and 102E to 102H corresponding to the terahertz elements 20E to 20H, which are located closer to the second dielectric side surface 54, are disposed in the proximity of the first dielectric side surface 53. Specifically, the electrodes 101E to 101H and 102E to 102H are disposed on the first projection 61 of the dielectric 50. Thus, as viewed from above, the conductive portions 110E to 110H and 120E to 120H extend over the separate antenna bases 70A to 70D in the x-direction.

As viewed from above, the conductive portions 110E and 120E are disposed to overlap the proximity of the interface between the separate antenna base 70A and the separate antenna base 70B. As viewed from above, the conductive portions 110F and 120F are disposed to overlap the proximity of the interface between the separate antenna base 70B and the separate antenna base 70C. As viewed from above, the conductive portions 110G and 120G are disposed to overlap the proximity of the interface between the separate antenna base 70C and the separate antenna base 70D.

As viewed from above, the conductive portion 110H is disposed to overlap one of the opposite ends of the reflective film 82D of the separate antenna base 70D in the y-direction located closer to the fourth dielectric side surface 56. As viewed from above, the conductive portion 120H is disposed closer to the fourth dielectric side surface 56 than the reflective film 82D. Since the reflective film 82D is located at a position lower than the base main surface 71, the two conductive portions 110H and 120H are located above and separated from the reflective film 82D in the z-direction. In addition, the two conductive portions 110H and 120H are encapsulated by the dielectric 50. Thus, the two conductive portions 110H and 120H are not in contact with the reflective film 82D.

As viewed from above, this structure reduces the blocking caused by the overlap of the conductive portions 110A to 110H and 120A to 120H with the antenna surfaces 81A to 81H.

Figure 59:
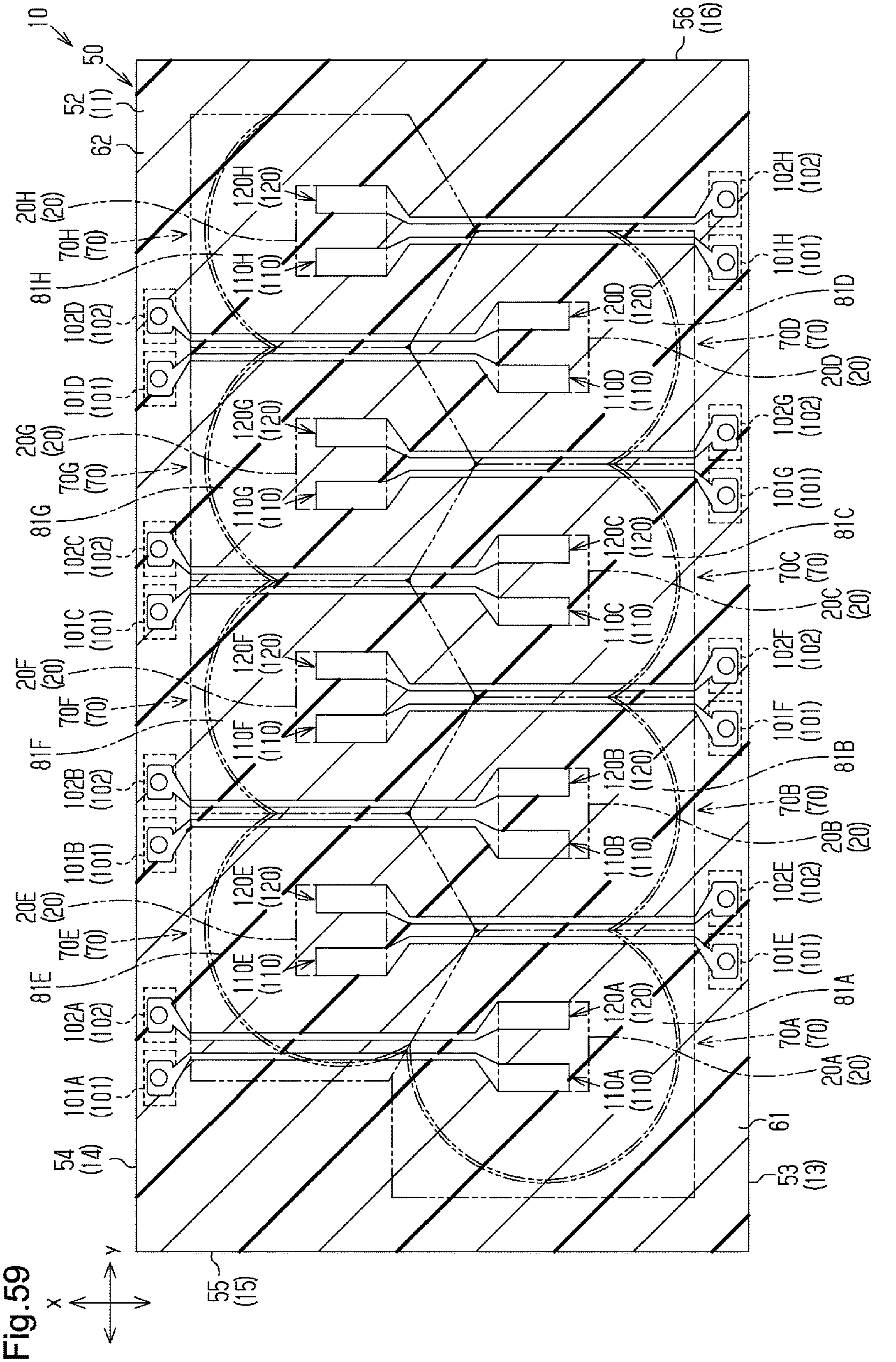
FIG. 59 is a cross-sectional view of a modified example of the second embodiment of the terahertz device.

In the modified example shown in FIG. 58, the shapes of the conductive portions 110A to 110H and 120A to 120H may be changed so that, for example, as shown in FIG. 59, the conductive portions 110B to 110G and 120B to 120G are located closer to the interface between the separate antenna bases that are adjacent to each other in the x-direction. Specifically, as viewed from above, each of the conductive portions 110A to 110H and 120A to 120H may be disposed adjacent to the third base side surface 75 or the fourth base side surface 76 of the corresponding separate antenna base in the y-direction.

More specifically, as shown in FIG. 59, as viewed from above, the conductive portion 110A is located closer to the third dielectric side surface 55 than the reflective film 82E. The conductive portion 120A is disposed to overlap one of the opposite ends of the reflective film 82E in the y-direction that is located closer to the third dielectric side surface 55. As viewed from above, the conductive portion 110B is disposed to overlap one of the opposite ends of the reflective film 82E in the y-direction that is located closer to the reflective film 82F. The conductive portion 120B is disposed to overlap one of the opposite ends of the reflective film 82F in the y-direction that is located closer to the reflective film 82E. As viewed from above, the conductive portion 110C is disposed to overlap one of the opposite ends of the reflective film 82F in the y-direction that is located closer to the reflective film 82G. The conductive portion 120C is disposed to overlap one of the opposite ends of the reflective film 82G in the y-direction that is located closer to the reflective film 82F. As viewed from above, the conductive portion 110D is disposed to overlap one of the opposite ends of the reflective film 82G in the y-direction that is located closer to the reflective film 82H. The conductive portion 120D is disposed to overlap one of the opposite ends of the reflective film 82H in the y-direction that is located closer to the reflective film 82G.

As viewed from above, the conductive portion 110E is disposed to overlap one of the opposite ends of the reflective film 82A in the y-direction that is located closer to the reflective film 82B. The conductive portion 120E is disposed to overlap one of the opposite ends of the reflective film 82B in the y-direction that is located closer to the reflective film 82A. As viewed from above, the conductive portion 110F is disposed to overlap one of the opposite ends of the reflective film 82B in the y-direction that is located closer to the reflective film 82C. The conductive portion 120F is disposed to overlap one of the opposite ends of the reflective film 82C in the y-direction that is located closer to the reflective film 82B. As viewed from above, the conductive portion 110G is disposed to overlap one of the opposite ends of the reflective film 82C in the y-direction that is located closer to the reflective film 82D. The conductive portion 120G is disposed to overlap one of the opposite ends of the reflective film 82D in the y-direction that is located closer to the reflective film 82C. As viewed from above, the conductive portion 110H is disposed to overlap one of the opposite ends of the reflective film 82D in the y-direction that is located closer to the fourth dielectric side surface 56. The conductive portion 120H is disposed closer to the fourth dielectric side surface 56 than the reflective film 82D.

As viewed from above, the part of the two conductive portions 110 and 120 overlapping the reflective film 82 is located above the reflective film 82, and the two conductive portions 110 and 120 are encapsulated by the dielectric 50. Thus, the two conductive portions 110 and 120 are not in contact with the reflective film 82.

As viewed from above, this structure further reduces the blocking caused by the overlap of the conductive portions 110A to 110H and 120A to 120H with the antenna surfaces 81A to 81H.

In the second embodiment, as viewed from above, the first electrode 101 and the conductive portion 110 may be shifted from the second electrode 102 and the conductive portion 120 by 180° about the reception point P1 of the terahertz element 20. In other words, as viewed from above, the first electrode 101 and the conductive portion 110 may be opposed to the second electrode 102 and the conductive portion 120 in a direction orthogonal to the arrangement direction of the separate antenna bases 70A to 70D (arrangement direction of the separate antenna bases 70E to 70H).

Figure 60:
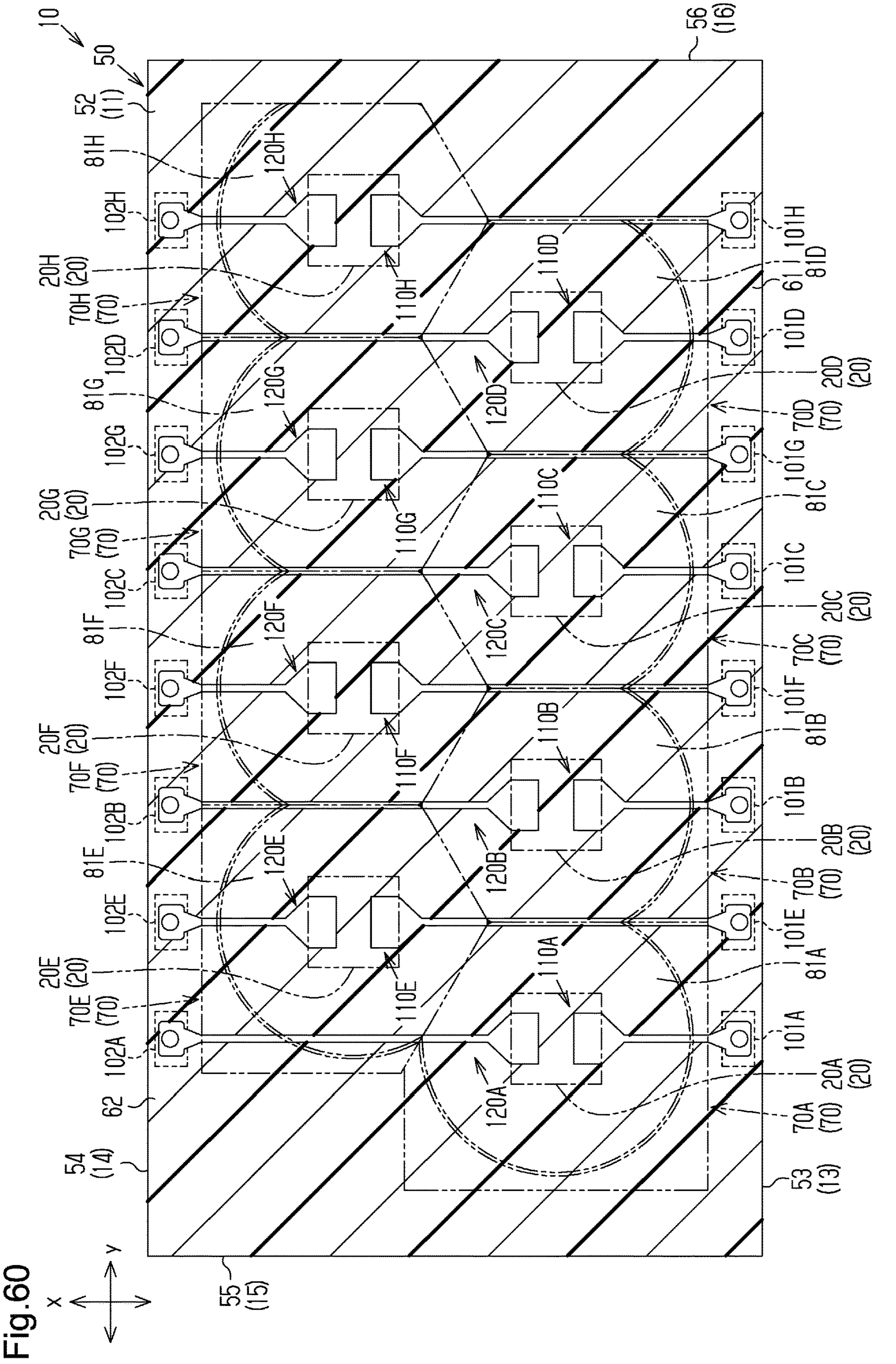
FIG. 60 is a cross-sectional view showing a modified example of the second embodiment of the terahertz device.

In an example, as shown in FIG. 60, the first electrode 101A and the conductive portion 110A are opposed to the second electrode 102A and the conductive portion 120A in the x-direction. The first electrode 101B and the conductive portion 110B are opposed to the second electrode 102B and the conductive portion 120B in the x-direction. The first electrode 101C and the conductive portion 110C are opposed to the second electrode 102C and the conductive portion 120C in the x-direction. The first electrode 101D and the conductive portion 110D are opposed to the second electrode 102D and the conductive portion 120D in the x-direction. Also, the first electrode 101E and the conductive portion 110E are opposed to the second electrode 102E and the conductive portion 120E in the x-direction. The first electrode 101F and the conductive portion 110F are opposed to the second electrode 102F and the conductive portion 120F in the x-direction. The first electrode 101G and the conductive portion 110G are opposed to the second electrode 102G and the conductive portion 120G in the x-direction. The first electrode 101H and the conductive portion 110H are opposed to the second electrode 102H and the conductive portion 120H in the x-direction. In the shown example, the first electrodes 101A to 101H are arranged on the first projection 61 of the dielectric 50. The second electrodes 102A to 102H are arranged on the second projection 62 of the dielectric 50.

As shown in FIG. 60, the positional relationship of the conductive portions 110A to 110H and 120A to 120H with the terahertz elements 20A to 20H is the same as that in the modified example shown in FIG. 57. Also, the shape of the element opposing parts 111 and 121 is the same as that in the modified example shown in FIG. 57.

As viewed from above, the conductive portion 110E is disposed to overlap the interface between the reflective film 82A and the reflective film 82B. The conductive portion 110F is disposed to overlap the interface between the reflective film 82B and the reflective film 82C. The conductive portion 110G is disposed to overlap the interface between the reflective film 82C and the reflective film 82D. The conductive portion 110H is disposed to overlap one of the opposite open ends of the reflective film 82D in the y-direction that is located closer to the fourth dielectric side surface 56.

The interface between the reflective film 82A and the reflective film 82B, the interface between the reflective film 82B and the reflective film 82C, the interface between the reflective film 82C and the reflective film 82D, and one of the opposite open ends of the reflective film 82D in the y-direction that is located closer to the fourth dielectric side surface 56 are located at a position lower than the base main surface 71T. The conductive portions 110E to 110H are encapsulated by the dielectric 50. Thus, the conductive portions 110E to 110H are not in contact with the reflective films 82A to 82D.

As viewed from above, the conductive portion 120B is disposed to overlap the interface between the reflective film 82E and the reflective film 82F. The conductive portion 120C is disposed to overlap the interface between the reflective film 82F and the reflective film 82G. The conductive portion 120D is disposed to overlap the interface between the reflective film 82G and the reflective film 82H.

The interface between the reflective film 82E and the reflective film 82F, the conductive portion 120C is the interface between and the reflective film 82F and the reflective film 82G, and the conductive portion 120D is the interface between the reflective film 82G and the reflective film 82H are located at a position lower than the base main surface 71T. The conductive portions 120B to 120D are encapsulated by the dielectric 50. Thus, the conductive portions 120B to 120D are not in contact with the reflective films 82F to 82H.

In this structure, as viewed from above, the conductive portions 110E to 110H and 120B to 120D are disposed to overlap the interface between ones of the antenna surfaces 81A to 81H that are adjacent to each other in the y-direction. This reduces the blocking caused by overlaps of the conductive portions 110E to 110H and 120B to 120D with the antenna surfaces 81A to 81H as viewed from above.

Figure 61:
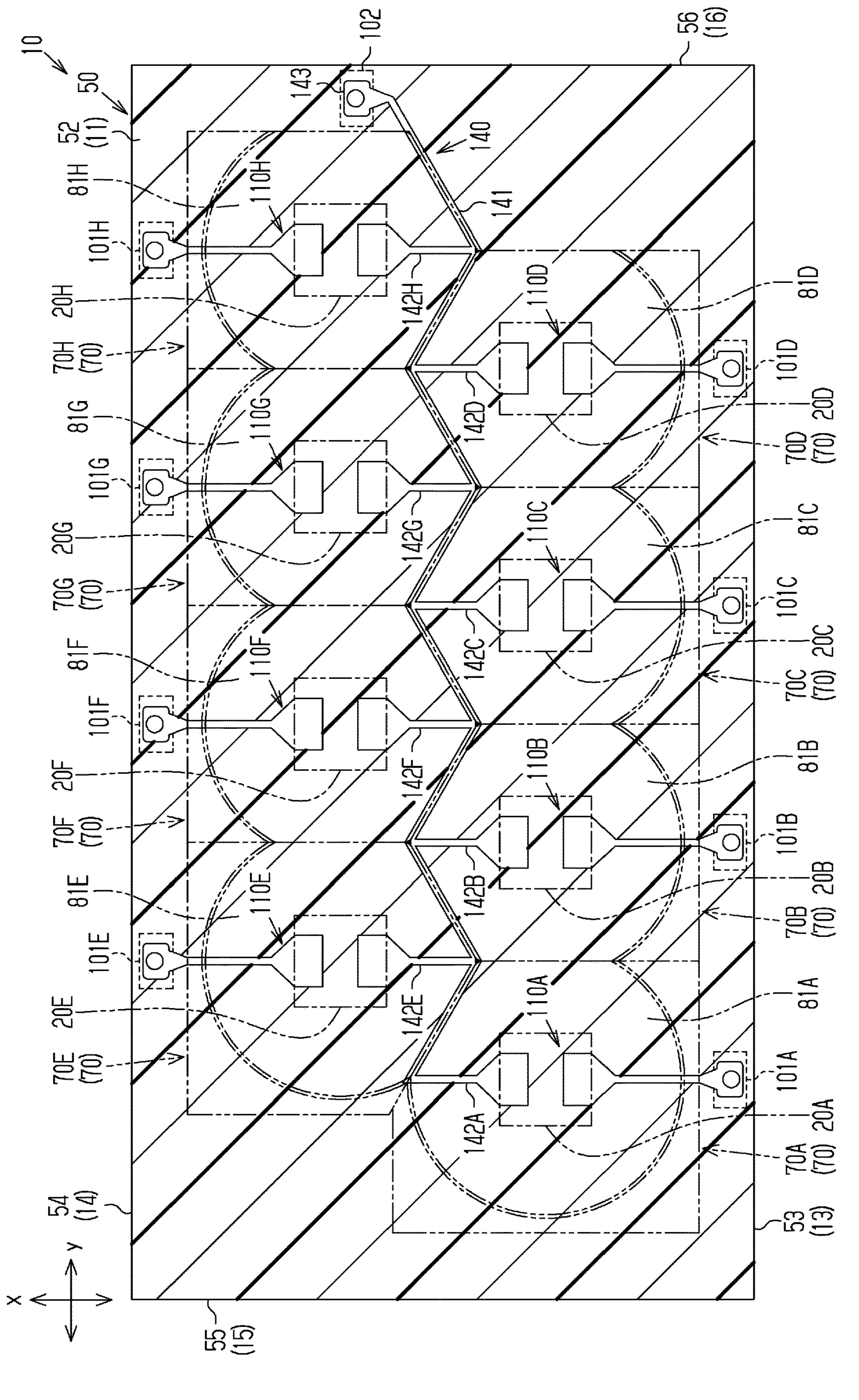
FIG. 61 is a cross-sectional view showing a modified example of the second embodiment of the terahertz device.

In the modified example shown in FIG. 60, the conductive portions 120A to 120H may be a single conductive portion 140. In an example, as shown in FIG. 61, the conductive portion 140 includes a common wire part 141, a first wire part 142A, a second wire part 142B, a third wire part 142C, a fourth wire part 142D, a fifth wire part 142E, a sixth wire part 142F, a seventh wire part 142G, an eighth wire part 142H, and an electrode opposing part 143. In the shown example, the conductive portion 140 is a single-piece component in which the common wire part 141, the wire parts 142A to 142H, and the electrode opposing part 143 are formed integrally.

As viewed from above, the electrode opposing part 143 is disposed to overlap the second electrode 102 and is connected to the second electrode 102 by a post, which is not shown. As viewed from above, the post is disposed to overlap both the electrode opposing part 143 and the second electrode 102. The post is connected to the electrode opposing part 143 and the second electrode 102 in the z-direction.

The common wire part 141 is disposed in the middle of the antenna base 70 in the x-direction. More specifically, as viewed from above, the common wire part 141 is disposed to overlap the interfaces between ones of the reflective films 82A to 82H located adjacent to each other in the third direction and the fourth direction, which differ from the x-direction and the y-direction. In an example, the third direction refers to a direction in which the reflective film 82A and the reflective film 82E are arranged. In an example, the fourth direction refers to a direction in which the reflective film 82B and the reflective film 82B are arranged. In the example shown, as viewed from above, the common wire part 141 is disposed to overlap the interface between the reflective film 82A and the reflective film 82E, the interface between the reflective film 82E and the reflective film 82B, the interface between the reflective film 82B and the reflective film 82F, the interface between the reflective film 82F and the reflective film 82C, the interface between the reflective film 82C and the reflective film 82G, the interface between the reflective film 82G and the reflective film 82D, and the interface between the reflective film 82D and the reflective film 82H.

The wire parts 142A to 142H extend from the common wire part 141 in the x-direction. More specifically, the wire parts 142A to 142D extend from the common wire part 141 toward the first dielectric side surface 53 in the x-direction. The wire parts 142E to 142H extend from the common wire part 141 toward the second dielectric side surface 54 in the x-direction.

The first wire part 142A connects the common wire part 141 and the terahertz element 20A. The first wire part 142A extends from the common wire part 141 toward the terahertz element 20A in the x-direction.

The second wire part 142B connects the common wire part 141 and the terahertz element 20B. The second wire part 142B extends from the common wire part 141 toward the terahertz element 20B in the x-direction.

The third wire part 142C connects the common wire part 141 and the terahertz element 20C. The third wire part 142C extends from the common wire part 141 toward the terahertz element 20C in the x-direction.

The fourth wire part 142D connects the common wire part 141 and the terahertz element 20D. The fourth wire part 142D extends from the common wire part 141 toward the terahertz element 20D in the x-direction.

The fifth wire part 142E connects the common wire part 141 and the terahertz element 20E. The fifth wire part 142E extends from the common wire part 141 toward the terahertz element 20E in the x-direction.

The sixth wire part 142F connects the common wire part 141 and the terahertz element 20F. The sixth wire part 142F extends from the common wire part 141 toward the terahertz element 20F in the x-direction.

The seventh wire part 142G connects the common wire part 141 and the terahertz element 20G. The seventh wire part 142G extends from the common wire part 141 toward the terahertz element 20G in the x-direction.

The eighth wire part 142H connects the common wire part 141 and the terahertz element 20H. The eighth wire part 142H extends from the common wire part 141 toward the terahertz element 20H in the x-direction.

In this structure, the common wire part 141 overlaps the interfaces between the reflective films 82A to 82H in the third direction and the fourth direction. This reduces the blocking caused by overlaps of the common wire part 141 with the reflective films 82A to 82H as viewed from above.

Figure 62:
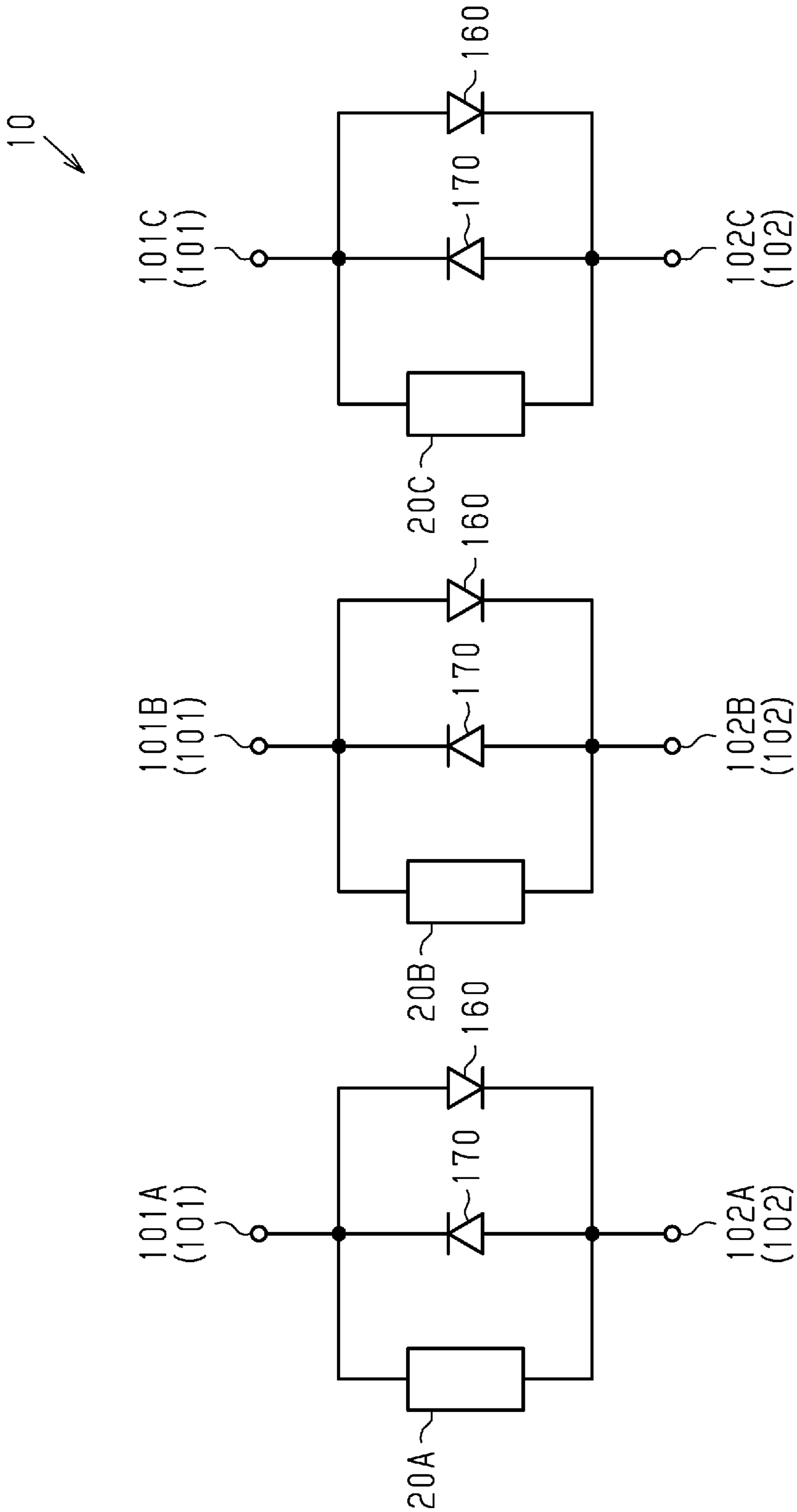
FIG. 62 is general a circuit diagram showing a modified example of the first embodiment of the terahertz device.

In the first embodiment, as shown in FIG. 62, the terahertz device 10 may include protection diodes 160 and 170 respectively electrically connected to the terahertz elements 20A to 20C. The protection diodes 160 and 170 are an example of a specified element. The protection diodes 160 and 170 are connected in parallel to the terahertz elements 20A to 20C. The two protection diodes 160 and 170 are connected to the terahertz elements 20A to 20C in opposite directions. The protection diodes 160 and 170 may be general diodes or Zener diodes, Schottky diodes, or light emitting diodes.

Figure 63:
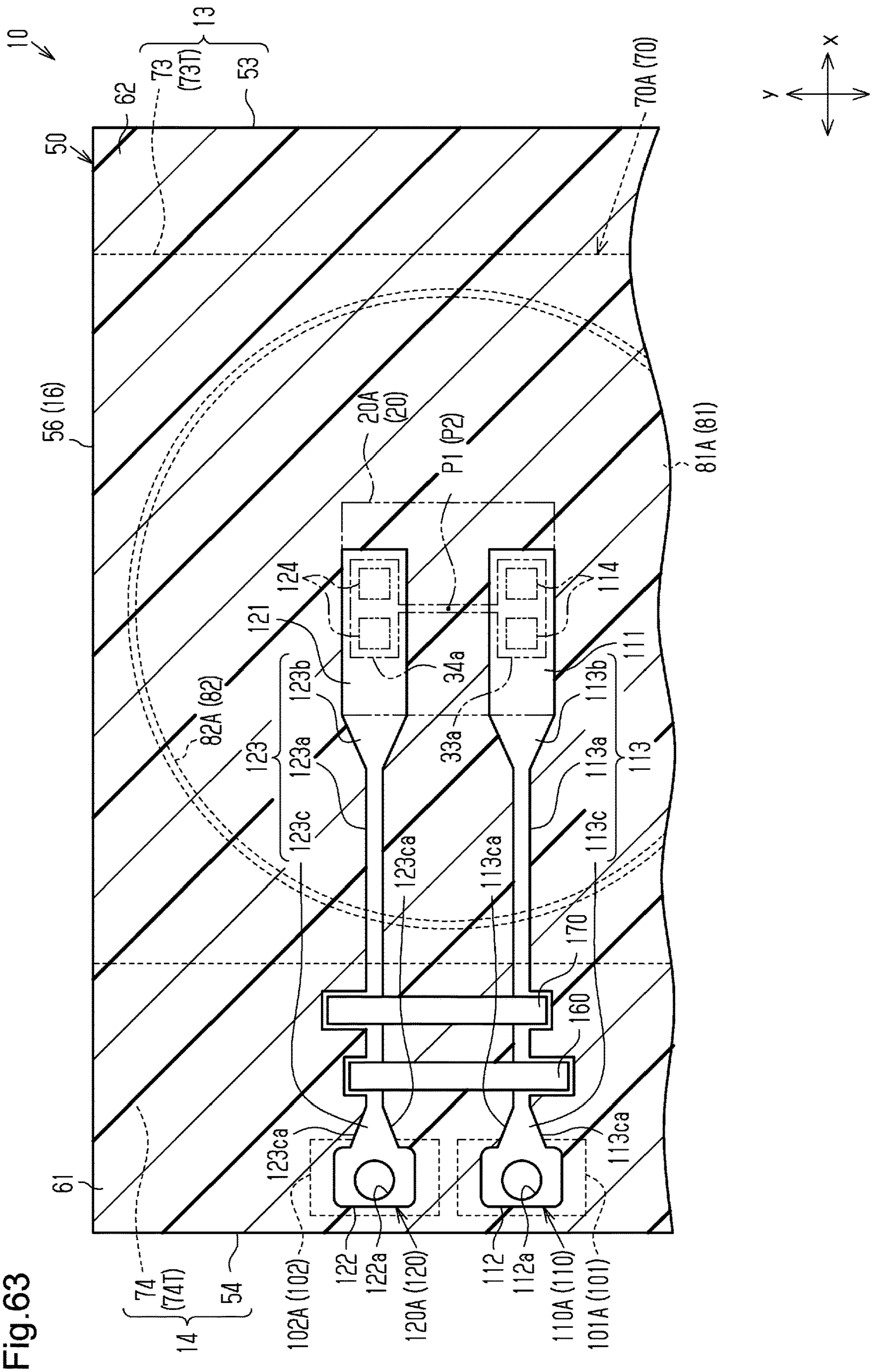
FIG. 63 is an enlarged partial cross-sectional view showing a modified example of the first embodiment of the terahertz device.

As shown in FIG. 63, the protection diodes 160 and 170 are arranged in the dielectric 50. More specifically, the dielectric 50 encapsulates the protection diodes 160 and 170, the conductive portions 110 and 120, and the terahertz elements 20. FIG. 63 shows the relationship of the separate antenna base 70A, the terahertz element 20A, the two electrodes 101A and 102A, the two conductive portions 110A and 120A, and the two protection diodes 160 and 170.

The protection diodes 160 and 170 are disposed so as not to overlap the reflective film 82A (the antenna surface 81A) as viewed in the z-direction. Specifically, the protection diodes 160 and 170 are arranged in the projections 61 and 62 of the dielectric 50 projecting sideward from the antenna base 70. In the example shown, the protection diodes 160 and 170 are arranged in the first projection 61. This avoids interference of the protection diodes 160 and 170 with an incident electromagnetic wave toward the reflective film 82A. In the example shown, the protection diodes 160 and 170 are separate in the x-direction. The protection diodes 160 and 170 are connected to the two conductive portions 110A and 120A. More specifically, the protection diodes 160 and 170 are connected between the element opposing parts 111 and 121 and the electrode opposing parts 112 and 122. In other words, the protection diodes 160 and 170 are connected to the connectors 113 and 123. The protection diode 160 has an anode electrode connected to the first connector 113 and a cathode electrode connected to the second connector 123. The protection diode 170 has an anode electrode connected to the second connector 123 and a cathode electrode connected to the first connector 113. Thus, the protection diodes 160 and 170 are electrically connected to the electrodes 101A and 102A.

In the example shown, the protection diode 160 is located at an inner side of the first electrode 101A. The protection diode 170 is located at an inner side of the second electrode 102A. In other words, the protection diodes 160 and 170 and the electrodes 101A and 102A are arranged in a direction away from the terahertz element 20A in the x-direction. Since the protection diodes 160 and 170 are encapsulated by the dielectric 50, the protection diodes 160 and 170 are not in contact with the electrodes 101A and 102A.

The same relationship applies to the separate antenna bases 70B and 70C, the terahertz element 20B and 20C, the electrodes 101B, 101C, 102B, and 102C, and the conductive portions 110B, 110C, 120B, and 120C, and the protection diodes 160 and 170. Thus, the relationship will not be described.

With this structure, for example, when static electricity causes a high voltage to be applied to opposite ends of the terahertz elements 20A to 20C, the protection diodes 160 and 170 allow current to flow through the protection diodes 160 and 170. This limits an excessive current flowing to the terahertz elements 20A to 20C. Thus, the terahertz elements 20A to 20C are protected.

In addition, the protection diodes 160 and 170 are connected to the terahertz elements 20A to 20C in opposite directions. Thus, the terahertz elements 20A to 20C are protected even when a high voltage is generated in any direction.

Figure 64:
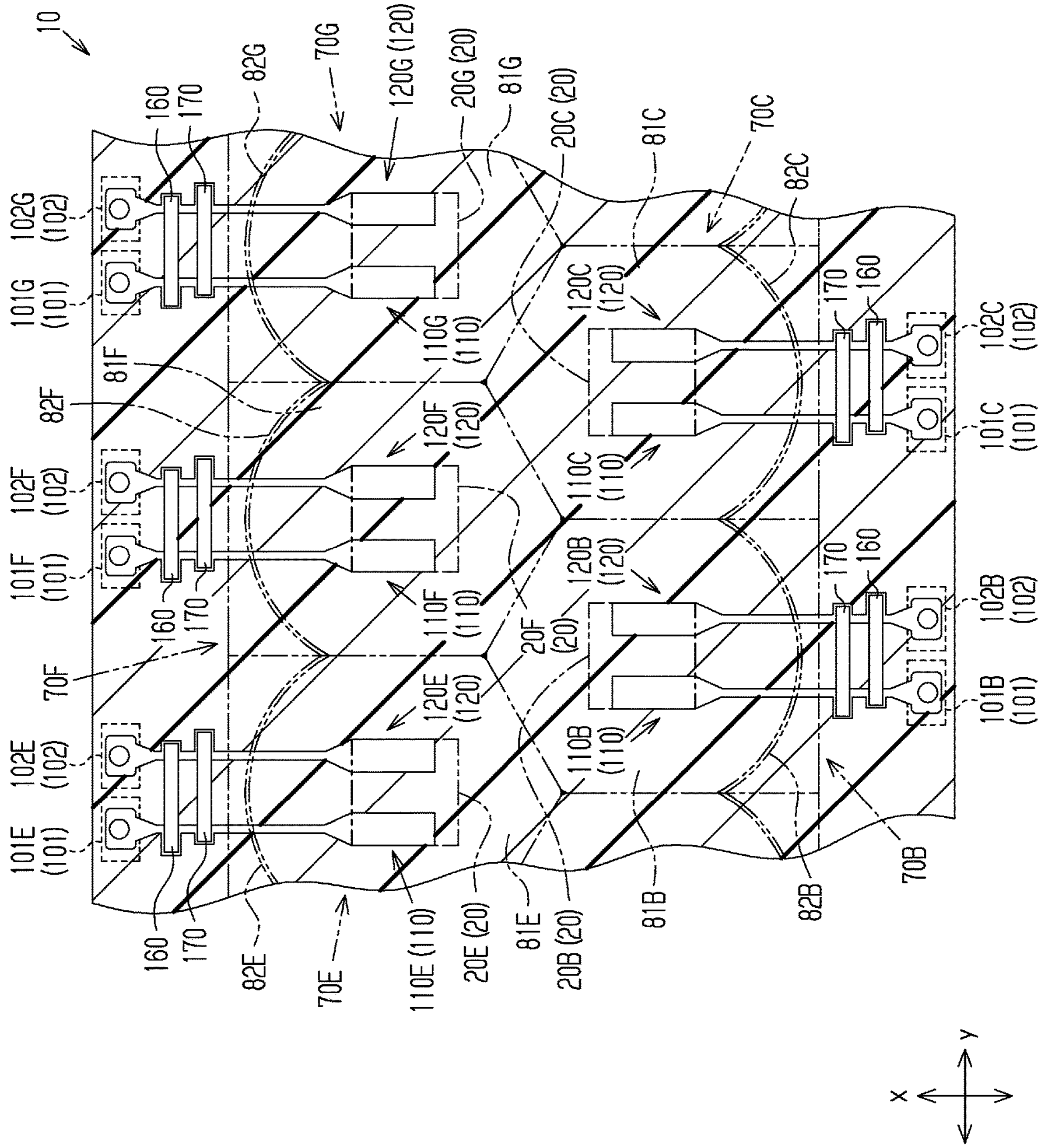
FIG. 64 is an enlarged partial cross-sectional view showing a modified example of the second embodiment of the terahertz device.

In the second embodiment, in the same manner as the modified example shown in FIGS. 62 and 63, the terahertz device 10 may include protection diodes 160 and 170 respectively electrically connected to the terahertz elements 20A to 20H. The protection diodes 160 and 170 are an example of a specified element. In an example, as shown in FIG. 64, the protection diodes 160 and 170 connected to the conductive portions 110E and 120E, the protection diodes 160 and 170 connected to the conductive portions 110F and 120F, and the protection diodes 160 and 170 connected to the two conductive portions 110G and 120G are arranged on the second projection 62 of the dielectric 50. The protection diodes 160 and 170 connected to the conductive portions 110B and 120B and the protection diodes 160 and 170 connected to the conductive portions 110C and 120C are arranged on the first projection 61 of the dielectric 50. Although not shown, the protection diodes 160 and 170 connected to the two conductive portions 110H and 120H are arranged on the second projection 62 of the dielectric 50. The protection diodes 160 and 170 connected to the conductive portions 110A and 120A and the protection diodes 160 and 170 connected to the conductive portions 110D and 120D are arranged on the first projection 61 of the dielectric 50.

Figure 65:
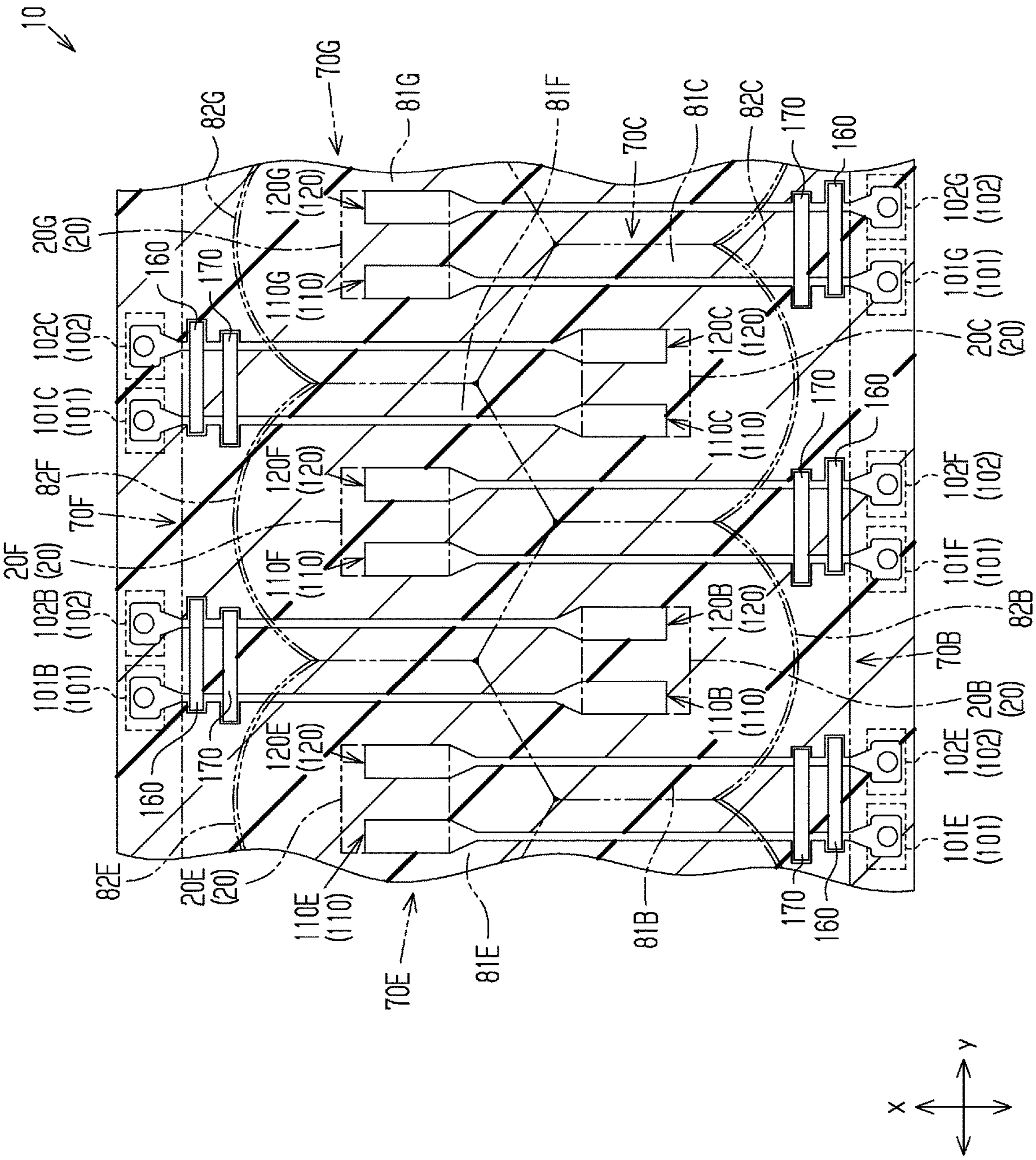
FIG. 65 is an enlarged partial cross-sectional view showing a modified example of the second embodiment of the terahertz device.

In the modified example shown in FIG. 58, in the same manner as the modified example shown in FIGS. 62 and 63, the terahertz device 10 may include protection diodes 160 and 170 respectively electrically connected to the terahertz elements 20A to 20H. The protection diodes 160 and 170 are an example of a specified element. In an example, as shown in FIG. 65, as viewed from above, the protection diodes 160 and 170 connected to the conductive portions 110B and 120B are disposed to overlap the base main surface 71 of the separate antenna base 70E and the base main surface 71 of the separate antenna base 70F. The protection diodes 160 and 170 connected to the conductive portions 110C and 120C are disposed to overlap the base main surface 71 of the separate antenna base 70F and the base main surface 71 of the separate antenna base 70G. More specifically, as viewed from above, the protection diodes 160 and 170 connected to the conductive portions 110B and 120B are disposed between the reflective film 82E (the antenna surface 81E) and the reflective film 82F (the antenna surface 81F) in the y-direction. As viewed from above, the protection diodes 160 and 170 connected to the two conductive portions 110C and 120C are disposed between the antenna surface 81F and the antenna surface 81G in the y-direction.

As viewed from above, the protection diodes 160 and 170 connected to the two conductive portions 110E and 120E are disposed to overlap the base main surface 71 of the separate antenna base 70A and the base main surface 71 of the separate antenna base 70B. The protection diodes 160 and 170 connected to the two conductive portions 110F and 120F are disposed to overlap the base main surface 71 of the separate antenna base 70B and the base main surface 71 of the separate antenna base 70C. The protection diodes 160 and 170 connected to the conductive portions 110G and 120G are disposed to overlap the base main surface 71 of the separate antenna base 70C and the base main surface 71 of the separate antenna base 70D. More specifically, as viewed from above, the protection diodes 160 and 170 connected to the conductive portions 110E and 120E are disposed between the reflective film 82A (the antenna surface 81A) and the reflective film 82B (the antenna surface 81B) in the y-direction. As viewed from above, the protection diodes 160 and 170 connected to the conductive portions 110F and 120F are disposed between the reflective film 82B (the antenna surface 81B) and the reflective film 82C (the antenna surface 81C) in the y-direction. As viewed from above, the protection diodes 160 and 170 connected to the two conductive portions 110G and 120G are disposed between the reflective film 82C (the antenna surface 81C) and the reflective film 82D (the antenna surface 81D) in the y-direction.

Although not shown, the protection diodes 160 and 170 connected to the conductive portions 110A and 120A are disposed to overlap the base main surface 71 of the separate antenna base 70E. The protection diodes 160 and 170 connected to the conductive portions 110D and 120D are disposed between the antenna surface 81G and the antenna surface 81H in the y-direction. The protection diodes 160 and 170 connected to the two conductive portions 110H and 120H are disposed to overlap the base main surface 71 of the separate antenna base 70D.

In this structure, there is no need for the projections 61 and 62 of the dielectric 50 to have space for the protection diodes 160 and 170. This limits increases in the side of the terahertz device 10 in the x-direction.

The conductive portions 110 and 120 may be formed outside the dielectric 50. In an example, the conductive portions 110 and 120 may be respectively electrically connected to the terahertz elements 20 and formed on the dielectric main surface 51 or the dielectric back surface 52. However, to avoid short-circuiting of the reflective film 82 and the conductive portions 110 and 120, it is preferred that the conductive portions 110 and 120 are disposed in the dielectric 50.

Modified Examples Related to Terahertz Element

In each embodiment, at least one of the terahertz elements 20 may be disposed so that the reception point P1 is located at a position differing from the center point P2 of the reflective film 82 as viewed in the z-direction. That is, as viewed in the z-direction, the focal point of the reflective film 82 does not have to coincide with the reception point P1.

In each embodiment, the position and the shape of the pads 33*a* and 34*a* of the terahertz element 20 may be changed in any manner. In an example, the pads 33*a* and 34*a* do not have to be opposed to each other at opposite sides of the reception point P1 (generation point P1) in the x-direction or the y-direction. The pads 33*a* and 34*a* may be disposed together on one end of the element main surface 21 in the x-direction. In this case, it is preferred that the pads 33*a* and 34*a* are insulated from each other.

The element conductive layers 33 and 34 may partially form a dipole antenna. More specifically, an antenna may be integrated at the side of the element main surface 21 of the terahertz element 20. The antenna may have any specific configuration and may be as a slot antenna, a biconical antenna, or a loop antenna instead of a dipole antenna.

Figure 66:
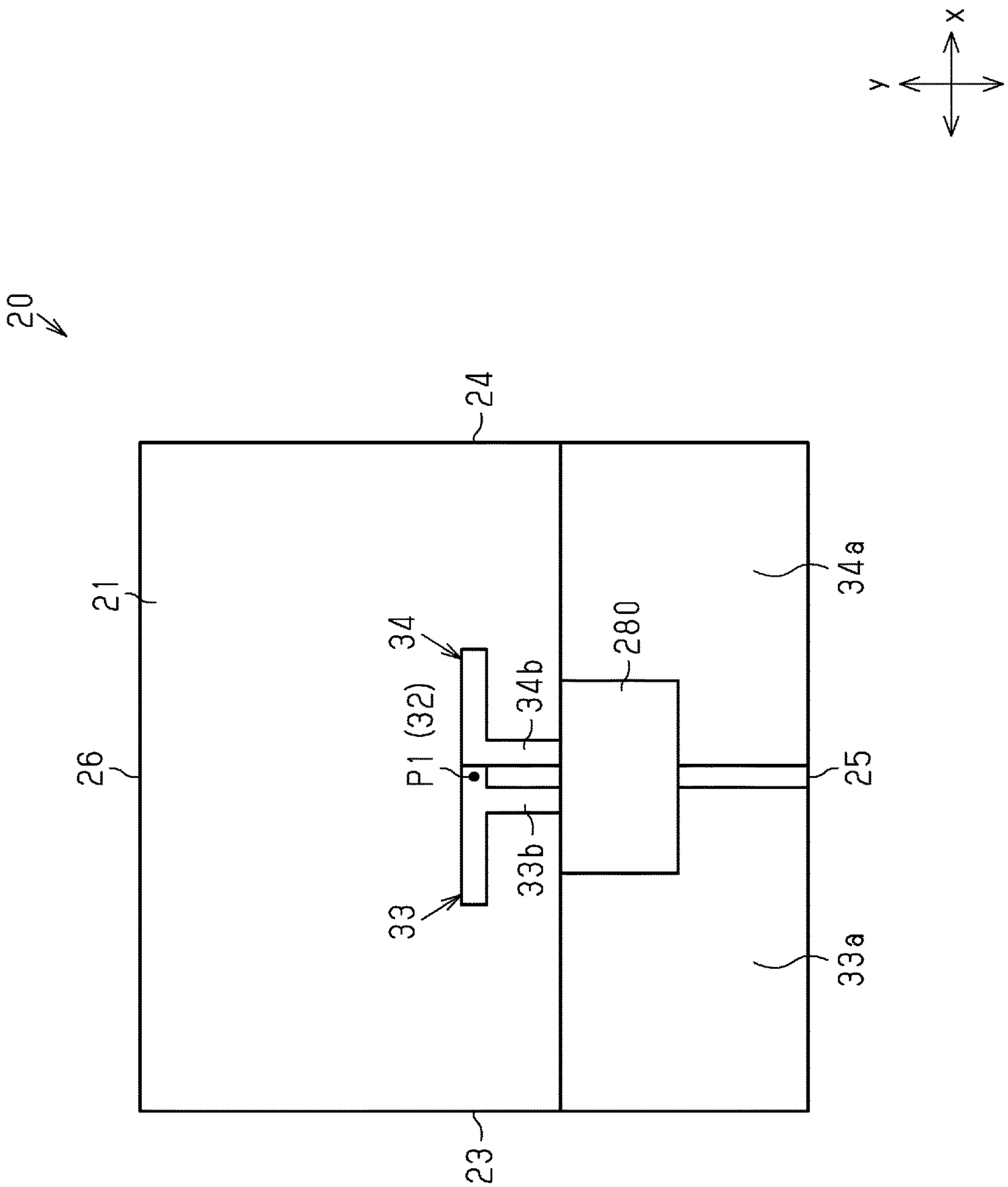
FIG. 66 is a schematic front view showing a modified example of a terahertz element.

In each embodiment, as shown in FIG. 66, the terahertz element 20 may include a metal insulator metal (MIM) reflector 280. The MIM reflector 280 is formed by sandwiching an insulator between a portion of the first element conductive layer 33 and a portion of the second element conductive layer 34 in the z-direction. The MIM reflector 280 is configured to short-circuit the portion of the first element conductive layer 33 and the portion of the second element conductive layer 34 at a high frequency. The MIM reflector 280 reflects high-frequency electromagnetic waves.

In each embodiment, the terahertz element 20 may be an element that generates electromagnetic waves. Specifically, the reception point P1 of the terahertz element 20 may be configured to be a generation point that generates electromagnetic waves. In this case, when the terahertz element 20 generates electromagnetic waves, the electromagnetic waves are emitted upward by the reflective film 82 formed on the antenna surface 81 that is opposed to the terahertz element 20 in the z-direction. In an example, the terahertz element 20 may be configured to radiate electromagnetic waves from the generation point in a range of an opening angle. That is, the electromagnetic waves generated from the terahertz element 20 may have directivity. Preferably, the opening angle is in a range in which reflection occurs on the reflective surface opposed to the terahertz element and is, for example, approximately 120° to 150°. In this case, the reflective film 82 is configured to reflect electromagnetic waves from the terahertz element 20 in one direction (in each embodiment, upward). In an example, in the first embodiment, the reflective film 82A is configured to reflect electromagnetic waves from the terahertz element 20A in one direction (upward). The reflective film 82B is configured to reflect electromagnetic waves from the terahertz element 20B in one direction. The reflective film 82C is configured to reflect electromagnetic waves from the terahertz element 20C in one direction.

Modified Examples Related to Dielectric

In each embodiment, the material of the dielectric 50 may be changed to any specific material as long as the material is transmissive to electromagnetic waves and the dielectric refractive index n2 is greater than the gas refractive index n3 and less than the element refractive index n1.

In each embodiment, the material forming the element substrate 31 may be a semiconductor that differs from InP. Since the element refractive index n1 is the refractive index of the element substrate 31, when the material forming the element substrate 31 is changed, the element refractive index n1 will also be changed. In this regard, it is preferred that the element substrate 31 is formed from a material having a higher refractive index than the dielectric refractive index n2.

In each embodiment, the shape of the dielectric 50 as viewed in the z-direction may be changed in any manner. In an example, in the first embodiment, one of the projections 61 and 62 that does not include the electrodes 101 and 102 may be omitted.

In an example, in the second embodiment, the third dielectric side surface 55 of the dielectric 50 may be formed to overlap the third base side surface 75 of the separate antenna base 70A as viewed in the z-direction. In an example, in the second embodiment, the third dielectric side surface 55 may be disposed to overlap the third base side surface 75T of the antenna base 70 and be identical in shape to the third base side surface 75T as viewed in the z-direction. In an example, in the second embodiment, the fourth dielectric side surface 56 of the dielectric 50 may be formed to overlap the fourth base side surface of the separate antenna base 70H as viewed in the z-direction. In an example, in the second embodiment, the fourth dielectric side surface 56 may be disposed to overlap the fourth base side surface 76T of the antenna base 70 and be identical in shape to the fourth base side surface 76T as viewed in the z-direction.

In each embodiment, the electrodes 101 and 102 are disposed on the dielectric main surface 51. Alternatively, the electrodes 101 and 102 may be disposed on the dielectric back surface 52. In this case, the posts 115 and 125 extend from the conductive portions 110 and 120 toward the dielectric back surface 52.

Modified Examples Related to Antenna Base

In each embodiment, the antenna base 70 may be formed from metal. In this case, the reflective film 82 may be omitted. With this structure, the antenna surface 81 reflects electromagnetic waves. More specifically, when the antenna base 70 is formed from metal, the antenna surface includes a reflective surface that reflects electromagnetic waves.

Figure 67:
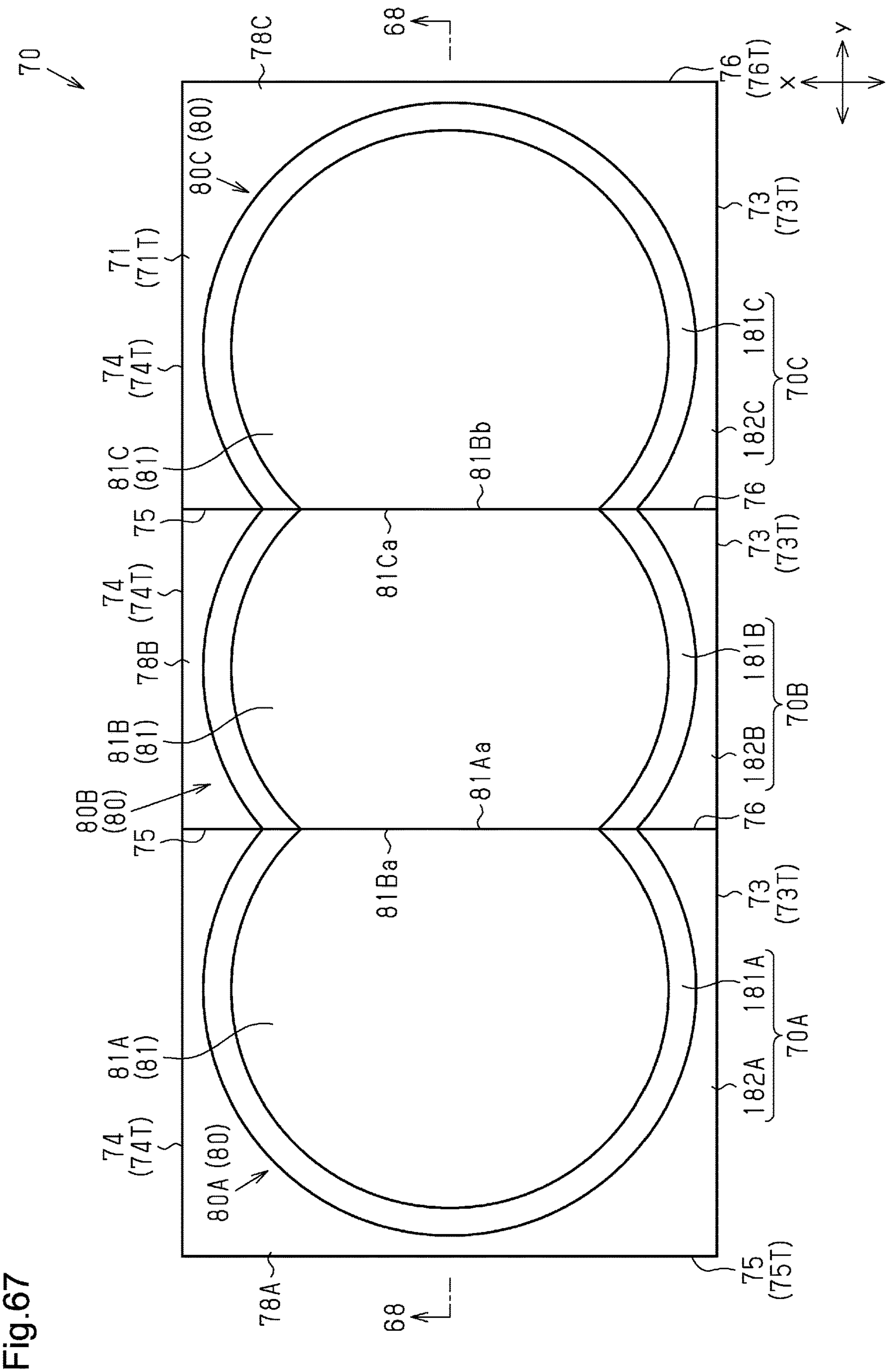
FIG. 67 is a plan view of an antenna base in a modified example of the first embodiment of the terahertz device.
Figure 68:
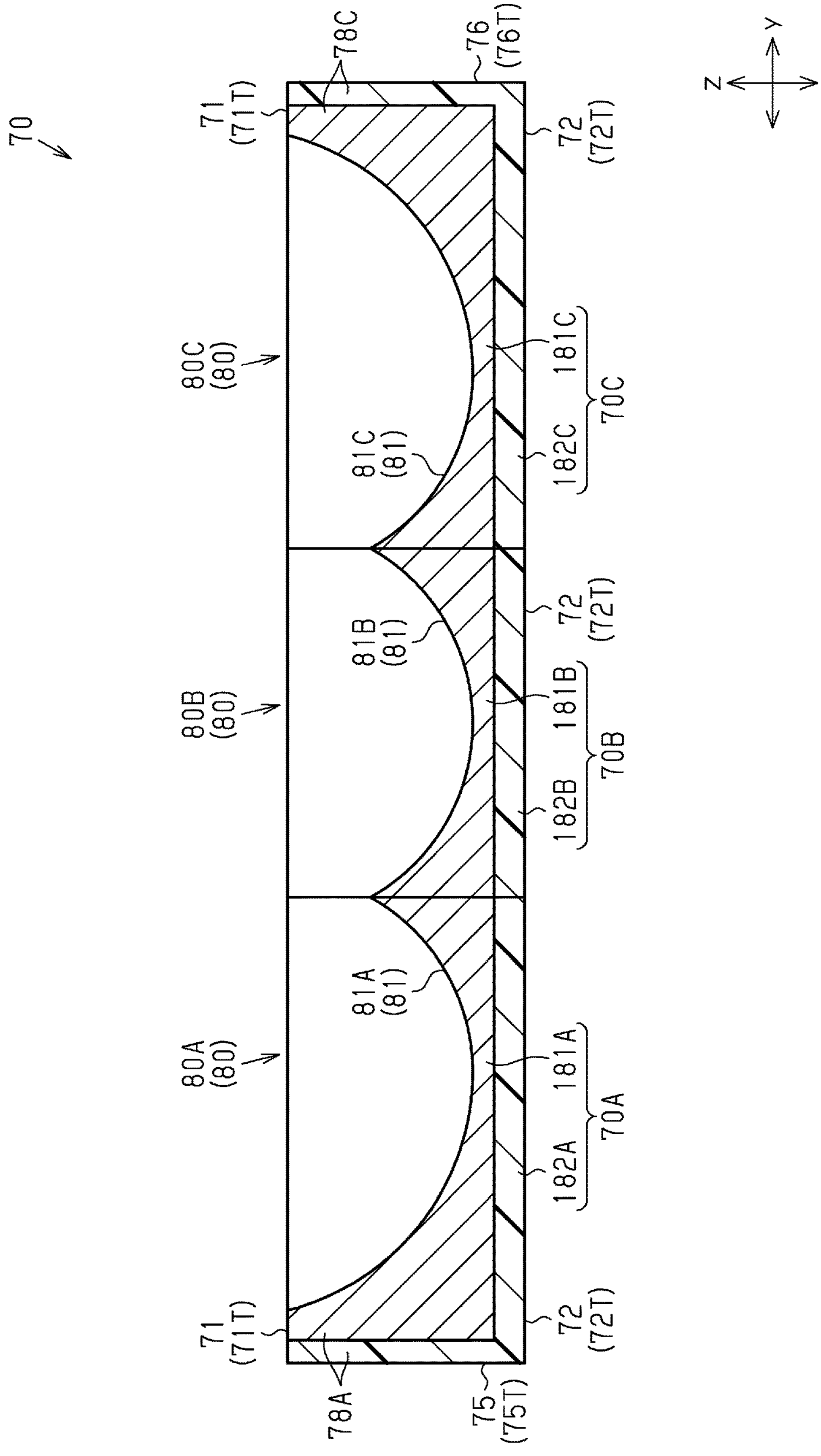
FIG. 68 is a cross-sectional view of the antenna base shown in FIG. 67 taken along line 68-68.

In each embodiment, each separate antenna base may include a first part formed from metal and including the antenna surface 81 and a second part formed from an electrical insulation material and disposed outward from the first part. An example of the electrical insulation material is epoxy resin. The second part form a base side surface excluding the base side surfaces corresponding to the cut-away portions of the antenna surface 81 of the separate antenna base. In an example, as shown in FIGS. 67 and 68, in the first embodiment, the separate antenna base 70A include a first part 181A including the antenna surface 81A and a second part 182A covering the periphery excluding the open end 81Aa of the antenna surface 81A as viewed from above. The second part 182A defines the peripheral wall 78A. The separate antenna base 70B includes a first part 181B including the antenna surface 81B and a second part 182B covering the periphery excluding the open ends 81Ba and 81Bb of the antenna surface 81B as viewed from above. The second part 182B defines the peripheral wall 78B. The separate antenna base 70C includes a first part 181C including the antenna surface 81C and a second part 182C covering the periphery excluding the open end 81Ca of the antenna surface 81C as viewed from above. The second part 182C defines the peripheral wall 78C. The second parts 182A to 182C are formed from an electrical insulation material, for example, epoxy resin.

In each embodiment, the separate antenna bases may be formed integrally. In an example, in the first embodiment, the separate antenna base 70A and the separate antenna base 70B may be formed integrally as a single component. The separate antenna base 70A and the separate antenna base 70C may be formed integrally as a single component. In an example, in the second embodiment, the separate antenna base 70B, the separate antenna base 70C, and the separate antenna base 70E may be formed integrally as a single component. In an example, in the third embodiment, the separate antenna base 70A, the separate antenna base 70B, the separate antenna base 70D, and the separate antenna base 70E may be formed integrally as a single component.

In each embodiment, the antenna base 70 may be formed of a single component. In other words, the antenna base 70 may include multiple antenna surfaces 81. Specifically, in the first embodiment, the antenna base 70 includes the antenna surfaces 81A to 81C. In the second embodiment, the antenna base 70 includes the antenna surfaces 81A to 81H. In the third embodiment, the antenna base 70 includes the antenna surfaces 81A to 81I.

Figure 69:
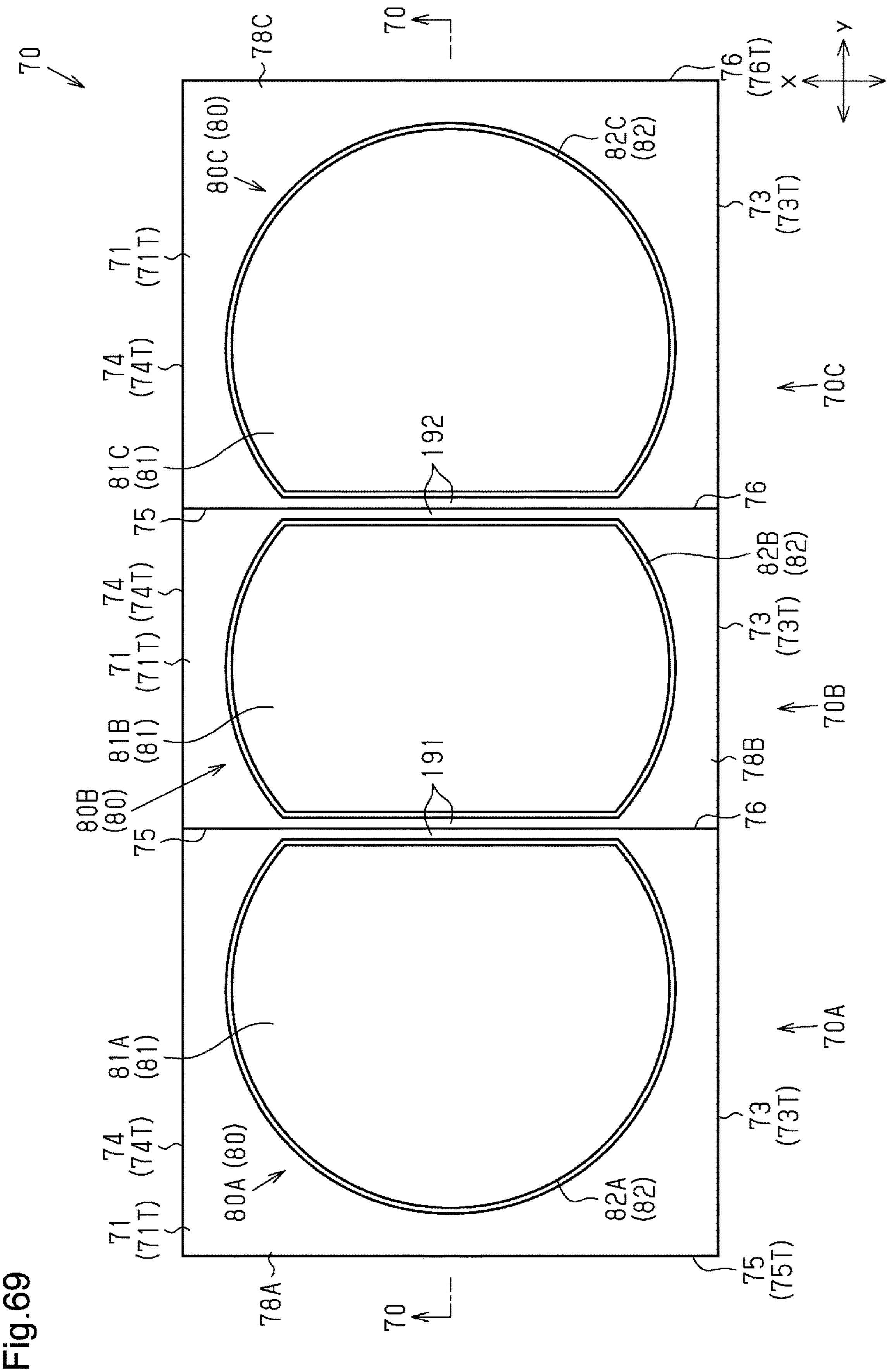
FIG. 69 is a plan view of an antenna base in a modified example of the first embodiment of the terahertz device.
Figure 70:
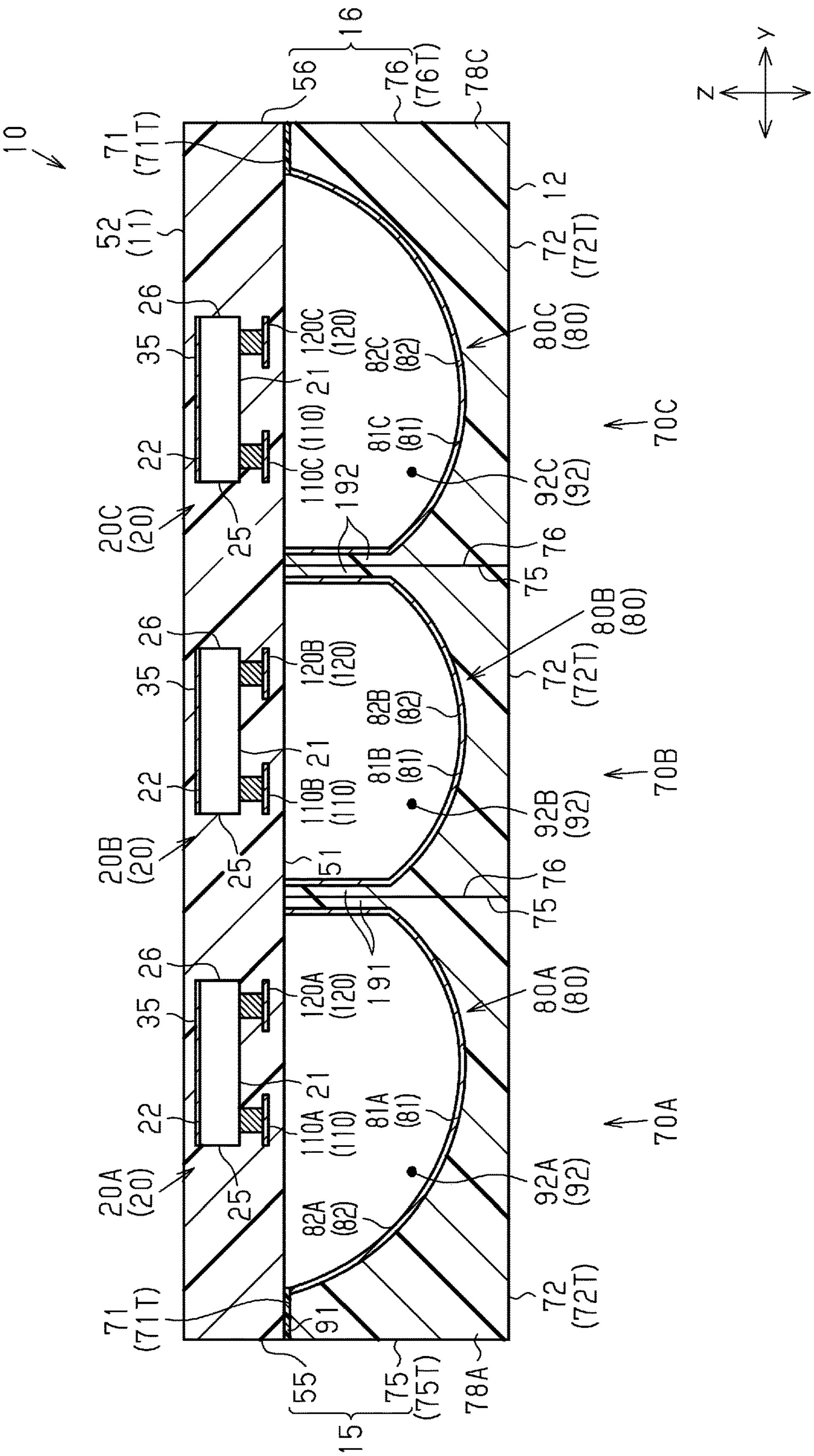
FIG. 70 is a cross-sectional view of the antenna base shown in FIG. 69 taken along line 70-70.

In the first embodiment, partition walls may be arranged in the interface between the antenna surfaces 81 that are adjacent to each other in the first direction, which is the arrangement direction of the separate antenna bases (in the first embodiment, the y-direction). The partition walls are in contact with the dielectric 50 to divide the gas cavity for each antenna surface 81. In an example, as shown in FIGS. 69 and 70, a first partition wall 191 is arranged in the interface between the antenna surface 81A and the antenna surface 81B, and a second partition wall 192 is arranged in the interface between the antenna surface 81B and the antenna surface 81C. The partition walls 191 and 192 extend from the interfaces toward the dielectric 50 in the z-direction. The partition walls 191 and 192 are in contact with the dielectric main surface 51 of the dielectric 50. This separates the gas cavity 92A, the gas cavity 92B, and the gas cavity 92C. That is, the gas cavities 92A to 92C are not connected to each other. The gas cavity 92A is sealed by the dielectric 50 and the reflective film 82A. The gas cavity 92B is sealed by the dielectric 50 and the reflective film 82B. The gas cavity 92C is sealed by the dielectric 50 and the reflective film 82C. In the example shown, the reflective film 82 is formed on side surfaces of the partition walls 191 and 192 that are in contact with the gas cavity 92.

Figure 71:
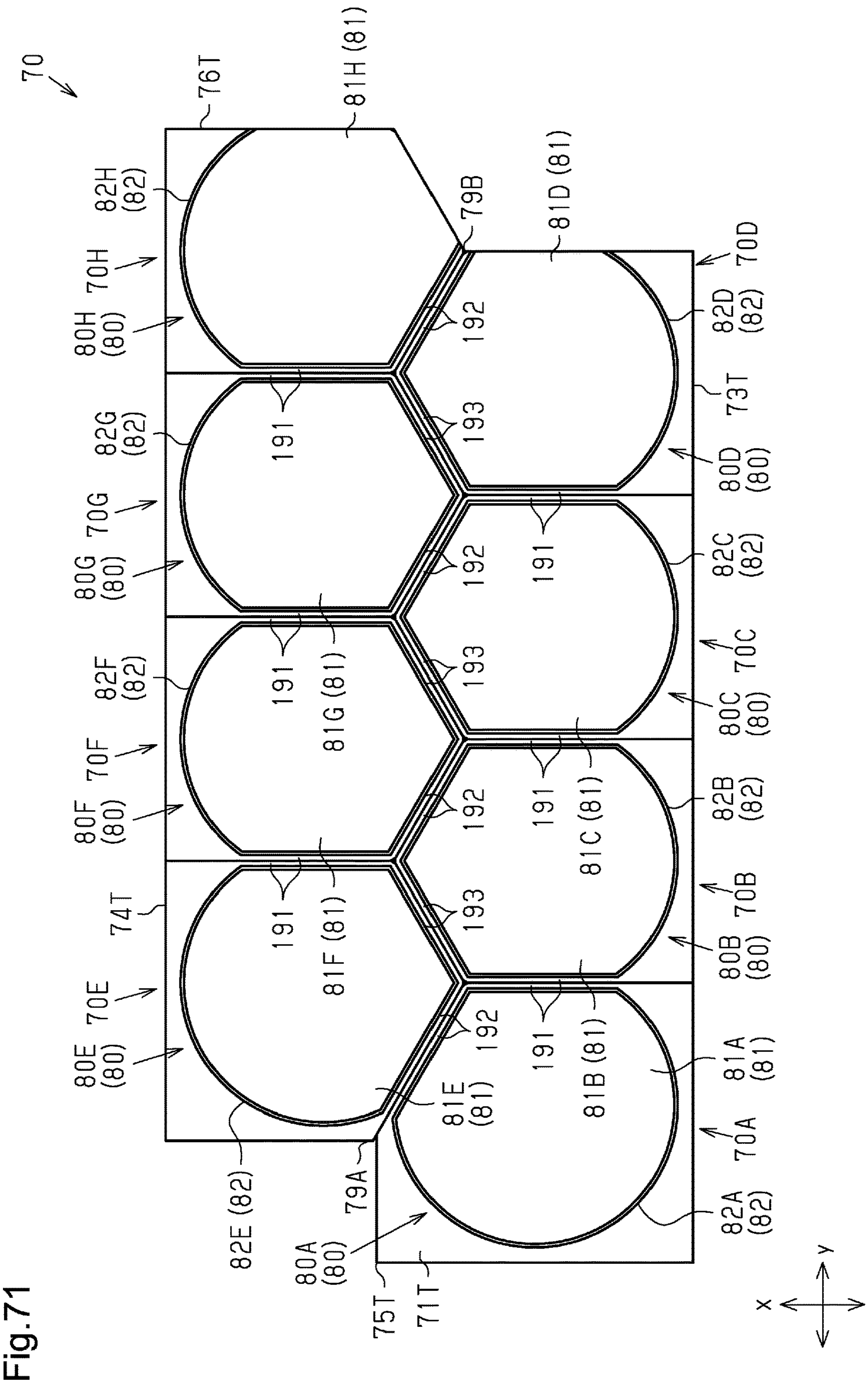
FIG. 71 is a plan view of an antenna base in a modified example of the second embodiment of the terahertz device.

In the second embodiment, partition walls may be arranged in the interface between the antenna surfaces 81 that are adjacent to each other in the first direction, the third direction, and the fourth direction, which are the arrangement directions of the separate antenna bases. In an example, as shown in FIG. 71, the first partition wall 191 is arranged in each interface between antenna surfaces located adjacent to each other in the first direction, namely, the interface between the antenna surface 81A and the antenna surface 81B, the interface between the antenna surface 81B and the antenna surface 81C, the interface between the antenna surface 81C and the antenna surface 81D, the interface between the antenna surface 81E and the antenna surface 81F, the interface between the antenna surface 81F and the antenna surface 81G, and the interface between the antenna surface 81G and the antenna surface 81H. The second partition wall 192 is arranged in each interface between antenna surfaces located adjacent to each other in the third direction, namely, the interface between the antenna surface 81A and the antenna surface 81E, the interface between the antenna surface 81B and the antenna surface 81F, the interface between the antenna surface 81C and the antenna surface 81G, and the interface between the antenna surface 81D and the antenna surface 81H. A third partition wall 193 is arranged in each interface between antenna surfaces located adjacent to each other in the fourth direction, namely, the interface between the antenna surface 81B and the antenna surface 81E, the interface between the antenna surface 81C and the antenna surface 81F, and the interface between the antenna surface 81D and the antenna surface 81G. Although not shown, the partition walls 191 to 193 extend from the interfaces toward the dielectric 50 in the z-direction to contact the dielectric main surface 51 of the dielectric 50. The gas cavities corresponding to the reflective films 82A to 82H (the antenna surfaces 81A to 81H) are sealed by the dielectric 50 and the reflective films 82A to 82H, respectively. In the example shown, the reflective film 82 is formed on side surfaces of the partition walls 191 to 193 that are in contact with the gas cavity 92.

Figure 72:
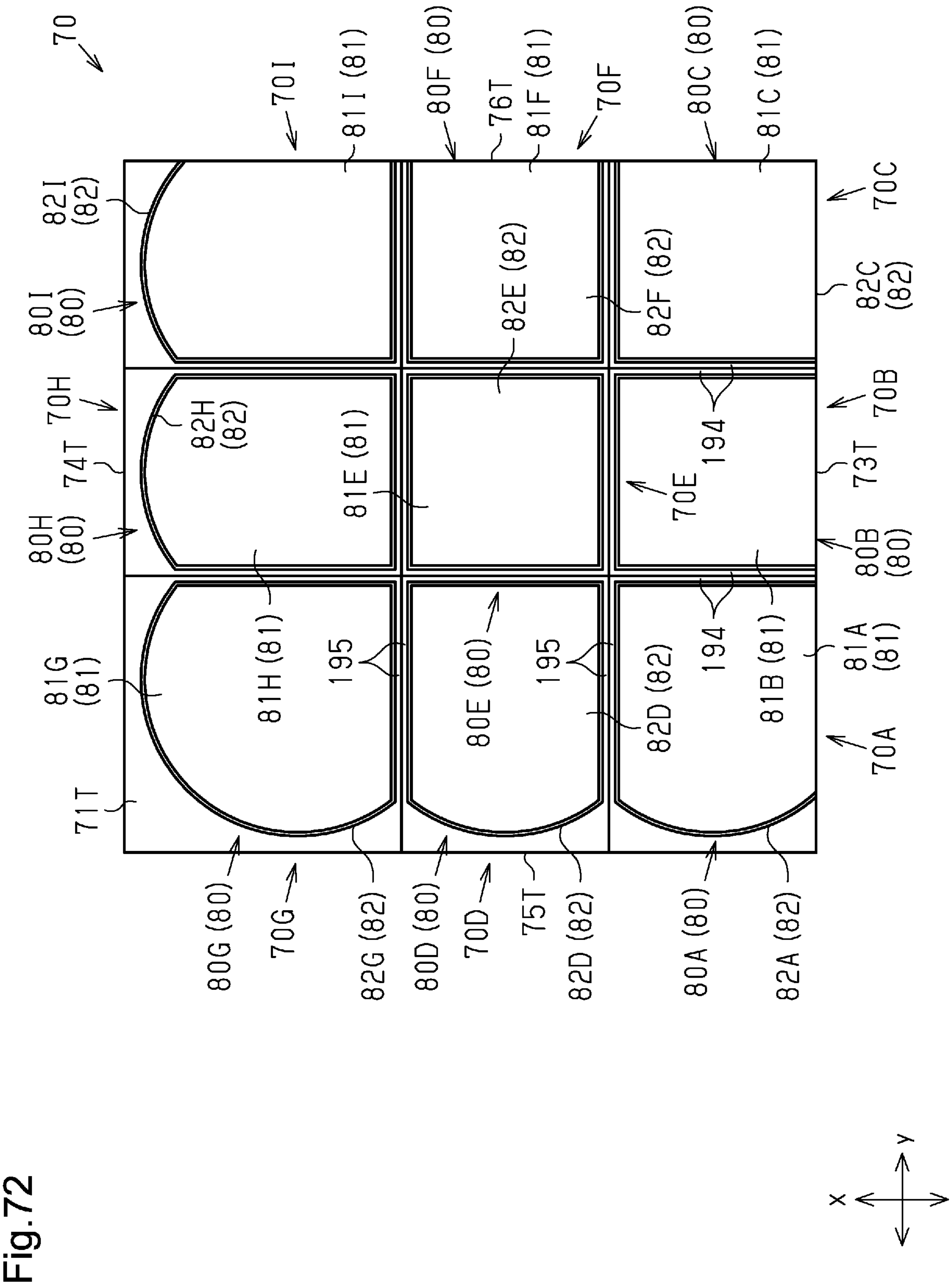
FIG. 72 is a plan view of an antenna base in a modified example of the third embodiment of the terahertz device.

In the third embodiment, partition walls may be arranged in the interface between the antenna surfaces 81 that are adjacent to each other in the first direction and the second direction, which are the arrangement directions of the separate antenna bases. In an example, as shown in FIG. 72, a partition wall 194 is arranged in each interface between antenna surfaces located adjacent to each other in the first direction, namely the interface between the antenna surface 81A and the antenna surface 81B, the interface between the antenna surface 81B and the antenna surface 81C, the interface between the antenna surface 81D and the antenna surface 81E, the interface between the antenna surface 81E and the antenna surface 81F, the interface between the antenna surface 81G and the antenna surface 81H, and the interface between the antenna surface 81H and the antenna surface 81I. A partition wall 195 is arranged in each interface between antenna surfaces located adjacent to each other in the second direction, namely, the interface between the antenna surface 81A and the antenna surface 81D, the interface between the antenna surface 81B and the antenna surface 81E, the interface between the antenna surface 81C and the antenna surface 81F, the interface between the antenna surface 81G and the antenna surface 81D, the interface between the antenna surface 81H and the antenna surface 81E, and the interface between the antenna surface 81I and the antenna surface 81F. The reflective film 82 is formed on side surfaces of the partition walls 194 and 195 that are in contact with the gas cavity 92.

In an example, with regard to the antenna surfaces 81A, 81B, 81D, and 81E, the portion of the partition wall 194 disposed in the interface between the antenna surface 81A and the antenna surface 81B defines "a first partition wall that separates the first reflective surface and the second reflective surface". The portion of the partition wall 194 disposed in the interface between the antenna surface 81D and the antenna surface 81E forms "a fourth partition wall that separates the third reflective surface and the fourth reflective surface". The portion of the partition wall 195 disposed in the interface between the antenna surface 81A and the antenna surface 81D forms "a second partition wall that separates the first reflective surface and the third reflective surface". The portion of the partition wall 195 disposed in the interface between the antenna surface 81B and the antenna surface 81E forms "a third partition wall that separates the second reflective surface and the fourth reflective surface".

In the first embodiment, the structure of the antenna base 70 may be changed in any manner. Specifically, the number of separate antenna bases forming the antenna base 70 and the type of the separate antenna base may be changed in any manner. In an example, the antenna base 70 may be formed of multiple separate antenna bases 70B. The antenna base 70 may be formed of the separate antenna base 70A and one or more separate antenna bases 70B. The antenna base 70 may be formed of the separate antenna base 70C and one or more separate antenna bases 70B. The antenna base 70 may be formed of the separate antenna base 70A and the separate antenna base 70C. In an example, the antenna base 70 may be formed of the separate antenna bases 70A and 70C and multiple separate antenna bases 70B.

In the second embodiment, the structure of the antenna base 70 may be changed in any manner. Specifically, the number of separate antenna bases forming the antenna base 70 and the type of the separate antenna base may be changed in any manner. In an example, the antenna base 70 may be formed of three or more separate antenna bases 70B. The antenna base 70 may be formed of the separate antenna base 70A, the separate antenna base 70E, and the separate antenna base 70B.

In the third embodiment, the structure of the antenna base 70 may be changed in any manner. Specifically, the number of separate antenna bases forming the antenna base 70 and the type of the separate antenna base may be changed in any manner. In an example, the antenna base 70 may be formed of the separate antenna bases 70B, 70C, 70E, and 70F. In an example, the antenna base 70 may be formed of multiple (four or more) separate antenna bases 70E.

Figure 73:
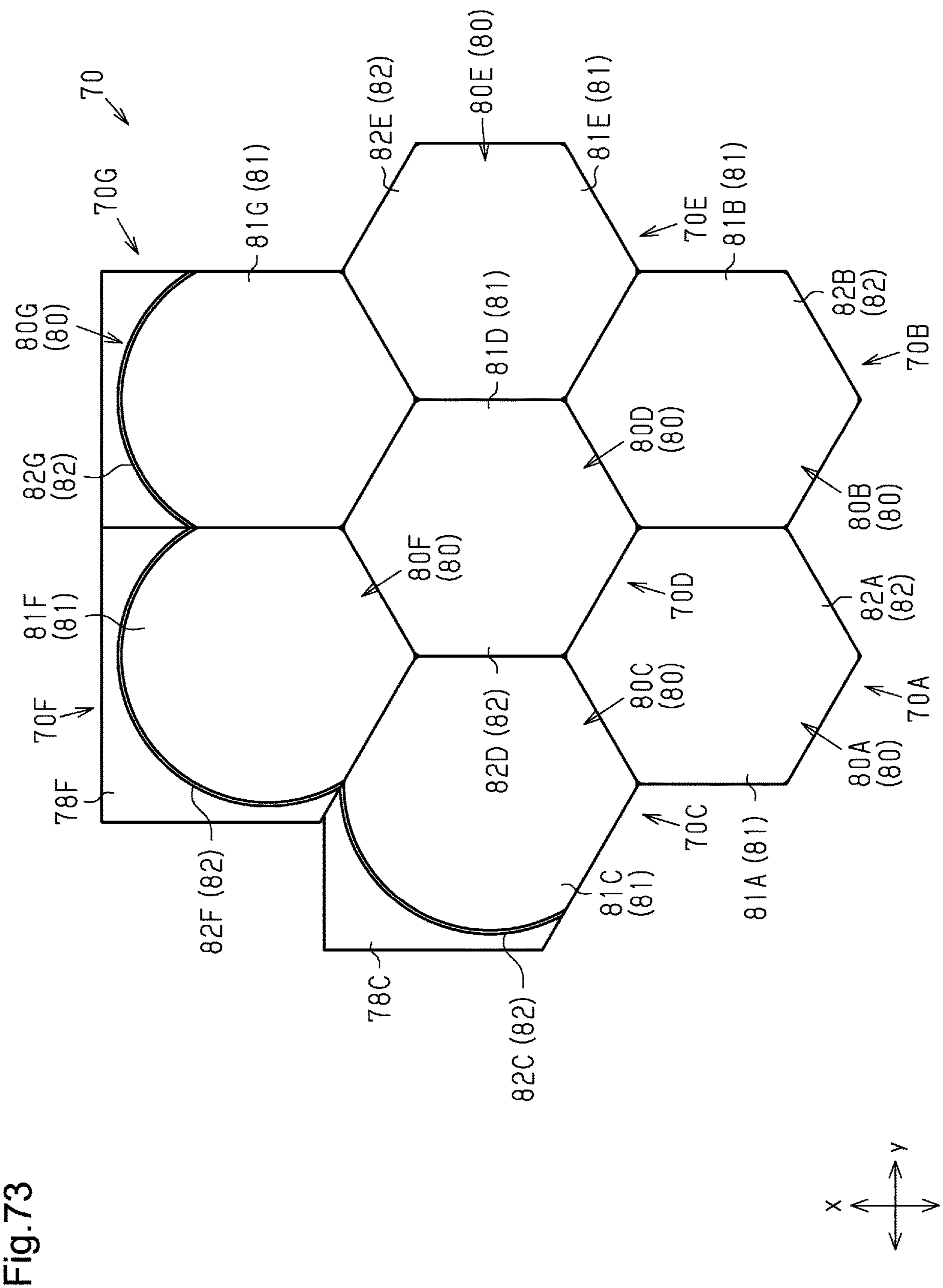
FIG. 73 is a plan view of an antenna base in a modified example of a terahertz device.

The antenna base 70 may include a separate antenna base that differs in shape from the separate antenna bases in the embodiments. In an example, as shown in FIG. 73, the antenna base 70 includes the separate antenna bases 70A to 70G. The antenna base 70 has a structure such that six separate antenna bases 70A, 70B, 70C, 70E, 70F, and 70G are arranged around a hexagonal separate antenna base 70D as viewed in the z-direction.

In the example shown, the separate antenna base 70C includes the peripheral wall 78C, and the separate antenna base 70F includes a peripheral wall 78F. The separate antenna base 70G is identical in shape to the separate antenna base 70G of the second embodiment. The separate antenna bases 70A, 70B, 70D, and 70E do not include a peripheral wall. The separate antenna bases 70A, 70B, and 70E are identical in shape to the separate antenna base 70D.

The separate antenna bases 70A and 70B are arranged in the first direction (in the example shown, the y-direction). The separate antenna bases 70C to 70E are arranged in the first direction. The separate antenna bases 70F and 70G are arranged in the first direction.

The separate antenna bases 70A and 70D are arranged in the third direction that differs from the first direction and the second direction (in the example shown, the x-direction). The separate antenna bases 70B and 70E are arranged in the third direction. The separate antenna bases 70C and 70F are arranged in the third direction. The separate antenna bases 70D and 70G are arranged in the third direction.

The separate antenna bases 70A and 70C are arranged in the fourth direction that differs from the first direction, the second direction, and the third direction. The separate antenna bases 70B and 70D are arranged in the fourth direction. The separate antenna bases 70D and 70F are arranged in the fourth direction. The separate antenna bases 70E and 70G are arranged in the fourth direction.

The antenna recesses 80A to 80G are spherically recessed downward.

As viewed from above, each of the antenna surfaces 81A, 81B, 81D, and 81F of the antenna recesses 80A, 80B, 80D, and 80F is hexagonal and is cut away at opposite open ends in the first direction, opposite open ends in the third direction, and opposite open ends in the fourth direction.

As viewed from above, the antenna surface 81C is cut away at one open end in the first direction, opposite open ends in the third direction, and one open end in the fourth direction. As viewed from above, the antenna surface 81C has the form of an arc connecting the other open end in the first direction and the other open end in the fourth direction.

As viewed from above, the antenna surface 81F is cut away at one open end in the first direction, one open end in the third direction, and one open end in the fourth direction. As viewed from above, the antenna surface 81F has the form of an arc connecting the other open end in the first direction, the other open end in the third direction, and the other open end in the fourth direction.

As viewed from above, the antenna surface 81G is cut away at opposite open ends in the first direction, one open end in the third direction, and one open end in the fourth direction. As viewed from above, the antenna surface 81G has the form of an arc connecting the other open end in the third direction and the other open end in the fourth direction.

The reflective films 82A, 82B, 82D, and 82F are formed on the antenna surfaces 81A, 81B, 81D, and 81F. As viewed from above, the reflective films 82A, 82B, 82D, and 82F are substantially identical in shape to the antenna surfaces 81A, 81B, 81D, and 81F.

In an example, with regard to the separate antenna bases 70A, 70B, and 70D, the reflective film 82A (the antenna surface 81A) and the reflective film 82B (the antenna surface 81B) are arranged adjacent to each other in the first direction. The reflective film 82A (the antenna surface 81A) and the reflective film 82D (the antenna surface 81D) are arranged adjacent to each other in the third direction. The reflective film 82B (the antenna surface 81B) and the reflective film 82D (the antenna surface 81D) are arranged adjacent to each other in the fourth direction.

Figure 74:
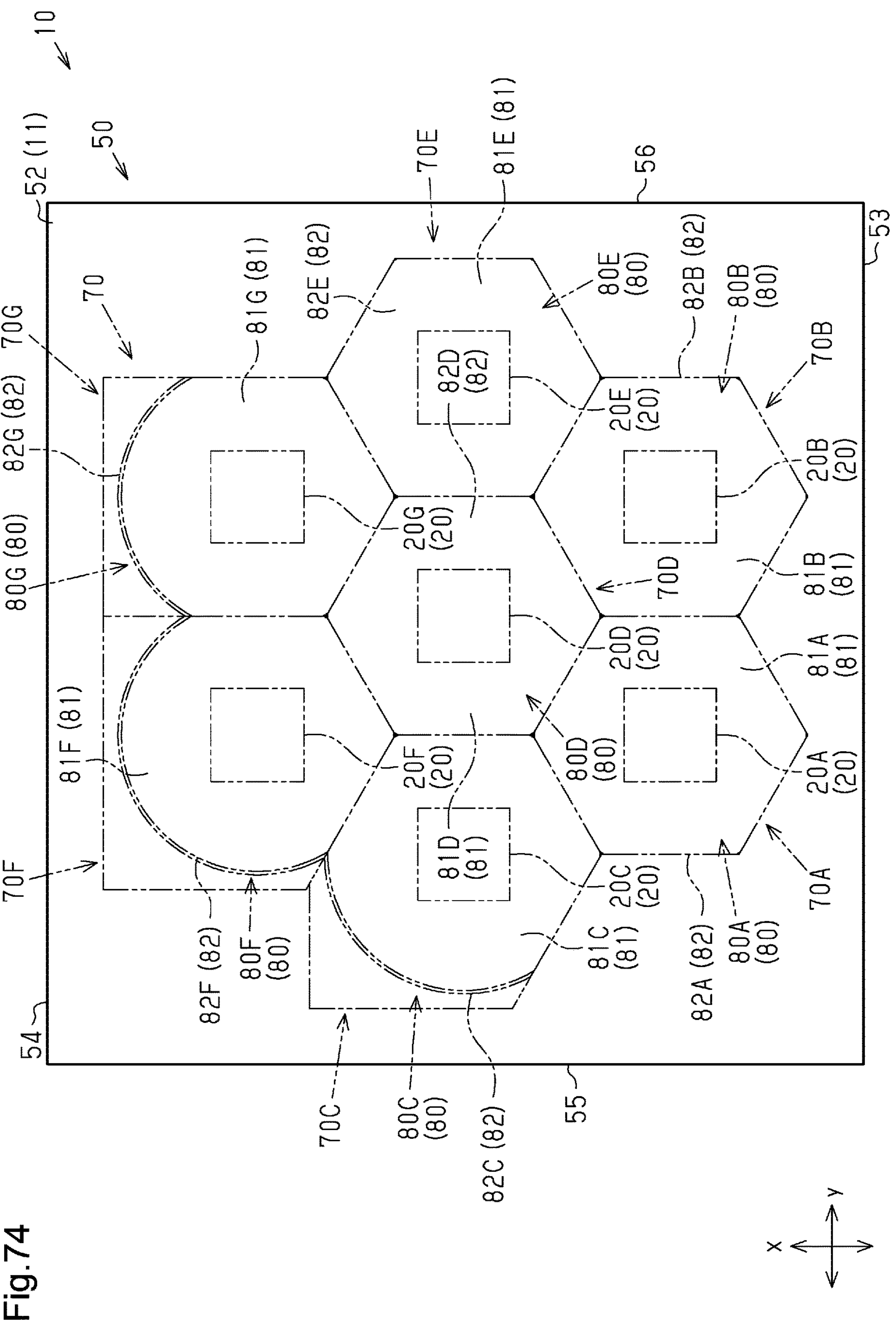
FIG. 74 is a plan view of a modified example of a terahertz device including the antenna base shown in FIG. 73.

As shown in FIG. 74, the terahertz device 10 includes terahertz elements 20A to 20G and a dielectric 50 retaining the terahertz elements 20A to 20G.

The reflective film 82A (the antenna surface 81A) is opposed to the terahertz element 20A in the thickness-wise direction of the terahertz element 20A (the z-direction). In the same manner, the reflective films 82B to 82G (the antenna surfaces 81B to 81G) are opposed to the terahertz elements 20B to 20G in the thickness-wise direction of the terahertz elements 20B to 20G (the z-direction).

As viewed from above, the reflective film 82A (the antenna surface 81A) is larger than the terahertz element 20A. More specifically, the reflective film 82A (the antenna surface 81A) is larger than the terahertz element 20A in the x-direction and the y-direction. In the same manner, the reflective films 82B to 82G (the antenna surfaces 81B to 81G) are larger than the terahertz elements 20B to 20G.

In each embodiment, as viewed from above, the shape of the antenna surface 81 of the separate antenna base and the shape of the reflective film 82 formed on the antenna surface 81 may be changed in any manner.

In an example, in the first embodiment, as viewed from above, the shape of the antenna surface 81A of the separate antenna base 70A and the shape of the reflective film 82A may be circular with no cutaway portion. Even in this case, as viewed from above, the shape of the antenna surface 81B of the separate antenna base 70B and the shape of the reflective film 82B are circular with cutaway portions. Thus, the inter-element distance between the terahertz element 20A and the terahertz element 20B is reduced in the first direction, which is the arrangement direction of the reflective film 82A and the reflective film 82B. This improves the resolution of the terahertz device 10.

In an example, in the second embodiment, as viewed from above, the shape of the antenna surface 81B of the separate antenna base 70B and the shape of the reflective film 82B may be circular with no cutaway portion. Even in this case, as viewed from above, the shape of the antenna surface 81F of the separate antenna base 70F and the shape of the reflective film 82F are circular with cutaway portions. Thus, the inter-element distance between the terahertz element 20B and the terahertz element 20F is reduced in the third direction, which is the arrangement direction of the reflective film 82B and the reflective film 82F. Also, as viewed from above, the shape of the antenna surface 81E of the separate antenna base 70E and the shape of the reflective film 82E are circular with cutaway portions. Thus, the inter-element distance between the terahertz element 20B and the terahertz element 20E is reduced in the fourth direction, which is the arrangement direction of the reflective film 82B and the reflective film 82E. Also, as viewed from above, the shape of the antenna surface 81A of the separate antenna base 70A and the shape of the reflective film 82A are circular with cutaway portions. Thus, the inter-element distance between the terahertz element 20A and the terahertz element 20B is reduced in the first direction, which is the arrangement direction of the reflective film 82A and the reflective film 82B. This improves the resolution of the terahertz device 10.

In an example, in the third embodiment, as viewed from above, the shape of the antenna surface 81E of the separate antenna base 70E and the shape of the reflective film 82E may be circular with no cutaway portion. Even in this case, as viewed from above, the shape of the antenna surface 81D of the separate antenna base 70D and the shape of the reflective film 82D are circular with cutaway portions. Thus, the inter-element distance between the terahertz element 20D and the terahertz element 20E is reduced in the first direction, which is the arrangement direction of the reflective film 82D and the reflective film 82E. Also, as viewed from above, the shape of the antenna surface 81B of the separate antenna base 70B and the shape of the reflective film 82B are circular with cutaway portions. Thus, the inter-element distance between the terahertz element 20B and the terahertz element 20E is reduced in the second direction, which is the arrangement direction of the reflective film 82B and the reflective film 82E. This improves the resolution of the terahertz device 10.

In each embodiment, the shape of the separate antenna base may be changed in any manner. In an example of the separate antenna base, the peripheral portion of the base back surface 72 may be cut away, or a cutaway portion may be formed at the base back surface 72.

Modified Examples Related to Structure of Terahertz Device

In each embodiment, the terahertz device 10 may include a flat substrate instead of the dielectric 50. The terahertz elements 20 are mounted on the substrate. An example of a substrate used instead of the dielectric 50 in the terahertz device 10 of the first embodiment will be described with reference to FIG. 75.

Figure 75:
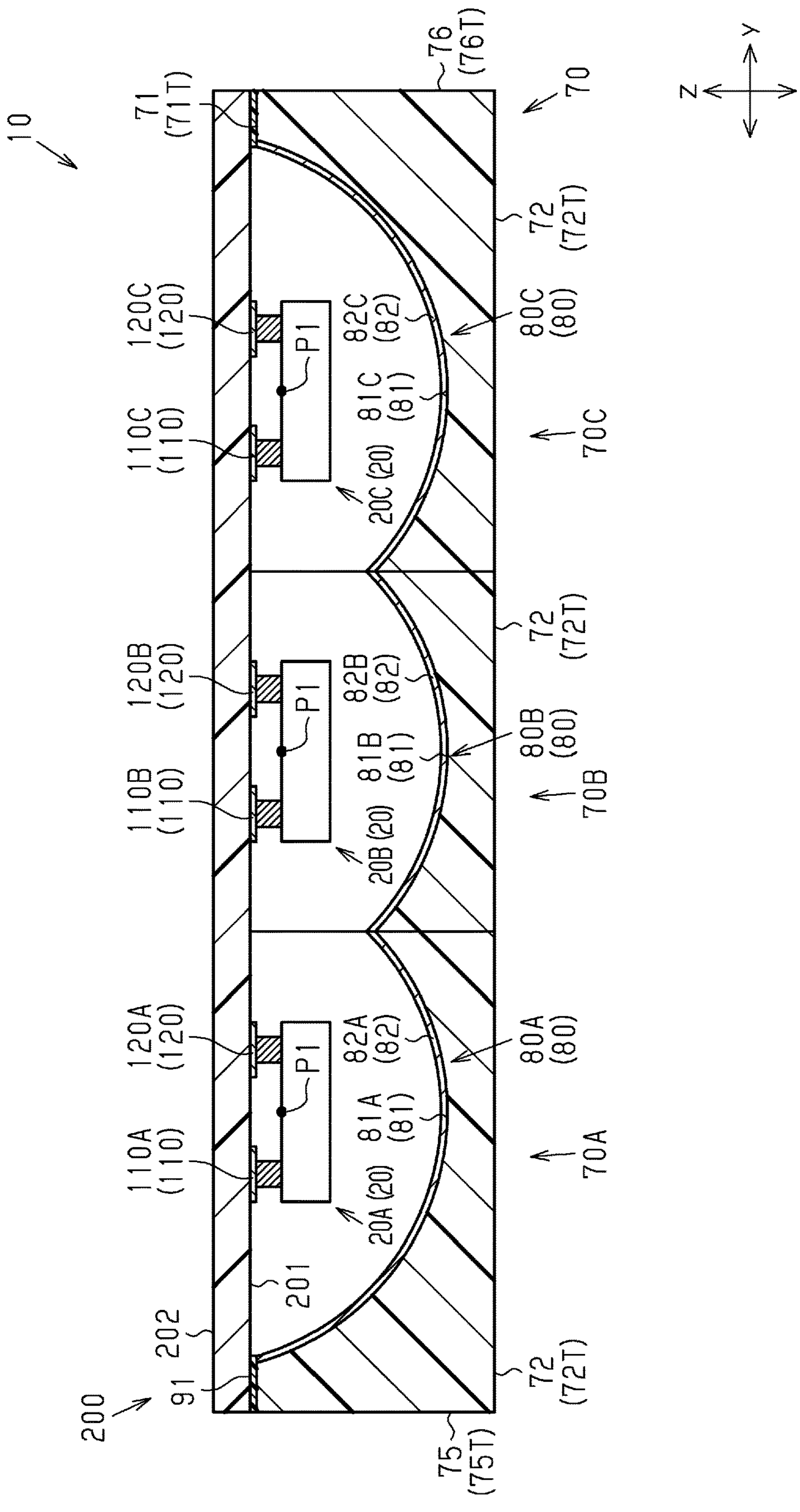
FIG. 75 is a cross-sectional view showing a modified example of the first embodiment of the terahertz device.

As shown in FIG. 75, a substrate 200 includes a substrate main surface 20I and a substrate back surface 202 that face in opposite directions in the thickness-wise direction (in the example shown, the z-direction). The substrate main surface 20I faces downward, and the substrate back surface 202 faces upward. Thus, the substrate main surface 20I faces toward the antenna base 70. In the same manner as the first embodiment, the substrate 200 is fixed to the base main surface 71T of the antenna base 70 by the adhesive layer 91. The shape of the substrate 200 as viewed in the z-direction and the dimensions of the substrate 200 in the x-direction and the y-direction are the same as those of the dielectric 50 of the first embodiment. The dimension (thickness) of the substrate 200 in the z-direction is smaller than the dimension (thickness) of the dielectric 50 in the z-direction. In the example shown, for example, a printed substrate formed from glass-epoxy resin is used as the substrate 200.

The terahertz elements 20A to 20C are mounted on the substrate main surface 20I. Specifically, the conductive portions 110A to 110C and 120A to 120C and the electrodes 101A to 101C and 102A to 102C, which are not shown, are formed on the substrate main surface 20I. In the same manner as the embodiments, the terahertz elements 20A to 20 are mounted on the conductive portions 110A to 110C and 120A to 120C.

As shown in FIG. 75, the element main surfaces 21 of the terahertz elements 20A to 20C are located closer to the base back surface 72T than the base main surface 71T of the antenna base 70 in the z-direction. In the same manner as the embodiments, the terahertz elements 20A to 20C are disposed so that the element main surfaces 21 are opposed to the reflective film 82 (the antenna surface 81).

In FIG. 75, the terahertz elements 20A to 20C are flip-chip-mounted on the substrate 200. Alternatively, the terahertz elements 20A to 20C may be mounted on the substrate 200 using a different process. In an example, when the element main surfaces 21 are faced downward, the terahertz elements 20A to 20C may be die-bonded to the substrate main surface 20I of the substrate 200 at the element back surfaces 22. More specifically, the element back surfaces 22 of the terahertz elements 20A to 20C may be bonded to the substrate main surface 20I by a conductive bonding material such as a silver (Ag) paste or solder. The element conductive layers 33 and 34 of the element main surfaces 21 of the terahertz elements 20A to 20C are bonded to the conductive portions 110 and 120 by bonding wires. The bonding structure of the terahertz elements 20A to 20C to the substrate 200 may be changed in any manner. In an example, the element back surfaces 22 of the terahertz elements 20A to 20C may be bonded to the substrate main surface 20I by an adhesive. An example of the adhesive contains epoxy resin as the main component.

In the first and second embodiments, the gas contained in the gas cavity 92 is not limited to air and may be changed in any manner as long as the gas has a refractive index that is lower than the dielectric refractive index n2.

In each embodiment, the terahertz device 10 may include a control IC (e.g., application-specific integrated circuit (ASIC)) as a controller. The control IC may be configured to, for example, detect current flowing to the terahertz elements 20, supply power to the terahertz elements 20, or process signals.

Clauses

The technical aspects that are understood from the embodiments and the modified examples will be described below.

A1. An antenna base, including:

antenna surfaces, each of the antenna surfaces being opposed to one of terahertz elements in a thickness-wise direction of the one of the terahertz elements, in which each of the antenna surfaces is opened toward one of the terahertz elements opposed in the thickness-wise direction of the one of the terahertz elements and is curved to be recessed in a direction away from the one of the terahertz elements opposed, and as viewed in a thickness-wise direction of the antenna base, each of the antenna surfaces is smaller in an arrangement direction in which the antenna surfaces are arranged than in a direction that differs from the arrangement direction.

This structure decreases the distance between a first terahertz element and a second terahertz element located adjacent to each other in the arrangement direction of the antenna surfaces. When the antenna base is used in a terahertz device and the terahertz elements are configured to receive electromagnetic waves, the resolution of the terahertz device in a detection range of the electromagnetic waves is improved. In addition, the antenna base includes the antenna surfaces respectively opposed to the terahertz elements. Thus, when the antenna base is used in a terahertz device and the terahertz elements are configured to generate electromagnetic waves, the terahertz device outputs high power.

A2. A terahertz device, including:

terahertz elements including a first terahertz element and a second terahertz element that receive an electromagnetic wave; and reflective surfaces including a first reflective surface and a second reflective surface, the first reflective surface being opposed to the first terahertz element in a thickness-wise direction of the first terahertz element to reflect a received electromagnetic wave toward the first terahertz element, the second reflective surface being opposed to the second terahertz element in a thickness-wise direction of the second terahertz element to reflect a received electromagnetic wave toward the second terahertz element, in which the first reflective surface is opened toward the first terahertz element and is curved to be recessed in a direction away from the first terahertz element, the second reflective surface is opened toward the second terahertz element and is curved to be recessed in a direction away from the second terahertz element, when a direction parallel to the thickness-wise direction of the first terahertz element and the thickness-wise direction of the second terahertz element is referred to as a height-wise direction of the terahertz device, the first reflective surface and the second reflective surface are arranged adjacent to each other in a first direction that intersects the height-wise direction of the terahertz device, and an inter-element distance that is a distance between a reception point of the first terahertz element and a reception point of the second terahertz element is less than or equal to a diameter of the first reflective surface and a diameter of the second reflective surface.

A3. A terahertz device, including:

terahertz elements including a first terahertz element and a second terahertz element that generate an electromagnetic wave; and reflective surfaces including a first reflective surface and a second reflective surface, the first reflective surface being opposed to the first terahertz element in a thickness-wise direction of the first terahertz element to reflect an electromagnetic wave generated from the first terahertz element in one direction, the second reflective surface being opposed to the second terahertz element in a thickness-wise direction of the second terahertz element to reflect an electromagnetic wave generated from the second terahertz element in one direction, in which the first reflective surface is opened toward the first terahertz element and is curved to be recessed in a direction away from the first terahertz element, the second reflective surface is opened toward the second terahertz element and is curved to be recessed in a direction away from the second terahertz element, when a direction parallel to the thickness-wise direction of the first terahertz element and the thickness-wise direction of the second terahertz element is referred to as a height-wise direction of the terahertz device, the first reflective surface and the second reflective surface are arranged adjacent to each other in a first direction that intersects the height-wise direction of the terahertz device, and an inter-element distance that is a distance between a generation point of the first terahertz element and a generation point of the second terahertz element is less than or equal to a diameter of the first reflective surface and a diameter of the second reflective surface.

A4. The terahertz device according to clause A2 or A3, in which the inter-element distance is less than the diameter of the first reflective surface and the diameter of the second reflective surface.

A5. The terahertz device according to any one of clauses A2 to A4, in which as viewed in the height-wise direction of the terahertz device, a reception point of the first terahertz element coincides with a center point of the first reflective surface, and a reception point of the second terahertz element coincides with a center point of the second reflective surface.

B1. The terahertz device according to claim 1 or 2, in which as viewed in the height-wise direction of the terahertz device, each of the first reflective surface and the second reflective surface is smaller in the first direction than in a second direction that differs from the first direction, and as viewed in the height-wise direction of the terahertz device, an interface between the first reflective surface and the second reflective surface extends linearly.

B2. The terahertz device according to any one of claims 1 and 2 and clause B1, further including: an antenna base including a first antenna surface opposed to the first terahertz element in the height-wise direction of the terahertz device and a second antenna surface opposed to the second terahertz element in the height-wise direction of the terahertz device, in which the first reflective surface is defined by a reflective film formed on the first antenna surface, and the second reflective surface is defined by a reflective film formed on the second antenna surface.

B3. The terahertz device according to any one of claims 1 and 2 and clause B1, further including: an antenna base including a first antenna surface opposed to the first terahertz element in the height-wise direction of the terahertz device and a second antenna surface opposed to the second terahertz element in the height-wise direction of the terahertz device, in which the antenna base is formed from metal, the first reflective surface is defined by the first antenna surface, and the second reflective surface is defined by the second antenna surface.

B4. The terahertz device according to clause B2 or B3, in which the antenna base includes a first antenna base including the first antenna surface and a second antenna base including the second antenna surface, as viewed in the height-wise direction of the terahertz device, the first antenna surface includes opposite open ends in the first direction, and one of the opposite open ends located at the second antenna surface overlaps a base side surface of the first antenna base facing toward the second antenna base in the first direction, as viewed in the height-wise direction of the terahertz device, the second antenna surface includes opposite open ends in the first direction, and one of the opposite open ends located at the first antenna surface overlaps a base side surface of the second antenna base facing toward the first antenna base in the first direction, and the first antenna base is arranged adjacent to the second antenna base.

B5. The terahertz device according to any one of clauses B2 to 4, further including: a retaining member coupled to the antenna base to retain the first terahertz element and the second terahertz element, in which the retaining member covers the first reflective surface and the second reflective surface.

B6. The terahertz device according to clause B5, in which a partition wall is arranged in the interface between the first reflective surface and the second reflective surface and is in contact with the retaining member to separate the first reflective surface from the second reflective surface.

B7. The terahertz device according to any one of claims 3 to 5, in which as viewed in the height-wise direction of the terahertz device, the second reflective surface is smaller in the first direction than in a second direction that differs from the first direction, and as viewed in the height-wise direction of the terahertz device, an interface between the second reflective surface and the third reflective surface extends linearly.

B8. The terahertz device according to any one of claims 3 to 5 and clause B7, further including an antenna base including a first antenna surface opposed to the first terahertz element in the height-wise direction of the terahertz device, a second antenna surface opposed to the second terahertz element in the height-wise direction of the terahertz device, and a third antenna surface opposed to the third terahertz element in the height-wise direction of the terahertz device, in which the first reflective surface is defined by a reflective film formed on the first antenna surface, the second reflective surface is defined by a reflective film formed on the second antenna surface, and the third reflective surface is defined by a reflective film formed on the third antenna surface.

B9. The terahertz device according to any one of claims 3 to 5 and clause B7, further including: an antenna base including a first antenna surface opposed to the first terahertz element in the height-wise direction of the terahertz device, a second antenna surface opposed to the second terahertz element in the height-wise direction of the terahertz device, and a third antenna surface opposed to the third terahertz element in the height-wise direction of the terahertz device, in which the antenna base is formed from metal, the first reflective surface is defined by the first antenna surface, the second reflective surface is defined by the second antenna surface, and the third reflective surface is defined by the third antenna surface.

B10. The terahertz device according to clause B8 or B9, in which the antenna base includes a first antenna base including the first antenna surface, a second antenna base including the second antenna surface, and a third antenna base including the third antenna surface, as viewed in the height-wise direction of the terahertz device, the first antenna surface includes opposite open ends in the first direction, and one of the opposite open ends located at the second antenna surface overlaps a base side surface of the first antenna base facing toward the second antenna base in the first direction, as viewed in the height-wise direction of the terahertz device, the second antenna surface includes opposite open ends in the first direction, and one of the opposite open ends located at the first antenna surface overlaps a base side surface of the second antenna base facing toward the first antenna base in the first direction, as viewed in the height-wise direction of the terahertz device, the third antenna surface includes opposite open ends in the first direction, and one of the opposite open ends located at the second antenna surface overlaps a base side surface of the third antenna base facing toward the third antenna base in the first direction, the first antenna base is arranged adjacent to the second antenna base, and the third antenna base is arranged adjacent to the second antenna base at a side of the second antenna base opposite from the first antenna base.

B11. The terahertz device according to any one of clauses B8 to B10, further including a retaining member coupled to the antenna base to retain the first terahertz element, the second terahertz element, and the third terahertz element, in which the retaining member covers the first reflective surface, the second reflective surface, and the third reflective surface.

B12. The terahertz device according to clause B11, further including:

a first partition wall arranged in an interface between the first reflective surface and the second reflective surface and in contact with the retaining member to separate the first reflective surface from the second reflective surface; and a second partition wall arranged in an interface between the second reflective surface and the third reflective surface and in contact with the retaining member to separate the second reflective surface from the third reflective surface.

B13. The terahertz device according to claim 6 or 7, in which as viewed in the height-wise direction of the terahertz device, the first reflective surface is smaller in the third direction than in the second direction, and the second reflective surface is smaller in the fourth direction than in the second direction, and as viewed in the height-wise direction of the terahertz device, each of an interface between the first reflective surface and the third reflective surface and an interface between the second reflective surface and the third reflective surface extends linearly.

B14. The terahertz device according to any one of claims 6 to 10 and clause B13, further including an antenna base including a first antenna surface opposed to the first terahertz element in the height-wise direction of the terahertz device, a second antenna surface opposed to the second terahertz element in the height-wise direction of the terahertz device, and a third antenna surface opposed to the third terahertz element in the height-wise direction of the terahertz device, in which the first reflective surface is defined by a reflective film formed on the first antenna surface, the second reflective surface is defined by a reflective film formed on the second antenna surface, and the third reflective surface is defined by a reflective film formed on the third antenna surface.

B15. The terahertz device according to any one of claims 6 to 10 and clause B13, further including: an antenna base including a first antenna surface opposed to the first terahertz element in the height-wise direction of the terahertz device, a second antenna surface opposed to the second terahertz element in the height-wise direction of the terahertz device, and a third antenna surface opposed to the third terahertz element in the height-wise direction of the terahertz device, in which the antenna base is formed from metal, the first reflective surface is defined by the first antenna surface, the second reflective surface is defined by the second antenna surface, and the third reflective surface is defined by the third antenna surface.

B16. The terahertz device according to clause B 14 or B 15, in which the antenna base includes a first antenna base including the first antenna surface, a second antenna base including the second antenna surface, and a third antenna base including the third antenna surface, as viewed in the height-wise direction of the terahertz device, the first antenna surface includes opposite open ends in the first direction, and one of the opposite open ends located at the second antenna surface overlaps a base side surface of the first antenna base facing toward the second antenna base in the first direction, as viewed in the height-wise direction of the terahertz device, the second antenna surface includes opposite open ends in the first direction, and one of the opposite open ends located at the first antenna surface overlaps a base side surface of the second antenna base facing toward the first antenna base in the first direction, as viewed in the height-wise direction of the terahertz device, the third antenna surface includes opposite open ends in the first direction, and one of the opposite open ends located at the second antenna surface overlaps a base side surface of the third antenna base facing toward the third antenna base in the first direction, the first antenna base is arranged adjacent to the second antenna base in the first direction, the first antenna base is arranged adjacent to the third antenna base in the third direction, and the second antenna base is arranged adjacent to the third antenna base in the fourth direction.

B17. The terahertz device according to any one of clauses B14 to B16, further including a retaining member coupled to the antenna base to retain the first terahertz element, the second terahertz element, and the third terahertz element, in which the retaining member covers the first reflective surface, the second reflective surface, and the third reflective surface.

B18. The terahertz device according to B17, further including:

a first partition wall arranged in an interface between the first reflective surface and the second reflective surface and in contact with the retaining member to separate the first reflective surface from the second reflective surface;

a second partition wall arranged in an interface between the second reflective surface and the third reflective surface and in contact with the retaining member to separate the second reflective surface from the third reflective surface; and a third partition wall arranged in an interface between the first reflective surface and the third reflective surface and in contact with the retaining member to separate the first reflective surface from the third reflective surface.

B19. The terahertz device according to claim 11 or 12, in which as viewed in the height-wise direction of the terahertz device, each of the third reflective surface and the fourth reflective surface is smaller in the second direction than in the third direction, and as viewed in the height-wise direction of the terahertz device, each of an interface between the first reflective surface and the third reflective surface and an interface between the second reflective surface and the fourth reflective surface extends linearly.

B20. The terahertz device according to any one of claims 11 to 13 and clause B19, further including an antenna base including a first antenna surface opposed to the first terahertz element in the height-wise direction of the terahertz device, a second antenna surface opposed to the second terahertz element in the height-wise direction of the terahertz device, a third antenna surface opposed to the third terahertz element in the height-wise direction of the terahertz device, and a fourth antenna surface opposed to the fourth terahertz element in the height-wise direction of the terahertz device, in which the first reflective surface is defined by a reflective film formed on the first antenna surface, the second reflective surface is defined by a reflective film formed on the second antenna surface, the third reflective surface is defined by a reflective film formed on the third antenna surface, and the fourth reflective surface is defined by a reflective film formed on the fourth antenna surface.

B21. The terahertz device according to any one of claims 11 to 13 and clause B19, further including an antenna base including a first antenna surface opposed to the first terahertz element in the height-wise direction of the terahertz device, a second antenna surface opposed to the second terahertz element in the height-wise direction of the terahertz device, a third antenna surface opposed to the third terahertz element in the height-wise direction of the terahertz device, and a fourth antenna surface opposed to the fourth terahertz element in the height-wise direction of the terahertz device, in which the antenna base is formed from metal, the first reflective surface is defined by the first antenna surface, the second reflective surface is defined by the second antenna surface, the third reflective surface is defined by the third antenna surface, and the fourth reflective surface is defined by the fourth antenna surface.

B22. The terahertz device according to clause B20 or B21, in which the antenna base includes a first antenna base including the first antenna surface, a second antenna base including the second antenna surface, and a third antenna base including the third antenna surface, and a fourth antenna base including the fourth antenna surface, as viewed in the height-wise direction of the terahertz device, the first antenna surface includes opposite open ends in the first direction, and one of the opposite open ends located at the second antenna surface overlaps a base side surface of the first antenna base facing toward the second antenna base in the first direction, and the first antenna surface includes opposite open ends in the second direction, one of the opposite open ends located at the third antenna surface overlaps a base side surface of the first antenna base facing toward the third antenna base in the second direction, as viewed in the height-wise direction of the terahertz device, the second antenna surface includes opposite open ends in the first direction, and one of the opposite open ends located at the first antenna surface overlaps a base side surface of the second antenna base facing the first antenna base in the first direction, and as viewed in the height-wise direction of the terahertz device, the second antenna surface includes opposite open ends in the second direction, one of the opposite open ends located at the fourth antenna surface overlaps a base side surface of the second antenna base facing the fourth antenna base in the first direction, as viewed in the height-wise direction of the terahertz device, the third antenna surface includes opposite open ends in the first direction, and one of the opposite open ends located at the fourth antenna surface overlaps a base side surface of the third antenna base facing toward the fourth antenna base in the first direction, and the third antenna surface includes opposite open ends in the second direction, and one of the opposite open ends located at the first antenna surface overlaps a base side surface of the third antenna base facing toward the first antenna base in the second direction, as viewed in the height-wise direction of the terahertz device, the fourth antenna surface includes opposite open ends in the first direction, and one of the opposite open ends located at the third antenna surface overlaps a base side surface of the fourth antenna base facing toward the third antenna base in the first direction, and the fourth antenna surface includes opposite open ends in the second direction, and one of the opposite open ends located at the second antenna surface overlaps a base side surface of the fourth antenna base facing toward the second antenna base in the second direction, in the first direction, the first antenna base is in contact with the second antenna base, and the third antenna base is in contact with the fourth antenna base, and in the second direction, the first antenna base is in contact with the third antenna base, and the second antenna base is in contact with the fourth antenna base.

B23. The terahertz device according to any one of clauses B20 to B22, further including a retaining member coupled to the antenna base to retain the first terahertz element, the second terahertz element, the third terahertz element, and the fourth terahertz element, in which the retaining member covers the first reflective surface, the second reflective surface, the third reflective surface, and the fourth reflective surface.

B24. The terahertz device according to clause B23, in which a first partition wall is arranged in an interface between the first reflective surface and the second reflective surface and in contact with the retaining member to separate the first reflective surface from the second reflective surface, a second partition wall is arranged in an interface between the first reflective surface and the third reflective surface and in contact with the retaining member to separate the first reflective surface from the third reflective surface, a third partition wall is arranged in an interface between the second reflective surface and the fourth reflective surface and in contact with the retaining member to separate the second reflective surface from the fourth reflective surface, and a fourth partition wall is arranged in an interface between the third reflective surface and the fourth reflective surface and in contact with the retaining member to separate the third reflective surface from the fourth reflective surface.

C1. A terahertz device, including:

terahertz elements including a first terahertz element and a second terahertz element configured to receive an electromagnetic wave;

a retaining member that supports the first terahertz element and the second terahertz element;

a gas cavity containing a gas; and reflective surfaces including a first reflective surface and a second reflective surface, the first reflective surface being opposed to the first terahertz element through the gas cavity in a thickness-wise direction of the first terahertz element to reflect an incident electromagnetic wave toward the first terahertz element, and the second reflective surface being opposed to the second terahertz element through the gas cavity in a thickness-wise direction of the second terahertz element to reflect an incident electromagnetic wave toward the second terahertz element, in which the first reflective surface is opened toward the first terahertz element and is curved to be recessed in a direction away from the first terahertz element, the second reflective surface is opened toward the second terahertz element and is curved to be recessed in a direction away from the second terahertz element, when a direction parallel to the thickness-wise direction of each of the terahertz elements is referred to as a height-wise direction of the terahertz device, the first reflective surface and the second reflective surface are arranged adjacent to each other in a first direction that intersects the height-wise direction of the terahertz device, the gas cavity includes a first gas cavity defined by the first reflective surface and the retaining member and a second gas cavity defined by the second reflective surface and the retaining member, and the first gas cavity is continuous with the second gas cavity at an interface between the first reflective surface and the second reflective surface in the first direction.

In this structure, the first reflective surface and the second reflective surface are formed so that the first gas cavity is continuous with the second gas cavity in the first direction. This decreases the distance between the first reflective surface and the second reflective surface in the first direction. Accordingly, the distance between the first terahertz element and the second terahertz element located adjacent in the first direction is decreased. This improves the resolution of the terahertz device in the detection range of electromagnetic waves.

C2. The terahertz device according to C1, in which the first reflective surface and the second reflective surface are each spherical, and in a cross-sectional view of the reflective surfaces cut along a plane extending in the first direction and the height-wise direction of the terahertz device through a center point of the first reflective surface, the first reflective surface includes an arc-shaped part that connects arc endpoints in the first direction and has a central angle of less than 180°, and the second reflective surface includes an arc-shaped part that connects arc endpoints in the first direction and has a central angle of less than 180°.

C3. The terahertz device according to clause C1 or C2, in which the terahertz elements include a third terahertz element retained by the retaining member, the reflective surfaces include a third reflective surface opposed to the third terahertz element in the height-wise direction of the terahertz device to reflect an incident electromagnetic wave toward the third terahertz element, the third reflective surface is opened toward the third terahertz element and is curved to be recessed in a direction away from the third terahertz element, as viewed in the height-wise direction of the terahertz device, the third reflective surface is arranged adjacent to the second reflective surface at a side opposite to the second reflective surface and the first reflective surface in the first direction, the gas cavity includes a third gas cavity defined by the third reflective surface and the retaining member, the second gas cavity is continuous with the third gas cavity at an interface between the second reflective surface and the third reflective surface in the first direction.

C4. The terahertz device according to clause C3, in which the third reflective surface is spherical, in a cross-sectional view of the reflective surfaces cut along a plane extending in the first direction and the height-wise direction of the terahertz device through a center point of the third reflective surface, the third reflective surface includes an arc-shaped part that connects arc endpoints in the first direction and has a central angle of less than 180°.

C5. The terahertz device according to clause C4, in which as viewed from the height of the terahertz device, the interface between the second reflective surface and the third reflective surface extends linearly.

C6. The terahertz device according to clause C1 or C2, in which the terahertz elements include a third terahertz element retained by the retaining member, the reflective surfaces include a third reflective surface opposed to the third terahertz element in the height-wise direction of the terahertz device to reflect an incident electromagnetic wave toward the third terahertz element, the third reflective surface is opened toward the third terahertz element and is curved to be recessed in a direction away from the third terahertz element, when a direction that intersects the height-wise direction of the terahertz device and differs from the first direction and the second direction is referred to as a third direction, and a direction that intersects the height-wise direction of the terahertz device and differs from the first direction, the second direction, and the third direction is referred to as a fourth direction, as viewed in the height-wise direction of the terahertz device, the third reflective surface is arranged adjacent to the first reflective surface in the third direction and adjacent to the second reflective surface in the fourth direction, the gas cavity includes a third gas cavity defined by the third reflective surface and the retaining member, the first gas cavity is continuous with the third gas cavity at an interface between the first reflective surface and the third reflective surface in the third direction, the second gas cavity is continuous with the third gas cavity at an interface between the second reflective surface and the third reflective surface in the fourth direction.

C7. The terahertz device according to clause C6, in which the third terahertz element is disposed at a position shifted from the first terahertz element and the second terahertz element in the second direction and, as viewed in the second direction, overlaps the first terahertz element and the second terahertz element.

C8. The terahertz device according to clause C6 or C7, in which as viewed in the height-wise direction of the terahertz device, each of the interface between the first reflective surface and the third reflective surface and the interface between the second reflective surface and the third reflective surface extends linearly.

C9. The terahertz device according to clause C1 or C2, in which the terahertz elements include a third terahertz element and a fourth terahertz element, the reflective surfaces include a third reflective surface opposed to the third terahertz element in the height-wise direction of the terahertz device to reflect an incident electromagnetic wave toward the third terahertz element and a fourth reflective surface opposed to the fourth terahertz element in the height-wise direction of the terahertz device to reflect an incident electromagnetic wave toward the fourth terahertz element, the third reflective surface is opened toward the third terahertz element and is curved to be recessed in a direction away from the third terahertz element, the fourth reflective surface is opened toward the fourth terahertz element and is curved to be recessed in a direction away from the fourth terahertz element, as viewed in the height-wise direction of the terahertz device, the second direction is orthogonal to the first direction, the gas cavity includes a third gas cavity defined by the third reflective surface and the retaining member and a fourth gas cavity defined by the fourth reflective surface and the retaining member, as viewed in the height-wise direction of the terahertz device, the third reflective surface is arranged adjacent to the first reflective surface in the second direction, the fourth reflective surface is arranged adjacent to the second reflective surface in the second direction, the third reflective surface is arranged adjacent to the fourth reflective surface in the first direction, the first gas cavity is continuous with the third gas cavity at an interface between the first reflective surface and the third reflective surface in the second direction, the second gas cavity is continuous with the fourth gas cavity at an interface between the second reflective surface and the fourth reflective surface in the second direction.

C10. The terahertz device according to clause C9, in which as viewed in the height-wise direction of the terahertz device, at least one of the third reflective surface and the fourth reflective surface is smaller in the second direction than in a third direction that differs from the first direction and the second direction.

C11. The terahertz device according to clause C10, in which the third reflective surface and the fourth reflective surface are spherical, as viewed in the height-wise direction of the terahertz device, the third reflective surface includes a circumference including a circumferential part that connects arc endpoints in the second direction, and the fourth reflective surface includes a circumference including a circumferential part that connects arc endpoints in the second direction, and the circumferential part of at least one of the third reflective surface and the fourth reflective surface is arc-shaped and has a central angel of less than 180°.

C12. The terahertz device according to clause C9 or C10, in which as viewed in the height-wise direction of the terahertz device, the third reflective surface and the fourth reflective surface are smaller in the second direction than in the third direction, and as viewed in the height-wise direction of the terahertz device, each of an interface between the first reflective surface and the third reflective surface and an interface between the second reflective surface and the fourth reflective surface extends linearly.

D1. The terahertz device according to claim 14, in which the first reflective surface and the second reflective surface are each spherical, as viewed in the height-wise direction of the terahertz device, the first reflective surface includes a circumference including a circumferential part that connects arc endpoints in the first direction, and the second reflective surface includes a circumference including a circumferential part that connects arc endpoints in the first direction, and the circumferential part of at least one of the first reflective surface and the second reflective surface is arc-shaped and has a central angle of less than 180°.

D2. The terahertz device according to clause D1, in which as viewed in the height-wise direction of the terahertz device, each of the first reflective surface and the second reflective surface is smaller in the first direction than in a second direction that differs from the first direction, and as viewed in the height-wise direction of the terahertz device, an interface between the first reflective surface and the second reflective surface extends linearly.

D3. The terahertz device according to any one of claim 14 and clauses D1 and D2, further including: an antenna base including a first antenna surface opposed to the first terahertz element in the height-wise direction of the terahertz device and a second antenna surface opposed to the second terahertz element in the height-wise direction of the terahertz device, in which the first reflective surface is defined by a reflective film formed on the first antenna surface, and the second reflective surface is defined by a reflective film formed on the second antenna surface.

D4. The terahertz device according to any one of claim 14 and clauses D1 and D2, further including: an antenna base including a first antenna surface opposed to the first terahertz element in the height-wise direction of the terahertz device and a second antenna surface opposed to the second terahertz element in the height-wise direction of the terahertz device, in which the antenna base is formed from metal, the first reflective surface is defined by the first antenna surface, and the second reflective surface is defined by the second antenna surface.

D5. The terahertz device according to clause D3 and D4, in which the antenna base includes a first antenna base including the first antenna surface and a second antenna base including the second antenna surface, as viewed in the height-wise direction of the terahertz device, the first antenna surface includes opposite open ends in the first direction, and one of the opposite open ends located at the second antenna surface overlaps a base side surface of the first antenna base facing toward the second antenna base in the first direction, as viewed in the height-wise direction of the terahertz device, the second antenna surface includes opposite open ends in the first direction, and one of the opposite open ends located at the first antenna surface overlaps a base side surface of the second antenna base facing toward the first antenna base in the first direction, and the first antenna base is arranged adjacent to the second antenna base.

D6. The terahertz device according to any one of clauses D3 to D5, further including: a retaining member coupled to the antenna base to retain the first terahertz element and the second terahertz element, in which the retaining member covers the first reflective surface and the second reflective surface.

D7. The terahertz device according to clause D6, in which a partition wall is arranged in the interface between the first reflective surface and the second reflective surface and is in contact with the retaining member to separate the first reflective surface from the second reflective surface.

D8. The terahertz device according to any one of claim 14 and clauses D1 and D2, in which the terahertz elements include a third terahertz element, the reflective surfaces include a third reflective surface opposed to the third terahertz element in the height-wise direction of the terahertz device to reflect an electromagnetic wave from the third terahertz element in one direction, the third reflective surface is opened toward the third terahertz element and is curved to be recessed in a direction away from the third terahertz element, as viewed in the height-wise direction of the terahertz device, the third reflective surface is arranged adjacent to the second reflective surface at a side opposite to the first reflective surface in the first direction, and as viewed in the height-wise direction of the terahertz device, the third reflective surface is smaller in the first direction than in the second direction.

D9. The terahertz device according to D8, in which the third reflective surface is spherical, and as viewed in the height-wise direction of the terahertz device, the third reflective surface includes a circumference including a circumferential part that connects arc endpoints in the first direction that is arc-shaped and has a central angle of less than 180°.

D10. The terahertz device according to D8 and D9, in which the second reflective surface is spherical, and as viewed in the height-wise direction of the terahertz device, the second reflective surface includes a circumference including a circumferential part that connects arc endpoints in the first direction that is arc-shaped and has a central angle of less than 90°.

D11. The terahertz device according to any one of clauses D8 to D10, in which as viewed in the height-wise direction of the terahertz device, the second reflective surface is smaller in the first direction than in a second direction that differs from the first direction, and as viewed in the height-wise direction of the terahertz device, an interface between the second reflective surface and the third reflective surface extends linearly.

D12. The terahertz device according to any one of clauses D8 to D11, further including an antenna base including a first antenna surface opposed to the first terahertz element in the height-wise direction of the terahertz device, a second antenna surface opposed to the second terahertz element in the height-wise direction of the terahertz device, and a third antenna surface opposed to the third terahertz element in the height-wise direction of the terahertz device, in which the first reflective surface is defined by a reflective film formed on the first antenna surface, the second reflective surface is defined by a reflective film formed on the second antenna surface, and the third reflective surface is defined by a reflective film formed on the third antenna surface.

D13. The terahertz device according to any one of clauses D8 to C11, further including an antenna base including a first antenna surface opposed to the first terahertz element in a thickness-wise direction of the first terahertz element, a second antenna surface opposed to the second terahertz element in a thickness-wise direction of the second terahertz element, and a third antenna surface opposed to the third terahertz element in a thickness-wise direction of the third terahertz element, in which the antenna base is formed from metal, the first reflective surface is defined by the first antenna surface, the second reflective surface is defined by the second antenna surface, and the third reflective surface is defined by the third antenna surface.

D14. The terahertz device according to clause D12 or D13, in which the antenna base includes a first antenna base including the first antenna surface, a second antenna base including the second antenna surface, and a third antenna base including the third antenna surface, as viewed in the height-wise direction of the terahertz device, the first antenna surface includes opposite open ends in the first direction, and one of the opposite open ends located at the second antenna surface overlaps a base side surface of the first antenna base facing toward the second antenna base in the first direction, as viewed in the height-wise direction of the terahertz device, the second antenna surface includes opposite open ends in the first direction, and one of the opposite open ends located at the first antenna surface overlaps a base side surface of the second antenna base facing toward the first antenna base in the first direction, as viewed in the height-wise direction of the terahertz device, the third antenna surface includes opposite open ends in the first direction, and one of the opposite open ends located at the second antenna surface overlaps a base side surface of the third antenna base facing toward the third antenna base in the first direction, the first antenna base is arranged adjacent to the second antenna base, and the third antenna base is arranged adjacent to the second antenna base at a side of the second antenna base opposite from the first antenna base.

D15. The terahertz device according to any one of clauses D12 to D14, further including a retaining member coupled to the antenna base to retain the first terahertz element, the second terahertz element, and the third terahertz element, in which the retaining member covers the first reflective surface, the second reflective surface, and the third reflective surface.

D16. The terahertz device according to clause D15, further including:

a first partition wall arranged in an interface between the first reflective surface and the second reflective surface and in contact with the retaining member to separate the first reflective surface from the second reflective surface; and a second partition wall arranged in an interface between the second reflective surface and the third reflective surface and in contact with the retaining member to separate the second reflective surface from the third reflective surface.

D17. The terahertz device according to any one of claim 14 and clauses D1 and D2, in which the terahertz elements include a third terahertz element, the reflective surfaces include a third reflective surface opposed to the third terahertz element in the height-wise direction of the terahertz device to reflect an electromagnetic wave from the third terahertz element in one direction, the third reflective surface is opened toward the third terahertz element and is curved to be recessed in a direction away from the third terahertz element, when a direction that intersects the height-wise direction of the terahertz device and differs from the first direction and the second direction is referred to as a third direction, and a direction that intersects the height-wise direction of the terahertz device and differs from the first direction, the second direction, and the third direction is referred to as a fourth direction, as viewed in the height-wise direction of the terahertz device, the third reflective surface is arranged adjacent to the first reflective surface in the third direction and adjacent to the second reflective surface in the fourth direction, and as viewed in the height-wise direction of the terahertz device, the third reflective surface is smaller in at least one of the third direction and the fourth direction than in the second direction.

D18. The terahertz device according to clause D17, in which the third terahertz element is arranged between the first terahertz element and the second terahertz element in the first direction at a position differing from the first terahertz element and the second terahertz element in the second direction.

D19. The terahertz device according to clauses D17 or D18, in which the third reflective surface is spherical, and as viewed in the height-wise direction of the terahertz device, the third reflective surface includes a circumference including a circumferential part that connects arc endpoints in the third direction and a circumferential part that connects arc endpoints in the fourth direction, and at least one of the circumferential parts is arc-shaped and has a central angle of less than 180°.

D20. The terahertz device according to any one of clauses D17 to D19, in which as viewed in the height-wise direction of the terahertz device, the first reflective surface is smaller in the third direction than in the second direction.

D21. The terahertz device according to any one of clauses D17 to D20, in which as viewed in the height-wise direction of the terahertz device, the second reflective surface is smaller in the fourth direction than in the second direction.

D22. The terahertz device according to clause D17 or D18, in which as viewed in the height-wise direction of the terahertz device, the first reflective surface is smaller in the third direction than in the second direction, and the second reflective surface is smaller in the fourth direction than in the second direction, and as viewed in the height-wise direction of the terahertz device, each of an interface between the first reflective surface and the third reflective surface and an interface between the second reflective surface and the third reflective surface extends linearly.

D23. The terahertz device according to any one of clause D17 to D22, further including an antenna base including a first antenna surface opposed to the first terahertz element in the height-wise direction of the terahertz device, a second antenna surface opposed to the second terahertz element in the height-wise direction of the terahertz device, and a third antenna surface opposed to the third terahertz element in the height-wise direction of the terahertz device, in which the first reflective surface is defined by a reflective film formed on the first antenna surface, the second reflective surface is defined by a reflective film formed on the second antenna surface, and the third reflective surface is defined by a reflective film formed on the third antenna surface.

D24. The terahertz device according to any one of clauses D17 to D22, further including an antenna base including a first antenna surface opposed to the first terahertz element in a thickness-wise direction of the first terahertz element, a second antenna surface opposed to the second terahertz element in a thickness-wise direction of the second terahertz element, and a third antenna surface opposed to the third terahertz element in a thickness-wise direction of the third terahertz element, in which the antenna base is formed from metal, the first reflective surface is defined by the first antenna surface, the second reflective surface is defined by the second antenna surface, and the third reflective surface is defined by the third antenna surface.

D25. The terahertz device according to clause D12 or D13, in which the antenna base includes a first antenna base including the first antenna surface, a second antenna base including the second antenna surface, and a third antenna base including the third antenna surface, as viewed in the height-wise direction of the terahertz device, the first antenna surface includes opposite open ends in the first direction, and one of the opposite open ends located at the second antenna surface overlaps a base side surface of the first antenna base facing toward the second antenna base in the first direction, as viewed in the height-wise direction of the terahertz device, the second antenna surface includes opposite open ends in the first direction, and one of the opposite open ends located at the first antenna surface overlaps a base side surface of the second antenna base facing toward the first antenna base in the first direction, as viewed in the height-wise direction of the terahertz device, the third antenna surface includes opposite open ends in the first direction, and one of the opposite open ends located at the second antenna surface overlaps a base side surface of the third antenna base facing toward the third antenna base in the first direction, the first antenna base is arranged adjacent to the second antenna base in the first direction, the first antenna base is arranged adjacent to the third antenna base in the third direction, and the second antenna base is arranged adjacent to the third antenna base in the fourth direction.

D26. The terahertz device according to any one of clauses D23 to D25, further including a retaining member coupled to the antenna base to retain the first terahertz element, the second terahertz element, and the third terahertz element, in which the retaining member covers the first reflective surface, the second reflective surface, and the third reflective surface.

D27. The terahertz device according to D26, further including:

a first partition wall arranged in an interface between the first reflective surface and the second reflective surface and in contact with the retaining member to separate the first reflective surface from the second reflective surface;

a second partition wall arranged in an interface between the second reflective surface and the third reflective surface and in contact with the retaining member to separate the second reflective surface from the third reflective surface; and a third partition wall arranged in an interface between the first reflective surface and the third reflective surface and in contact with the retaining member to separate the first reflective surface from the third reflective surface.

D28. The terahertz device according to any one of claim 14 and clauses D1 and D2, in which the terahertz elements include a third terahertz element and a fourth terahertz element, the reflective surfaces include a third reflective surface opposed to the third terahertz element in the height-wise direction of the terahertz device to reflect an electromagnetic wave from the third terahertz element in one direction and a fourth reflective surface opposed to the fourth terahertz element in the height-wise direction of the terahertz device to reflect an electromagnetic wave from the fourth terahertz element in one direction, the third reflective surface is opened toward the third terahertz element and is curved to be recessed in a direction away from the third terahertz element, the fourth reflective surface is opened toward the fourth terahertz element and is curved to be recessed in a direction away from the fourth terahertz element, as viewed in the height-wise direction of the terahertz device, the second direction is orthogonal to the first direction, as viewed in the height-wise direction of the terahertz device, the third reflective surface is arranged adjacent to the first reflective surface in the second direction, the fourth reflective surface is arranged adjacent to the second reflective surface in the second direction, and the third reflective surface is arranged adjacent to the fourth reflective surface in the first direction, as viewed in the height-wise direction of the terahertz device, at least one of the third reflective surface and the fourth reflective surface is smaller in the first direction than in a third direction that differs from the first direction and the second direction.

D29. The terahertz device according to clause D28, in which as viewed in the height-wise direction of the terahertz device, at least one of the third reflective surface and the fourth reflective surface is smaller in the second direction than in a third direction that differs from the first direction and the second direction.

D30. The terahertz device according to clause D28 or D29, in which the third reflective surface and the fourth reflective surface are spherical, as viewed in the height-wise direction of the terahertz device, the third reflective surface includes a circumference including a circumferential part that connects arc endpoints in the second direction, and the fourth reflective surface includes a circumference including a circumferential part that connects arc endpoints in the second direction, and the circumferential part of at least one of the third reflective surface and the fourth reflective surface is arc-shaped and has a central angel of less than 180°.

D31. The terahertz device according to clause D28 or D29, in which as viewed in the height-wise direction of the terahertz device, each of the third reflective surface and the fourth reflective surface is smaller in the second direction than in the third direction, and as viewed in the height-wise direction of the terahertz device, each of an interface between the first reflective surface and the third reflective surface and an interface between the second reflective surface and the fourth reflective surface extends linearly.

D32. The terahertz device according to any one of clauses D28 to D31, further including an antenna base including a first antenna surface opposed to the first terahertz element in the height-wise direction of the terahertz device, a second antenna surface opposed to the second terahertz element in the height-wise direction of the terahertz device, a third antenna surface opposed to the third terahertz element in the height-wise direction of the terahertz device, and a fourth antenna surface opposed to the fourth terahertz element in the height-wise direction of the terahertz device, in which the first reflective surface is defined by a reflective film formed on the first antenna surface, the second reflective surface is defined by a reflective film formed on the second antenna surface, the third reflective surface is defined by a reflective film formed on the third antenna surface, and the fourth reflective surface is defined by a reflective film formed on the fourth antenna surface.

D33. The terahertz device according to any one of clauses D28 to D31, further including an antenna base including a first antenna surface opposed to the first terahertz element in the height-wise direction of the terahertz device, a second antenna surface opposed to the second terahertz element in the height-wise direction of the terahertz device, a third antenna surface opposed to the third terahertz element in the height-wise direction of the terahertz device, and a fourth antenna surface opposed to the fourth terahertz element in the height-wise direction of the terahertz device, in which the antenna base is formed from metal, the first reflective surface is defined by the first antenna surface, the second reflective surface is defined by the second antenna surface, the third reflective surface is defined by the third antenna surface, and the fourth reflective surface is defined by the fourth antenna surface.

D34. The terahertz device according to clause D32 or D33, in which the antenna base includes a first antenna base including the first antenna surface, a second antenna base including the second antenna surface, and a third antenna base including the third antenna surface, and a fourth antenna base including the fourth antenna surface, as viewed in the height-wise direction of the terahertz device, the first antenna surface includes opposite open ends in the first direction, and one of the opposite open ends located at the second antenna surface overlaps a base side surface of the first antenna base facing toward the second antenna base in the first direction, and the first antenna surface includes opposite open ends in the second direction, one of the opposite open ends located at the third antenna surface overlaps a base side surface of the first antenna base facing toward the third antenna base in the second direction, as viewed in the height-wise direction of the terahertz device, the second antenna surface includes opposite open ends in the first direction, and one of the opposite open ends located at the first antenna surface overlaps a base side surface of the second antenna base facing the first antenna base in the first direction, and as viewed in the height-wise direction of the terahertz device, the second antenna surface includes opposite open ends in the second direction, one of the opposite open ends located at the fourth antenna surface overlaps a base side surface of the second antenna base facing the fourth antenna base in the first direction, as viewed in the height-wise direction of the terahertz device, the third antenna surface includes opposite open ends in the first direction, and one of the opposite open ends located at the fourth antenna surface overlaps a base side surface of the third antenna base facing toward the fourth antenna base in the first direction, and the third antenna surface includes opposite open ends in the second direction, and one of the opposite open ends located at the first antenna surface overlaps a base side surface of the third antenna base facing toward the first antenna base in the second direction, as viewed in the height-wise direction of the terahertz device, the fourth antenna surface includes opposite open ends in the first direction, and one of the opposite open ends located at the third antenna surface overlaps a base side surface of the fourth antenna base facing toward the third antenna base in the first direction, and the fourth antenna surface includes opposite open ends in the second direction, and one of the opposite open ends located at the second antenna surface overlaps a base side surface of the fourth antenna base facing toward the second antenna base in the second direction, in the first direction, the first antenna base is in contact with the second antenna base, and the third antenna base is in contact with the fourth antenna base, and in the second direction, the first antenna base is in contact with the third antenna base, and the second antenna base is in contact with the fourth antenna base.

D35. The terahertz device according to any one of clauses D32 to D34, further including a retaining member coupled to the antenna base to retain the first terahertz element, the second terahertz element, the third terahertz element, and the fourth terahertz element, in which the retaining member covers the first reflective surface, the second reflective surface, the third reflective surface, and the fourth reflective surface.

D36. The terahertz device according to clause D35, in which a first partition wall is arranged in an interface between the first reflective surface and the second reflective surface and in contact with the retaining member to separate the first reflective surface from the second reflective surface, a second partition wall is arranged in an interface between the first reflective surface and the third reflective surface and in contact with the retaining member to separate the first reflective surface from the third reflective surface, a third partition wall is arranged in an interface between the second reflective surface and the fourth reflective surface and in contact with the retaining member to separate the second reflective surface from the fourth reflective surface, and a fourth partition wall is arranged in an interface between the third reflective surface and the fourth reflective surface and in contact with the retaining member to separate the third reflective surface from the fourth reflective surface.

D37. A terahertz device, including:

terahertz elements including a first terahertz element and a second terahertz element configured to generate an electromagnetic wave; and a retaining member that supports the first terahertz element and the second terahertz element;

a gas cavity containing a gas;

reflective surfaces including a first reflective surface and a second reflective surface, the first reflective surface being opposed to the first terahertz element through the gas cavity in a thickness-wise direction of the first terahertz element to reflect an electromagnetic wave from the first terahertz element in one direction, and the second reflective surface being opposed to the second terahertz element through the gas cavity in a thickness-wise direction of the second terahertz element to reflect an electromagnetic wave from the second terahertz element in one direction, in which the first reflective surface is opened toward the first terahertz element and is curved to be recessed in a direction away from the first terahertz element, the second reflective surface is opened toward the second terahertz element and is curved to be recessed in a direction away from the second terahertz element, when a direction parallel to the thickness-wise direction of each of the terahertz elements is referred to as a height-wise direction of the terahertz device, the first reflective surface and the second reflective surface are arranged adjacent to each other in a first direction that intersects the height-wise direction of the terahertz device, the gas cavity includes a first gas cavity defined by the first reflective surface and the retaining member and a second gas cavity defined by the second reflective surface and the retaining member, and the first gas cavity is continuous with the second gas cavity at an interface between the first reflective surface and the second reflective surface in the first direction.

In this structure, the terahertz device includes multiple terahertz elements. Thus, when the terahertz device is used as a light source configured to output an electromagnetic wave having a frequency in the terahertz band, the light source outputs high power. In addition, the first reflective surface and the second reflective surface are formed so that the first gas cavity is continuous with the second gas cavity in the first direction. This decreases the distance between the first reflective surface and the second reflective surface in the first direction. Accordingly, the distance between the first terahertz element and the second terahertz element located adjacent in the first direction is decreased. This eliminates or decreases a gap in the first direction between electromagnetic waves that are output in one direction from the terahertz elements through the reflective surfaces. Thus, the electromagnetic waves are uniformly output from the terahertz device in the first direction.

D38. The terahertz device according to clause D37, in which the first reflective surface and the second reflective surface are each spherical, and in a cross-sectional view of the reflective surfaces cut along a plane extending in the first direction and the height-wise direction of the terahertz device through a center point of the first reflective surface, the first reflective surface includes an arc-shaped part that connects arc endpoints in the first direction and has a central angle of less than 180°, and the second reflective surface includes an arc-shaped part that connects arc endpoints in the first direction and has a central angle of less than 180°.

D39. The terahertz device according to clause D37 or D38, in which the terahertz elements include a third terahertz element retained by the retaining member, the reflective surfaces include a third reflective surface opposed to the third terahertz element in the height-wise direction of the terahertz device to reflect an electromagnetic wave from the third terahertz element in one direction, the third reflective surface is opened toward the third terahertz element and is curved to be recessed in a direction away from the third terahertz element, as viewed in the height-wise direction of the terahertz device, the third reflective surface is arranged adjacent to the second reflective surface in the first direction at a side opposite to the second reflective surface and the first reflective surface, the gas cavity includes a third gas cavity defined by the third reflective surface and the retaining member, and the second gas cavity is continuous with the third gas cavity at an interface between the second reflective surface and the third reflective surface in the first direction.

D40. The terahertz device according to clause D39, in which the third reflective surface is spherical, in a cross-sectional view of the reflective surfaces cut along a plane extending in the first direction and the height-wise direction of the terahertz device through a center point of the third reflective surface, the third reflective surface includes an arc-shaped part that connects arc endpoints in the first direction and has a central angle of less than 180°.

D41. The terahertz device according to clause D39, in which as viewed from the height of the terahertz device, the interface between the second reflective surface and the third reflective surface extends linearly.

D42. The terahertz device according to clause D37 or D38, in which the terahertz elements include a third terahertz element retained by the retaining member, the reflective surfaces include a third reflective surface opposed to the third terahertz element in the height-wise direction of the terahertz device to reflect an electromagnetic wave from the third terahertz element in one direction, the third reflective surface is opened toward the third terahertz element and is curved to be recessed in a direction away from the third terahertz element, when a direction that intersects the height-wise direction of the terahertz device and differs from the first direction and the second direction is referred to as a third direction, and a direction that intersects the height-wise direction of the terahertz device and differs from the first direction, the second direction, and the third direction is referred to as a fourth direction, as viewed in the height-wise direction of the terahertz device, the third reflective surface is arranged adjacent to the first reflective surface in the third direction and adjacent to the second reflective surface in the fourth direction, the gas cavity includes a third gas cavity defined by the third reflective surface and the retaining member, and the first gas cavity is continuous with the third gas cavity at an interface between the first reflective surface and the third reflective surface in the third direction, and the second gas cavity is continuous with the third gas cavity at an interface between the second reflective surface and the third reflective surface in the fourth direction.

D43. The terahertz device according to clause D42, in which the third terahertz element is disposed at a position shifted from the first terahertz element and the second terahertz element in the second direction and, as viewed in the second direction, overlaps the first terahertz element and the second terahertz element.

D44. The terahertz device according to clause D42 or D43, in which as viewed in the height-wise direction of the terahertz device, each of the interface between the first reflective surface and the third reflective surface and the interface between the second reflective surface and the third reflective surface extends linearly.

D45. The terahertz device according to clause D37 or D38, in which the terahertz elements include a third terahertz element and a fourth terahertz element, the reflective surfaces include a third reflective surface opposed to the third terahertz element in the height-wise direction of the terahertz device to reflect an electromagnetic wave from the third terahertz element in one direction and a fourth reflective surface opposed to the fourth terahertz element in the height-wise direction of the terahertz device to reflect an electromagnetic wave from the fourth terahertz element in one direction, the third reflective surface is opened toward the third terahertz element and is curved to be recessed in a direction away from the third terahertz element, the fourth reflective surface is opened toward the fourth terahertz element and is curved to be recessed in a direction away from the fourth terahertz element, as viewed in the height-wise direction of the terahertz device, the second direction is orthogonal to the first direction, the gas cavity includes a third gas cavity defined by the third reflective surface and the retaining member and a fourth gas cavity defined by the fourth reflective surface and the retaining member, as viewed in the height-wise direction of the terahertz device, the third reflective surface is arranged adjacent to the first reflective surface in the second direction, the fourth reflective surface is arranged adjacent to the second reflective surface in the second direction, the third reflective surface is arranged adjacent to the fourth reflective surface in the first direction, the first gas cavity is continuous with the third gas cavity at an interface between the first reflective surface and the third reflective surface in the second direction, and the second gas cavity is continuous with the fourth gas cavity at an interface between the second reflective surface and the fourth reflective surface in the second direction.

D46. The terahertz device according to clause D45, in which as viewed in the height-wise direction of the terahertz device, at least one of the third reflective surface and the fourth reflective surface is smaller in the second direction than in a third direction that differs from the first direction and the second direction.

D47. The terahertz device according to clause D45 or D46, in which the third reflective surface and the fourth reflective surface are spherical, as viewed in the height-wise direction of the terahertz device, the third reflective surface includes a circumference including a circumferential part that connects arc endpoints in the second direction, and the fourth reflective surface includes a circumference including a circumferential part that connects arc endpoints in the second direction, and the circumferential part of at least one of the third reflective surface and the fourth reflective surface is arc-shaped and has a central angel of less than 180°.

D48. The terahertz device according to clause D45 or D46, in which as viewed in the height-wise direction of the terahertz device, each of the third reflective surface and the fourth reflective surface is smaller in the second direction than in the third direction, as viewed in the height-wise direction of the terahertz device, each of an interface between the first reflective surface and the third reflective surface and an interface between the second reflective surface and the fourth reflective surface extends linearly.

E1. A terahertz device, including a retaining member that retains terahertz elements, in which the retaining member includes conductive portions, each conductive portion being respectively electrically connected to the terahertz elements.

E2. The terahertz device according to clause E1, in which each of the terahertz elements includes a pad, each of the conductive portions includes an element opposing part opposed to the pad in a thickness-wise direction of the terahertz elements and a bump disposed between the pad and the element opposing part, and each of the terahertz elements is flip-chip-mounted on the element opposing part via the bump.

E3. The terahertz device according to clause E1 or E2, in which each of the conductive portions includes a first conductive portion and a second conductive portion, and as viewed in a height-wise direction of the terahertz device, the first conductive portion and the second conductive portion are arranged next to each other in the first direction and extend toward one side of the terahertz elements in the second direction.

E4. A terahertz device, in which the terahertz elements include a first terahertz element, a second terahertz element, and a third terahertz element, when a direction parallel to a thickness-wise direction of the terahertz element is referred to as the height-wise direction of the terahertz device, the terahertz device includes reflective surfaces including a first reflective surface opposed to the first terahertz element, a second reflective surface opposed to the second terahertz element, and a third reflective surface opposed to the third terahertz element in the height-wise direction of the terahertz device, the first reflective surface and the second reflective surface are arranged next to each other in a first direction that intersects the height-wise direction of the terahertz device, as viewed in the height-wise direction of the terahertz device, the first reflective surface and the third reflective surface are arranged next to each other in a third direction that intersects the height-wise direction of the terahertz device and differs from the first direction, as viewed in the height-wise direction of the terahertz device, the second reflective surface and the third reflective surface are arranged next to each other in a fourth direction that intersects the height-wise direction of the terahertz device and differs from the first direction and the third direction, the retaining member includes conductive portions, each conductive portion being respectively electrically connected to the terahertz elements, each of the conductive portions includes a first conductive portion and a second conductive portion, and a first conductive portion and a second conductive portion that are connected to the third terahertz element are disposed to overlap an interface between the first reflective surface and the second reflective surface as viewed in the height-wise direction of the terahertz device.

E5. The terahertz device according to any one of claims 1 to 18, further including electrodes used for electrical connection with an external device, in which as viewed in the height-wise direction of the terahertz device, the electrodes are arranged not to overlap the reflective surfaces.

E6. The terahertz device according to any one of claims 1 to 18, in which as viewed in the height-wise direction of the terahertz device, the reflective surfaces are larger than the terahertz elements.

E7. The terahertz device according to any one of claims 1 to 18, further including a retaining member that retains the terahertz elements, in which the retaining member is formed from a dielectric material to surround the terahertz elements.

E8. The terahertz device according to any one of claims 1 to 18, in which the reflective surfaces are electrically isolated.

E9. The terahertz device according to any one of claims 1 to 18, further including protection diodes separately connected in parallel to the terahertz elements.

E10. The terahertz device according to clause E9, in which as viewed in the height-wise direction of the terahertz device, the protection diodes are disposed not to overlap the reflective surfaces.

REFERENCE SIGNS LIST

10) terahertz device
20, 20A to 20I) terahertz element (first to fourth terahertz elements)
50) dielectric (retaining member)
70) antenna base
70A to 70I) separate antenna base
81, 81A to 81I) antenna surface
82, 82A to 82I) reflective film
92) gas cavity
191) first partition wall
192) second partition wall
193) third partition wall
P2) center point

The invention claimed is:

1. A terahertz device, comprising:

terahertz elements including a first terahertz element and a second terahertz element configured to receive an electromagnetic wave; and reflective surfaces including a first reflective surface and a second reflective surface, the first reflective surface being opposed to the first terahertz element in a thickness-wise direction of the first terahertz element to reflect an incident electromagnetic wave toward the first terahertz element, and the second reflective surface being opposed to the second terahertz element in a thickness-wise direction of the second terahertz element to reflect an incident electromagnetic wave toward the second terahertz element, wherein the first reflective surface is opened toward the first terahertz element and is curved to be recessed in a direction away from the first terahertz element, the second reflective surface is opened toward the second terahertz element and is curved to be recessed in a direction away from the second terahertz element, when a direction parallel to the thickness-wise direction of each of the terahertz elements is referred to as a height-wise direction of the terahertz device, the first reflective surface and the second reflective surface are arranged adjacent to each other in a first direction that intersects the height-wise direction of the terahertz device, and as viewed in the height-wise direction of the terahertz device, at least one of the first reflective surface and the second reflective surface is smaller in the first direction than in a second direction that differs from the first direction.

2. The terahertz device according to claim 1, wherein each of the first reflective surface and the second reflective surface is spherical, and as viewed in the height-wise direction of the terahertz device, the first reflective surface includes a circumference including a circumferential part that connects arc endpoints in the first direction, the second reflective surface includes a circumference including a circumferential part that connects arc endpoints in the first direction, and the circumferential part of at least one of the first reflective surface and the second reflective surface is arc-shaped and has a central angle of less than 180°.

3. The terahertz device according to claim 1, wherein the terahertz elements include a third terahertz element, the reflective surfaces include a third reflective surface opposed to the third terahertz element in the height-wise direction of the terahertz device to reflect an incident electromagnetic wave toward the third terahertz element, the third reflective surface is opened toward the third terahertz element and is curved to be recessed in a direction away from the third terahertz element, as viewed in the height-wise direction of the terahertz device, the third reflective surface is arranged adjacent to the second reflective surface at a side opposite to the first reflective surface in the first direction, and as viewed in the height-wise direction of the terahertz device, the third reflective surface is smaller in the first direction than in the second direction.

4. The terahertz device according to claim 3, wherein the third reflective surface is spherical, and as viewed in the height-wise direction of the terahertz device, the third reflective surface includes a circumference including a circumferential part that connects arc endpoints in the first direction, and the circumferential part is arc-shaped and has a central angle of less than 180°.

5. The terahertz device according to claim 3, wherein the second reflective surface is spherical, and as viewed in the height-wise direction of the terahertz device, the second reflective surface includes a circumference including a circumferential part that connects arc endpoints in the first direction, and the circumferential part is arc-shaped and has a central angle of less than 90°.

6. The terahertz device according to claim 1, wherein the terahertz elements include a third terahertz element, the reflective surfaces include a third reflective surface opposed to the third terahertz element in the height-wise direction of the terahertz device to reflect an incident electromagnetic wave toward the third terahertz element, the third reflective surface is opened toward the third terahertz element and is curved to be recessed in a direction away from the third terahertz element, when a direction that intersects the height-wise direction of the terahertz device and differs from the first direction and the second direction is referred to as a third direction, and a direction that intersects the height-wise direction of the terahertz device and differs from the first direction, the second direction, and the third direction is referred to as a fourth direction, as viewed in the height-wise direction of the terahertz device, the third reflective surface is arranged adjacent to the first reflective surface in the third direction and adjacent to the second reflective surface in the fourth direction, and as viewed in the height-wise direction of the terahertz device, the third reflective surface is smaller in at least one of the third direction and the fourth direction than in the second direction.

7. The terahertz device according to claim 6, wherein the third terahertz element is arranged between the first terahertz element and the second terahertz element in the first direction at a position differing from the first terahertz element and the second terahertz element in the second direction.

8. The terahertz device according to claim 6, wherein the third reflective surface is spherical, and as viewed in the height-wise direction of the terahertz device, the third reflective surface includes a circumference including a circumferential part that connects arc endpoints in the third direction and a circumferential part that connects arc endpoints in the fourth direction, and at least one of the circumferential parts is arc-shaped and has a central angle of less than 180°.

9. The terahertz device according to claim 6, wherein as viewed in the height-wise direction of the terahertz device, the first reflective surface is smaller in the third direction than in the second direction.

10. The terahertz device according to claim 6, wherein as viewed in the height-wise direction of the terahertz device, the second reflective surface is smaller in the fourth direction than in the second direction.

11. The terahertz device according to claim 1, wherein the terahertz elements include a third terahertz element and a fourth terahertz element, the reflective surfaces include a third reflective surface opposed to the third terahertz element in a thickness-wise direction of the third terahertz element to reflect an incident electromagnetic wave toward the third terahertz element, and a fourth reflective surface opposed to the fourth terahertz element in a thickness-wise direction of the fourth terahertz element to reflect an incident electromagnetic wave toward the fourth terahertz element, the third reflective surface is opened toward the third terahertz element and is curved to be recessed in a direction away from the third terahertz element, the fourth reflective surface is opened toward the fourth terahertz element and is curved to be recessed in a direction away from the fourth terahertz element, as viewed in the height-wise direction of the terahertz device, the second direction is orthogonal to the first direction, as viewed in the height-wise direction of the terahertz device, the first reflective surface and the third reflective surface are arranged adjacent to each other in the second direction, the second reflective surface and the fourth reflective surface are arranged adjacent to each other in the second direction, and the third reflective surface and the fourth reflective surface are arranged adjacent to each other in the first direction, and as viewed in the height-wise direction of the terahertz device, at least one of the third reflective surface and the fourth reflective surface is smaller in the first direction than in a third direction that differs from the first direction and the second direction.

12. The terahertz device according to claim 11, wherein as viewed in the height-wise direction of the terahertz device, at least one of the third reflective surface and the fourth reflective surface is smaller in the second direction than in a third direction that differs from the first direction and the second direction.

13. The terahertz device according to claim 11, wherein each of the third reflective surface and the fourth reflective surface is spherical, and as viewed in the height-wise direction of the terahertz device, the third reflective surface includes a circumference including a circumferential part that connects arc endpoints in the second direction, the fourth reflective surface includes a circumference including a circumferential part that connects arc endpoints in the second direction, and the circumferential part of at least one of the third reflective surface and the fourth reflective surface is arc-shaped and has a central angle of less than 180°.

14. A terahertz device, comprising:

terahertz elements including a first terahertz element and a second terahertz element configured to generate an electromagnetic wave; and reflective surfaces including a first reflective surface and a second reflective surface, the first reflective surface being opposed to the first terahertz element in a thickness-wise direction of the first terahertz element to reflect the electromagnetic wave generated by the first terahertz element in one direction, and the second reflective surface being opposed to the second terahertz element in a thickness-wise direction of the second terahertz element to reflect the electromagnetic wave generated by the second terahertz element in one direction, wherein the first reflective surface is opened toward the first terahertz element and is curved to be recessed in a direction away from the first terahertz element, the second reflective surface is opened toward the second terahertz element and is curved to be recessed in a direction away from the second terahertz element, when a direction parallel to the thickness-wise direction of each of the terahertz elements is referred to as a height-wise direction of the terahertz device, the first reflective surface and the second reflective surface are arranged adjacent to each other in a first direction that intersects the height-wise direction of the terahertz device, and as viewed in the height-wise direction of the terahertz device, at least one of the first reflective surface and the second reflective surface is smaller in the first direction than in a second direction that differs from the first direction.

15. The terahertz device according to claim 14, further comprising an antenna base including antenna surfaces respectively opposed to the terahertz elements in the height-wise direction of the terahertz device, wherein the reflective surfaces include reflective films respectively formed on the antenna surfaces.

16. The terahertz device according to claim 14, further comprising an antenna base including antenna surfaces respectively opposed to the terahertz elements in the height-wise direction of the terahertz device, wherein the antenna base is formed of metal, and the reflective surfaces include the antenna surfaces.

17. The terahertz device according to claim 15, further comprising a retaining member coupled to the antenna base and retaining the terahertz elements, wherein the retaining member covers the reflective surfaces.

18. The terahertz device according to claim 17, wherein a partition wall is arranged in an interface between adjacent ones of the reflective surfaces and in contact with the retaining member to separate the adjacent ones of the reflective surfaces from each other.

19. The terahertz device according to claim 1, further comprising an antenna base including antenna surfaces respectively opposed to the terahertz elements in the height-wise direction of the terahertz device, wherein the reflective surfaces include reflective films respectively formed on the antenna surfaces.

20. The terahertz device according to claim 1, further comprising an antenna base including antenna surfaces respectively opposed to the terahertz elements in the height-wise direction of the terahertz device, wherein the antenna base is formed of metal, and the reflective surfaces include the antenna surfaces.

21. The terahertz device according to claim 19, further comprising a retaining member coupled to the antenna base and retaining the terahertz elements, wherein the retaining member covers the reflective surfaces.

22. The terahertz device according to claim 21, wherein a partition wall is arranged in an interface between adjacent ones of the reflective surfaces and in contact with the retaining member to separate the adjacent ones of the reflective surfaces from each other.

* * * * *